United States Patent
Aoki et al.

(10) Patent No.: US 12,136,465 B2
(45) Date of Patent: Nov. 5, 2024

(54) SEMICONDUCTOR DEVICE AND ELECTRONIC DEVICE

(71) Applicant: Semiconductor Energy Laboratory Co., Ltd., Atsugi (JP)

(72) Inventors: Takeshi Aoki, Ebina (JP); Yoshiyuki Kurokawa, Sagamihara (JP); Munehiro Kozuma, Atsugi (JP); Takuro Kanemura, Sapporo (JP); Tatsunori Inoue, Yamato (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/922,659

(22) PCT Filed: May 6, 2021

(86) PCT No.: PCT/IB2021/053819
§ 371 (c)(1),
(2) Date: Nov. 1, 2022

(87) PCT Pub. No.: WO2021/229373
PCT Pub. Date: Nov. 18, 2021

(65) Prior Publication Data
US 2023/0326491 A1  Oct. 12, 2023

(30) Foreign Application Priority Data

May 15, 2020 (JP) .................................. 2020-085737
Jul. 31, 2020 (JP) .................................. 2020-129885
(Continued)

(51) Int. Cl.
*G11C 5/06* (2006.01)
*G11C 5/10* (2006.01)
(Continued)

(52) U.S. Cl.
CPC .............. *G11C 5/10* (2013.01); *G11C 11/221* (2013.01); *H01L 29/6684* (2013.01); *H01L 29/78391* (2014.09); *H10B 53/30* (2023.02)

(58) Field of Classification Search
CPC ... G11C 5/10; G11C 11/221; H01L 29/78391; H01L 29/6684; H10B 53/30
(Continued)

(56) References Cited

U.S. PATENT DOCUMENTS 9,851,942 B2  12/2017  Kurokawa
9,934,826 B2   4/2018  Kurokawa
(Continued)

FOREIGN PATENT DOCUMENTS

JP   04-067259 A    3/1992
JP   2017-168099 A  9/2017
(Continued)

OTHER PUBLICATIONS

International Search Report (Application No. PCT/IB2021/053819) Dated Aug. 24, 2021.
(Continued)

*Primary Examiner* — Viet Q Nguyen
(74) *Attorney, Agent, or Firm* — Eric J. Robinson; Robinson Intellectual Property Law Office, P.C.

(57) ABSTRACT

A semiconductor device with a small circuit area and low power consumption is provided. The semiconductor device includes first to fourth cells, a current mirror circuit, and first to fourth wirings, and the first to fourth cells each include a first transistor, a second transistor, and a capacitor. In each of the first to fourth cells, a first terminal of the first transistor is electrically connected to a first terminal of the capacitor and a gate of the second transistor. The first wiring is electrically connected to first terminals of the second transistors in the first cell and the second cell, the second wiring
(Continued)

is electrically connected to first terminals of the second transistors in the third cell and the fourth cell, the third wiring is electrically connected to second terminals of the capacitors in the first cell and the third cell, and the fourth wiring is electrically connected to second terminals of the capacitors in the second cell and the fourth cell. The current mirror circuit is electrically connected to the first wiring and the second wiring.

25 Claims, 42 Drawing Sheets

(30) Foreign Application Priority Data

| | | |
|---|---|---|
| Jul. 31, 2020 | (JP) | 2020-129929 |
| Aug. 3, 2020 | (JP) | 2020-131822 |
| Feb. 17, 2021 | (JP) | 2021-023247 |

(51) Int. Cl.
    *G11C 11/22*     (2006.01)
    *H01L 29/66*     (2006.01)
    *H01L 29/78*     (2006.01)
    *H10B 53/30*     (2023.01)

(58) Field of Classification Search
    USPC .......................................................... 365/65
    See application file for complete search history.

(56) References Cited

U.S. PATENT DOCUMENTS

| | | | | |
|---|---|---|---|---|
| 10,114,611 | B2 | 10/2018 | Kurokawa | |
| 10,769,520 | B2* | 9/2020 | Kurokawa | H01L 27/1225 |
| 10,916,288 | B1* | 2/2021 | Di Vincenzo | G11C 11/4091 |
| 11,003,986 | B2* | 5/2021 | Kurokawa | G11C 5/063 |
| 11,037,614 | B2* | 6/2021 | Liu | G11C 11/2275 |
| 11,139,298 | B2* | 10/2021 | Harada | H01L 27/1255 |
| 11,211,108 | B2* | 12/2021 | Van Houdt | H01L 23/528 |
| 11,387,254 | B2* | 7/2022 | Noack | H01L 29/0673 |
| 11,636,883 | B2* | 4/2023 | Kurokawa | G11C 7/16 |
| | | | | 706/20 |
| 2017/0301376 | A1 | 10/2017 | Kurokawa | |
| 2021/0318856 | A1 | 10/2021 | Ikeda et al. | |
| 2022/0254401 | A1* | 8/2022 | Kurokawa | H01L 27/1225 |
| 2023/0049977 | A1* | 2/2023 | Kurokawa | G06F 7/5443 |
| 2023/0062313 | A1* | 3/2023 | Min | G06V 10/26 |

FOREIGN PATENT DOCUMENTS

| | | |
|---|---|---|
| JP | 2017-194963 A | 10/2017 |
| TW | 201732609 | 9/2017 |
| TW | 201741942 | 12/2017 |
| TW | 201809815 | 3/2018 |
| TW | 201818234 | 5/2018 |
| WO | WO-2017/178947 | 10/2017 |
| WO | WO-2019/207404 | 10/2019 |

OTHER PUBLICATIONS

Written Opinion (Application No. PCT/IB2021/053819) Dated Aug. 24, 2021.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

AMANO.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

* cited by examiner

100

FIG. 39A
| Amorphous | Crystalline | Crystal |
|---|---|---|
| • completely amorphous | • CAAC<br>• nc<br>• CAC<br><br>excluding single crystal and poly crystal | • single crystal<br>• poly crystal |
Intermediate state
New crystalline phase
FIG. 39B
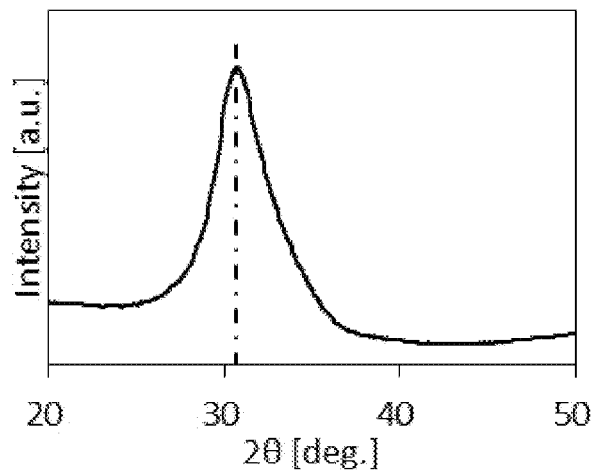
FIG. 39C
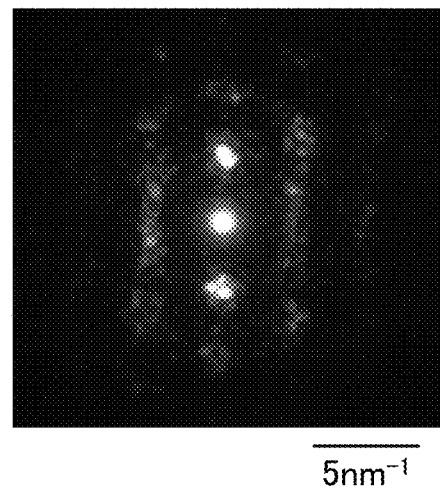

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an image capturing device, a memory device, a signal processing device, a sensor, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate the brain mechanism as electronic circuits and include circuits corresponding to "neurons" and "synapses" of the human brain. Such integrated circuits may therefore be called "neuromorphic", "brainmorphic", or "brain-inspired" circuits. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). By using an artificial neural network, inference with an accuracy as high as or higher than that of a human can be carried out. In an artificial neural network, the main arithmetic operation is the weighted sum operation of outputs from neurons, i.e., the product-sum operation.

For example, Patent Document 1 discloses an invention that utilizes a memory cell using an OS transistor (sometimes referred to as an oxide semiconductor transistor) as a circuit that executes a product-sum operation. An OS transistor is a transistor in which a channel formation region contains a metal oxide semiconductor, and has been reported to exhibit an ultralow off-state current (e.g., Non-Patent Documents 1 and 2). A variety of semiconductor devices using OS transistors have been manufactured (e.g., Non-Patent Documents 3 and 4). The manufacturing process of an OS transistor can be incorporated in a CMOS process with a conventional Si transistor (a transistor containing Si in its channel formation region), and an OS transistor can be stacked over a Si transistor (e.g., Non-Patent Document 4).

REFERENCES

Patent Document

[Patent Document 1] Japanese Published Patent Application No. 2017-168099

Non-Patent Documents

[Non-Patent Document 1] S. Yamazaki et al., "Properties of crystalline In—Ga—Zn-oxide semiconductor and its transistor characteristics," Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide," Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency," SID Symp. Dig. Papers, vol. 41, pp. 626-629 (2010). [Non-Patent Document 4] T. Ishizu et al., "Embedded Oxide Semiconductor Memories: A Key Enabler for Low-Power ULSI," ECS Tran., vol. 79, pp. 149-156 (2017).

SUMMARY OF THE INVENTION

Problems to be Solved by the Invention

When a digital circuit carries out a product-sum operation, a digital multiplication circuit carries out multiplication of multiplier digital data (multiplier data) and multiplicand digital data (multiplicand data). Then, the digital data yielded by the multiplication (product data) are added in a digital addition circuit to yield digital data (product-sum data) resulted from the product-sum operation. The digital multiplication circuit and the digital addition circuit preferably have specifications that allow a multi-bit arithmetic operation. However, in this case, the circuit scale of the digital multiplication circuit and the digital addition circuit is sometimes increased, which might lead to an increase in the circuit area of the entire arithmetic circuit and an increase in power consumption.

In an artificial neural network, an arithmetic operation of an activation function is performed in addition to a product-sum operation. Under specifications such that a digital circuit performs an arithmetic operation of an activation function, an increase in the circuit area of the entire arithmetic circuit and an increase in power consumption might be caused as described above. In the case where a product-sum operation is executed not by a digital multiplication circuit nor a digital addition circuit but by an analog circuit, an arithmetic operation result output from the analog circuit is an analog signal. Thus, to input the arithmetic operation result to the digital circuit performing an arithmetic operation of an activation function, the analog signal needs to be converted into a digital signal once. Moreover, since the digital circuit outputs an arithmetic operation result of an activation function as a digital signal, performing a product-sum operation using the arithmetic operation result again necessitates conversion of the digital signal as the arithmetic operation result into an analog signal in order that the arithmetic operation result can be input to the analog circuit. Specifically, a product-sum operation and an arithmetic operation of an activation function are repeatedly performed in an artificial neural network; thus, a circuit in which an analog circuit and a digital circuit are combined frequently performs conversion between a digital signal and an analog signal. As a result, the power consumption of the circuit performing the conversion between a digital signal and an analog signal might also increase.

An object of one embodiment of the present invention is to provide a semiconductor device capable of performing a product-sum operation and/or an arithmetic operation of an activation function. Another object of one embodiment of the present invention is to provide a semiconductor device with low power consumption.

Another object of one embodiment of the present invention is to provide a novel semiconductor device and the like. Another object of one embodiment of the present invention is to provide an electronic device including the semiconductor device.

Note that the objects of one embodiment of the present invention are not limited to the objects listed above. The objects listed above do not preclude the existence of other objects. The other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first cell, a second cell, a third cell, a fourth cell, a current mirror circuit, a first wiring, a second wiring, a third wiring, and a fourth wiring. The first cell, the second cell, the third cell, and the fourth cell each include a first transistor, a second transistor, and a capacitor. A first terminal of the first transistor is electrically connected to a first terminal of the capacitor and a gate of the second transistor in each of the first cell, the second cell, the third cell, and the fourth cell. A first terminal of the second transistor in the first cell is electrically connected to the first wiring, and a second terminal of the capacitor in the first cell is electrically connected to the third wiring. A first terminal of the second transistor in the second cell is electrically connected to the first wiring, and a second terminal of the capacitor in the second cell is electrically connected to the fourth wiring. A first terminal of the second transistor in the third cell is electrically connected to the second wiring, and a second terminal of the capacitor in the third cell is electrically connected to the third wiring. A first terminal of the second transistor in the fourth cell is electrically connected to the second wiring, and a second terminal of the capacitor in the fourth cell is electrically connected to the fourth wiring. The current mirror circuit is electrically connected to the first wiring and the second wiring, and the current mirror circuit has a function of supplying current corresponding to a potential of the first wiring to the second wiring. First data is determined depending on a difference between a first potential and a second potential, and second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the third wiring and the fourth potential is input to the fourth wiring, a current amount obtained by subtracting the amount of current flowing from the second wiring to the first terminal of the second transistor in the third cell and the amount of current flowing from the second wiring to the first terminal of the second transistor in the fourth cell from the amount of current flowing from the current mirror circuit to the second wiring is an amount corresponding to a product of the first data and the second data.

(2)

Another embodiment of the present invention is a semiconductor device including m (m is an integer greater than or equal to 1) first cells, m second cells, m third cells, m fourth cells, a current mirror circuit, a first wiring, a second wiring, m third wirings, and m fourth wirings. The m first cells, the m second cells, the m third cells, and the m fourth cells each include a first transistor, a second transistor, and a capacitor. A first terminal of the first transistor is electrically connected to a first terminal of the capacitor and a gate of the second transistor in each of the m first cells, the m second cells, the m third cells, and the m fourth cells. A first terminal of the second transistor in each of the m first cells is electrically connected to the first wiring, and a second terminal of the capacitor in the i-th (i is an integer greater than or equal to 1 and less than or equal to m) first cell is electrically connected to the i-th third wiring. A first terminal of the second transistor in each of the m second cells is electrically connected to the first wiring, and a second terminal of the capacitor in the i-th second cell is electrically connected to the i-th fourth wiring. A first terminal of the second transistor in each of the m third cells is electrically connected to the second wiring, and a second terminal of the capacitor in the i-th third cell is electrically connected to the i-th third wiring. A first terminal of the second transistor in each of the m fourth cells is electrically connected to the second wiring, and a second terminal of the capacitor in the i-th fourth cell is electrically connected to the i-th fourth wiring. The current mirror circuit is electrically connected to the first wiring and the second wiring, and the current mirror circuit has a function of supplying current corresponding to a potential of the first wiring to the second wiring. The first cell electrically connected to the i-th third wiring has a function of retaining a potential $V_{W\alpha}[i]$ in the first terminal of the capacitor in the first cell, and the third cell electrically connected to the i-th third wiring has a function of retaining a potential $V_{W\beta}[i]$ in the first terminal of the capacitor in the third cell. The second cell electrically connected to the i-th fourth wiring has a function of retaining the potential $V_{W\beta}[i]$ in the first terminal of the capacitor in the second cell, and the fourth cell electrically connected to the i-th fourth wiring has a function of retaining the potential $V_{W\alpha}[i]$ in the first terminal of the capacitor in the fourth cell. When a potential $V_{X\alpha}[i]$ is input to the i-th third wiring and a potential $V_{X\beta}[i]$ is input to the i-th fourth wiring, a current amount obtained by subtracting a total amount of current flowing from the second wiring to the first terminals of the second transistors in the m third cells and a total amount of current flowing from the second wiring to the first terminals of the second transistors in the m fourth cells from the amount of current flowing from the current mirror circuit to the second wiring is an amount corresponding to a value of Formula (A1).

[Formula 1]

$$\sum_{i=1}^{m}(V_{W\alpha}[i]-V_{W\beta}[i])(V_{X\alpha}[i]-V_{X\beta}[i]) \tag{A1}$$

(3)

Another embodiment of the present invention is a semiconductor device including a first cell, a second cell, a third cell, a fourth cell, a first current source, a second current source, a subtraction circuit, a first wiring, a second wiring, a third wiring, and a fourth wiring. The first cell, the second cell, the third cell, and the fourth cell each include a first transistor, a second transistor, and a capacitor. A first terminal of the first transistor is electrically connected to a first terminal of the capacitor and a gate of the second transistor in each of the first cell, the second cell, the third cell, and the fourth cell. A first terminal of the second transistor in the first cell is electrically connected to the first wiring, and a second terminal of the capacitor in the first cell is electrically connected to the third wiring. A first terminal of the second transistor in the second cell is electrically connected to the first wiring, and a second terminal of the capacitor in the second cell is electrically connected to the fourth wiring. A first terminal of the second transistor in the third cell is electrically connected to the second wiring, and a second terminal of the capacitor in the third cell is electrically connected to the third wiring. A first terminal of the second transistor in the fourth cell is electrically connected to the second wiring, and a second terminal of the capacitor in the fourth cell is electrically connected to the fourth wiring. The first current source is electrically connected to the first wiring, and the second current source is electrically connected to the second wiring. Note that the amount of current flowing from the first current source to the first wiring is greater than or equal to 0.9 times and less than or equal to 1.1 times the amount of current flowing from the second current source to the second wiring. A first input terminal of the subtraction circuit is electrically connected to the first wiring, and a second input terminal of the subtraction circuit is electrically connected to the second wiring. First data is determined depending on a difference between a first potential and a second potential, and second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the third wiring and the fourth potential is input to the fourth wiring, current with an amount obtained by subtracting a total amount of current flowing from the first wiring to the first terminals of the second transistors in the first cell and the second cell from the amount of current flowing from the first current source to the first wiring is input to the first input terminal of the subtraction circuit, and current with an amount obtained by subtracting a total amount of current flowing from the second wiring to the first terminals of the second transistors in the third cell and the fourth cell from the amount of current flowing from the second current source to the second wiring is input to the second input terminal of the subtraction circuit. Thus, voltage corresponding to a product of the first data and the second data is output from an output terminal of the subtraction circuit.

(4)

One embodiment of the present invention is a semiconductor device including m (m is an integer greater than or equal to 1) first cells, m second cells, m third cells, m fourth cells, a first current source, a second current source, a subtraction circuit, a first wiring, a second wiring, m third wirings, and m fourth wirings. The m first cells, the m second cells, the m third cells, and the m fourth cells each include a first transistor, a second transistor, and a capacitor. A first terminal of the first transistor is electrically connected to a first terminal of the capacitor and a gate of the second transistor in each of the m first cells, the m second cells, the m third cells, and the m fourth cells. A first terminal of the second transistor in each of the m first cells is electrically connected to the first wiring, and a second terminal of the capacitor in the i-th (i is an integer greater than or equal to 1 and less than or equal to m) first cell is electrically connected to the i-th third wiring. A first terminal of the second transistor in each of the m second cells is electrically connected to the first wiring, and a second terminal of the capacitor in the i-th second cell is electrically connected to the i-th fourth wiring. A first terminal of the second transistor in each of the m third cells is electrically connected to the second wiring, and a second terminal of the capacitor in the i-th third cell is electrically connected to the i-th third wiring. A first terminal of the second transistor in each of the m fourth cells is electrically connected to the second wiring, and a second terminal of the capacitor in the i-th fourth cell is electrically connected to the i-th fourth wiring. The first current source is electrically connected to the first wiring, and the second current source is electrically connected to the second wiring. Note that the amount of current flowing from the first current source to the first wiring is greater than or equal to 0.9 times and less than or equal to 1.1 times the amount of current flowing from the second current source to the second wiring. A first input terminal of the subtraction circuit is electrically connected to the first wiring, and a second input terminal of the subtraction circuit is electrically connected to the second wiring. The first cell electrically connected to the i-th third wiring has a function of retaining a potential $V_{W\alpha}[i]$ in the first terminal of the capacitor in the first cell, and the third cell electrically connected to the i-th third wiring has a function of retaining a potential $V_{W\beta}[i]$ in the first terminal of the capacitor in the third cell. The second cell electrically connected to the i-th fourth wiring has a function of retaining the potential $V_{W\beta}[i]$ in the first terminal of the capacitor in the second cell, and the fourth cell electrically connected to the i-th fourth wiring has a function of retaining the potential $V_{W\alpha}[i]$ in the first terminal of the capacitor in the fourth cell. When a potential $V_{X\alpha}[i]$ is input to the i-th third wiring and a potential $V_{X\beta}[i]$ is input to the i-th fourth wiring, current with an amount obtained by subtracting a total amount of current flowing from the first wiring to the first terminals of the second transistors in the m first cells and the m second cells from the amount of current flowing from the first current source to the first wiring is input to the first input terminal of the subtraction circuit, and current with an amount obtained by subtracting a total amount of current flowing from the second wiring to the first terminals of the second transistors in the m third cells and the m fourth cells from the amount of current flowing from the second current source to the second wiring is input to the second input terminal of the subtraction circuit. Thus, voltage corresponding to a value of Formula (A2) is output to an output terminal of the subtraction circuit.

[Formula 2]

$$\sum_{i=1}^{m}(V_{W\alpha}[i] - V_{W\beta}[i])(V_{X\alpha}[i] - V_{X\beta}[i]) \quad (A2)$$

(5)

Another embodiment of the present invention is a semiconductor device including a first cell, a second cell, a third cell, a fourth cell, a first wiring, a second wiring, and a third wiring. The first cell, the second cell, the third cell, and the fourth cell each include a first transistor, a second transistor, and a capacitor. In each of the first cell, the second cell, the third cell, and the fourth cell, a first terminal of the first transistor is electrically connected to a first terminal of the capacitor and a gate of the second transistor, and a gate of the first transistor is electrically connected to the first wiring. The second wiring is electrically connected to a second terminal of the first transistor in the first cell and a second terminal of the first transistor in the fourth cell, and the third wiring is electrically connected to a second terminal of the first transistor in the second cell and a second terminal of the first transistor in the third cell.

(6)

Another embodiment of the present invention is a semiconductor device including a first cell, a second cell, a third cell, a fourth cell, a first wiring, a second wiring, a third wiring, a fourth wiring, a fifth wiring, a sixth wiring, and a seventh wiring. The first cell, the second cell, the third cell, and the fourth cell each include a first transistor, a second transistor, and a capacitor. A first terminal of the first transistor is electrically connected to a first terminal of the capacitor and a gate of the second transistor in each of the first cell, the second cell, the third cell, and the fourth cell. A first terminal of the second transistor in the first cell is electrically connected to the fourth wiring, a second terminal of the capacitor in the first cell is electrically connected to the sixth wiring, a second terminal of the first transistor in the first cell is electrically connected to the second wiring, and a gate of the first transistor in the first cell is electrically connected to the first wiring. A first terminal of the second transistor in the second cell is electrically connected to the fourth wiring, a second terminal of the capacitor in the second cell is electrically connected to the seventh wiring, a second terminal of the first transistor in the second cell is electrically connected to the third wiring, and a gate of the first transistor in the second cell is electrically connected to the first wiring. A first terminal of the second transistor in the third cell is electrically connected to the fifth wiring, a second terminal of the capacitor in the third cell is electrically connected to the sixth wiring, a second terminal of the first transistor in the third cell is electrically connected to the third wiring, and a gate of the first transistor in the third cell is electrically connected to the first wiring. A first terminal of the second transistor in the fourth cell is electrically connected to the fifth wiring, a second terminal of the capacitor in the fourth cell is electrically connected to the seventh wiring, a second terminal of the first transistor in the fourth cell is electrically connected to the second wiring, and a gate of the first transistor in the fourth cell is electrically connected to the first wiring.

(7)

In another embodiment of the present invention according to (6) above, a current mirror circuit is preferably included. It is preferable that the current mirror circuit be electrically connected to the fourth wiring and the fifth wiring. The current mirror circuit preferably has a function of supplying current corresponding to a potential of the fourth wiring to the fifth wiring.

(8)

In another embodiment of the present invention according to (7) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the sixth wiring and the fourth potential is input to the seventh wiring, a current amount obtained by subtracting the amount of current flowing from the fifth wiring to the first terminal of the second transistor in the third cell and the amount of current flowing from the fifth wiring to the first terminal of the second transistor in the fourth cell from the amount of current flowing from the current mirror circuit to the fifth wiring is an amount corresponding to the product of the first data and the second data.

(9)

In another embodiment of the present invention according to (6) above, a first current source, a second current source, and a subtraction circuit are preferably included. It is preferable that the first current source be electrically connected to the fourth wiring, and the second current source be electrically connected to the fifth wiring. It is preferable that a first input terminal of the subtraction circuit be electrically connected to the fourth wiring, and a second input terminal of the subtraction circuit be electrically connected to the fifth wiring. The amount of current flowing from the first current source to the fourth wiring is preferably greater than or equal to 0.9 times and less than or equal to 1.1 times the amount of current flowing from the second current source to the fifth wiring.

(10)

In another embodiment of the present invention according to (9) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the sixth wiring and the fourth potential is input to the seventh wiring, current with an amount obtained by subtracting a total amount of current flowing from the fourth wiring to the first terminals of the second transistors in the first cell and the second cell from the amount of current flowing from the first current source to the fourth wiring is input to the first input terminal of the subtraction circuit, and current with an amount obtained by subtracting a total amount of current flowing from the fifth wiring to the first terminals of the second transistors in the third cell and the fourth cell from the amount of current flowing from the second current source to the fifth wiring is input to the second input terminal of the subtraction circuit. Thus, voltage corresponding to the product of the first data and the second data is output from an output terminal of the subtraction circuit.

(11)

Another embodiment of the present invention is a semiconductor device including m (m is an integer greater than or equal to 1) first cells, m second cells, m third cells, m fourth cells, a current mirror circuit, m first wirings, a second wiring, a third wiring, a fourth wiring, a fifth wiring, m sixth wirings, and m seventh wirings. The m first cells, the m second cells, the m third cells, and the m fourth cells each include a first transistor, a second transistor, and a capacitor. A first terminal of the first transistor is electrically connected to a first terminal of the capacitor and a gate of the second transistor in each of the m first cells, the m second cells, the m third cells, and the m fourth cells. A first terminal of the second transistor in each of the m first cells is electrically connected to the fourth wiring, a second terminal of the capacitor in the i-th (i is an integer greater than or equal to 1 and less than or equal to m) first cell is electrically connected to the i-th sixth wiring, a second terminal of the first transistor in each of the m first cells is electrically connected to the second wiring, and a gate of the first transistor in the i-th first cell is electrically connected to the i-th first wiring. A first terminal of the second transistor in each of the m second cells is electrically connected to the fourth wiring, a second terminal of the capacitor in the i-th second cell is electrically connected to the i-th seventh wiring, a second terminal of the first transistor in each of the m second cells is electrically connected to the third wiring, and a gate of the first transistor in the i-th second cell is electrically connected to the i-th first wiring. A first terminal of the second transistor in each of the m third cells is electrically connected to the fifth wiring, a second terminal of the capacitor in the i-th third cell is electrically connected to the i-th sixth wiring, a second terminal of the first transistor in each of the m third cells is electrically connected to the third wiring, and a gate of the first transistor in the i-th third cell is electrically connected to the i-th first wiring. A first terminal of the second transistor in each of the m fourth cells is electrically connected to the fifth wiring, a second terminal of the capacitor in the i-th fourth cell is electrically connected to the i-th seventh wiring, a second terminal of the first transistor in each of the m fourth cells is electrically connected to the second wiring, and a gate of the first transistor in the i-th fourth cell is electrically connected to the i-th first wiring. The current mirror circuit is electrically connected to the fourth wiring and the fifth wiring. The current mirror circuit has a function of supplying current corresponding to a potential of the fourth wiring to the fifth wiring. The first cell electrically connected to the i-th sixth wiring has a function of retaining a potential $V_{W\alpha}[i]$ in the first terminal of the capacitor in the first cell, and the third cell electrically connected to the i-th sixth wiring has a function of retaining a potential $V_{W\beta}[i]$ in the first terminal of the capacitor in the third cell. The second cell electrically connected to the i-th seventh wiring has a function of retaining the potential $V_{W\beta}[i]$ in the first terminal of the capacitor in the second cell, and the fourth cell electrically connected to the i-th seventh wiring has a function of retaining the potential $V_{W\alpha}[i]$ in the first terminal of the capacitor in the fourth cell. When a potential $V_{X\alpha}[i]$ is input to the i-th sixth wiring and a potential $V_{X\beta}[i]$ is input to the i-th seventh wiring, a current amount obtained by subtracting a total amount of current flowing from the fifth wiring to the first terminals of the second transistors in the m third cells and a total amount of current flowing from the fifth wiring to the first terminals of the second transistors in the m fourth cells from the amount of current flowing from the current mirror circuit to the fifth wiring is an amount corresponding to a value of Formula (A3).

[Formula 3]

$$\sum_{i=1}^{m}(V_{W\alpha}[i] - V_{W\beta}[i])(V_{X\alpha}[i] - V_{X\beta}[i]) \quad (A3)$$

(12)

Another embodiment of the present invention is a semiconductor device including m (m is an integer greater than or equal to 1) first cells, m second cells, m third cells, m fourth cells, a first current source, a second current source, a subtraction circuit, m first wirings, a second wiring, a third wiring, a fourth wiring, a fifth wiring, m sixth wirings, and m seventh wirings. The m first cells, the m second cells, the m third cells, and the m fourth cells each include a first transistor, a second transistor, and a capacitor. A first terminal of the first transistor is electrically connected to a first terminal of the capacitor and a gate of the second transistor in each of the m first cells, the m second cells, the m third cells, and the m fourth cells. A first terminal of the second transistor in each of the m first cells is electrically connected to the fourth wiring, a second terminal of the capacitor in the i-th (i is an integer greater than or equal to 1 and less than or equal to m) first cell is electrically connected to the i-th sixth wiring, a second terminal of the first transistor in each of the m first cells is electrically connected to the second wiring, and a gate of the first transistor in the i-th first cell is electrically connected to the i-th first wiring. A first terminal of the second transistor in each of the m second cells is electrically connected to the fourth wiring, a second terminal of the capacitor in the i-th second cell is electrically connected to the i-th seventh wiring, a second terminal of the first transistor in each of the m second cells is electrically connected to the third wiring, and a gate of the first transistor in the i-th second cell is electrically connected to the i-th first wiring. A first terminal of the second transistor in each of the m third cells is electrically connected to the fifth wiring, a second terminal of the capacitor in the i-th third cell is electrically connected to the i-th sixth wiring, a second terminal of the first transistor in each of the m third cells is electrically connected to the third wiring, and a gate of the first transistor in the i-th third cell is electrically connected to the i-th first wiring. A first terminal of the second transistor in each of the m fourth cells is electrically connected to the fifth wiring, a second terminal of the capacitor in the i-th fourth cell is electrically connected to the i-th seventh wiring, a second terminal of the first transistor in each of the m fourth cells is electrically connected to the second wiring, and a gate of the first transistor in the i-th fourth cell is electrically connected to the i-th first wiring. Furthermore, the first current source is electrically connected to the fourth wiring, and the second current source is electrically connected to the fifth wiring. The amount of current flowing from the first current source to the fourth wiring is greater than or equal to 0.9 times and less than or equal to 1.1 times the amount of current flowing from the second current source to the fifth wiring. A first input terminal of the subtraction circuit is electrically connected to the fourth wiring, and a second input terminal of the subtraction circuit is electrically connected to the fifth wiring. The first cell electrically connected to the i-th sixth wiring has a function of retaining a potential $V_{W\alpha}[i]$ in the first terminal of the capacitor in the first cell, and the third cell electrically connected to the i-th sixth wiring has a function of retaining a potential $V_W[i]$ in the first terminal of the capacitor in the third cell. The second cell electrically connected to the i-th seventh wiring has a function of retaining the potential $V_{W\beta}[i]$ in the first terminal of the capacitor in the second cell, and the fourth cell electrically connected to the i-th seventh wiring has a function of retaining the potential $V_{W\alpha}[i]$ in the first terminal of the capacitor in the fourth cell. When a potential $V_{X\alpha}[i]$ is input to the i-th sixth wiring and a potential $V_{X\beta}[i]$ is input to the i-th seventh wiring, current with an amount obtained by subtracting a total amount of current flowing from the fourth wiring to the first terminals of the second transistors in the m first cells and the m second cells from the amount of current flowing from the first current source to the fourth wiring is input to the first input terminal of the subtraction circuit, and current with an amount obtained by subtracting a total amount of current flowing from the fifth wiring to the first terminals of the second transistors in the m third cells and the m fourth cells from the amount of current flowing from the second current source to the fifth wiring is input to the second input terminal of the subtraction circuit. Thus, voltage corresponding to a value of Formula (A4) is output to an output terminal of the subtraction circuit.

[Formula 4]

$$\sum_{i=1}^{m}(V_{W\alpha}[i] - V_{W\beta}[i])(V_{X\alpha}[i] - V_{X\beta}[i]) \quad (A4)$$

(13)

Another embodiment of the present invention is a semiconductor device including a first cell, a second cell, a third cell, a fourth cell, a first current mirror circuit, a second current mirror circuit, and a third current mirror circuit. The first cell, the second cell, the third cell, and the fourth cell each include a first transistor, a second transistor, and a capacitor. A first terminal of the first transistor is electrically connected to a first terminal of the capacitor and a gate of the second transistor in each of the first cell, the second cell, the third cell, and the fourth cell. A gate of the first transistor in the first cell is electrically connected to a gate of the first transistor in the second cell, a gate of the first transistor in the third cell, and a gate of the first transistor in the fourth cell. A first terminal of the first current mirror circuit is electrically connected to a first terminal of the second transistor in the first cell, and a second terminal of the first current mirror circuit is electrically connected to a first terminal of the second transistor in the fourth cell. A first terminal of the second current mirror circuit is electrically connected to a first terminal of the second transistor in the third cell, and a second terminal of the second current mirror circuit is electrically connected to a first terminal of the second transistor in the second cell. A first terminal of the third current mirror circuit is electrically connected to the first terminal of the second transistor in the second cell, and a second terminal of the third current mirror circuit is electrically connected to the first terminal of the second transistor in the fourth cell. The first current mirror circuit has a function of supplying current corresponding to a potential of the first terminal of the first current mirror circuit to the outside from the first terminal and the second terminal of the first current mirror circuit. The second current mirror circuit has a function of supplying current corresponding to a potential of the first terminal of the second current mirror circuit to the outside from the first terminal and the second terminal of the second current mirror circuit. The third current mirror circuit has a function of supplying current corresponding to a potential of the first terminal of the third current mirror circuit to the inside from the first terminal and the second terminal of the third current mirror circuit.

(14)

In another embodiment of the present invention according to (13) above, it is preferable that a second terminal of the capacitor in the first cell be electrically connected to a second terminal of the capacitor in the third cell, a second terminal of the first transistor in the first cell be electrically connected to a second terminal of the first transistor in the fourth cell, a second terminal of the capacitor in the second cell be electrically connected to a second terminal of the capacitor in the fourth cell, and a second terminal of the first transistor in the second cell be electrically connected to a second terminal of the first transistor in the third cell.

(15)

In another embodiment of the present invention according to (14) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to each of the second terminal of the capacitor in the first cell and the second terminal of the capacitor in the third cell and the fourth potential is input to each of the second terminal of the capacitor in the second cell and the second terminal of the capacitor in the fourth cell, a current amount obtained by subtracting the amount of current flowing through the first terminal of the second transistor in the fourth cell and the amount of current flowing through the third terminal of the third current mirror circuit from the amount of current flowing from the second terminal of the first current mirror circuit is an amount corresponding to the product of the first data and the second data.

(16)

Another embodiment of the present invention is a semiconductor device including a first cell, a second cell, a third cell, a fourth cell, a first current mirror circuit, a second current mirror circuit, a third current mirror circuit, and a fourth current mirror circuit. The first cell, the second cell, the third cell, and the fourth cell each include a first transistor, a second transistor, and a capacitor. A first terminal of the first transistor is electrically connected to a first terminal of the capacitor and a gate of the second transistor in each of the first cell, the second cell, the third cell, and the fourth cell. A gate of the first transistor in the first cell is electrically connected to a gate of the first transistor in the second cell, a gate of the first transistor in the third cell, and a gate of the first transistor in the fourth cell. A first terminal of the first current mirror circuit is electrically connected to a first terminal of the second transistor in the first cell, and a second terminal of the first current mirror circuit is electrically connected to a first terminal of the second transistor in the fourth cell. A first terminal of the second current mirror circuit is electrically connected to a first terminal of the second transistor in the third cell, and a second terminal of the second current mirror circuit is electrically connected to a first terminal of the third current mirror circuit. A second terminal of the third current mirror circuit is electrically connected to the first terminal of the second transistor in the fourth cell. A first terminal of the fourth current mirror circuit is electrically connected to a first terminal of the second transistor in the second cell, and a second terminal of the fourth current mirror circuit is electrically connected to the first terminal of the second transistor in the fourth cell. The first current mirror circuit has a function of supplying current corresponding to a potential of the first terminal of the first current mirror circuit to the outside from the first terminal and the second terminal of the first current mirror circuit. The second current mirror circuit has a function of supplying current corresponding to a potential of the first terminal of the second current mirror circuit to the outside from the first terminal and the second terminal of the second current mirror circuit. The third current mirror circuit has a function of supplying current corresponding to a potential of the first terminal of the third current mirror circuit to the inside from the first terminal and the second terminal of the third current mirror circuit. The fourth current mirror circuit has a function of supplying current corresponding to a potential of the first terminal of the fourth current mirror circuit to the outside from the first terminal and the second terminal of the fourth current mirror circuit.

(17)

In another embodiment of the present invention according to (16) above, it is preferable that a second terminal of the capacitor in the first cell be electrically connected to a second terminal of the capacitor in the third cell, a second terminal of the first transistor in the first cell be electrically connected to a second terminal of the first transistor in the fourth cell, a second terminal of the capacitor in the second cell be electrically connected to a second terminal of the capacitor in the fourth cell, and a second terminal of the first transistor in the second cell be electrically connected to a second terminal of the first transistor in the third cell.

(18)

In another embodiment of the present invention according to (17) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to each of the second terminal of the capacitor in the first cell and the second terminal of the capacitor in the third cell and the fourth potential is input to each of the second terminal of the capacitor in the second cell and the second terminal of the capacitor in the fourth cell, a current amount obtained by subtracting the amount of current flowing through the first terminal of the second transistor in the fourth cell and the amount of current flowing through the third terminal of the third current mirror circuit from a total amount of current flowing from the second terminal of the first current mirror circuit and current flowing from the second terminal of the fourth current mirror circuit is an amount corresponding to the product of the first data and the second data.

(19)

Another embodiment of the present invention is a semiconductor device including a first cell, a second cell, a third cell, a fourth cell, a first wiring, a second wiring, and a third wiring. The first cell, the second cell, the third cell, and the fourth cell each include a first transistor, a second transistor, and a capacitor. In particular, the capacitor included in each of the second cell and the third cell includes a material that can show ferroelectricity. In each of the first cell, the second cell, the third cell, and the fourth cell, a first terminal of the first transistor is electrically connected to a first terminal of the capacitor and a gate of the second transistor, and a gate of the first transistor is electrically connected to the first wiring. The second wiring is electrically connected to a second terminal of the first transistor in the first cell and a second terminal of the first transistor in the fourth cell, and the third wiring is electrically connected to a second terminal of the first transistor in the second cell and a second terminal of the first transistor in the third cell.

(20)

In another embodiment of the present invention according to (19) above, it is preferable that the material that can show ferroelectricity include one or more materials selected from hafnium oxide, zirconium oxide, $HfZrO_X$ (X is a real number greater than 0), yttria-stabilized zirconia, barium titanate, $PbTiO_X$, lead zirconate titanate, barium strontium titanate, strontium titanate, and strontium bismuth tantalate.

(21)

Another embodiment of the present invention is a semiconductor device including a first cell, a second cell, a third cell, a fourth cell, a first wiring, a second wiring, a third wiring, a fourth wiring, a fifth wiring, a sixth wiring, and a seventh wiring. The first cell, the second cell, the third cell, and the fourth cell each include a first transistor, a second transistor, and a capacitor. In particular, the capacitor included in each of the second cell and the third cell includes a material that can show ferroelectricity. A first terminal of the first transistor is electrically connected to a first terminal of the capacitor and a gate of the second transistor in each of the first cell, the second cell, the third cell, and the fourth cell, and a second terminal of the first transistor in the first cell is electrically connected to the second wiring. A second terminal of the capacitor in the first cell is electrically connected to the sixth wiring, a first terminal of the second transistor in the first cell is electrically connected to the fourth wiring, and a gate of the first transistor in the first cell is electrically connected to the first wiring. A second terminal of the first transistor in the second cell is electrically connected to the third wiring, a second terminal of the capacitor in the second cell is electrically connected to the seventh wiring, a first terminal of the second transistor in the second cell is electrically connected to the fourth wiring, and a gate of the first transistor in the second cell is electrically connected to the first wiring. A second terminal of the first transistor in the third cell is electrically connected to the third wiring, a second terminal of the capacitor in the third cell is electrically connected to the sixth wiring, a first terminal of the second transistor in the third cell is electrically connected to the fifth wiring, and a gate of the first transistor in the third cell is electrically connected to the first wiring. A second terminal of the first transistor in the fourth cell is electrically connected to the second wiring, a second terminal of the capacitor in the fourth cell is electrically connected to the seventh wiring, a first terminal of the second transistor in the fourth cell is electrically connected to the fifth wiring, and a gate of the first transistor in the fourth cell is electrically connected to the first wiring.

(22)

In another embodiment of the present invention according to (21) above, it is preferable that the material that can show ferroelectricity include one or more materials selected from hafnium oxide, zirconium oxide, $HfZrO_X$ (X is a real number greater than 0), yttria-stabilized zirconia, barium titanate, $PbTiO_X$, lead zirconate titanate, barium strontium titanate, strontium titanate, and strontium bismuth tantalate.

(23)

In another embodiment of the present invention according to (21) or (22) above, a first circuit and a second circuit are preferably included. It is particularly preferable that the second wiring be electrically connected to the first circuit, the third wiring be electrically connected to the second circuit, the first circuit include an analog-to-digital converter circuit, and the second circuit include a voltage source.

(24)

In another embodiment of the present invention according to any one of (21) to (23) above, a current mirror circuit is preferably included. It is particularly preferable that the current mirror circuit be electrically connected to the fourth wiring and the fifth wiring, and the current mirror circuit have a function of supplying current corresponding to a potential of the fourth wiring to the fifth wiring.

(25)

In another embodiment of the present invention according to (24) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the sixth wiring and the fourth potential is input to the seventh wiring, a current amount obtained by subtracting the amount of current flowing from the fifth wiring to the first terminal of the second transistor in the third cell and the amount of current flowing from the fifth wiring to the first terminal of the second transistor in the fourth cell from the amount of current flowing from the current mirror circuit to the fifth wiring is an amount corresponding to the product of the first data and the second data.

(26)

In another embodiment of the present invention according to (21) or (22) above, a first current source, a second current source, and a subtraction circuit are preferably included. It is preferable that the first current source be electrically connected to the fourth wiring, and the second current source be electrically connected to the fifth wiring. It is preferable that a first input terminal of the subtraction circuit be electrically connected to the fourth wiring, and a second input terminal of the subtraction circuit be electrically connected to the fifth wiring. The amount of current flowing from the first current source to the fourth wiring is preferably greater than or equal to 0.9 times and less than or equal to 1.1 times the amount of current flowing from the second current source to the fifth wiring.

(27)

In another embodiment of the present invention according to (26) above, a product of first data and second data is preferably calculated. Note that the first data is determined depending on a difference between a first potential and a second potential, and the second data is determined depending on a difference between a third potential and a fourth potential. The first cell has a function of retaining the first potential in the first terminal of the capacitor in the first cell, the second cell has a function of retaining the second potential in the first terminal of the capacitor in the second cell, the third cell has a function of retaining the second potential in the first terminal of the capacitor in the third cell, and the fourth cell has a function of retaining the first potential in the first terminal of the capacitor in the fourth cell. When the third potential is input to the sixth wiring and the fourth potential is input to the seventh wiring, current with an amount obtained by subtracting a total amount of current flowing from the fourth wiring to the first terminals of the second transistors in the first cell and the second cell from the amount of current flowing from the first current source to the fourth wiring is input to the first input terminal of the subtraction circuit, and current with an amount obtained by subtracting a total amount of current flowing from the fifth wiring to the first terminals of the second transistors in the third cell and the fourth cell from the amount of current flowing from the second current source to the fifth wiring is input to the second input terminal of the subtraction circuit. Thus, voltage corresponding to the product of the first data and the second data is output from an output terminal of the subtraction circuit.

(28)

In another embodiment of the present invention according to any one of (1) to (27) above, each of the first transistors and the second transistors includes a metal oxide in a channel formation region in the first cell, the second cell, the third cell, and the fourth cell.

(29)

Another embodiment of the present invention is an electronic device including the semiconductor device according to any one of (1) to (28) above and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, an electronic component including a chip in a package, and the like are examples of the semiconductor device. Moreover, a memory device, a display device, a light-emitting device, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions.

Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components, the function of a wiring and the function of an electrode. Thus, electrical connection in this specification includes, in its category, such a case where one conductive film has functions of a plurality of components.

In this specification and the like, a "resistor" can be, for example, a circuit element or a wiring having a resistance value higher than $0 \Omega$. Therefore, in this specification and the like, a "resistor" sometimes includes a wiring having a resistance value, a transistor in which current flows between its source and drain, a diode, a coil, and the like. Thus, the term "resistor" can be replaced with the terms "resistance", "load", "region having a resistance value", and the like; conversely, the terms "resistance", "load", and "region having a resistance value" can be replaced with the term "resistor" and the like. The resistance value can be, for example, preferably higher than or equal to 1 m$\Omega$ and lower than or equal to 10$\Omega$, further preferably higher than or equal to m$\Omega$ and lower than or equal to 5$\Omega$, still further preferably higher than or equal to 10 m$\Omega$ and lower than or equal to 1$\Omega$. For another example, the resistance value can be higher than or equal to 1$\Omega$ and lower than or equal to $1\times10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, the term "capacitor", "parasitic capacitance", "gate capacitance", or the like can be replaced with the term "capacitance" or the like in some cases. Conversely, the term "capacitance" can be replaced with the term "capacitor", "parasitic capacitance", "gate capacitance", or the like in some cases. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. For another example, the electrostatic capacitance value can be higher than or equal to 1 pF and lower than or equal to 10 µF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can sometimes be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. As a result, a differential circuit, a current mirror circuit, or the like having excellent properties can be obtained.

The case where a single circuit element is illustrated in a circuit diagram may indicate a case where the circuit element includes a plurality of circuit elements. For example, the case where a single resistor is illustrated in a circuit diagram includes a case where two or more resistors are electrically connected to each other in series. For another example, the case where a single capacitor is illustrated in a circuit diagram includes a case where two or more capacitors are electrically connected to each other in parallel. For another example, the case where a single transistor is illustrated in a circuit diagram includes a case where two or more transistors are electrically connected to each other in series and their gates are electrically connected to each other. Similarly, for another example, the case where a single switch is illustrated in a circuit diagram includes a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. For another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. For another example, the term "insulating layer" or "insulating film" can be changed into the term "insulator" in some cases.

In this specification and the like, the terms "electrode," "wiring," and "terminal" do not functionally limit these components. For example, an "electrode" is used as part of a "wiring" in some cases, and vice versa. Furthermore, the term "electrode" or "wiring" also includes the case where a plurality of "electrodes", "wirings", or the like are formed in an integrated manner, for example. For example, a "terminal" is used as part of a "wiring", an "electrode", or the like in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case, for example.

In this specification and the like, the terms "wiring", "signal line", "power supply line", and the like can be interchanged with each other depending on the case or according to circumstances. For example, the term "wiring" can be changed into the term "signal line" in some cases. For another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of impurities that change the characteristics of the semiconductor include Group 1 elements, Group 2 elements, Group 13 elements, Group 14 elements, Group 15 elements, and transition metals other than the main components; specific examples are hydrogen (included also in water), lithium, sodium, silicon, boron, phosphorus, carbon, and nitrogen. Specifically, when the semiconductor is a silicon layer, examples of impurities that change the characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to control whether current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to, for example, a state where a source electrode and a drain electrode of the transistor can be regarded as being electrically short-circuited or a state where current can flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Thus, the case where the angle is greater than or equal to $-5°$ and less than or equal to $5°$ is also included. Moreover, "approximately parallel" or "substantially parallel" indicates a state where two straight lines are placed at an angle greater than or equal to $-30°$ and less than or equal to $30°$. In addition, "perpendicular" indicates a state where two straight lines are placed at an angle greater than or equal to $80°$ and less than or equal to $100°$. Thus, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

Effect of the Invention

One embodiment of the present invention can provide a semiconductor device capable of performing a product-sum operation and/or an arithmetic operation of an activation function. Alternatively, one embodiment of the present invention can provide a semiconductor device with low power consumption.

Alternatively, one embodiment of the present invention can provide a novel semiconductor device and the like. Alternatively, one embodiment of the present invention can provide an electronic device including the semiconductor device.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 39A is a diagram showing classification of crystal structures of IGZO, FIG. 39B is a diagram showing an XRD spectrum of crystalline IGZO, and FIG. 39C is a diagram showing a nanobeam electron diffraction pattern of the crystalline IGZO.

MODE FOR CARRYING OUT THE INVENTION

Figure 1:
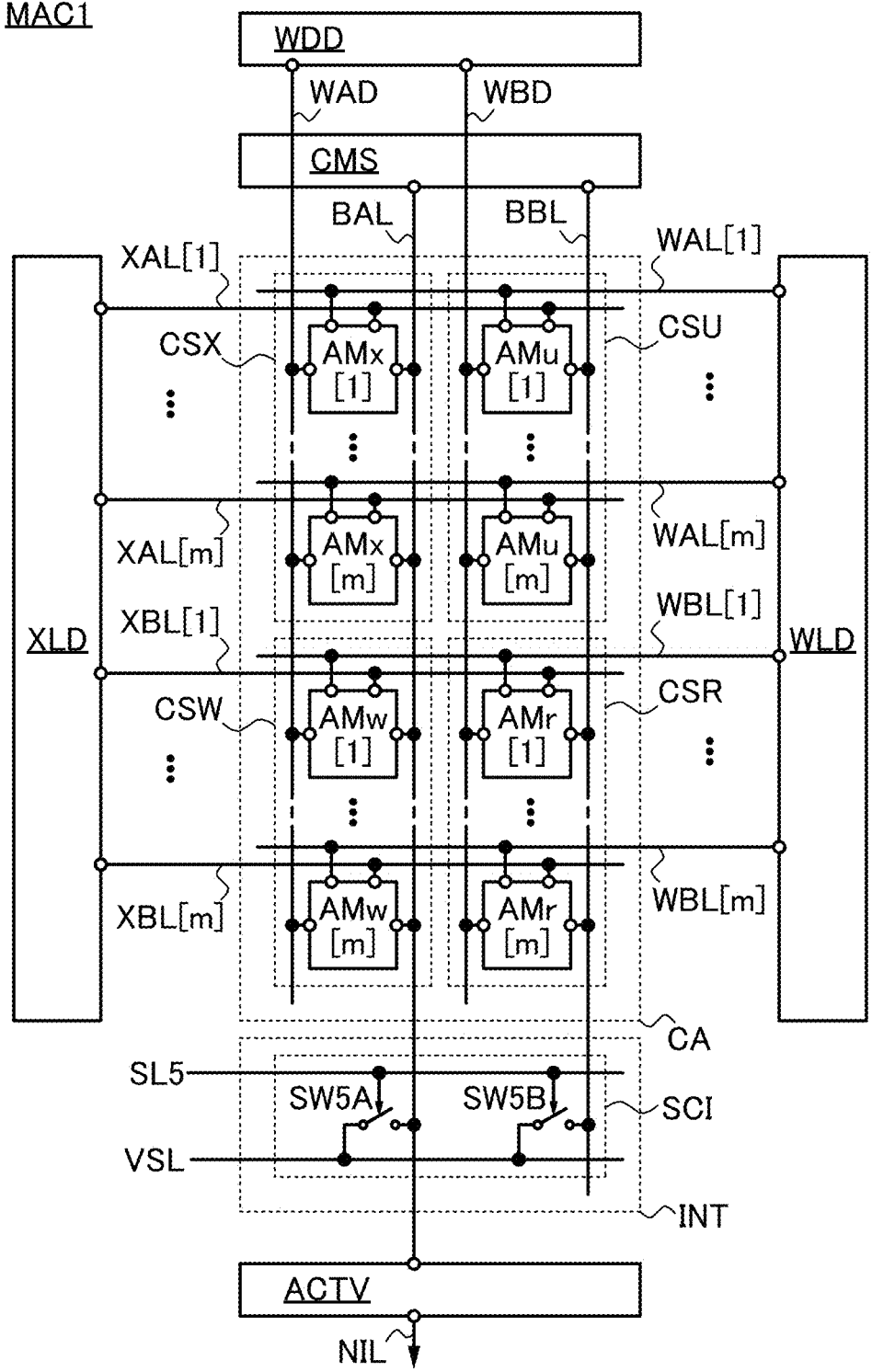
FIG. 1 is a block diagram illustrating an example of a semiconductor device.

In an artificial neural network (hereinafter, referred to as a neural network), the connection strength between synapses can be changed by providing the neural network with existing information. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield neural network and a hierarchical neural network. In particular, a neural network with a multilayer structure is called a "deep neural network" (DNN) and machine learning using a deep neural network is called "deep learning" in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen can be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments, for example.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numeral, and in particular need to be distinguished from each other, an identification sign such as "_1", "[n]", or "[m,n]" is sometimes added to the reference numeral. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to the shapes, values, or the like shown in the drawings. For example, variations in signal, voltage, or current due to noise, variations in signal, voltage, or current due to difference in timing, or the like can be included.

Embodiment 1

Described in this embodiment is an example of an arithmetic circuit, which is a semiconductor device of one embodiment of the present invention, capable of performing a product-sum operation and an arithmetic operation of a function.

Structure Example 1 of Semiconductor Device

FIG. 1 illustrates a structure example of a semiconductor device capable of performing a product-sum operation of a plurality of pieces of first data and a plurality of pieces of second data.

An arithmetic circuit MAC1 illustrated in FIG. 1 shows a structure example of an arithmetic circuit capable of performing a product-sum operation and an arithmetic operation of a function. The arithmetic circuit MAC1 is a circuit that performs a product-sum operation of the plurality of pieces of first data retained in a plurality of memory cells described below and the plurality of pieces of input second data and performs an arithmetic operation of an activation function using the product-sum operation result. Note that the plurality of pieces of first data and the plurality of pieces of second data can be analog data or multilevel data (discrete data), for example. The plurality of pieces of first data are sometimes collectively referred to as a first group of first data or the like. Similarly, the plurality of pieces of second data are sometimes collectively referred to as a second group of second data or the like.

The arithmetic circuit MAC1 includes, for example, a memory cell array CA, a circuit CMS, a circuit WDD, a circuit XLD, a circuit WLD, a circuit INT, and a circuit ACTV.

The memory cell array CA includes a memory cell AMx[1] to a memory cell AMx[m] (m is an integer greater than or equal to 1), a memory cell AMw[1] to a memory cell AMw[m], a memory cell AMu[1] to a memory cell AMu[m], and a memory cell AMr[1] to a memory cell AMr[m].

Note that in this specification and the like, description is sometimes given assuming that the memory cell AMx[1] to the memory cell AMx[m] are included in a circuit CSX, the memory cell AMu[1] to the memory cell AMu[m] are included in a circuit CSU, the memory cell AMw[1] to the memory cell AMw[m] are included in a circuit CSW, and the memory cell AMr[1] to the memory cell AMr[m] are included in a circuit CSR.

In the memory cell array CA, the memory cells are arranged in a matrix of 2m rows and 2 columns. Specifically, the memory cell AMx[1] to the memory cell AMx[m] are arranged at addresses from the first row and the first column to the m-th row and the first column in the memory cell array CA, the memory cell AMw[1] to the memory cell AMw[m] are arranged at addresses from the m+1-th row and the first column to the 2m-th row and the first column in the memory cell array CA, the memory cell AMu[1] to the memory cell AMu[m] are arranged at addresses from the first row and the second column to the m-th row and the second column in the memory cell array CA, and the memory cell AMr[1] to the memory cell AMr[m] are arranged at addresses from the m+1-th row and the second column to the 2m-th row and the second column in the memory cell array CA.

The memory cells AMx, the memory cells AMw, the memory cells AMu, and the memory cells AMr each have a function of retaining voltage corresponding to the first data. Note that the voltage corresponding to the first data can be, for example, the difference between voltage retained in the memory cell AMu[i] and the memory cell AMw[i] and voltage retained in the memory cell AMx[i] and the memory cell AMr[i].

The memory cell AMx[1] is electrically connected to a wiring WAD, a wiring BAL, a wiring WAL[1], and a wiring XAL[1]. The memory cell AMx[m] is electrically connected to the wiring WAD, the wiring BAL, a wiring WAL[m], and a wiring XAL[m]. The memory cell AMw[1] is electrically connected to the wiring WAD, the wiring BAL, a wiring WBL[1], and a wiring XBL[1]. The memory cell AMw[m] is electrically connected to the wiring WAD, the wiring BAL, a wiring WBL[m], and a wiring XBL[m]. The memory cell AMu[1] is electrically connected to a wiring WBD, a wiring BBL, the wiring WAL[1], and the wiring XAL[1]. The memory cell AMu[m] is electrically connected to the wiring WBD, the wiring BBL, the wiring WAL[m], and the wiring XAL[m]. The memory cell AMr[1] is electrically connected to the wiring WBD, the wiring BBL, the wiring WBL[1], and the wiring XBL[1]. The memory cell AMr[m] is electrically connected to the wiring WBD, the wiring BBL, the wiring WBL[m], and the wiring XBL[m].

The detailed circuit structure example of each of the memory cell AMx[1] to the memory cell AMx[m], the memory cell AMw[1] to the memory cell AMw[m], the memory cell AMu[1] to the memory cell AMu[m], and the memory cell AMr[1] to the memory cell AMr[m] will be described later.

The circuit CMS is electrically connected to the wiring BAL and the wiring BBL, for example. The circuit CMS has a function of supplying current from the wiring BAL to each of the memory cell AMx[1] to the memory cell AMx[m] and the memory cell AMw[1] to the memory cell AMw[m] and a function of supplying current from the wiring BBL to each of the memory cell AMu[1] to the memory cell AMu[m] and the memory cell AMr[1] to the memory cell AMr[m]. Note that the amount of current flowing through the wiring BAL and the amount of current flowing through the wiring BBL, which are from the circuit CMS, are preferably equal to each other. Specifically, the amount of current flowing through the wiring BAL is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing through the wiring BBL. Note that the above-described lower limits and upper limits can be combined with each other.

Note that a specific structure example of the circuit CMS will be described later.

The circuit WDD is electrically connected to the wiring WAD and the wiring WBD, for example. The circuit WDD has a function of transmitting data to be stored in each memory cell included in the memory cell array CA. For example, the circuit WDD can transmit the first data or reference data as the data to each of the wiring WAD and the wiring WBD.

The circuit WLD is electrically connected to the wiring WAL[1] to the wiring WAL[m] and the wiring WBL[1] to the wiring WBL[m], for example. The circuit WLD has a function of selecting a memory cell to which data is to be written when data is written to the memory cell included in the memory cell array CA. Specifically, for example, when data is written to the memory cell AMx[i] (i is an integer greater than or equal to 1 and less than or equal to m) and the memory cell AMu[i] in the memory cell array CA, the circuit WLD supplies a high-level potential to the wiring WAL[i] and supplies a low-level potential to the wiring WAL[m] except the wiring WAL[i] and the wiring WBL[1] to the wiring WBL[m], thereby selecting the memory cell AMx[i] and the memory cell AMu[i] to which data is to be written. For another example, when data is written to the memory cell AMw[i] and the memory cell AMr[i] in the memory cell array CA, the circuit WLD supplies a high-level potential to the wiring WBL[i] and supplies a low-level potential to the wiring WAL[1] to the wiring WAL[m] and the wiring WBL[1] to the wiring WBL[m] except the wiring WBL[i], thereby selecting the memory cell AMw[i] and the memory cell AMr[i] to which data is to be written.

The circuit XLD is electrically connected to the wiring XAL[1] to the wiring XAL[m] and the wiring XBL[1] to the wiring XBL[m], for example. The circuit XLD has a function of transmitting the second data for performing multiplication by the first data to each memory cell included in the memory cell array CA. Specifically, for example, the circuit XLD can supply a potential corresponding to the second data to the wiring XAL[1] to the wiring XAL[m] and the wiring XBL[1] to the wiring XBL[m].

The circuit INT is electrically connected to the wiring BAL and the wiring BBL, for example. The circuit INT has a function of inputting a predetermined voltage to the wiring BAL and the wiring BBL, for example. Note that the voltage can be, for example, a low-level potential or a ground potential.

For a specific structure example, the circuit INT includes a circuit SCI, and the circuit SCI includes a switch SW5A and a switch SW5B. A first terminal of the switch SW5A is electrically connected to the wiring BAL, and a second terminal of the switch SW5A is electrically connected to a wiring VSL. A first terminal of the switch SW5B is electrically connected to the wiring BBL, and a second terminal of the switch SW5B is electrically connected to the wiring VSL. A control terminal of each of the switch SW5A and the switch SW5B is electrically connected to a wiring SL5.

As the switch SW5A and the switch SW5B, an electrical switch such as an analog switch or a transistor can be used, for example. Alternatively, a mechanical switch may be used as the switch SW5A and the switch SW5B, for example. Note that in the case of using a transistor as the switch SW5A and the switch SW5B, the transistor can be an OS transistor or a transistor containing Si in a channel formation region (hereinafter, referred to as a Si transistor).

Note that in this embodiment, each of the switch SW5A and the switch SW5B is turned on when a high-level potential is input to the control terminal, and is turned off when a low-level potential is input to the control terminal.

The wiring SL5 functions as a wiring that supplies voltage for switching the conducting state and the non-conducting state of the switch SW5A and the switch SW5B, for example. Thus, the voltage can be, for example, a high-level potential or a low-level potential.

The wiring VSL functions as a wiring that supplies a constant voltage, for example. The constant voltage can be a low-level potential or a ground potential, for example.

The circuit ACTV is electrically connected to the wiring BAL and a wiring NIL, for example. The circuit ACTV has a function of outputting voltage corresponding to the amount of current flowing from the wiring BAL to the circuit ACTV, a function of performing an arithmetic operation according to a function system defined in advance using the voltage, and a function of outputting a result of the arithmetic operation of the function to the wiring NIL, for example.

Specifically, as the function system in the circuit ACTV, a sigmoid function, a tanh function, a softmax function, a ReLU function (ramp function), a threshold function, or the like can be used, for example. Any of these functions can be used as an activation function in a neural network, for example.

Structure Example of Memory Cell Array CA

Next, structure examples of the memory cell AMx[1] to the memory cell AMx[m], the memory cell AMu[1] to the memory cell AMu[m], the memory cell AMw[1] to the memory cell AMw[m], and the memory cell AMr[1] to the memory cell AMr[m] included in the memory cell array CA will be described.

Figure 2:
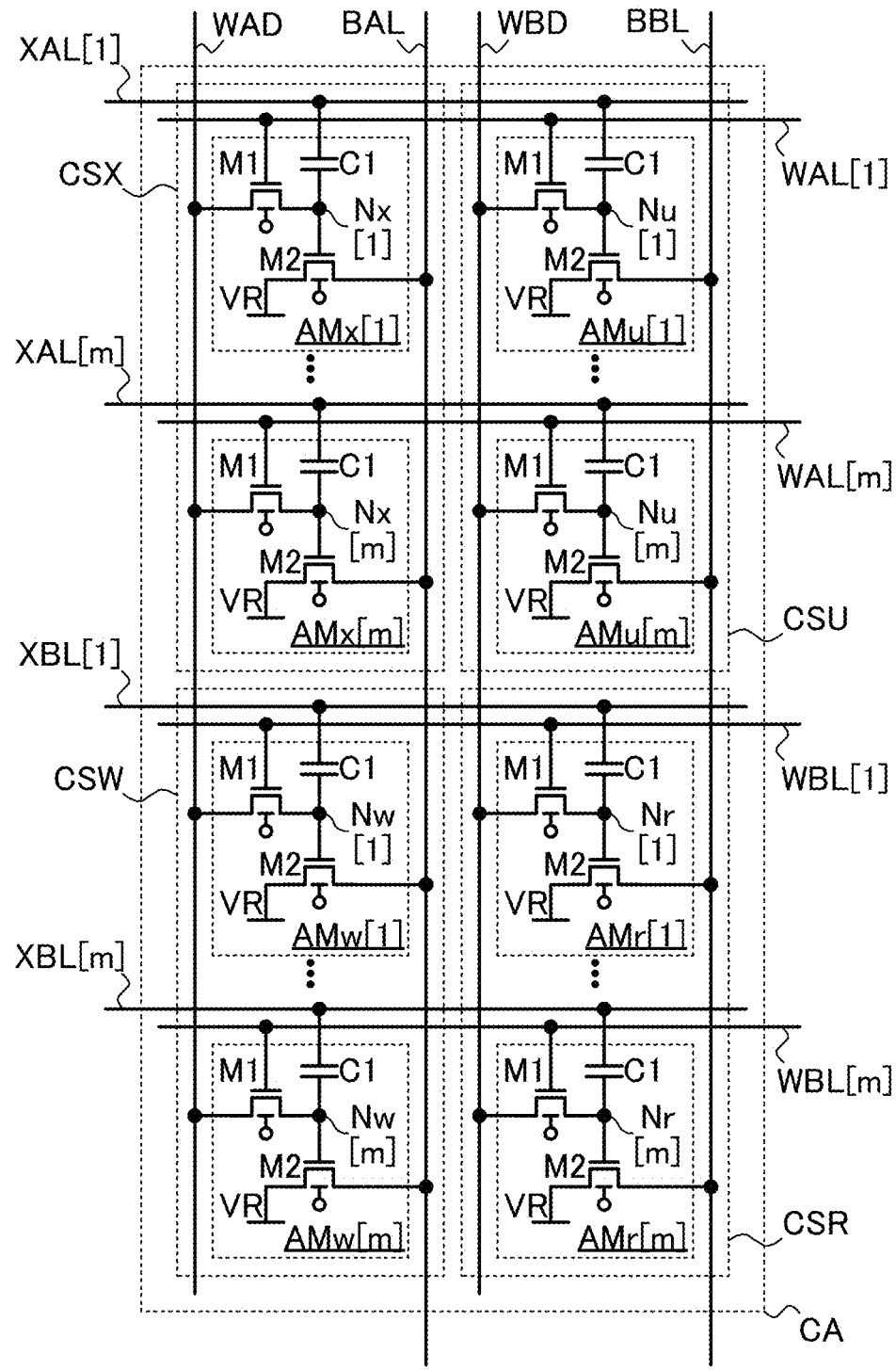
FIG. 2 is a circuit diagram illustrating a structure example of a circuit included in a semiconductor device.

FIG. 2 is a circuit diagram illustrating a structure example of the memory cell array CA. The memory cell array CA has a function of calculating a product-sum of the plurality of pieces of first data and the plurality of pieces of second data.

In the memory cell array CA illustrated in FIG. 2, the memory cells AMx, the memory cells AMu, the memory cells AMw, and the memory cells AMr each include a transistor M1, a transistor M2, and a capacitor C1.

The transistors M1 included in the memory cells AMx, the memory cells AMu, the memory cells AMw, and the memory cells AMr preferably have the same size. In addition, the transistors M2 included in the memory cells AMx, the memory cells AMu, the memory cells AMw, and the memory cells AMr preferably have the same size.

By making the transistors have the same size, each transistor can have almost the same electrical characteristics. Thus, by making the transistors M1 included in the memory cells AMx, the memory cells AMu, the memory cells AMw, and the memory cells AMr have the same size and making the transistors M2 included in the memory cells AMx, the memory cells AMu, the memory cells AMw, and the memory cells AMr have the same size, the memory cells AMx, the memory cells AMu, the memory cells AMw, and the memory cells AMr can perform substantially the same operation when under the same conditions. The same conditions here mean, for example, potentials of a source, a drain, a gate, and the like of the transistor M1; potentials of a source, a drain, a gate, and the like of the transistor M2; and voltages input to the memory cells AMx, the memory cells AMu, the memory cells AMw, and the memory cells AMr.

Note that the transistor M1 may function as a switching element unless otherwise specified. That is, voltages in a range where the transistor M1 operates as a switching element may be appropriately input to the gate, the source, and the drain of the transistor M1. However, one embodiment of the present invention is not limited thereto. For example, the transistor M1 in the on state can operate in a saturation region or a linear region. Alternatively, the transistor M1 can operate in a subthreshold region in order to reduce the amount of current flowing through the transistor M1. Alternatively, the transistor M1 can operate in a linear region, in a saturation region, and in a subthreshold region. Alternatively, the transistor M1 can operate both in a linear region and in a saturation region, both in a saturation region and in a subthreshold region, or both in a linear region and in a subthreshold region.

Note that in this specification and the like, a subthreshold region refers to a region where gate voltage is lower than threshold voltage in a graph of gate voltage (Vg)-drain current (Id) characteristics of a transistor. Alternatively, the subthreshold region refers to a region where current flows due to carrier diffusion, which is out of gradual channel approximation (a model in which only drift current is considered). Alternatively, the subthreshold region refers to a region where drain current increases exponentially with respect to an increase in gate voltage. Alternatively, the subthreshold region includes a region that can be regarded as any region of the above description.

Drain current when a transistor operates in the subthreshold region is referred to as subthreshold current. The subthreshold current increases exponentially with respect to gate voltage, regardless of drain voltage. The circuit operation using the subthreshold current can reduce the influence of a variation in drain voltage.

Unless otherwise specified, the transistor M2 in the on state may operate in a saturation region. That is, voltages in the range where the transistor operates in a saturation region may be appropriately input to the gate, the source, and the drain of each of the above transistors. However, one embodiment of the present invention is not limited thereto. The transistor M2 can operate in a linear region in order to decrease the amplitude value of voltage to be supplied. Alternatively, the transistor M2 can operate in a subthreshold region in order to reduce the amount of current flowing through the transistor M2. Alternatively, the transistor M2 can operate in a linear region, in a saturation region, and in a subthreshold region. Alternatively, the transistor M2 can operate both in a linear region and in a saturation region. Alternatively, the transistor M2 can operate both in a saturation region and in a subthreshold region.

Note that the transistor M1 is preferably an OS transistor. In addition, it is further preferable that a channel formation region of the transistor M1 include an oxide containing at least one of indium, gallium, and zinc. Alternatively, the channel formation region of the transistor M1 may be an oxide containing at least one of indium, an element M (as the element M, for example, one or more kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc. It is further preferable that the transistor M1 have a structure of a transistor described in Embodiment 5.

With the use of an OS transistor as the transistor M1, the leakage current of the transistor M1 can be suppressed, so that a product-sum operation circuit with high computation accuracy can be obtained in some cases. Moreover, the use of an OS transistor as the transistor M1 achieves an extremely low leakage current from retention nodes (e.g., a node Nx[1], a node Nx[m], a node Nu[1], a node Nu[m], a node Nw[1], a node Nw[m], a node Nr[1], and a node Nr[m] described later) to write word lines (e.g., the wiring WAD and the wiring WBD) at the time when each transistor M1 is in the non-conducting state. In other words, the frequency of refresh operations for the potential at the retention node can be reduced; thus, power consumption of the product-sum operation circuit can be reduced.

The use of an OS transistor also as the transistor M2 allows the transistor M2 to be formed concurrently with the transistor M1, which sometimes results in a reduction in the number of manufacturing steps for the product-sum operation circuit. The transistor M2 may be a Si transistor instead of an OS transistor. As silicon, amorphous silicon (sometimes referred to as hydrogenated amorphous silicon), microcrystalline silicon, polycrystalline silicon, single crystal silicon, or the like can be used, for example.

Note that an OS transistor has a drain current per micrometer of channel width of lower than $1 \times 10^{-20}$ A, lower than $1 \times 10^{-22}$ A, or lower than $1 \times 10^{-24}$ A when the gate voltage is lower than the threshold voltage of the transistor. In addition, an OS transistor has a drain current per micrometer of channel width of $1.0 \times 10^{-8}$ A or lower, $1.0 \times 10^{-12}$ A or lower, or $1.0 \times 10^{-15}$ A or lower when the gate voltage is equal to the threshold voltage of the transistor. That is, an OS transistor can have a large range of the gate voltage in which the transistor operates in the subthreshold region. Specifically, when the threshold voltage of an OS transistor is $V_{th}$, a circuit operation using the gate voltage in the voltage range of ($V_{th}$-1.0 V) to $V_{th}$, inclusive, or ($V_{th}$-0.5 V) to $V_{th}$, inclusive, is possible in the subthreshold region.

Meanwhile, a Si transistor has a high off-state current and a narrow range of the gate voltage in which the transistor operates in the subthreshold region. In the case of utilizing subthreshold current, an OS transistor can perform a circuit operation in a wider range of the gate voltage than a Si transistor.

For the transistor M1 and the transistor M2 in FIG. 2, the back gate is illustrated but the connection structure of the back gate is not illustrated; a target to which the back gate is electrically connected can be determined at the design stage. For example, in a transistor including a back gate, a gate and the back gate may be electrically connected to each other to increase the on-state current of the transistor. That is, for example, the gate and the back gate of the transistor M1 may be electrically connected to each other, and the gate and the back gate of the transistor M2 may be electrically connected to each other. Furthermore, for example, in a transistor including a back gate, a wiring electrically connecting the back gate of the transistor to an external circuit or the like may be provided and a potential may be supplied to the back gate of the transistor with the external circuit or the like to change the threshold voltage of the transistor or to reduce the off-state current of the transistor.

The transistor M1 and the transistor M2 illustrated in FIG. 2 have back gates; however, the semiconductor device of one embodiment of the present invention is not limited thereto. For example, the transistor M1 and the transistor M2 illustrated in FIG. 2 may each be a transistor having a structure not including a back gate, i.e., a single-gate structure. It is also possible that some transistors have a structure including a back gate and the other transistors have a structure not including a back gate.

The transistor M1 and the transistor M2 illustrated in FIG. 2 are n-channel transistors; however, the semiconductor device of one embodiment of the present invention is not limited thereto. For example, some or all of the transistors M1 and the transistors M2 may be replaced with p-channel transistors.

The above-described examples of changes in the structure and polarity of the transistor are not limited to the transistor M1 and the transistor M2. For example, the same applies to a transistor M3A and a transistor M3B described later, transistors described in other parts of this specification, transistors included in switches, circuits, and the like, transistors illustrated in other drawings, and the like.

In each of the memory cells AMx, the memory cells AMu, the memory cells AMw, and the memory cells AMr, a first terminal of the transistor M1 is electrically connected to a gate of the transistor M2. A first terminal of the transistor M2 is electrically connected to a wiring VR. A first terminal of the capacitor C1 is electrically connected to the gate of the transistor M2.

In each of the memory cell AMx[1] to the memory cell AMx[m], a second terminal of the transistor M1 is electrically connected to the wiring WAD, and a second terminal of the transistor M2 is electrically connected to the wiring BAL. In the memory cell AMx[i], the gate of the transistor M1 is electrically connected to the wiring WAL[i], and a second terminal of the capacitor C1 is electrically connected to the wiring XAL[i]. Note that an electrical connection portion of the first terminal of the transistor M1, the gate of the transistor M2, and the first terminal of the capacitor C1 in the memory cell AMx[1] is the node Nx[1], and an electrical connection portion of the first terminal of the transistor M1, the gate of the transistor M2, and the first terminal of the capacitor C1 in the memory cell AMx[m] is the node Nx[m].

In each of the memory cell AMu[1] to the memory cell AMu[m], a second terminal of the transistor M1 is electrically connected to the wiring WBD, and a second terminal of the transistor M2 is electrically connected to the wiring BBL. In the memory cell AMu[i], the gate of the transistor M1 is electrically connected to the wiring WAL[i], and a second terminal of the capacitor C1 is electrically connected to the wiring XAL[i]. Note that an electrical connection portion of the first terminal of the transistor M1, the gate of the transistor M2, and the first terminal of the capacitor C1 in the memory cell AMu[1] is the node Nu[1], and an electrical connection portion of the first terminal of the transistor M1, the gate of the transistor M2, and the first terminal of the capacitor C1 in the memory cell AMu[m] is the node Nu[m].

In each of the memory cell AMw[1] to the memory cell AMw[m], a second terminal of the transistor M1 is electrically connected to the wiring WAD, and a second terminal of the transistor M2 is electrically connected to the wiring BAL. In the memory cell AMw[i], the gate of the transistor M1 is electrically connected to the wiring WBL[i], and a second terminal of the capacitor C1 is electrically connected to the wiring XBL[i]. Note that an electrical connection portion of the first terminal of the transistor M1, the gate of the transistor M2, and the first terminal of the capacitor C1 in the memory cell AMw[1] is the node Nw[1], and an electrical connection portion of the first terminal of the transistor M1, the gate of the transistor M2, and the first terminal of the capacitor C1 in the memory cell AMw[m] is the node Nw[m].

In each of the memory cell AMr[1] to the memory cell AMr[m], a second terminal of the transistor M1 is electrically connected to the wiring WBD, and a second terminal of the transistor M2 is electrically connected to the wiring BBL. In the memory cell AMr[i], the gate of the transistor M1 is electrically connected to the wiring WBL[i], and a second terminal of the capacitor C1 is electrically connected to the wiring XBL[i]. Note that an electrical connection portion of the first terminal of the transistor M1, the gate of the transistor M2, and the first terminal of the capacitor C1 in the memory cell AMr[1] is the node Nr[1], and an electrical connection portion of the first terminal of the transistor M1, the gate of the transistor M2, and the first terminal of the capacitor C1 in the memory cell AMr[m] is the node Nr[m].

The node Nx[1], the node Nx[m], the node Nu[1], the node Nu[m], the node Nw[1], the node Nw[m], the node Nr[1], and the node Nr[m] described above function as retention nodes of the respective memory cells.

The wiring VR is a wiring for supplying current between the first terminal and the second terminal of the transistor M2 in each of the memory cells AMx, the memory cells AMu, the memory cells AMw, and the memory cells AMr. Thus, the wiring VR functions as a wiring for supplying a predetermined potential. In this embodiment, a potential supplied from the wiring VR can be, for example, a low-level potential, a ground potential, or a potential lower than the ground potential. The plurality of wirings VR illustrated in FIG. 2 can be the same wiring or different wirings. Alternatively, some of the plurality of wirings VR illustrated in FIG. 2 can be the same wiring and the others can be different wirings. Particularly in the case where all or some of the plurality of wirings VR are different wirings, the different wirings can be supplied with the respective potentials. In other words, the plurality of wirings VR illustrated in FIG. 13 can be supplied with the same potential or different potentials.

Structure Example of Circuit CMS

Next, a structure example of the circuit CMS will be described.

Figure 3A:
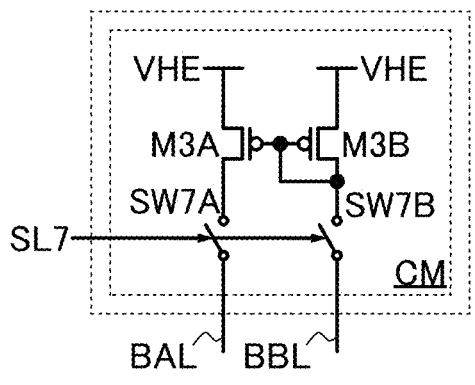
FIG. 3A and FIG. 3B are circuit diagrams illustrating structure examples of a circuit included in a semiconductor device.

FIG. 3A illustrates an example of a circuit structure that can be used for the circuit CMS in FIG. 1, and the circuit CMS in FIG. 3A includes a circuit CM. The circuit CM includes a transistor M3A and a transistor M3B, which are p-channel transistors, a switch SW7A, and a switch SW7B.

A first terminal of the transistor M3A is electrically connected to a first terminal of the switch SW7A, and a second terminal of the transistor M3A is electrically connected to a wiring VHE. A second terminal of the switch SW7A is electrically connected to the wiring BAL. A first terminal of the transistor M3B is electrically connected to a first terminal of the switch SW7B, a gate of the transistor M3A, and a gate of the transistor M3B, and a second terminal of the transistor M3B is electrically connected to the wiring VHE. A second terminal of the switch SW7B is electrically connected to the wiring BBL. A control terminal of each of the switch SW7A and the switch SW7B is electrically connected to a wiring SL7.

Note that the transistor M3A and the transistor M3B are each preferably a transistor containing silicon in its channel formation region (hereinafter, referred to as a Si transistor). Silicon contained in a channel formation region can be, for example, amorphous silicon (sometimes referred to as hydrogenated amorphous silicon), microcrystalline silicon, polycrystalline silicon, single crystal silicon, or the like.

Unless otherwise specified, the transistor M3A and the transistor M3B in the on state may each operate in a saturation region. That is, voltages in the range where the transistor operates in a saturation region may be appropriately input to the gate, the source, and the drain of each of the above transistors. However, one embodiment of the present invention is not limited thereto. The transistor M3A and the transistor M3B can operate in a linear region in order to decrease the amplitude value of voltage to be supplied. Alternatively, the transistor M3A and the transistor M3B can operate in a subthreshold region in order to reduce the amount of current flowing through the transistor M3A and the transistor M3B. Alternatively, the transistor M3A and the transistor M3B can operate in a linear region, in a saturation region, and in a subthreshold region. Alternatively, the transistor M3A and the transistor M3B can operate both in a linear region and in a saturation region, both in a saturation region and in a subthreshold region, or both in a linear region and in a subthreshold region.

As the switch SW7A and the switch SW7B, for example, a switch that can be used as the switch SW5A and the switch SW5B can be used. In this embodiment, each of the switch SW7A and the switch SW7B is turned on when a high-level potential is input to the control terminal, and is turned off when a low-level potential is input to the control terminal.

The wiring VHE functions as a wiring that supplies a constant voltage, for example. The constant voltage is preferably a high-level potential, for example.

The wiring SL7 functions as a wiring that supplies voltage for switching the conducting state and the non-conducting state of the switch SW7A and the switch SW7B, for example. Thus, the voltage can be, for example, a high-level potential or a low-level potential.

The circuit CM in FIG. 3A having the above structure functions as a current mirror circuit. Specifically, with reference to the potential of the first terminal of the transistor M3B (wiring BBL), the circuit CM in FIG. 3A has a function of supplying current corresponding to the potential between the source and the drain of each of the transistor M3A and the transistor M3B. In other words, the circuit CMS has a function of supplying current with the amount, which is almost equal to the amount of current flowing between the source and the drain of the transistor M3B, between the source and the drain of the transistor M3A.

The structure of the circuit CMS is not limited to the structure illustrated in FIG. 3A. The structure of the circuit CMS may be a structure in which the transistor M3A and a transistor M4A are cascode-connected and the transistor M3B and a transistor M4B are cascode-connected, as in the circuit CMS illustrated in FIG. 3B, for example. Specifically, the first terminal of the transistor M3A is electrically connected to a first terminal of the transistor M4A, and the second terminal of the transistor M3A is electrically connected to the wiring VHE. The first terminal of the transistor M3B is electrically connected to a first terminal of the transistor M4B, the gate of the transistor M3A, and the gate of the transistor M3B, and the second terminal of the transistor M3B is electrically connected to the wiring VHE. A second terminal of the transistor M4A is electrically connected to the wiring BAL. A second terminal of the transistor M4B is electrically connected to the wiring BBL, a gate of the transistor M4A, and a gate of the transistor M4B. When the transistors included in the circuit CM are cascode-connected as in the circuit CMS illustrated in FIG. 3B, the operation of the current mirror circuit of the circuit CM can be more stable.

Although the circuit CMS in FIG. 3A has a structure in which the first terminal of the transistor M3A is electrically connected to the wiring BAL through the switch SW7A and the first terminal of the transistor M3B is electrically connected to the wiring BBL through the switch SW7B, the electrical connection positions of the switch SW7A and the switch SW7B are not limited thereto. For example, the circuit CMS in FIG. 3A can have a structure in which the second terminal of the transistor M3A is electrically connected to the wiring VHE through the switch SW7A (not illustrated) and/or a structure in which the second terminal of the transistor M3B is electrically connected to the wiring VHE through the switch SW7B (not illustrated). Although the circuit CMS in FIG. 3B has a structure in which the second terminal of the transistor M4A is electrically connected to the wiring BAL through the switch SW7A and the second terminal of the transistor M4B is electrically connected to the wiring BBL through the switch SW7B, the electrical connection positions of the switch SW7A and the switch SW7B are not limited thereto. For example, the circuit CMS in FIG. 3B can have the structure in which the second terminal of the transistor M3A is electrically connected to the wiring VHE through the switch SW7A or a structure in which the first terminal of the transistor M3A is electrically connected to the first terminal of the transistor M4A through the switch SW7A. For another example, the circuit CMS in FIG. 3B can have the structure in which the second terminal of the transistor M3B is electrically connected to the wiring VHE through the switch SW7B or a structure in which the first terminal of the transistor M3B is electrically connected to the first terminal of the transistor M4B through the switch SW7B. As described above, the electrical connection positions of the switch SW7A and the switch SW7B in FIG. 3A and FIG. 3B can be freely determined in the design phase. Thus, in one embodiment of the present invention, there is no particular limitation on the electrical connection positions of the switch SW7A and the switch SW7B.

Structure Example of Circuit ACTV

Next, a structure example of the circuit ACTV that can be used in the arithmetic circuit MAC1 will be described.

Figure 4A:
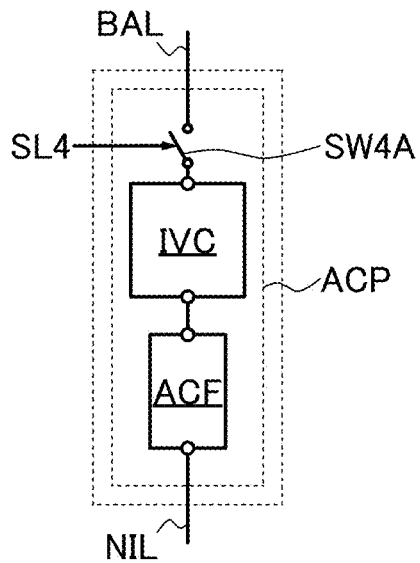
FIG. 4A to FIG. 4C are circuit diagrams illustrating structure examples of a circuit included in a semiconductor device.

FIG. 4A is a circuit diagram illustrating a structure example of the circuit ACTV. The circuit ACTV includes a circuit ACP, for example, and the circuit ACP includes a circuit IVC, a circuit ACF, and a switch SW4A.

A first terminal of the switch SW4A is electrically connected to the wiring BAL, a second terminal of the switch SW4A is electrically connected to a first terminal of the circuit IVC, and a second terminal of the circuit IVC is electrically connected to a first terminal of the circuit ACF. A second terminal of the circuit ACF is electrically connected to the wiring NIL. A control terminal of the switch SW4A is electrically connected to a wiring SL4. Note that in the description in Embodiment 2 below, the wiring BAL is replaced with a wiring BAN.

The circuit IVC has a function of outputting, to the second terminal, voltage corresponding to the amount of current input to the first terminal. That is, the circuit IVC has a function of a current-to-voltage converter circuit.

The circuit ACF has a function of performing an arithmetic operation according to a defined function system on the basis of the voltage input to the first terminal, and a function of outputting the result of the arithmetic operation of the function system to the second terminal of the circuit ACF (wiring NIL). Examples of the function system include a sigmoid function, a tanh function, a softmax function, a ReLU function (ramp function), and a threshold function.

As the switch SW4A, a switch that can be used as the switch SW5A and the switch SW5B can be used, for example.

The wiring SL4 functions as a wiring that supplies voltage for switching the conducting state and the non-conducting state of the switch SW4A, for example. Thus, the voltage can be, for example, a high-level potential or a low-level potential.

Figure 4B:
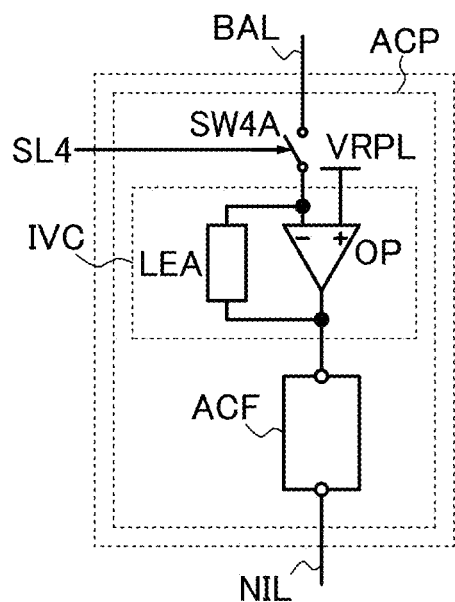

Next, a specific structure example of the circuit IVC is described. The circuit ACTV illustrated in FIG. 4B has a circuit structure applicable to the circuit ACTV in FIG. 4A, and FIG. 4B illustrates a specific structure example of the circuit IVC. In FIG. 4B, the circuit IVC includes an operational amplifier OP and a load LEA. An inverting input terminal of the operational amplifier OP is electrically connected to a first terminal of the circuit IVC and a first terminal of the load LEA, and an output terminal of the operational amplifier OP is electrically connected to a second terminal of the load LEA and a second terminal of the circuit IVC. A non-inverting input terminal of the operational amplifier OP is electrically connected to a wiring VRPL. Note that a third terminal of the circuit IVC is positioned between the non-inverting input terminal of the operational amplifier OP and the wiring VRPL.

As the load LEA, for example, a resistor, a diode, a transistor, or the like can be used.

The wiring VRPL functions as a wiring that supplies a constant voltage, for example. The constant voltage can be a ground potential or a low-level potential, for example.

In particular, by setting the potential supplied from the wiring VRPL to a ground potential, the ground potential is input to the non-inverting input terminal of the operational amplifier OP. Since the inverting input terminal of the operational amplifier OP is electrically connected to the output terminal of the operational amplifier OP through the load LEA (i.e., the operational amplifier OP has a negative feedback connection structure), the potential of the inverting input terminal of the operational amplifier OP can be regarded as being virtually grounded.

Figure 4C:
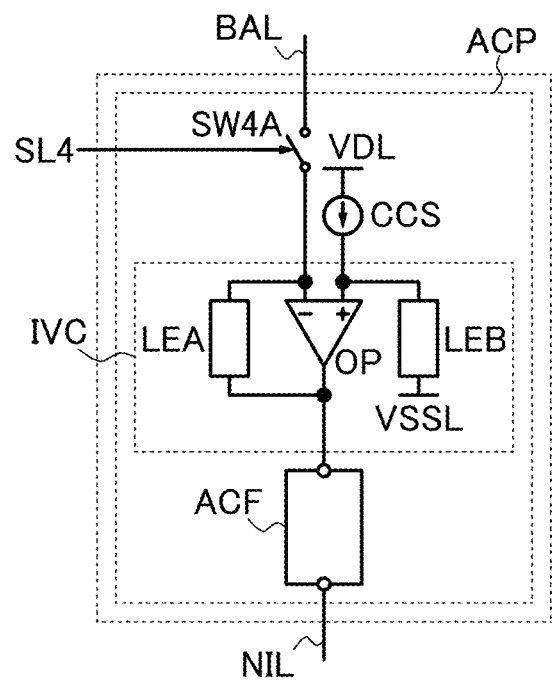

As the circuit structure applicable to the circuit ACTV in FIG. 4A, a circuit structure of the circuit ACTV in FIG. 4C, besides the circuit structure in FIG. 4B, can be employed. Note that the circuit ACP illustrated in FIG. 4C includes a current source CCS in addition to the circuit IVC and the circuit ACF. In FIG. 4C, the circuit IVC includes the operational amplifier OP, the load LEA, and a load LEB. The inverting input terminal of the operational amplifier OP is electrically connected to the first terminal of the circuit IVC and the first terminal of the load LEA, and the output terminal of the operational amplifier OP is electrically connected to the second terminal of the load LEA and the second terminal of the circuit IVC. The non-inverting input terminal of the operational amplifier OP is electrically connected to an output terminal of the current source CCS and a first terminal of the load LEB, an input terminal of the current source CCS is electrically connected to a wiring VDL, and a second terminal of the load LEB is electrically connected to a wiring VSSL. Note that the third terminal of the circuit IVC is positioned between the non-inverting input terminal of the operational amplifier OP and the output terminal of the current source CCS.

It is preferable to use a circuit element similar to the load LEA as the load LEB, for example.

The wiring VDL functions as a wiring that supplies a constant voltage, for example. The constant voltage can be a high-level potential, for example.

The wiring VSSL functions as a wiring that supplies a constant voltage, for example. The constant voltage can be a ground potential or a low-level potential, for example.

The circuit IVC illustrated in FIG. 4C functions as a subtraction circuit. Specifically, voltage corresponding to the difference between the amount of current flowing from the wiring BAL to the first terminal of the circuit IVC and the amount of current flowing from the output terminal of the current source CCS to the third terminal of the circuit IVC can be output to the second terminal of the circuit IVC. In the case where the circuit IVC functions as a subtraction circuit, the load LEA and the load LEB included in the circuit IVC preferably have the same resistance value.

Note that when current flowing from the output terminal of the current source CCS to the third terminal of the circuit IVC is 0 A (i.e., current can be regarded as not flowing) and the potential of the third terminal of the circuit IVC is the same as the potential supplied from the wiring VRPL in FIG. 4B, the circuit ACTV in FIG. 4C is equivalent to the circuit ACTV in FIG. 4B.

Figure 5A:
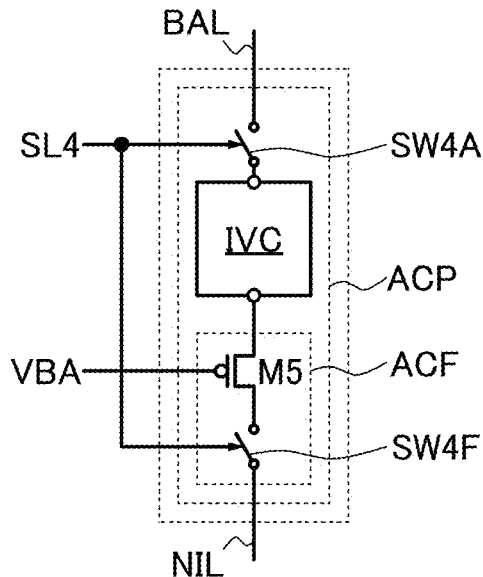
FIG. 5A to FIG. 5C are circuit diagrams illustrating structure examples of a circuit included in a semiconductor device.

Next, a specific structure example of the circuit ACF is described. FIG. 5A illustrates a circuit structure applicable to the circuit ACTV in FIG. 4A, and FIG. 5A illustrates a specific structure example of the circuit ACF. In FIG. 5A, the circuit ACF includes a transistor M5, which is a p-channel transistor, and a switch SW4F. A first terminal of the transistor M5 is electrically connected to the first terminal of the circuit ACF, a second terminal of the transistor M5 is electrically connected to a first terminal of the switch SW4F, and a second terminal of the switch SW4F is electrically connected to a second terminal of the circuit ACF. A gate of the transistor M5 is electrically connected to a wiring VBA, and a control terminal of the switch SW4F is electrically connected to the wiring SL4.

The wiring VBA functions as a wiring that supplies a given constant voltage, for example.

As the switch SW4F, for example, a switch that can be used as the switch SW5A and the switch SW5B can be used. Since the control terminal of the switch SW4F is electrically connected to the wiring SL4, the switch SW4F can switch between the on state and the off state in synchronization with the switch SW4A.

The transistor M5 functions as a pass transistor between the wiring BAL and the wiring NIL. The voltage output from the second terminal of the transistor M5 depends on the voltage input to the first terminal of the transistor M5 and the voltage supplied to the gate of the transistor M5. Here, the case where the voltage of the first terminal of the transistor M5 is regarded as $V_A$, the voltage supplied to the gate of the transistor M5 (voltage supplied from the wiring VBA) is regarded as $V_{BIAS}$, and the threshold voltage of the transistor M5 is regarded as $V_{th}$ is considered. When $V_A$ is higher than or equal to $V_{BIAS}+V_{th}$, the transistor M5 outputs approximately $V_A$ to the second terminal. When $V_A$ is lower than $V_{BIAS}+V_{th}$, the transistor M5 outputs approximately $V_{BIAS}+V_{th}$ to the second terminal. That is, the voltage output to the second terminal of the transistor M5 can be regarded as a result of an arithmetic operation of a ReLU function (ramp function), which is performed using the voltage of the first terminal of the transistor M5 as an input value.

Figure 5B:
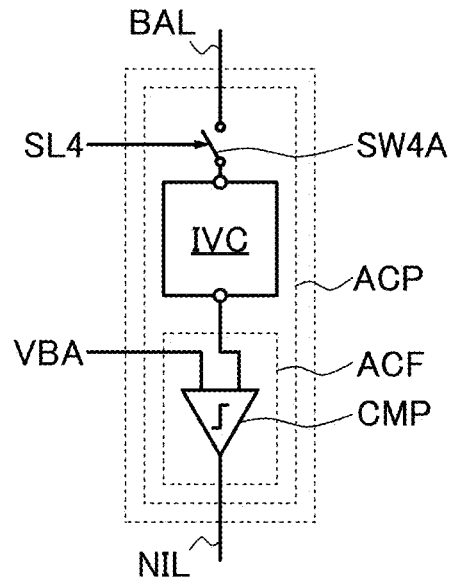

As another circuit structure applicable to the circuit ACF in the circuit ACTV in FIG. 4A, a circuit structure of the circuit ACF in the circuit ACTV illustrated in FIG. 5B can be employed, for example. Note that the circuit ACF illustrated in FIG. 5B includes a comparator CMP. Specifically, a first terminal of the comparator CMP is electrically connected to the first terminal of the circuit ACF, a second terminal of the comparator CMP is electrically connected to the wiring VBA, and an output terminal of the comparator CMP is electrically connected to the second terminal of the circuit ACF.

The wiring VBA here functions as a wiring for supplying voltage to be compared with the potential of the first terminal of the comparator CMP. Thus, the voltage can be a given constant voltage.

The use of the circuit ACTV in FIG. 5B as the circuit ACTV in the arithmetic circuit MAC1 enables the circuit ACF in FIG. 5B to output a low-level potential or a high-level potential (binary digital signal) to the wiring NIL depending on the magnitude relationship between the voltage supplied from the circuit IVC and the voltage supplied from the wiring VBA. That is, in the circuit ACF in FIG. 5B, the voltage output to the second terminal of the circuit ACF can be regarded as a result of an arithmetic operation of a step function (ramp function), which is performed using the voltage of the first terminal of the circuit ACF as an input value.

Figure 5C:
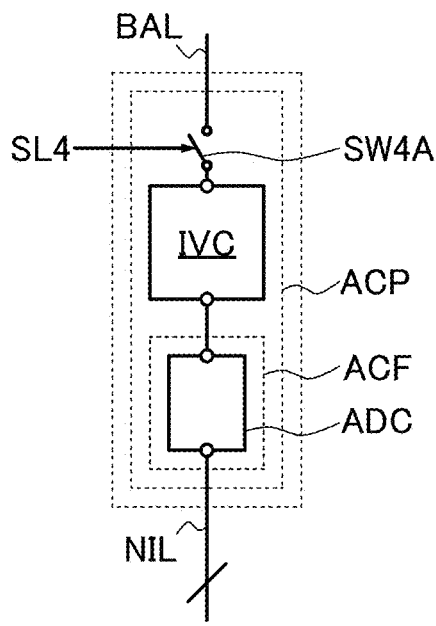

As another circuit structure applicable to the circuit ACF in the circuit ACTV in FIG. 4A, a circuit structure of the circuit ACF in the circuit ACTV illustrated in FIG. 5C can be employed, for example. Note that the circuit ACF illustrated in FIG. 5C includes an analog-to-digital converter circuit ADC. Specifically, an input terminal of the analog-to-digital converter circuit ADC is electrically connected to the first terminal of the circuit ACF, and an output terminal of the analog-to-digital converter circuit ADC is electrically connected to the second terminal of the circuit ACF. That is, the circuit ACF in FIG. 5C has a structure in which an analog voltage of the first terminal of the circuit ACF is converted into a digital value to be output to the second terminal of the circuit ACF. Note that in the case where the circuit ACTV in FIG. 5C is used as the circuit ACTV in FIG. 4A, the number of wirings NIL electrically connected to the circuit ACTV preferably depends on the number of bits.

Operation Example of Arithmetic Circuit

Next, an operation example of the arithmetic circuit MAC1 will be described.

Figure 6:
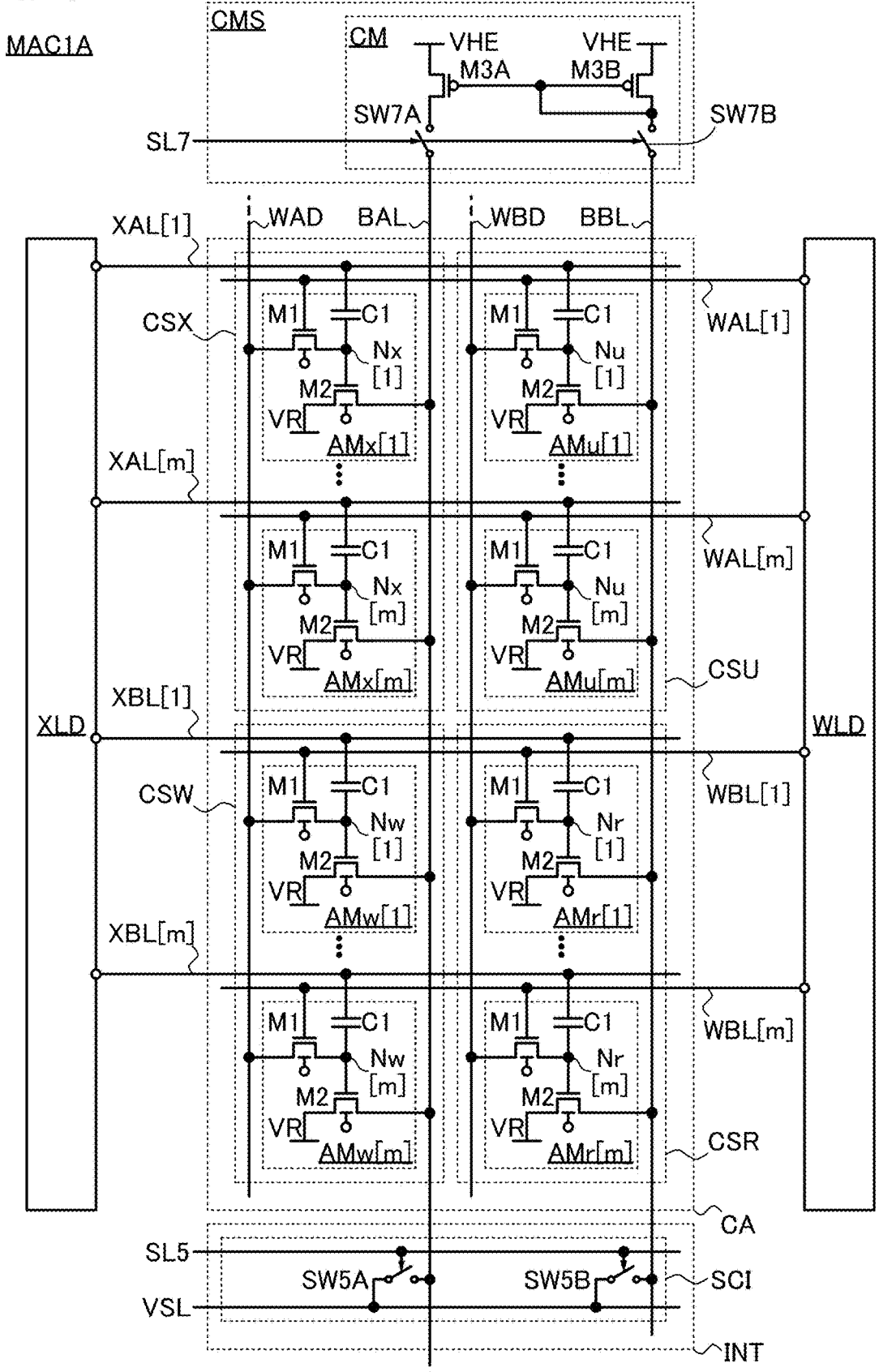
FIG. 6 is a circuit diagram illustrating an example of a semiconductor device.

The arithmetic circuit MAC1 here is an arithmetic circuit MAC1A illustrated in FIG. 6 in which the memory cell array CA in FIG. 2 is used as the memory cell array CA and the circuit CMS in FIG. 3A is used as the circuit CMS. Note that FIG. 6 mainly illustrates the memory cell array CA, the circuit CMS, the circuit XLD, the circuit WLD, and the circuit INT in the arithmetic circuit MAC1A. Although not illustrated, the circuit ACTV in FIG. 4A is used as the circuit ACTV in the arithmetic circuit MAC1A in FIG. 6.

Figure 7:
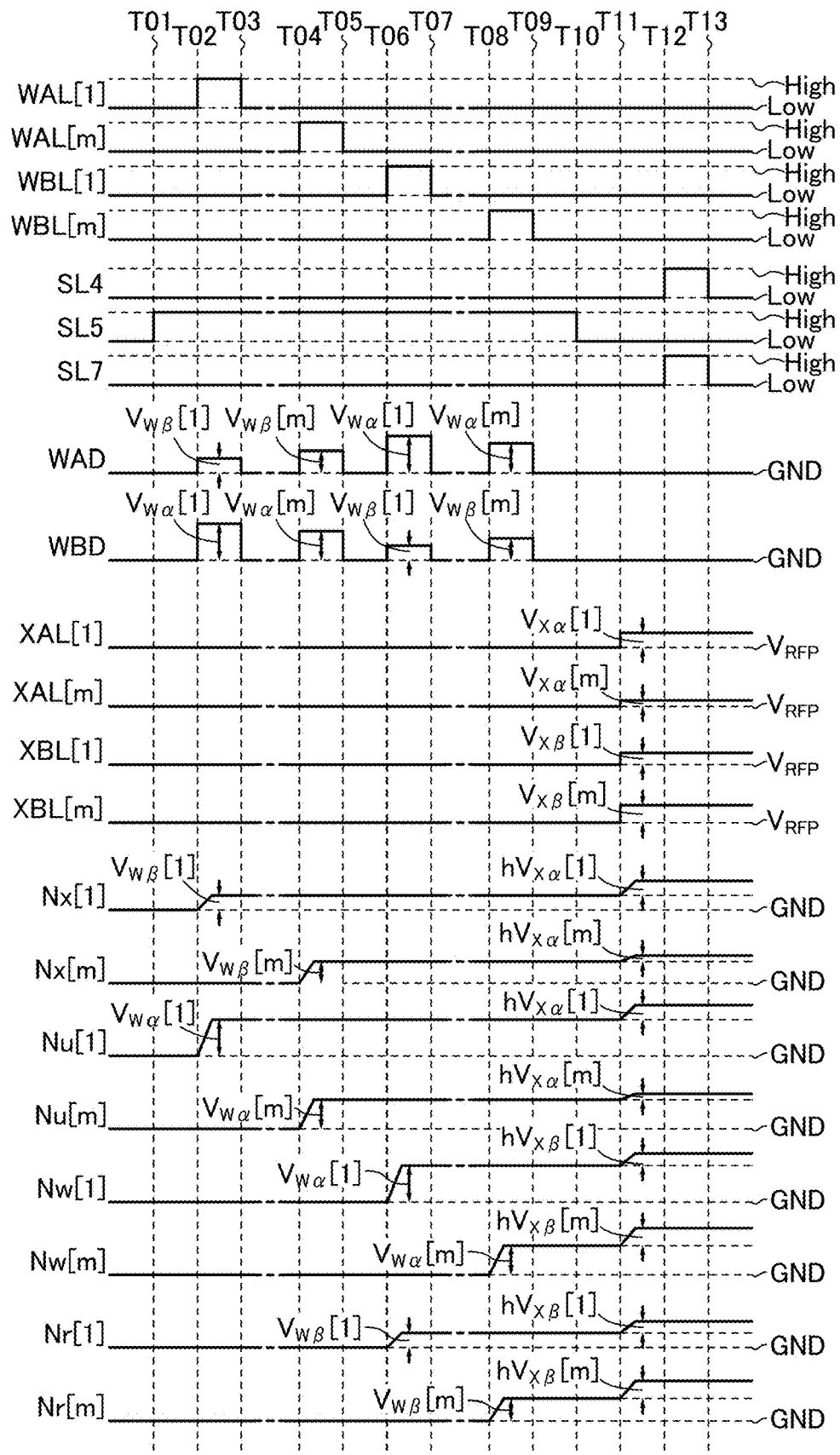
FIG. 7 is a timing chart showing an operation example of a semiconductor device.

FIG. 7 shows a timing chart of an operation example of the arithmetic circuit MAC1A.

The timing chart in FIG. 7 shows changes in the potentials of the wiring WAL[1], the wiring WAL[m], the wiring WBL[1], the wiring WBL[m], the wiring SL4, the wiring SL5, the wiring SL7, the wiring WAD, the wiring WBD, the wiring XAL[1], the wiring XAL[m], the wiring XBL[1], the wiring XBL[m], the node Nx[1], the node Nx[m], the node Nu[1], the node Nu[m], the node Nw[1], the node Nw[m], the node Nr[1], and the node Nr[m] at and around Time T01 to Time T13. Note that in FIG. 7, a high-level potential is denoted by High and a low-level potential is denoted by Low.

In this operation example, the voltage supplied from the wiring VR is a ground potential.

<<Before Time T01>>

Before Time T01, the potentials of the node Nx[1] to the node Nx[m], the node Nu[1] to the node Nu[m], the node Nw[1] to the node Nw[m], and the node Nr[1] to the node Nr[m] are each a ground potential. Note that the ground potential is denoted by GND in FIG. 15.

A low-level potential is input to each of the wiring WAD and the wiring WBD from the circuit WDD (not illustrated in FIG. 6).

A reference potential $V_{RFP}$ is input to each of the wiring XAL[1] to the wiring XAL[m] and the wiring XBL[1] to the wiring XBL[m] from the circuit XLD. Note that $V_{RFP}$ may be higher or lower than a ground potential.

A low-level potential is input to each of the wiring WAL[1] to the wiring WAL[m] and the wiring WBL[1] to the wiring WBL[m] from the circuit WLD. Thus, the transistors M1 included in all of the memory cells AMx, the memory cells AMu, the memory cells AMw, and the memory cells AMr in the memory cell array CA are turned off.

A low-level potential is input to each of the wiring SL4, the wiring SL5, and the wiring SL7. Thus, the switch SW4A, the switch SW5A, the switch SW5B, the switch SW7A, and the switch SW7B are each turned off.

<<From Time T01 to Time T02>>

During the period from Time T01 to Time T02, a high-level potential is input to the wiring SL5. Thus, the switch SW5A and the switch SW5B included in the circuit INT are each turned on.

When the switch SW5A and the switch SW5B are each turned on, electrical continuity is established between the wiring VSL and each of the wiring BAL and the wiring BBL, whereby the potential from the wiring VSL is supplied to each of the wiring BAL and the wiring BBL. Note that in this operation example, the wiring VSL is a wiring for supplying an initialization potential to each of the wiring BAL and the wiring BBL, and the initialization potential is a ground potential. Thus, during the period from Time T01 to Time T02, the potentials of the wiring BAL and the wiring BBL are each a ground potential.

A ground potential is supplied from the wiring VR to the first terminals of the transistors M2 included in all of the memory cells AMx, the memory cells AMu, the memory cells AMw, and the memory cells AMr in the memory cell array CA; hence, the voltage between the first terminal and the second terminal of each of the transistors M2 is 0 V. In addition, since the potentials of the node Nx[1] to the node Nx[m], the node Nu[1] to the node Nu[m], the node Nw[1] to the node Nw[m], and the node Nr[1] to the node Nr[m] are each a ground potential, the transistors M2 are each turned off.

<<From Time T02 to Time T03>>

During the period from Time T02 to Time T03, a high-level potential is input to the wiring WAL[1]. Thus, a high-level potential is applied to the gates of the transistors M1 included in the memory cell AMx[1] and the memory cell AMu[1] in the memory cell array CA, whereby the transistors M1 are each turned on.

Furthermore, during the period from Time T02 to Time T03, a potential higher than a ground potential by $V_{w\beta}[1]$ is input to the wiring WAD. Since the transistor M1 in the memory cell AMx[1] is in the on state at this time, electrical continuity is established between the wiring WAD and the node Nx[1], and the potential higher than a ground potential by $V_{w\beta}[1]$ is input to the first terminal of the capacitor C1 (node Nx[1]) in the memory cell AMx[1].

Moreover, during the period from Time T02 to Time T03, a potential higher than a ground potential by $V_{w\alpha}[1]$ is input to the wiring WBD. Since the transistor M1 in the memory cell AMu[1] is in the on state at this time, electrical continuity is established between the wiring WBD and the node Nu[1], and the potential higher than a ground potential by $V_{w\alpha}[1]$ is input to the first terminal of the capacitor C1 (node Nu[1]) in the memory cell AMu[1].

Here, $V_W[1]$ is defined as in the following formula.

[Formula 5]

$$V_W[i] = V_{w\alpha}[i] - V_{X\beta}[1] \quad (1.1)$$

$V_W[1]$ is voltage corresponding to the first one among the m pieces of first data. That is, $V_{w\alpha}[1]$ and $V_{w\beta}[1]$ can each be regarded as voltage corresponding to the first one among the m pieces of first data. Note that a combination of the voltages $V_{w\alpha}[1]$ and $V_{w\beta}[1]$ can be freely determined as long as Formula (1.1) is satisfied. For example, $V_{w\alpha}[1]$ may be voltage higher than $V_{w\beta}[1]$, lower than $V_{w\beta}[1]$, or equal to $V_{w\beta}[1]$. That is, $V_W[1]$ may be a positive voltage, 0, or a negative voltage.

Note that since the switch SW5A is in the on state, a ground potential is input to the wiring BAL. Moreover, a ground potential from the wiring VR is input to the first terminal of the transistor M2 in the memory cell AMx[1], so that the voltage between the first terminal and the second terminal of the transistor M2 is approximately 0 V. Thus, no current flows between the first terminal and the second terminal of the transistor M2 in the memory cell AMx[1].

Similarly, since the switch SW5B is in the on state, a ground potential is input to the wiring BBL. Moreover, a ground potential from the wiring VR is input to the first terminal of the transistor M2 in the memory cell AMu[1], so that the voltage between the first terminal and the second terminal of the transistor M2 is also approximately 0 V. Thus, no current flows between the first terminal and the second terminal of the transistor M2 in the memory cell AMu[1].

During the period from Time T02 to Time T03, a low-level potential has been continuously input to the wiring WAL[2] to the wiring WAL[m] and the wiring WBL[1] to the wiring WBL[m] since before Time T02. Thus, a low-level potential is applied to the gate of the transistor M1 included in each of the memory cell AMx[2] to the memory cell AMx[m] and the memory cell AMu[2] to the memory cell AMu[m] arranged in the second row to the m-th row and the memory cell AMw[1] to the memory cell AMw[m] and the memory cell AMr[1] to the memory cell AMr[m] arranged in the m+1-th row to the 2m-th row in the memory cell array CA, so that the transistors M1 are each turned off. This prevents the data that has been input to each of the wiring WAD and the wiring WBD from being written to the node Nx[2] to the node Nx[m], the node Nu[2] to the node Nu[m], the node Nw[1] to the node Nw[m], and the node Nr[1] to the node Nr[m].

<<From Time T03 to Time T04>>

During the period from Time T03 to Time T04, a low-level potential is input to the wiring WAL[1]. Thus, a low-level potential is applied to the gates of the transistors M1 included in the memory cell AMx[1] and the memory cell AMu[1] in the memory cell array CA, whereby the transistors M1 are each turned off.

By turning off the transistor M1 in the memory cell AMx[1], the potential higher than a ground potential by $V_{w\beta}[1]$ is retained at the first terminal of the capacitor C1 (node Nx[1]) in the memory cell AMx[1]. Furthermore, by turning off the transistor M1 in the memory cell AMu[1], the potential higher than a ground potential by $V_{w\alpha}[1]$ is retained at the first terminal of the capacitor C1 (node Nu[1]) in the memory cell AMu[1].

During the period from Time T03 to Time T04, the voltages $V_{w\beta}[2]$ to $V_{w\beta}[m-1]$ are sequentially written to the memory cell AMx[2] to the memory cell AMx[m-1] arranged in the second row to the m-1-th row in the memory cell array CA, as in the operation of writing the voltage $V_{w\beta}[1]$ to the memory cell AMx[1] during the period from Time T02 to Time T03. Moreover, the voltages $V_{w\alpha}[2]$ to $V_{w\alpha}[m-1]$ are written to the memory cell AMu[2] to the memory cell AMu[m-1], respectively, arranged in the second row to the m-1-th row in the memory cell array CA, as in the operation of writing the voltages to the memory cell AMx[2] to the memory cell AMx[m-1].

At this time, the memory cell AMx[p] positioned in the p-th row (p is an integer greater than or equal to 2 and less than or equal to m-1) retains the voltage $V_{w\beta}[p]$, and the memory cell AMu[p] retains the voltage $V_{w\alpha}[p]$. Here, as in Formula (1.1), the voltage $V_W[p]$ corresponding to the p-th one among the m pieces of first data is defined as in the following formula.

[Formula 6]

$$V_W[p] = V_{W\alpha}[p] - V_{W\beta}[p] \qquad (1.2)$$

$V_W[p]$ is voltage corresponding to the p-th one among the m pieces of first data. That is, $V_{W\alpha}[p]$ and $V_{W\beta}[p]$ can each be regarded as voltage corresponding to the p-th one among the m pieces of first data. Note that a combination of the voltages $V_{W\alpha}[p]$ and $V_{W\beta}[p]$ can be freely determined as long as Formula (1.2) is satisfied. For example, $V_{W\alpha}[p]$ may be voltage higher than $V_{W\beta}[p]$, lower than $V_{W\beta}[p]$, or equal to $V_{W\beta}[p]$. That is, $V_W[p]$ may be a positive voltage, 0, or a negative voltage.

<<From Time T04 to Time T05>>

During the period from Time T04 to Time T05, a high-level potential is input to the wiring WAL[m]. Thus, a high-level potential is applied to the gates of the transistors M1 included in the memory cell AMx[m] and the memory cell AMu[m] in the memory cell array CA, whereby the transistors M1 are each turned on.

Furthermore, during the period from Time T04 to Time T05, a potential higher than a ground potential by $V_{W\beta}[m]$ is input to the wiring WAD. Since the transistor M1 in the memory cell AMx[m] is in the on state at this time, electrical continuity is established between the wiring WAD and the node Nx[m], and the potential higher than a ground potential by $V_{W\beta}[m]$ is input to the first terminal of the capacitor C1 (node Nx[m]) in the memory cell AMx[m].

Moreover, during the period from Time T04 to Time T05, a potential higher than a ground potential by $V_{W\alpha}[m]$ is input to the wiring WBD. Since the transistor M1 in the memory cell AMu[m] is in the on state at this time, electrical continuity is established between the wiring WBD and the node Nu[m], and the potential higher than a ground potential by $V_{W\alpha}[m]$ is input to the first terminal of the capacitor C1 (node Nu[m]) in the memory cell AMu[m].

Here, $V_W[m]$ is defined as in the following formula.

[Formula 7]

$$V_W[m] = V_{W\alpha}[m] - V_{W\beta}[m] \qquad (1.3)$$

$V_W[m]$ is voltage corresponding to the m-th one among the m pieces of first data. That is, $V_{W\alpha}[m]$ and $V_{W\beta}[m]$ can each be regarded as voltage corresponding to the m-th one among the m pieces of first data. Note that a combination of the voltages $V_{W\alpha}[m]$ and $V_{W\beta}[m]$ can be freely determined as long as Formula (1.3) is satisfied. For example, $V_{W\alpha}[m]$ may be voltage higher than $V_W[m]$, lower than $V_{W\beta}[m]$, or equal to $V_{W\beta}[m]$. That is, $V_W[m]$ may be a positive voltage, 0, or a negative voltage.

Note that since the switch SW5A is in the on state, a ground potential is input to the wiring BAL. Moreover, a ground potential from the wiring VR is input to the first terminal of the transistor M2 in the memory cell AMx[m], so that the voltage between the first terminal and the second terminal of the transistor M2 is approximately 0 V. Thus, no current flows between the first terminal and the second terminal of the transistor M2 in the memory cell AMx[m].

Similarly, since the switch SW5B is in the on state, a ground potential is input to the wiring BBL. Moreover, a ground potential from the wiring VR is input to the first terminal of the transistor M2 in the memory cell AMu[m], so that the voltage between the first terminal and the second terminal of the transistor M2 is also approximately 0 V. Thus, no current flows between the first terminal and the second terminal of the transistor M2 in the memory cell AMu[m].

During the period from Time T04 to Time T05, a low-level potential has been continuously input to the wiring WAL[1] to the wiring WAL[m−1] and the wiring WBL[1] to the wiring WBL[m] since before Time T04. Thus, a low-level potential is applied to the gate of the transistor M1 included in each of the memory cell AMx[1] to the memory cell AMx[m−1] and the memory cell AMu[1] to the memory cell AMu[m−1] arranged in the first row to the m−1-th row and the memory cell AMw[1] to the memory cell AMw[m] and the memory cell AMr[1] to the memory cell AMr[m] arranged in the m+1-th row to the 2m-th row in the memory cell array CA, so that the transistors M1 are each turned off. This prevents the data that has been input to each of the wiring WAD and the wiring WBD from being written to the node Nx[1] to the node Nx[m−1], the node Nu[1] to the node Nu[m−1], the node Nw[1] to the node Nw[m], and the node Nr[1] to the node Nr[m].

<<From Time T05 to Time T06>>

During the period from Time T05 to Time T06, a low-level potential is input to the wiring WAL[m]. Thus, a low-level potential is applied to the gates of the transistors M1 included in the memory cell AMx[m] and the memory cell AMu[m] in the memory cell array CA, whereby the transistors M1 are each turned off.

By turning off the transistor M1 in the memory cell AMx[m], the potential higher than a ground potential by $V_{W\beta}[m]$ is retained at the first terminal of the capacitor C1 (node Nx[m]) in the memory cell AMx[m]. Furthermore, by turning off the transistor M1 in the memory cell AMu[m], the potential higher than a ground potential by $V_{W\alpha}[m]$ is retained at the first terminal of the capacitor C1 (node Nu[1]) in the memory cell AMu[m].

<<From Time T06 to Time T07>>

During the period from Time T06 to Time T07, a high-level potential is input to the wiring WBL[1]. Thus, a high-level potential is applied to the gates of the transistors M1 included in the memory cell AMw[1] and the memory cell AMr[1] in the memory cell array CA, whereby the transistors M1 are each turned on.

Furthermore, during the period from Time T06 to Time T07, a potential higher than a ground potential by $V_{W\alpha}[1]$ is input to the wiring WAD. Since the transistor M1 in the memory cell AMw[1] is in the on state at this time, electrical continuity is established between the wiring WAD and the node Nw[1], and the potential higher than a ground potential by $V_{W\alpha}[1]$ is input to the first terminal of the capacitor C1 (node Nw[1]) in the memory cell AMw[1].

Moreover, during the period from Time T06 to Time T07, a potential higher than a ground potential by $V_{W\beta}[1]$ is input to the wiring WBD. Since the transistor M1 in the memory cell AMr[1] is in the on state at this time, electrical continuity is established between the wiring WBD and the node Nr[1], and the potential higher than a ground potential by $V_W[1]$ is input to the first terminal of the capacitor C1 (node Nr[1]) in the memory cell AMr[1].

Note that since the switch SW5A is in the on state, a ground potential is input to the wiring BAL. Moreover, a ground potential from the wiring VR is input to the first terminal of the transistor M2 in the memory cell AMw[1], so that the voltage between the first terminal and the second terminal of the transistor M2 is approximately 0 V. Thus, no current flows between the first terminal and the second terminal of the transistor M2 in the memory cell AMw[1].

Similarly, since the switch SW5B is in the on state, a ground potential is input to the wiring BBL. Moreover, a ground potential from the wiring VR is input to the first terminal of the transistor M2 in the memory cell AMr[1], so that the voltage between the first terminal and the second terminal of the transistor M2 is also approximately 0 V. Thus, no current flows between the first terminal and the second terminal of the transistor M2 in the memory cell AMr[1].

During the period from Time T06 to Time T07, a low-level potential has been continuously input to the wiring WAL[1] to the wiring WAL[m] and the wiring WBL[2] to the wiring WBL[m] since before Time T06. Thus, a low-level potential is applied to the gate of the transistor M1 included in each of the memory cell AMx[1] to the memory cell AMx[m] and the memory cell AMu[1] to the memory cell AMu[m] arranged in the first row to the m-th row and the memory cell AMw[2] to the memory cell AMw[m] and the memory cell AMr[2] to the memory cell AMr[m] arranged in the m+2-th row to the 2m-th row in the memory cell array CA, so that the transistors M1 are each turned off. This prevents the data that has been input to each of the wiring WAD and the wiring WBD from being written to the node Nx[1] to the node Nx[m], the node Nu[1] to the node Nu[m], the node Nw[2] to the node Nw[m], and the node Nr[2] to the node Nr[m].

<<From Time T07 to Time T08>>

During the period from Time T07 to Time T08, a low-level potential is input to the wiring WBL[1]. Thus, a low-level potential is applied to the gates of the transistors M1 included in the memory cell AMw[1] and the memory cell AMr[1] in the memory cell array CA, whereby the transistors M1 are each turned off.

By turning off the transistor M1 in the memory cell AMw[1], a potential higher than a ground potential by $V_{W\alpha}[1]$ is retained at the first terminal of the capacitor C1 (node Nw[1]) in the memory cell AMw[1]. Furthermore, by turning off the transistor M1 in the memory cell AMr[1], a potential higher than a ground potential by $V_{W\beta}[1]$ is retained at the first terminal of the capacitor C1 (node Nr[1]) in the memory cell AMr[1].

During the period from Time T07 to Time T08, the voltages $V_{W\alpha}[2]$ to $V_{W\alpha}[m-1]$ are sequentially written to the memory cell AMw[2] to the memory cell AMw[m-1] arranged in the m+2-th row to the 2m-1-th row in the memory cell array CA, as in the operation of writing the voltage $V_{W\alpha}[1]$ to the memory cell AMw[1] during the period from Time T06 to Time T07. Moreover, the voltages $V_{W\beta}[2]$ to $V_{W\beta}[m-1]$ are written to the memory cell AMr[2] to the memory cell AMr[m-1], respectively, arranged in the 2m+2-th row to the 2m-1-th row in the memory cell array CA, as in the operation of writing the voltages to the memory cell AMw[2] to the memory cell AMw[m-1].

<<From Time T08 to Time T09>>

During the period from Time T08 to Time T09, a high-level potential is input to the wiring WBL[m]. Thus, a high-level potential is applied to the gates of the transistors M1 included in the memory cell AMw[m] and the memory cell AMr[m] in the memory cell array CA, whereby the transistors M1 are each turned on.

Furthermore, during the period from Time T08 to Time T09, a potential higher than a ground potential by $V_{W\alpha}[m]$ is input to the wiring WAD. Since the transistor M1 in the memory cell AMw[m] is in the on state at this time, electrical continuity is established between the wiring WAD and the node Nw[m], and the potential higher than a ground potential by $V_{W\alpha}[m]$ is input to the first terminal of the capacitor C1 (node Nw[m]) in the memory cell AMw[m].

Moreover, during the period from Time T08 to Time T09, a potential higher than a ground potential by $V_{W\beta}[m]$ is input to the wiring WBD. Since the transistor M1 in the memory cell AMr[m] is in the on state at this time, electrical continuity is established between the wiring WBD and the node Nr[m], and the potential higher than a ground potential by $V_{W\beta}[m]$ is input to the first terminal of the capacitor C1 (node Nr[m]) in the memory cell AMr[m].

Note that since the switch SW5A is in the on state, a ground potential is input to the wiring BAL. Moreover, a ground potential from the wiring VR is input to the first terminal of the transistor M2 in the memory cell AMw[m], so that the voltage between the first terminal and the second terminal of the transistor M2 is approximately 0 V. Thus, no current flows between the first terminal and the second terminal of the transistor M2 in the memory cell AMw[m].

Similarly, since the switch SW5B is in the on state, a ground potential is input to the wiring BBL. Moreover, a ground potential from the wiring VR is input to the first terminal of the transistor M2 in the memory cell AMr[m], so that the voltage between the first terminal and the second terminal of the transistor M2 is also approximately 0 V. Thus, no current flows between the first terminal and the second terminal of the transistor M2 in the memory cell AMr[m].

During the period from Time T08 to Time T09, a low-level potential has been continuously input to the wiring WAL[1] to the wiring WAL[m] and the wiring WBL[1] to the wiring WBL[m−1] since before Time T08. Thus, a low-level potential is applied to the gate of the transistor M1 included in each of the memory cell AMx[1] to the memory cell AMx[m] and the memory cell AMu[1] to the memory cell AMu[m] arranged in the first row to the m-th row and the memory cell AMw[1] to the memory cell AMw[m−1] and the memory cell AMr[1] to the memory cell AMr[m−1] arranged in the m+1-th row to the 2m−1-th row in the memory cell array CA, so that the transistors M1 are each turned off. This prevents the data that has been input to each of the wiring WAD and the wiring WBD from being written to the node Nx[1] to the node Nx[m], the node Nu[1] to the node Nu[m], the node Nw[1] to the node Nw[m−1], and the node Nr[1] to the node Nr[m−1].

<<From Time T09 to Time T10>>

During the period from Time T09 to Time T10, a low-level potential is input to the wiring WBL[m]. Thus, a low-level potential is applied to the gates of the transistors M1 included in the memory cell AMw[m] and the memory cell AMr[m] in the memory cell array CA, whereby the transistors M1 are each turned off.

By turning off the transistor M1 in the memory cell AMw[m], a potential higher than a ground potential by $V_{W\alpha}[m]$ is retained at the first terminal of the capacitor C1 (node Nw[m]) in the memory cell AMw[m]. Furthermore, by turning off the transistor M1 in the memory cell AMr[m], a potential higher than a ground potential by $V_{W\beta}[m]$ is retained at the first terminal of the capacitor C1 (node Nr[m]) in the memory cell AMr[m].

By the operation from Time T01 to Time T10, the voltage corresponding to the first data can be written to each of the memory cells AMx, the memory cells AMu, the memory cells AMw, and the memory cells AMr included in the memory cell array CA.

<<From Time T10 to Time T11>>

During the period from Time T10 to Time T11, a low-level potential is input to the wiring SL5. Thus, the switch SW5A and the switch SW5B in the circuit INT are each turned off.

<<From Time T11 to Time T12>>

During the period from Time T11 to Time T12, potentials corresponding to the m pieces of second data are input to the wiring XAL[1] to the wiring XAL[m]. Here, for example, a potential input from the circuit XLD to the wiring XAL[1] is higher than a ground potential by $V_{X\alpha}[1]$, a potential input from the circuit XLD to the wiring XAL[p] is higher than a ground potential by $V_{X\alpha}[p]$, and a potential input from the circuit XLD to the wiring XAL[m] is higher than a ground potential by $V_{X\alpha}[m]$.

The potential of the wiring XAL[1] increases from a ground potential to $V_{X\alpha}[1]$; thus, $V_{X\alpha}[1]$ is applied to the second terminal of the capacitor C1 in each of the memory cell AMx[1] and the memory cell AMu[1]. Since the node Nx[1] and the node Nu[1] are each in an electrically floating state at this time, the potentials of the node Nx[1] and the node Nu[1] are each changed by capacitive coupling of the capacitor C1.

In each of the memory cell AMx[1] and the memory cell AMu[1], the amount of increase in the gate potential of the transistor M2 is a potential obtained by multiplying a change in the potential of the wiring XAL[1] by a capacitive coupling coefficient determined by the memory cell structure. The capacitive coupling coefficient is calculated using the capacitance of the capacitor C1, the gate capacitance of the transistor M2, the parasitic capacitance, and the like. In this operation example, the capacitive coupling coefficient of each of the memory cell AMx and the memory cell AMu is set to h.

Thus, when a change in the potential of the wiring XAL[1] is $V_{X\alpha}[1]$, a change in the potential of each of the node Nx[1] and the node Nu[1] is $hV_{X\alpha}[1]$. That is, the potential of the node Nx[1] is $V_{w\beta}[1]+hV_{X\alpha}[1]$, and the potential of the node Nu[1] is $V_{w\alpha}[1]+hV_{X\alpha}[1]$.

In this operation example, the capacitive coupling coefficient in the memory cells included in the memory cell array CA other than the memory cell AMx[1] and the memory cell AMu[1] is described as h.

The potential of the wiring XAL[p] increases from a ground potential to $V_{X\alpha}[p]$; thus, $V_{X\alpha}[p]$ is applied to the second terminal of the capacitor C1 in each of the memory cell AMx[p] and the memory cell AMu[p]. Since the node Nx[p] and the node Nu[p] are each in an electrically floating state at this time, the potentials of the node Nx[p] and the node Nu[p] are each changed by capacitive coupling of the capacitor C1. Specifically, the potential of the node Nx[p] is $V_{w\beta}[p]+hV_{X\alpha}[p]$, and the potential of the node Nu[p] is $V_{w\alpha}[p]+hV_{X\alpha}[p]$.

The potential of the wiring XAL[m] increases from a ground potential to $V_{X\alpha}[m]$; thus, $V_{X\alpha}[m]$ is applied to the second terminal of the capacitor C1 in each of the memory cell AMx[m] and the memory cell AMu[m]. Since the node Nx[m] and the node Nu[m] are each in an electrically floating state at this time, the potentials of the node Nx[m] and the node Nu[m] are each changed by capacitive coupling of the capacitor C1. Specifically, the potential of the node Nx[m] is $V_{w\beta}[m]+hV_{X\alpha}[m]$, and the potential of the node Nu[m] is $V_{w\alpha}[m]+hV_{X\alpha}[m]$.

During the period from Time T11 to Time T12, the potentials corresponding to the m pieces of second data are input to the wiring XBL[1] to the wiring XBL[m]. Here, for example, a potential input from the circuit XLD to the wiring XBL[1] is higher than a ground potential by $V_{X\beta}[1]$, a potential input from the circuit XLD to the wiring XBL[p] is higher than a ground potential by $V_{X\beta}[p]$, and a potential input from the circuit XLD to the wiring XBL[m] is higher than a ground potential by $V_{X\beta}[m]$.

The potential of the wiring XBL[1] increases from a ground potential to $V_{X\beta}[1]$; thus, $V_{X\beta}[1]$ is applied to the second terminal of the capacitor C1 in each of the memory cell AMw[1] and the memory cell AMr[1]. Since the node Nw[1] and the node Nr[1] are each in an electrically floating state at this time, the potentials of the node Nw[1] and the node Nr[1] are each changed by capacitive coupling of the capacitor C1.

Note that in this operation example, the capacitive coupling coefficient of each of the memory cell AMw and the memory cell AMr included in the memory cell array CA is described as h, as in the memory cell AMx and the memory cell AMu.

Thus, when a change in the potential of the wiring XBL[1] is $V_{X\beta}[1]$, a change in the potential of each of the node Nw[1] and the node Nr[1] is $hV_{X\beta}[1]$. That is, the potential of the node Nw[1] is $V_{w\alpha}[1]+hV_{X\beta}[1]$, and the potential of the node Nr[1] is $V_{w\beta}[1]+hV_{X\beta}[1]$.

The potential of the wiring XBL[p] increases from a ground potential to $V_{X\beta}[p]$; thus, $V_{X\beta}[p]$ is applied to the second terminal of the capacitor C1 in each of the memory cell AMw[p] and the memory cell AMr[p]. Since the node Nw[p] and the node Nr[p] are each in an electrically floating state at this time, the potentials of the node Nw[p] and the node Nr[p] are each changed by capacitive coupling of the capacitor C1. Specifically, the potential of the node Nw[p] is $V_{w\alpha}[p]+hV_{X\beta}[p]$, and the potential of the node Nr[p] is $V_{w\beta}[p]+hV_{X\beta}[p]$.

The potential of the wiring XBL[m] increases from a ground potential to $V_{X\beta}[m]$; thus, $V_{X\beta}[m]$ is applied to the second terminal of the capacitor C1 in each of the memory cell AMw[m] and the memory cell AMr[m]. Since the node Nw[m] and the node Nr[m] are each in an electrically floating state at this time, the potentials of the node Nw[m] and the node Nr[m] are each changed by capacitive coupling of the capacitor C1. Specifically, the potential of the node Nw[m] is $V_{w\alpha}[m]+hV_{X\beta}[m]$, and the potential of the node Nu[m] is $V_{w\beta}[m]+hV_{X\beta}[m]$.

Here, $V_X[1]$, $V_X[p]$, and $V_X[m]$ are defined as in the following formulae.

[Formulae 8]

$$V_X[1] = V_{X\alpha}[1] - V_{X\beta}[1] \tag{1.4}$$

$$V_X[p] = V_{X\alpha}[p] - V_{X\beta}[p] \tag{1.5}$$

$$V_X[m] = V_{X\alpha}[m] - V_{X\beta}[m] \tag{1.6}$$

Each of $V_X[1]$ to $V_X[m]$ is voltage corresponding to the second data. That is, $V_{X\alpha}[1]$ to $V_{X\alpha}[m]$ and $V_{X\beta}[1]$ to $V_{X\beta}[m]$ can each be regarded as voltage corresponding to the second data. Note that a combination of the voltages $V_{X\alpha}[i]$ and $V_{X\beta}[i]$ can be freely determined as long as Formula (1.4) to Formula (1.6) are satisfied. For example, $V_{X\alpha}[i]$ may be voltage higher than $V_{X\beta}[i]$, lower than $V_{X\beta}[i]$, or equal to $V_{X\beta}[i]$. That is, $V_X[i]$ may be a positive voltage, 0, or a negative voltage.

<<From Time T12 to Time T13>>

During the period from Time T12 to Time T13, a high-level potential is input to the wiring SL4 and the wiring SL7.

Thus, the switch SW7A and the switch SW7B in the circuit CMS and the switch SW4A in the circuit ACTV are each turned on.

At this time, electrical continuity is established between the second terminal of the transistor M2 included in each of the memory cell AMx[1] to the memory cell AMx[m] and the memory cell AMw[1] to the memory cell AMw[m] and the first terminal of the transistor M3A included in the circuit CM through the wiring BAL. In addition, electrical continuity is established between the second terminal of the transistor M2 included in each of the memory cell AMx[1] to the memory cell AMx[m] and the memory cell AMw[1] to the memory cell AMw[m] and the first terminal of the circuit IVC included in the circuit ACTV through the wiring BAL. Moreover, electrical continuity is established between the second terminal of the transistor M2 included in each of the memory cell AMu[1] to the memory cell AMu[m] and the memory cell AMr[1] to the memory cell AMr[m] and the first terminal of the transistor M3B included in the circuit CM through the wiring BBL.

Here, current flowing from the second terminal to the first terminal of the transistor M2 in each of the memory cells AMx, the memory cells AMu, the memory cells AMw, and the memory cells AMr is considered.

Assuming that current flowing from the wiring BAL to the first terminal of the transistor M2 in the memory cell AMx[1] through its second terminal is $I_{AMx[1]}$, $I_{AMx[1]}$ can be expressed by the following formula.

[Formula 9]

$$I_{AMx[1]} = k(V_{W\beta}[1] + hV_{X\alpha}[1] - V_{th})^2 \quad (1.7)$$

Note that k is a constant determined by the channel length, the channel width, the mobility, the capacitance of a gate insulating film, and the like of the transistor M2. Furthermore, $V_{th}$ is the threshold voltage of the transistor M2. Note that the constant k can be applied not only to the memory cells AMx but also to the memory cells AMu, the memory cells AMw, and the memory cells AMr. In addition, the threshold voltage of the transistor M2 of not only the memory cells AMx but also the memory cells AMu, the memory cells AMw, and the memory cells AMr is denoted as $V_{th}$.

Assuming that current flowing from the wiring BAL to the first terminal of the transistor M2 in the memory cell AMx[m] through its second terminal is $I_{AMx[m]}$, $I_{AMx[m]}$ can be expressed by the following formula.

[Formula 10]

$$I_{AMx[m]} = k(V_{W\beta}[m] + hV_{X\alpha}[m] - V_{th})^2 \quad (1.8)$$

That is, assuming that the total amount of current flowing from the wiring BAL to the second terminals of the transistors M2 in the memory cell AMx[1] to the memory cell AMx[m] is $I_x$, $I_x$ can be expressed by the following formula according to Formula (1.7) and Formula (1.8).

[Formula 11]

$$I_x = k\sum_{i=1}^{m}(V_{W\beta}[i] + hV_{X\alpha}[i] - V_{th})^2 \quad (1.9)$$

Similarly, assuming that current flowing from the wiring BAL to the first terminal of the transistor M2 in the memory cell AMw[1] through its second terminal is $I_{AMw[1]}$ and current flowing from the wiring BAL to the first terminal of the transistor M2 in the memory cell AMw[m] through its second terminal is $I_{AMw[m]}$, $I_{AMw[1]}$ and $I_{AMw[m]}$ can be expressed by the following formulae.

[Formulae 12]

$$I_{AMw[1]} = k(V_{W\alpha}[1] + hV_{X\beta}[1] - V_{th})^2 \quad (1.10)$$

$$I_{AMw[m]} = k(V_{W\alpha}[m] + hV_{X\beta}[m] - V_{th})^2 \quad (1.11)$$

That is, assuming that the total amount of current flowing from the wiring BAL to the second terminals of the transistors M2 in the memory cell AMw[1] to the memory cell AMw[m] is $I_w$, $I_w$ can be expressed by the following formula according to Formula (1.10) and Formula (1.11).

[Formula 13]

$$I_w = k\sum_{i=1}^{m}(V_{W\alpha}[i] + hV_{X\beta}[i] - V_{th})^2 \quad (1.12)$$

Similarly, assuming that current flowing from the wiring BBL to the first terminal of the transistor M2 in the memory cell AMu[1] through its second terminal is $I_{AMu[1]}$ and current flowing from the wiring BBL to the first terminal of the transistor M2 in the memory cell AMu[m] through its second terminal is $I_{AMu[m]}$, $I_{AMu[1]}$ and $I_{AMu[m]}$ can be expressed by the following formulae.

[Formulae 14]

$$I_{AMu[1]} = k(V_{W\alpha}[1] + hV_{X\alpha}[1] - V_{th})^2 \quad (1.13)$$

$$I_{AMu[m]} = k(V_{W\alpha}[m] + hV_{X\alpha}[m] - V_{th})^2 \quad (1.14)$$

That is, assuming that the total amount of current flowing from the wiring BBL to the second terminals of the transistors M2 in the memory cell AMu[1] to the memory cell AMu[m] is $I_u$, $I_u$ can be expressed by the following formula according to Formula (1.13) and Formula (1.14).

[Formula 15]

$$I_u = k\sum_{i=1}^{m}(V_{W\alpha}[i] + hV_{X\alpha}[i] - V_{th})^2 \quad (1.15)$$

Similarly, assuming that current flowing from the wiring BBL to the first terminal of the transistor M2 in the memory cell AMr[1] through its second terminal is $I_{AMr[1]}$ and current flowing from the wiring BBL to the first terminal of the transistor M2 in the memory cell AMr[m] through its second terminal is $I_{AMr[m]}$, $I_{AMr[1]}$ and $I_{AMr[m]}$ can be expressed by the following formulae.

[Formulae 16]

$$I_{AMr[1]} = k(V_{W\beta}[1] + hV_{X\beta}[1] - V_{th})^2 \quad (1.16)$$

$$I_{AMr[m]} = k(V_{W\beta}[m] + hV_{X\beta}[m] - V_{th})^2 \quad (1.17)$$

That is, assuming that the total amount of current flowing from the wiring BBL to the second terminals of the transistors M2 in the memory cell AMr[1] to the memory cell AMr[m] is $I_r$, $I_r$ can be expressed by the following formula according to Formula (1.16) and Formula (1.17).

[Formula 17]

$$I_r = k\sum_{i=1}^{m}(V_{W\beta}[i] + hV_{X\beta}[i] - V_{th})^2 \quad (1.18)$$

During the period from Time T12 to Time T13, the switch SW7B included in the circuit CMS is in the on state and the switch SW5B included in the circuit INT is in the off state; thus, current with the total amount $I_u+I_r$ flowing to the memory cell AMu[1] to the memory cell AMu[m] and the memory cell AMr[1] to the memory cell AMr[m] through the wiring BBL flows from the wiring VHE through the first terminal of the transistor M3B. At this time, the voltage of the first terminal (gate) of the transistor M3B is voltage corresponding to the current amount $I_u+I_r$.

Since the circuit CM is the current mirror circuit, the amount of current flowing between the first terminal and the second terminal of the transistor M3B is substantially equal to the amount of current flowing between the first terminal and the second terminal of the transistor M3A. During the period from Time T12 to Time T13, the switch SW7A included in the circuit CMS is in the on state; thus, the amount of current flowing from the wiring VHE to the wiring BAL through the transistor M3B is $I_u+I_r$.

In addition, since the switch SW5B included in the circuit INT is in the off state and the switch SW4A included in the circuit ACTV is in the on state, current flows from the wiring BAL to the first terminal of the circuit IVC included in the circuit ACTV through the switch SW4A. Assuming that the amount of the current is $I_{EV}$, $I_{EV}$ can be expressed by the following formula.

[Formula 18]

$$I_{EV} = I_u + I_r - I_x - I_w \quad (1.19)$$

Formula (1.19) can be expressed by the following formula with the use of Formula (1.1) to Formula (1.6), Formula (1.9), Formula (1.12), Formula (1.15), and Formula (1.18).

[Formula 19]

$$I_{EV} = 2hk\sum_{i=1}^{m}(V_{W\alpha}[i] - V_{W\beta}[i])(V_{X\alpha}[i] - V_{X\beta}[i]) \quad (1.20)$$

$$= 2hk\sum_{i=1}^{m}V_W[i]V_X[i]$$

According to Formula (1.20), the amount $I_{EV}$ of current input from the wiring BAL to the circuit ACTV is proportional to the product-sum of the potentials $V_W[1]$ to $V_W[m]$ corresponding to the first data and the potentials $V_X[1]$ to $V_X[m]$ corresponding to the second data. That is, the product-sum of the first data and the second data can be expressed as the amount $I_{EV}$ of current.

The current with $I_{EV}$ flowing through the first terminal of the circuit IVC included in the circuit ACTV enables voltage corresponding to $I_{EV}$ to be output to the third terminal of the circuit IVC. After that, the voltage is input to the first terminal of the circuit ACF to be used for an arithmetic operation of a function system defined in advance by the circuit ACF, so that the arithmetic operation result is output as voltage (or current, for example) from the wiring NIL.

Formula (1.1) to Formula (1.3) can each be modified into $V_{W\alpha}[i]=V_{W\beta}[i]+V_W[i]$. That is, the memory cell AMu[i] and the memory cell AMw[i] retain $V_{W\beta}[i]+V_W[i]$. Since $V_{W\beta}[i]$ can be a given voltage, $V_{W\beta}[1]$ to $V_{W\beta}[m]$ may be the same voltage. Assuming that each of $V_{W\beta}[1]$ to $V_{W\beta}[m]$ is $V_{PR}$, for example, the memory cell AMx[i] retains $V_{PR}$, the memory cell AMu[i] retains $V_{PR}+V_W[i]$, the memory cell AMw[i] retains $V_{PR}+V_W[i]$, and the memory cell AMr[i] retains $V_{PR}$. When each of $V_{W\beta}[1]$ to $V_{W\beta}[m]$ is $V_{PR}$ in this manner, the arithmetic operation of Formula (1.20) can be performed similarly by retaining voltage obtained by addition of the voltage corresponding to the first data to the reference voltage $V_{PR}$ in the memory cell AMu and the memory cell AMw and by retaining the reference voltage in the memory cell AMx and the memory cell AMr.

Formula (1.4) to Formula (1.6) can each be modified into $V_{X\alpha}[i]=V_{X\beta}[i]+V_X[i]$. That is, during the period from Time T11 to Time T12, $V_{X\beta}[i]+V_X[i]$ is input to the wiring XAL[i]. Since $V_{X\beta}[i]$ can be a given voltage, $V_{X\beta}[1]$ to $V_{X\beta}[m]$ may be the same voltage. Assuming that each of $V_{X\beta}[1]$ to $V_{X\beta}[m]$ is $V_{RFP}$, for example, $V_{RFP}+V_X[i]$ is input to the wiring XAL[i], and $V_{RFP}$ is input to the wiring XBL[i]. When each of $V_{X\beta}[1]$ to $V_{X\beta}[m]$ is $V_{RFP}$ in this manner, the arithmetic operation of Formula (1.20) can be performed similarly by inputting voltage obtained by addition of the voltage corresponding to the second data to the reference voltage $V_{RFP}$ to the wiring XAL and by inputting the reference voltage to the wiring XBL.

Structure Example 2 of Semiconductor Device

Described here is a semiconductor device that is capable of performing a product-sum operation of the plurality of pieces of first data and the plurality of pieces of second data and is different from the arithmetic circuit MAC1 in FIG. 1.

Figure 8:
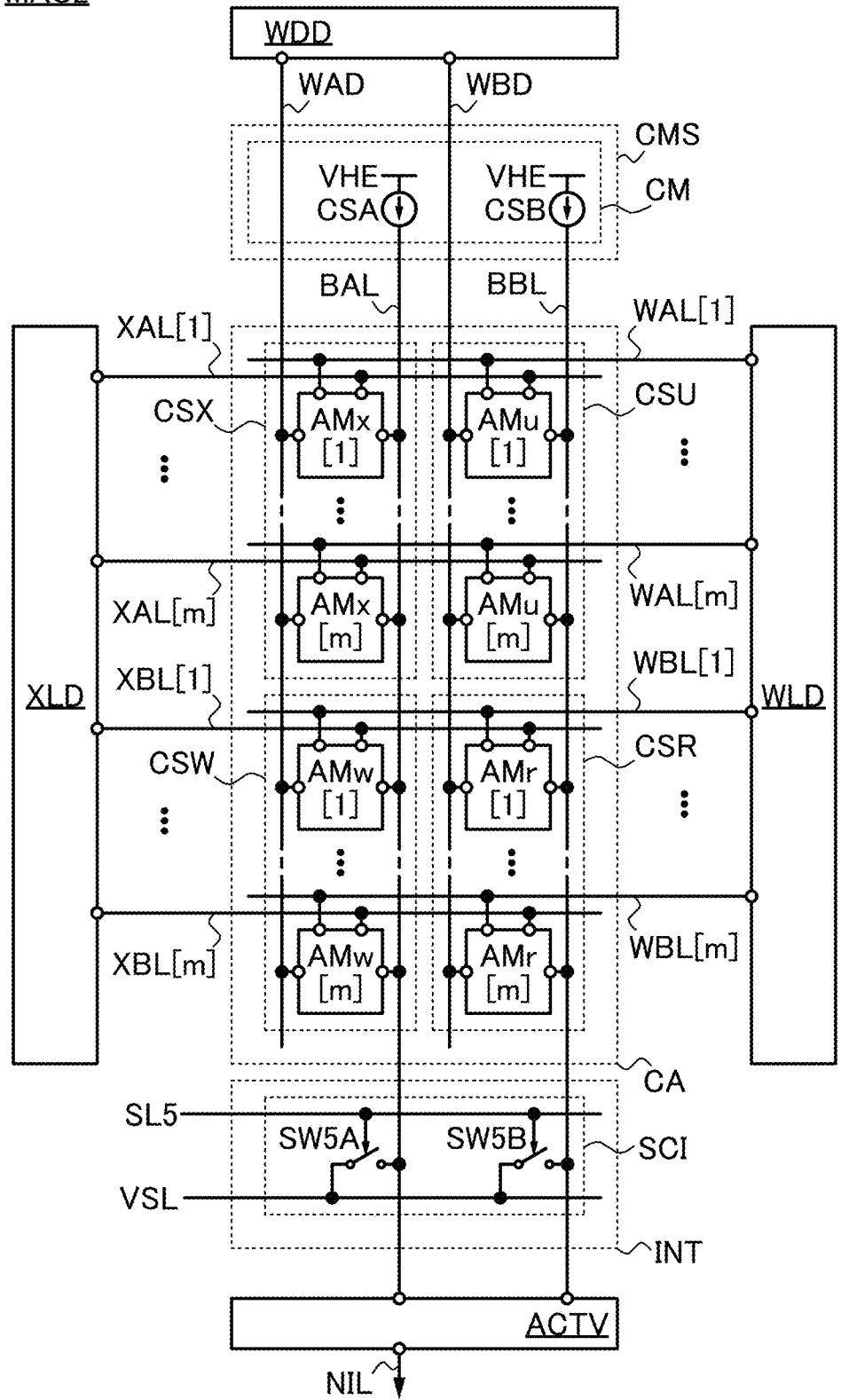
FIG. 8 is a block diagram illustrating an example of a semiconductor device.

Like the arithmetic circuit MAC1 in FIG. 1, an arithmetic circuit MAC2 in FIG. 8 is an example of a semiconductor device capable of performing a product-sum operation of the plurality of pieces of first data and the plurality of pieces of second data. Note that the arithmetic circuit MAC2 is different from the arithmetic circuit MAC1 in the circuit structure of the circuit CMS and in that the wiring BBL is electrically connected to the circuit ACTV.

The circuit CMS included in the arithmetic circuit MAC2 includes a current source CSA and a current source CSB. An input terminal of the current source CSA is electrically connected to the wiring VHE, and an output terminal of the current source CSA is electrically connected to the wiring BAL. An input terminal of the current source CSB is electrically connected to the wiring VHE, and an output terminal of the current source CSB is electrically connected to the wiring BBL.

Figure 3B:
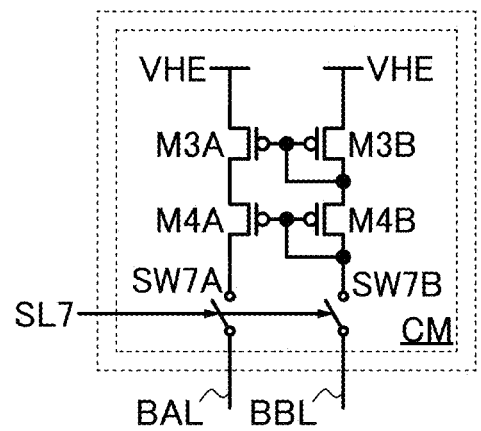

Note that the circuit CMS that is included in the arithmetic circuit MAC2 and has the above-described circuit structure does not have a function of the current mirror circuit illustrated in FIG. 3A and FIG. 3B.

The wiring VHE can be a wiring for supplying a constant voltage as in the description of the circuit CMS in FIG. 3A and FIG. 3B, for example. The constant voltage is preferably a high-level potential, for example.

The current source CSA and the current source CSB each have a function of outputting a constant current to the output terminal when a power supply potential is input to the input terminal. Note that the amount of current output to the output terminal of the current source CSA is preferably equal to the amount of current output to the output terminal of the current source CSB. Specifically, the amount of current flowing from the output terminal of the current source CSA to the wiring BAL is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing from the output terminal of the current source CSB to the wiring BBL. Note that the above-described lower limits and upper limits can be combined with each other.

As described above, the wiring BBL is electrically connected to the circuit ACTV. The circuit ACTV in FIG. 8 preferably has a function of outputting voltage corresponding to the amount of current, which is the difference between current flowing from the wiring BAL to the circuit ACTV and current flowing from the wiring BBL to the circuit ACTV, a function of performing an arithmetic operation according to a function system defined in advance using the voltage, and a function of outputting the result of the arithmetic operation of the function to the wiring NIL, for example.

Figure 9:
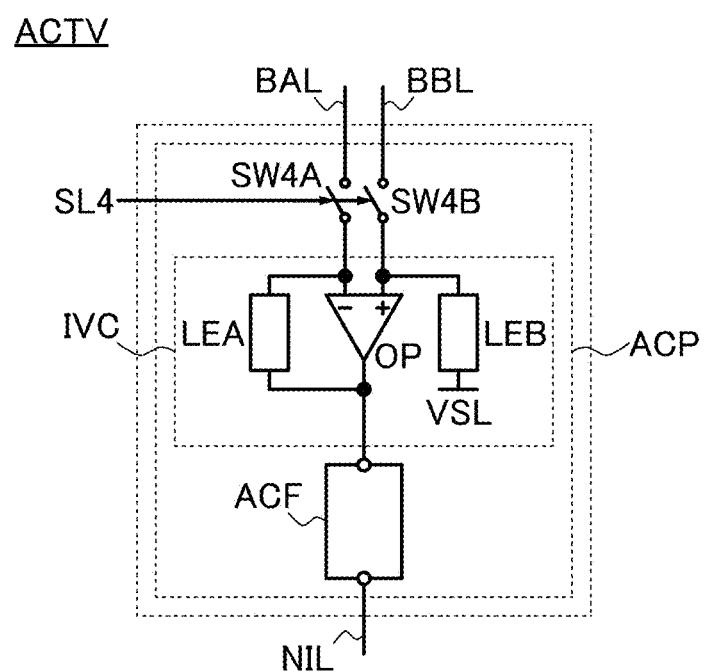
FIG. 9 is a block diagram illustrating a structure example of a circuit included in a semiconductor device.

Specifically, the circuit ACTV included in the arithmetic circuit MAC2 in FIG. 8 can be the circuit ACTV illustrated in FIG. 9, for example. The circuit ACTV illustrated in FIG. 9 includes the circuit ACP, and the circuit ACP includes the switch SW4A, the switch SW4B, the circuit IVC, and the circuit ACF.

The circuit IVC in FIG. 9 has the same circuit structure as that of the circuit IVC included in the circuit ACTV in FIG. 4C, which includes the operational amplifier OP, the load LEA, and the load LEB. Thus, for the description of the circuit IVC in FIG. 9, refer to the description of the circuit IVC in FIG. 4C.

The circuit ACF in FIG. 9 can be a circuit similar to the circuit ACF included in the circuit ACTV described with reference to FIG. 4A to FIG. 4C, for example. Thus, the circuit ACF in FIG. 9 can have a function of performing an arithmetic operation according to a defined function system on the basis of the voltage input to the first terminal, and a function of outputting the result of the arithmetic operation of the function system to the second terminal of the circuit ACF (wiring NIL), like the circuit ACF in FIG. 4A to FIG. 4C.

The first terminal of the switch SW4A is electrically connected to the wiring BAL, and the second terminal of the switch SW4A is electrically connected to the inverting input terminal of the operational amplifier OP and the first terminal of the load LEA through the first terminal of the circuit IVC. The first terminal of the circuit ACF is electrically connected to the output terminal of the operational amplifier OP and the second terminal of the load LEA through the second terminal of the circuit IVC. The first terminal of the switch SW4B is electrically connected to the wiring BBL, and the second terminal of the switch SW4B is electrically connected to the non-inverting input terminal of the operational amplifier OP and the first terminal of the load LEB through the third terminal of the circuit IVC. The control terminals of the switch SW4A and the switch SW4B are electrically connected to the wiring SL4.

As the switch SW4A, a switch that can be used as the switch SW4A, the switch SW5A, and the switch SW5B can be used, for example.

When a high-level potential is input to the wiring SL4 to turn on each of the switch SW4A and the switch SW4B, for example, the circuit ACTV in FIG. 9 can supply current from the wiring BAL to the first terminal of the circuit IVC and can supply current from the wiring BBL to the third terminal of the circuit IVC.

Assuming that the amount of current supplied from the current source CSA and the current source CSB respectively to the wiring BAL and the wiring BBL is $I_{CS}$, the total amount of current flowing from the wiring BAL to the memory cell AMx[1] to the memory cell AMx[m] is $I_x$, and the total amount of current flowing from the wiring BAL to the memory cell AMw[1] to the memory cell AMw[m] is $I_w$ in the arithmetic circuit MAC2 in FIG. 8, for example, the amount of current flowing from the wiring BAL to the first terminal of the circuit IVC is $I_{CS}-I_x-I_w$. In addition, assuming that the total amount of current flowing from the wiring BBL to the memory cell AMu[1] to the memory cell AMu[m] is $I_u$ and the total amount of current flowing from the wiring BBL to the memory cell AMr[1] to the memory cell AMr[m] is $I_r$, the amount of current flowing from the wiring BBL to the third terminal of the circuit IVC is $I_{CS}-I_u-I_r$.

In the case where the circuit IVC in FIG. 9 is a subtraction circuit (e.g., in the case where the load LEA and the load LEB are resistors), the second terminal of the circuit IVC outputs voltage corresponding to the difference $(-I_u-I_r+I_x+I_w)$ between the amount of current input to the first terminal of the circuit IVC and the amount of current input to the third terminal of the circuit IVC. The current amount corresponding to the difference depends on the sum of products of the plurality of pieces of first data and the plurality of pieces of second data according to Formula (1.19) and Formula (1.20); thus, voltage output from the second terminal of the circuit IVC can be regarded as voltage corresponding to the result of the sum of products of the plurality of pieces of first data and the plurality of pieces of second data.

After that, the voltage is input to the first terminal of the circuit ACF to be used for an arithmetic operation of a function system defined in advance by the circuit ACF, so that the arithmetic operation result is output as voltage (or current, for example) from the wiring NIL.

Structure Example 3 of Semiconductor Device

Described next is a semiconductor device that is capable of performing a product-sum operation of the plurality of pieces of first data and the plurality of pieces of second data and is different from the arithmetic circuit MAC1 in FIG. 1 and the arithmetic circuit MAC2 in FIG. 8.

Figure 10:
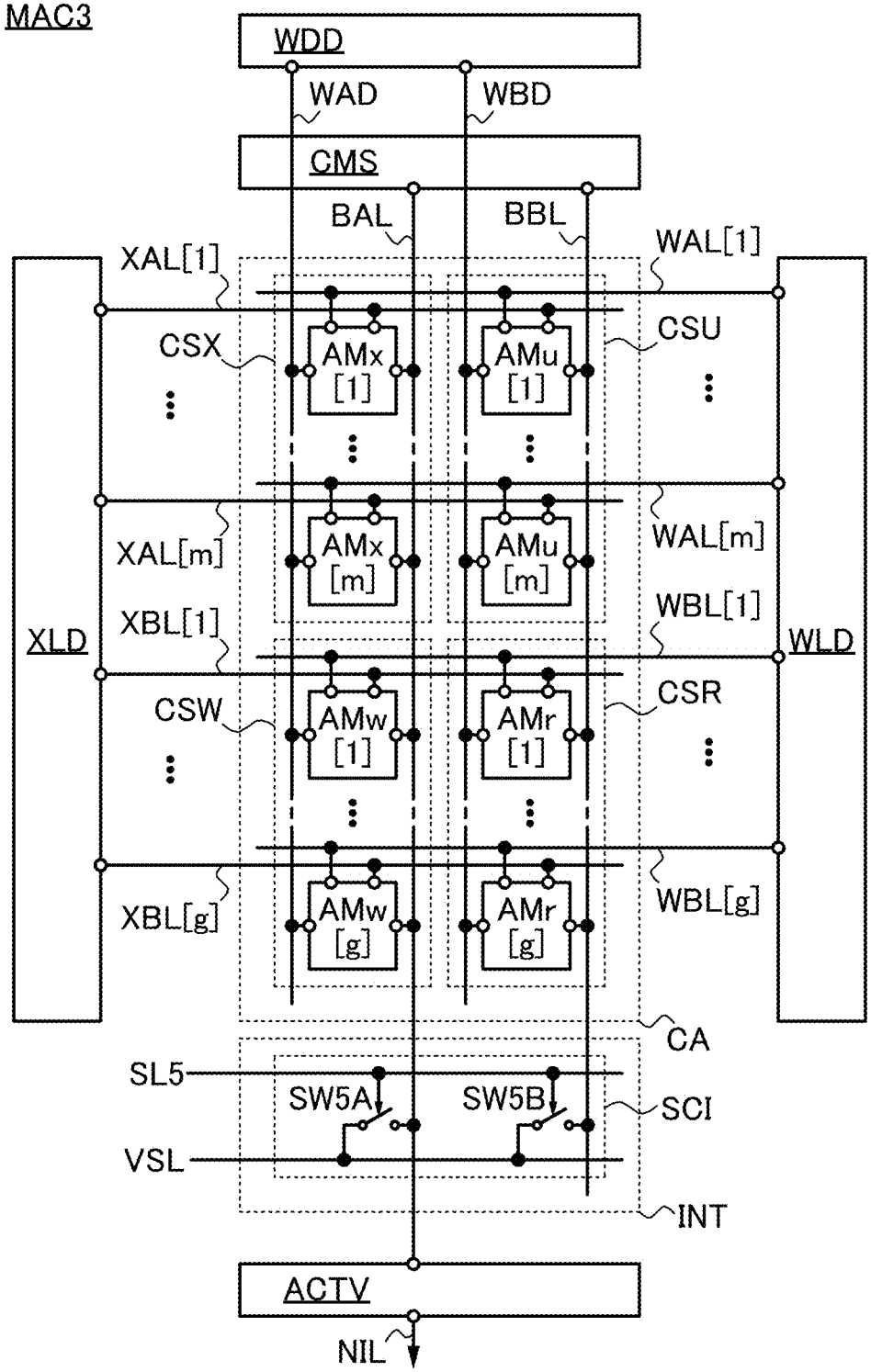
FIG. 10 is a block diagram illustrating an example of a semiconductor device.

Like the arithmetic circuit MAC1 and the arithmetic circuit MAC2, an arithmetic circuit MAC3 in FIG. 10 is an example of a semiconductor device capable of performing a product-sum operation of the plurality of pieces of first data and the plurality of pieces of second data. The arithmetic circuit MAC3 is a modification example of the arithmetic circuit MAC1, and is different from the arithmetic circuit MAC1 in the number of memory cells AMw included in the circuit CSW and the number of memory cells AMr included in the circuit CSR.

For example, in the arithmetic circuit MAC3, the number of memory cells AMw included in the circuit CSW can be g (g is an integer greater than or equal to 1 and is not m), and the number of memory cells AMr included in the circuit CSR can be g. Thus, the numbers of wirings XBL and wirings WBL are each g.

First, the case where g is greater than or equal to 1 and less than m is described.

The voltages corresponding to the plurality of pieces of first data are set to $V_W[1]$ to $V_W[m]$, and $V_{W\alpha}[1]$ to $V_{W\alpha}[m]$ and $V_{W\beta}[1]$ to $V_{W\beta}[m]$ are defined such that Formula (1.1) to Formula (1.3) are satisfied. In addition, the memory cell AMw[1] to the memory cell AMw[m] and the memory cell AMu[1] to the memory cell AMu[m] retain the respective voltages $V_{W\alpha}[1]$ to $V_{W\alpha}[m]$, and the memory cell AMx[1] to the memory cell AMx[m] and the memory cell AMr[1] to the memory cell AMr[m] retain the respective voltages $V_{W\beta}[1]$ to $V_{W\beta}[m]$.

Here, the case where the amount of potential change in the wiring XBL[1] to the wiring XBL[m] is small, e.g., the case where $V_{X\beta}[1]$ to $V_{X\beta}[m]$ are each 0 V, during the period from Time T11 to Time T12 in the timing chart in FIG. 7 is considered. Note that, for example, according to Formula (1.10) and Formula (1.11), current $I_{AMw}[i]$ flowing from the wiring BAL to the memory cell AMw[i] is $I_{AMw}[i]=k(V_{W\alpha}[i]-V_{th})^2$, and according to Formula (1.16) and Formula (1.17), current $I_{AMr}[i]$ flowing from the wiring BBL to the memory cell AMr[i] is $I_{AMr}[i]=k(V_{W\beta}[i]-V_{th})^2$. In the case where $V_W[i]=V_{W\alpha}[i]-V_W[i]$ is close to 0 at this time, $I_{AMw}[i]$ and $I_{AMr}[i]$ can be regarded as having substantially the same current amounts. Since $I_{AMr}[i]$, which is part of current flowing through the wiring BBL, is part of current supplied from the circuit CMS to the wiring BAL, $I_{AMr}[i]$, which is part of the current supplied from the circuit CMS, and $I_{AMw}[i]$ flowing to the memory cell AMw[i] are canceled in the wiring BAL.

To put it differently, in the case where the difference between the voltage $V_{W\alpha}[i]$ and the voltage $V_{W\beta}[i]$ respectively written to the memory cell AMw[i] and the memory cell AMr[i] is known to be close to 0 in advance, $V_{W\alpha}[i]$ and $V_{W\beta}[i]$ are not necessarily written respectively to the memory cell AMw[i] and the memory cell AMr[i]. This can reduce the number of memory cells AMw included in the circuit CSW and the number of memory cells AMr included in the circuit CSR, which can reduce power consumption required for the memory cells AMw included in the circuit CSW and the memory cells AMr included in the circuit CSR.

Assuming that the amount of change in the potential of the wiring XAL[i] is $V_{X\alpha}[i]$ ($=V_X[i]$) during the period from Time T11 to Time T12 in the timing chart in FIG. 7, the amount of current flowing from the wiring BAL to the memory cell AMx[i] is $I_{AMx}[i]=k(V_{W\beta}[i]+hV_{X\alpha}[i]-V_{th})^2$, and the amount of current flowing from the wiring BBL to the memory cell AMu[i] is $I_{AMu}[i]=k(V_{W\alpha}[i]+hV_{X\alpha}[i]-V_{th})^2$. The difference in current amount between $I_{AMx}[i]$ and $I_{AMu}[i]$ sometimes becomes larger with a higher value of $V_{X\alpha}[i]$; thus, voltage corresponding to the first data is preferably written to each of the memory cell AMx[i] and the memory cell AMu[i], unlike in the memory cell AMw[i] and the memory cell AMr[i].

Next, the case where g is greater than m, e.g., the case of g=m+1, is described.

The voltages corresponding to the plurality of pieces of first data are set to $V_W[1]$ to $V_W[m]$, and $V_{W\alpha}[1]$ to $V_{W\alpha}[m]$ and $V_{W\beta}[1]$ to $V_{W\beta}[m]$ are defined such that Formula (1.1) to Formula (1.3) are satisfied. In addition, the memory cell AMw[1] to the memory cell AMw[m] and the memory cell AMu[1] to the memory cell AMu[m] retain the respective voltages $V_{W\alpha}[1]$ to $V_{W\alpha}[m]$, and the memory cell AMx[1] to the memory cell AMx[m] and the memory cell AMr[1] to the memory cell AMr[m] retain the respective voltages $V_{W\beta}[1]$ to $V_{W\beta}[m]$.

Figure 15:
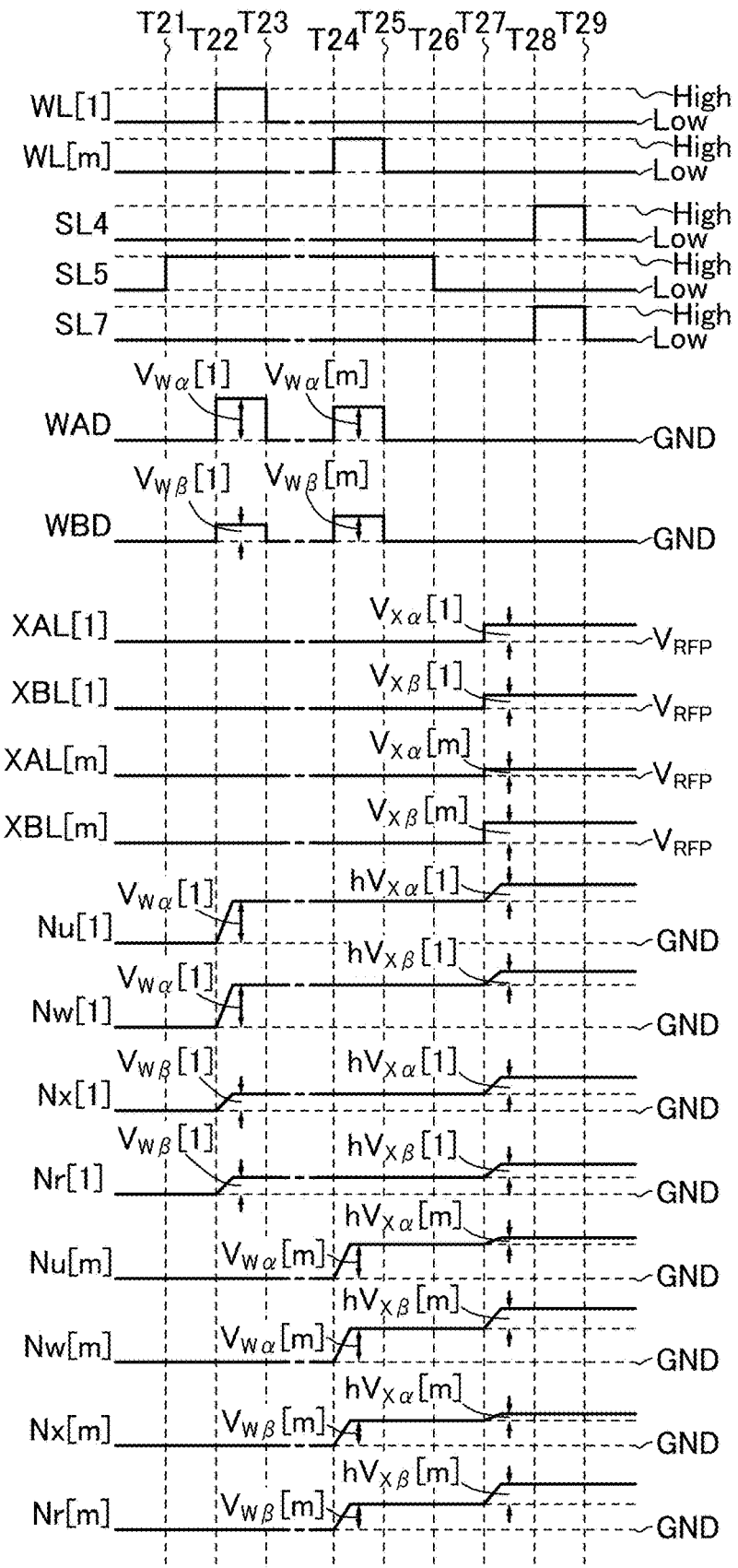
FIG. 15 is a timing chart showing an operation example of a semiconductor device.

Furthermore, a given voltage $V_b$ is written to the memory cell AMr[m+1], and a ground potential is written to the memory cell AMw[m+1]. In addition, during the period from Time T11 to Time T12 in the timing chart in FIG. 7, the voltage of the wiring XBL[m+1] does not change. In that case, assuming that current flowing from the wiring BBL to the memory cell AMr[m+1] during the period from Time T12 to Time T13 in the timing chart in FIG. 15 is $I_b$, $I_b$, and the amount $I_{EV}$ of current flowing from the wiring BAL to the circuit ACTV are expressed as in the following formulae.

[Formulae 20]

$$I_b = k\sum_{i=1}^{m}(V_b - V_{th})^2 \quad (1.21)$$

$$I_{EV} = 2hk\sum_{i=1}^{m} V_W[i]V_X[i] + I_b \quad (1.22)$$

Formula (1.22) corresponds to a formula in which a given value is added to the product-sum result. This can be used for calculation or the like in which a bias as a given value is added to the result of a product-sum operation of a weight coefficient and a signal of a neuron in an arithmetic operation in a hierarchical neural network, for example.

Although the case where the given voltage $V_b$ is written to the memory cell AMr[m+1] and a ground potential is written to the memory cell AMw[m+1] is described above, a ground potential may be written to the memory cell AMr[m+1] and the given voltage $V_b$ may be written to the memory cell AMw[m+1]. In that case, current with the amount $I_b$ flows from the wiring BAL to the memory cell AMw[m+1]; thus, the amount $I_{EV}$ of current flowing from the wiring BAL to the circuit ACTV is a value obtained by replacing $I_b$ in Formula (1.21) with $-I_b$. That is, a given value added to a product-sum result can be a negative value.

Omitting the writing of the voltages $V_{W\alpha}[i]$ and $V_{W\beta}[i]$ with a difference of close to 0 and adding a given value to a product-sum operation result can be concurrently performed. At this time, the value of g corresponding to the number of rows in the memory cell array CA may be greater than or equal to 1 and less than m, and g may be greater than m.

In addition, the value of g may be m. In that case, when the difference between the voltage $V_{W\alpha}[i]$ and the voltage $V_W[i]$ respectively written to the memory cell AMw[i] and the memory cell AMr[i] is known to be close to 0 in advance in the arithmetic circuit MAC1 in FIG. 1, for example, the given voltage $V_b$ is written to one of the memory cell AMw[i] and the memory cell AMr[i] and a ground potential is written to the other of the memory cell AMw[i] and the memory cell AMr[i] instead of writing $V_{W\alpha}[i]$ and $V_{W\beta}[i]$ respectively to the memory cell AMw[i] and the memory cell AMr[i], whereby omitting the writing of the voltages $V_{W\alpha}[i]$ and $V_{W\beta}[i]$ with a difference of close to 0 and adding a given value to a product-sum operation result can be concurrently performed.

Note that the semiconductor device of one embodiment of the present invention is not limited to the arithmetic circuit MAC1 to the arithmetic circuit MAC3 and the like described in this embodiment. For example, in the case where a plurality of product-sum operations are performed at the same time using the same second data, an arithmetic circuit MAC4 illustrated in FIG. 11 can be used. The arithmetic circuit MAC4 has a structure in which n memory cell arrays CA (n is an integer greater than or equal to 1) in the arithmetic circuit MAC1 in FIG. 1 are provided for every column.

Figure 11:
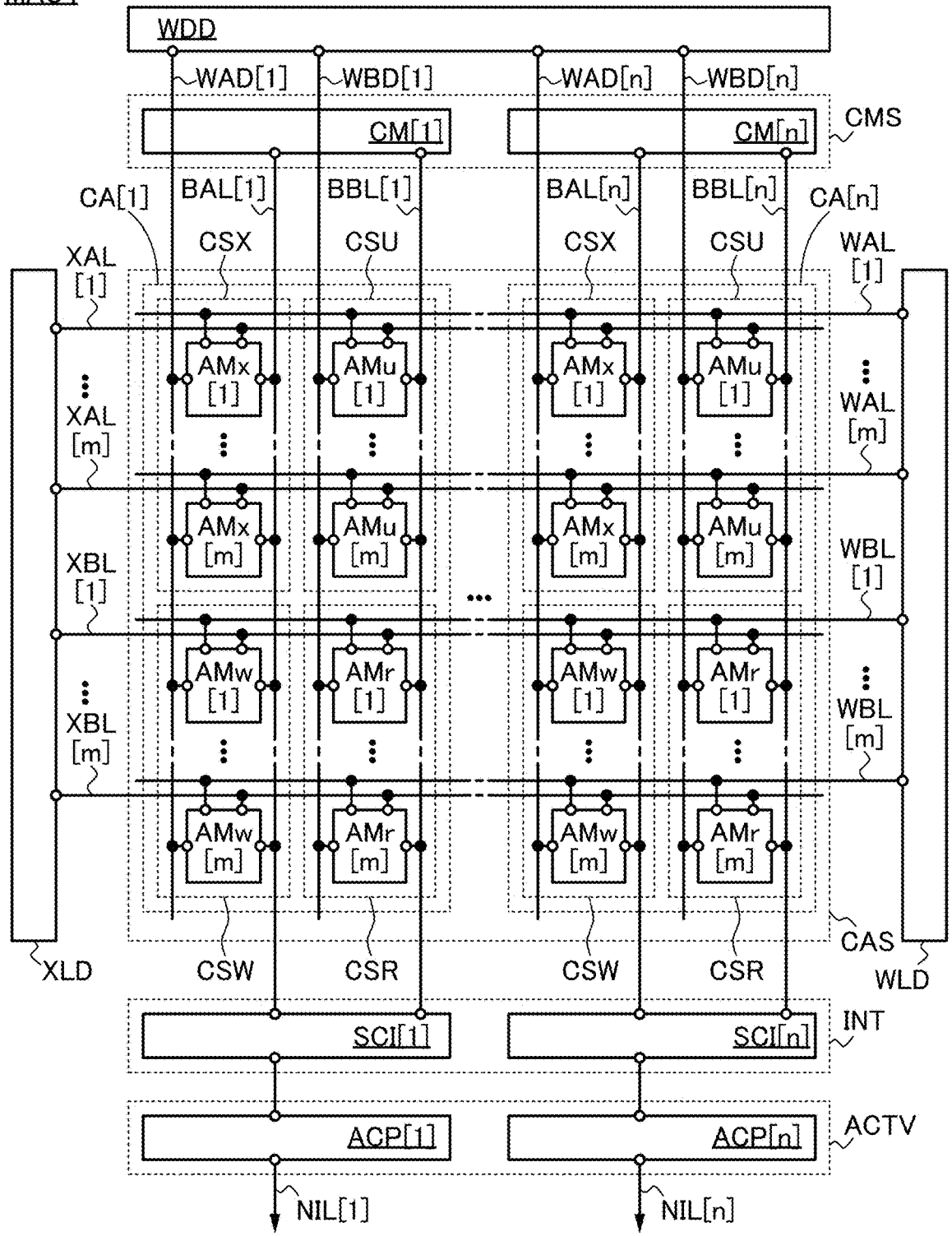
FIG. 11 is a block diagram illustrating an example of a semiconductor device.

FIG. 11 illustrates a memory cell array CA[1] to a memory cell array CA[n], and the memory cell array CA[1] to the memory cell array CA[n] are collectively referred to as a memory cell array CAS. Since the arithmetic circuit MAC4 includes the n memory cell arrays CA, the circuit CMS includes a circuit CM[1] to a circuit CM[n] as n circuits CM, the circuit INT includes a circuit SCI[1] to a circuit SCI[n] as n circuits SCI, and the circuit ACTV includes a circuit ACP[1] to a circuit ACP[n] as n circuits ACP in FIG. 11. The arithmetic circuit MAC4 includes a wiring BAL[1] to a wiring BAL[n] corresponding to the wiring BAL in the arithmetic circuit MAC1, a wiring BBL[1] to a wiring BBL[n] corresponding to the wiring BBL in the arithmetic circuit MAC1, a wiring WAD[1] to a wiring WAD[n] corresponding to the wiring WAD in the arithmetic circuit MAC1, a wiring WBD[1] to a wiring WBD[n] corresponding to the wiring WBD in the arithmetic circuit MAC1, and a wiring NIL[1] to a wiring NIL[n] corresponding to the wiring NIL in the arithmetic circuit MAC1.

The memory cell array CA[1] is electrically connected to the wiring BAL[1], the wiring BBL[1], the wiring WAD[1], the wiring WBD[1], the wiring XAL[1] to the wiring XAL[m], the wiring XBL[1] to the wiring XBL[m], the wiring WAL[1] to the wiring WAL[m], and the wiring WBL[1] to the wiring WBL[m]. The circuit WDD is electrically connected to the wiring WAD[1] and the wiring WBD[1]. The circuit CM[1] in the circuit CMS is electrically connected to the wiring BAL[1] and the wiring BBL[1], and the circuit SCI[1] in the circuit INT is electrically connected to the wiring BAL[1] and the wiring BBL[1] and the circuit ACP[1] in the circuit ACTV. The circuit ACP[1] is electrically connected to the wiring NIL[1].

Similarly, the memory cell array CA[n] is electrically connected to the wiring BAL[n], the wiring BBL[n], the wiring WAD[n], the wiring WBD[n], the wiring XAL[1] to the wiring XAL[m], the wiring XBL[1] to the wiring XBL[m], the wiring WAL[1] to the wiring WAL[m], and the wiring WBL[1] to the wiring WBL[m]. The circuit WDD is electrically connected to the wiring WAD[n] and the wiring WBD[n]. The circuit CM[n] in the circuit CMS is electrically connected to the wiring BAL[n] and the wiring BBL[n], and the circuit SCI[n] in the circuit INT is electrically connected to the wiring BAL[n] and the wiring BBL[n] and the circuit ACP[n] in the circuit ACTV. The circuit ACP[n] is electrically connected to the wiring NIL[n].

The arithmetic circuit MAC4 in FIG. 11 writes voltages corresponding to the first group to the n-th group of first data to the memory cell array CA[1] to the memory cell array CA[n], respectively, and then inputs the voltage corresponding to the second data to the wiring XAL[1] to the wiring XAL[m] and the wiring XBL[1] to the wiring XBL[m] as in the operation of the timing chart in FIG. 7, whereby the results of the product-sum operation of the first data and the second data in the first group to the n-th group can be concurrently output to the wiring NIL[1] to the wiring NIL[n].

Structure Example 4 of Semiconductor Device

Described here is a semiconductor device that is capable of performing a product-sum operation of the plurality of pieces of first data and the plurality of pieces of second data and is different from the arithmetic circuit MAC1, the arithmetic circuit MACIA, the arithmetic circuit MAC2, and the arithmetic circuit MAC3 described above.

Figure 12:
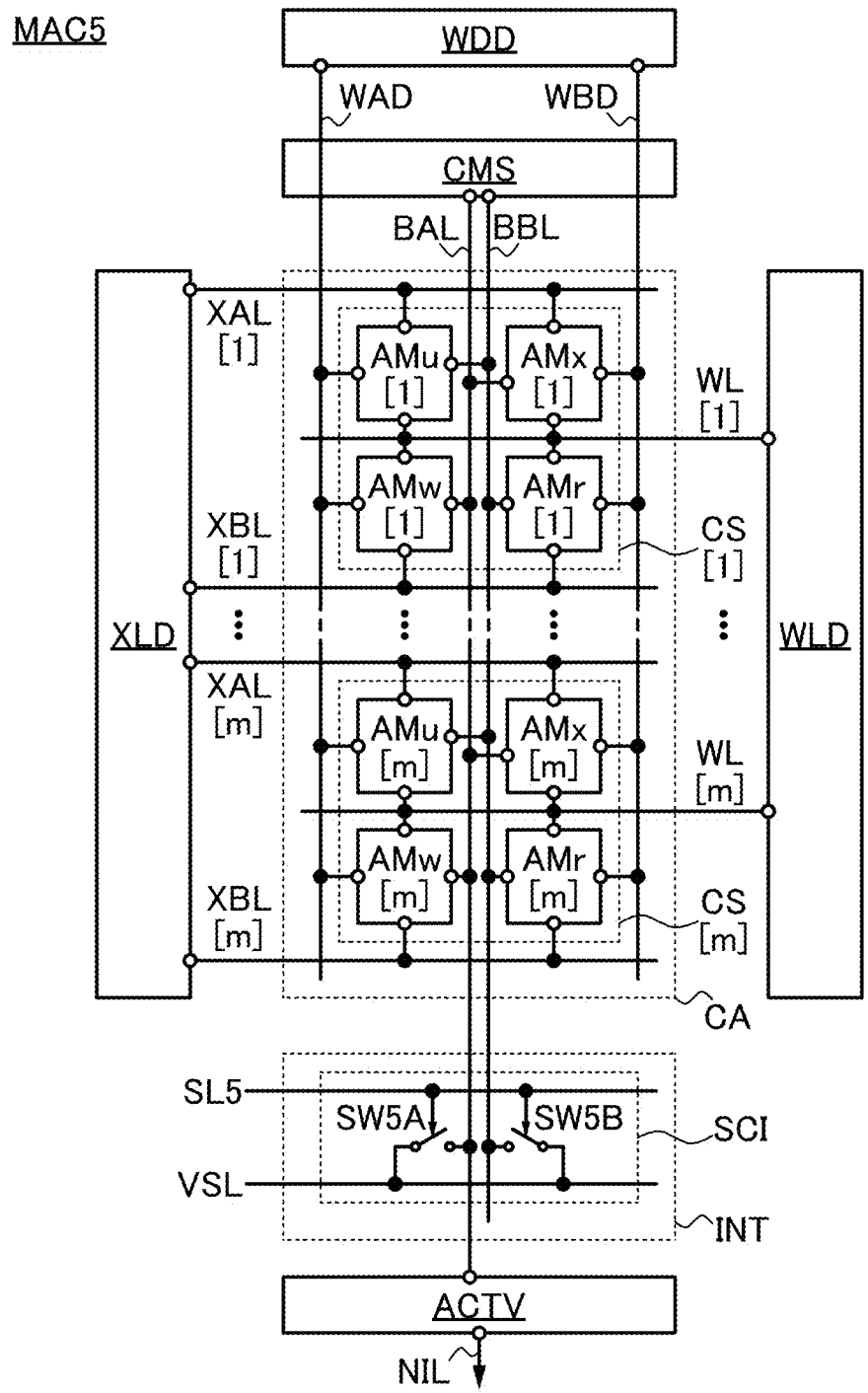
FIG. 12 is a block diagram illustrating an example of a semiconductor device.

Like the arithmetic circuit MAC1 or the like described above, an arithmetic circuit MAC5 illustrated in FIG. 12 shows a structure example of an arithmetic circuit capable of performing a product-sum operation and an arithmetic operation of a function. The arithmetic circuit MAC5 is a circuit that performs a product-sum operation of the plurality of pieces of first data retained in a plurality of memory cells described below and the plurality of pieces of input second data and performs an arithmetic operation of a function using the product-sum operation result.

The arithmetic circuit MAC5 includes, for example, the memory cell array CA, the circuit CMS, the circuit WDD, the circuit XLD, the circuit WLD, the circuit INT, and the circuit ACTV.

The memory cell array CA includes a circuit CS[1] to a circuit CS[m] (m here is an integer greater than or equal to 1). The circuit CS[1] to the circuit CS[m] each include the memory cell AMu, the memory cell AMx, the memory cell AMw, and the memory cell AMr. Although not illustrated in FIG. 12, the memory cell AMu, the memory cell AMx, the memory cell AMw, and the memory cell AMr included in the circuit CS[i] (i is an integer greater than or equal to 1 and less than or equal to m) are sometimes referred to as the memory cell AMu[i], the memory cell AMx[i], the memory cell AMw[i], and the memory cell AMr[i], respectively, in this specification and the like.

In the memory cell array CA, the memory cells are arranged in a matrix of 2m rows and 2 columns. In FIG. 12, for example, the memory cell AMu[i] is provided at an address of the 2i−1-th row and the first column, the memory cell AMw[i] is provided at an address of the 2i−1th row and the first column, the memory cell AMx[i] is provided at an address of the 2i−1-th row and the second column, and the memory cell AMr[i] is provided at an address of the 2i-th row and the second column.

The memory cells AMx, the memory cells AMw, the memory cells AMu, and the memory cells AMr each have a function of retaining voltage corresponding to the first data. Note that the voltage corresponding to the first data can be, for example, the difference between voltage retained in the memory cell AMu[i] and the memory cell AMw[i] and voltage retained in the memory cell AMx[i] and the memory cell AMr[i].

The memory cell AMu[1] is electrically connected to the wiring WAD, the wiring BBL, a wiring WL[1], and the wiring XAL[1]. The memory cell AMw[1] is electrically connected to the wiring WAD, the wiring BAL, the wiring WL[1], and the wiring XBL[1]. The memory cell AMx[1] is electrically connected to the wiring WBD, the wiring BAL, the wiring WL[1], and the wiring XAL[1]. The memory cell AMr[1] is electrically connected to the wiring WBD, the wiring BBL, the wiring WL[1], and the wiring XBL[1]. The memory cell AMu[m] is electrically connected to the wiring WAD, the wiring BBL, a wiring WL[m], and the wiring XAL[m]. The memory cell AMw[m] is electrically connected to the wiring WAD, the wiring BAL, the wiring WL[m], and the wiring XBL[m]. The memory cell AMx[m] is electrically connected to the wiring WBD, the wiring BAL, the wiring WL[m], and the wiring XAL[m]. The memory cell AMr[m] is electrically connected to the wiring WBD, the wiring BBL, the wiring WL[m], and the wiring XBL[m].

The detailed circuit structure examples of the memory cells AMu, the memory cells AMw, the memory cells AMx, and the memory cells AMr included in the circuit CS[1] to the circuit CS[m] will be described later.

The circuit CMS is electrically connected to the wiring BAL and the wiring BBL, for example. The circuit CMS has a function of supplying current to each of the memory cell AMx[1] to the memory cell AMx[m] and the memory cell AMw[1] to the memory cell AMw[m] through the wiring BAL and a function of supplying current to each of the memory cell AMu[1] to the memory cell AMu[m] and the memory cell AMr[1] to the memory cell AMr[m] through the wiring BBL. Note that the amount of current flowing through the wiring BAL and the amount of current flowing through the wiring BBL, which are from the circuit CMS, are preferably equal to each other.

For a specific structure example of the circuit CMS, refer to the above description of the circuit CMS that can be used in the arithmetic circuit MAC1.

For the circuit WDD, for example, refer to the above description of the circuit WDD that can be used in the arithmetic circuit MAC1.

The circuit WLD is electrically connected to the wiring WL[1] to the wiring WL[m], for example. The circuit WLD has a function of selecting a memory cell to which data is written when data is written to the memory cell included in the memory cell array CA. Specifically, for example, the wiring WL[i] is electrically connected to the memory cell AMu[i], the memory cell AMw[i], the memory cell AMx[i], and the memory cell AMr[i] included in the circuit CS[i]; thus, when the circuit WLD selects any one of the circuit CS[1] to the circuit CS[m] included in the memory cell array CA, the memory cell AMu, the memory cell AMw, the memory cell AMx, and the memory cell AMr included in the selected circuit CS become memory cells to which data is to be written.

For example, when data is written to the memory cells included in the circuit CS[i] in the memory cell array CA, the circuit WLD supplies a high-level potential to the wiring WL[i] and supplies a low-level potential to the wiring WL[1] to the wiring WL[m] except the wiring WL[i], thereby selecting the memory cell AMu[i], the memory cell AMw[i], the memory cell AMx[i], and the memory cell AMr[i], which are included in the circuit CS[i] and to which data is to be written.

For the circuit XLD, for example, refer to the above description of the circuit XLD that can be used in the arithmetic circuit MAC1.

For the circuit INT, for example, refer to the above description of the circuit INT that can be used in the arithmetic circuit MAC1.

For the circuit ACTV, for example, refer to the above description of the circuit ACTV that can be used in the arithmetic circuit MAC1.

Structure Example of Memory Cell Array CA

Next, structure examples of the memory cell AMu, the memory cell AMw, the memory cell AMx, and the memory cell AMr included in each of the circuit CS[1] to the circuit CS[m] in the memory cell array CA are described.

Figure 13:
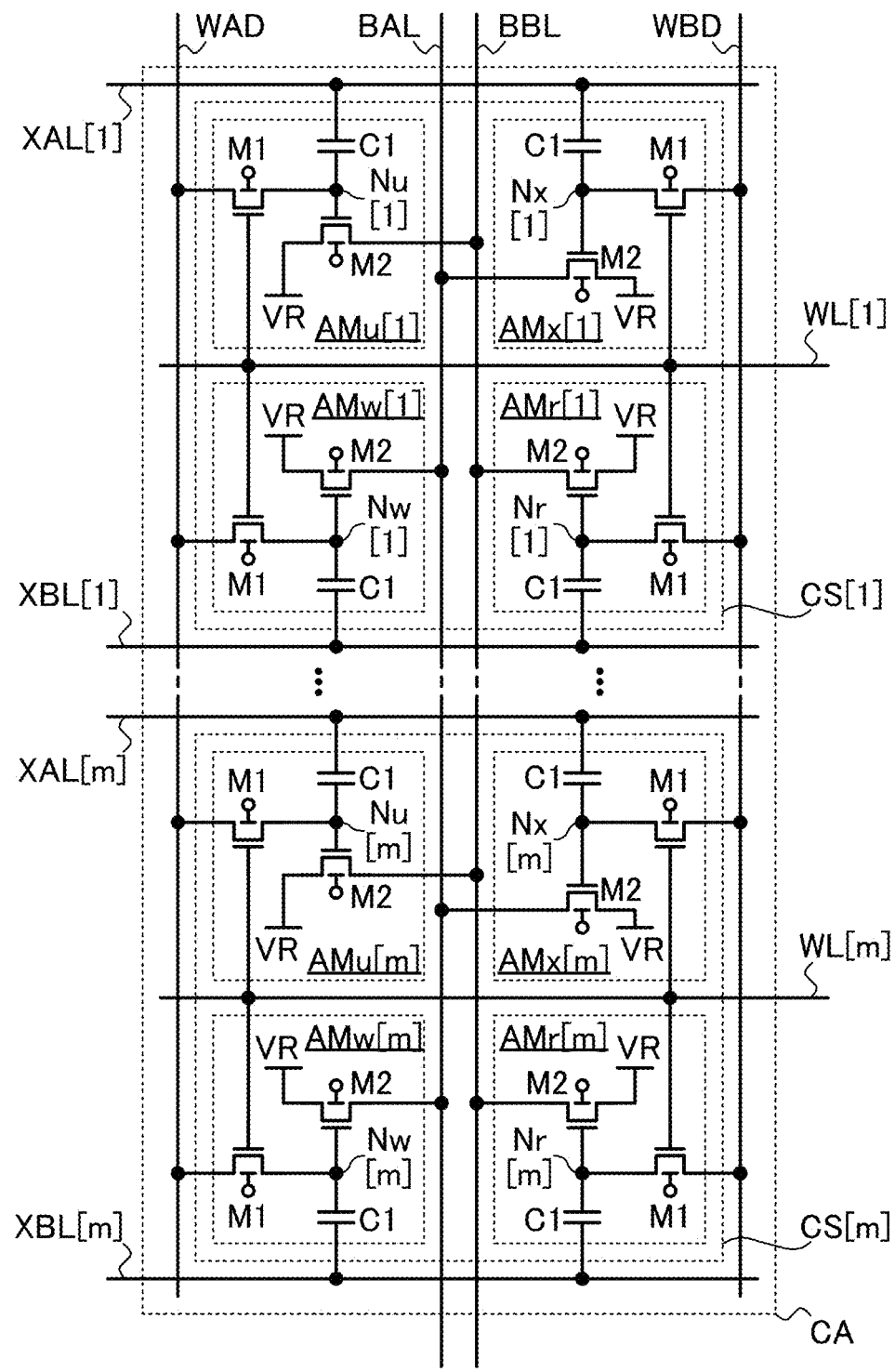
FIG. 13 is a circuit diagram illustrating a structure example of a circuit included in a semiconductor device.

FIG. 13 is a circuit diagram illustrating a structure example of the memory cell array CA. The memory cell array CA has a function of calculating a product-sum of the plurality of pieces of first data and the plurality of pieces of second data.

In the memory cell array CA illustrated in FIG. 13, the memory cells AMx, the memory cells AMu, the memory cells AMw, and the memory cells AMr each include the transistor M1, the transistor M2, and the capacitor C1.

For the transistor M1 and the transistor M2 included in each of the memory cell AMx, the memory cell AMu, the memory cell AMw, and the memory cell AMr, refer to the above description of the transistor M1 and the transistor M2 included in each of the memory cell AMx, the memory cell AMu, the memory cell AMw, and the memory cell AMr in the arithmetic circuit MAC1.

In each of the memory cells AMx, the memory cells AMu, the memory cells AMw, and the memory cells AMr, the first terminal of the transistor M1 is electrically connected to the gate of the transistor M2. The first terminal of the transistor M2 is electrically connected to the wiring VR. The first terminal of the capacitor C1 is electrically connected to the gate of the transistor M2.

In each of the memory cell AMu[1] to the memory cell AMu[m], the second terminal of the transistor M1 is electrically connected to the wiring WAD, and the second terminal of the transistor M2 is electrically connected to the wiring BBL. In the memory cell AMu[i], the gate of the transistor M1 is electrically connected to the wiring WL[i], and the second terminal of the capacitor C1 is electrically connected to the wiring XAL[i]. Note that the electrical connection portion of the first terminal of the transistor M1, the gate of the transistor M2, and the first terminal of the capacitor C1 in the memory cell AMu[1] is the node Nu[1], and the electrical connection portion of the first terminal of the transistor M1, the gate of the transistor M2, and the first terminal of the capacitor C1 in the memory cell AMu[m] is the node Nu[m].

In each of the memory cell AMw[1] to the memory cell AMw[m], the second terminal of the transistor M1 is electrically connected to the wiring WAD, and the second terminal of the transistor M2 is electrically connected to the wiring BAL. In the memory cell AMw[i], the gate of the transistor M1 is electrically connected to the wiring WL[i], and the second terminal of the capacitor C1 is electrically connected to the wiring XBL[i]. Note that the electrical connection portion of the first terminal of the transistor M1, the gate of the transistor M2, and the first terminal of the capacitor C1 in the memory cell AMw[1] is the node Nw[1], and the electrical connection portion of the first terminal of the transistor M1, the gate of the transistor M2, and the first terminal of the capacitor C1 in the memory cell AMw[m] is the node Nw[m].

In each of the memory cell AMx[1] to the memory cell AMx[m], the second terminal of the transistor M1 is electrically connected to the wiring WBD, and the second terminal of the transistor M2 is electrically connected to the wiring BAL. In the memory cell AMx[i], the gate of the transistor M1 is electrically connected to the wiring WL[i], and the second terminal of the capacitor C1 is electrically connected to the wiring XAL[i]. Note that the electrical connection portion of the first terminal of the transistor M1, the gate of the transistor M2, and the first terminal of the capacitor C1 in the memory cell AMx[1] is the node Nx[1], and the electrical connection portion of the first terminal of the transistor M1, the gate of the transistor M2, and the first terminal of the capacitor C1 in the memory cell AMx[m] is the node Nx[m].

In each of the memory cell AMr[1] to the memory cell AMr[m], the second terminal of the transistor M1 is electrically connected to the wiring WBD, and the second terminal of the transistor M2 is electrically connected to the wiring BBL. In the memory cell AMr[i], the gate of the transistor M1 is electrically connected to the wiring WL[i], and the second terminal of the capacitor C1 is electrically connected to the wiring XBL[i]. Note that the electrical connection portion of the first terminal of the transistor M1, the gate of the transistor M2, and the first terminal of the capacitor C1 in the memory cell AMr[1] is the node Nr[1], and the electrical connection portion of the first terminal of the transistor M1, the gate of the transistor M2, and the first terminal of the capacitor C1 in the memory cell AMr[m] is the node Nr[m].

The node Nx[1], the node Nx[m], the node Nu[1], the node Nu[m], the node Nw[1], the node Nw[m], the node Nr[1], and the node Nr[m] described above function as the retention nodes of the respective memory cells.

For the wiring VR, refer to the above description of the wiring VR included in the arithmetic circuit MAC1.

Operation Example of Arithmetic Circuit

Next, an operation example of the arithmetic circuit MAC5 will be described.

Figure 14:
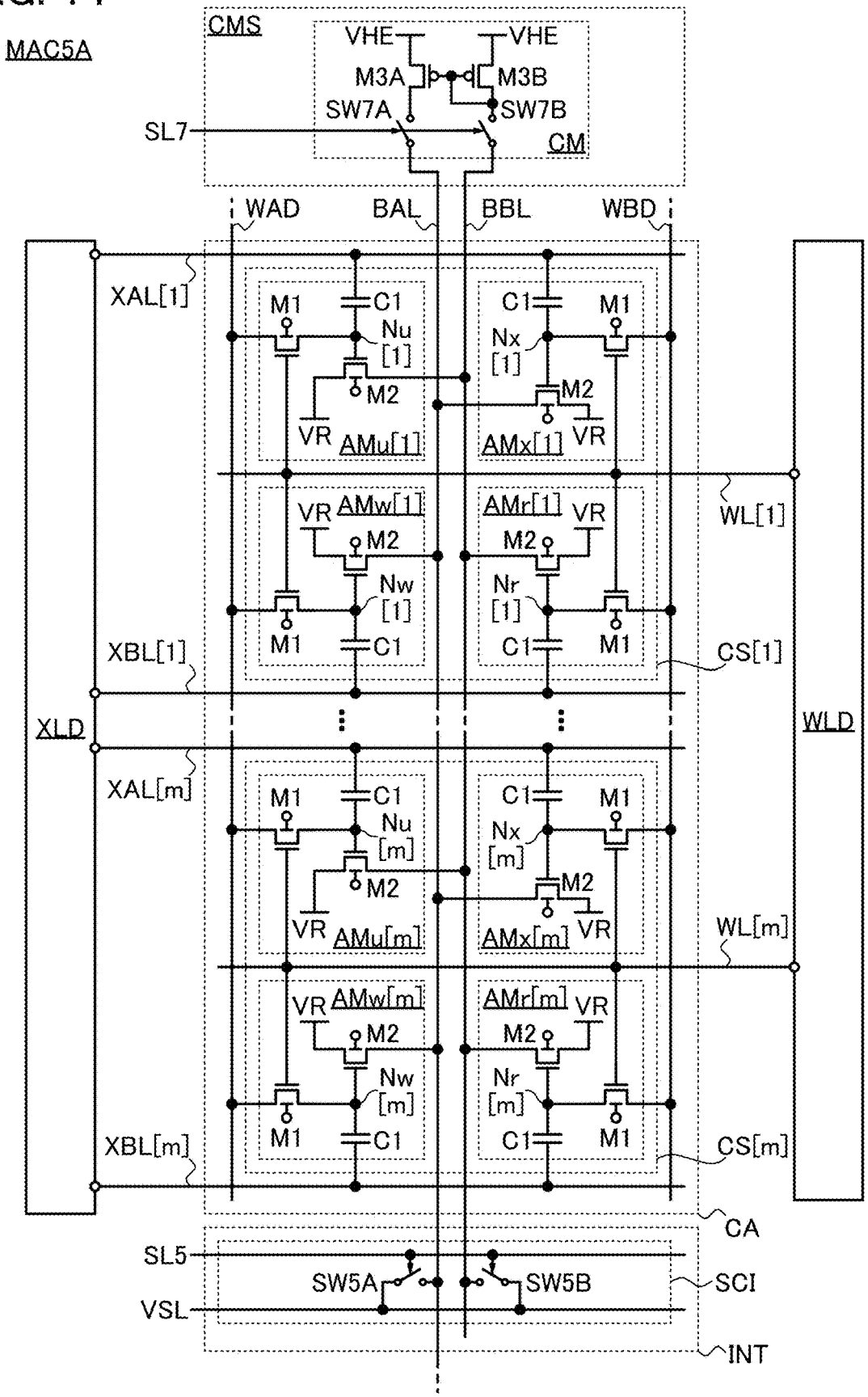
FIG. 14 is a circuit diagram illustrating an example of a semiconductor device.

The arithmetic circuit MAC5 here is an arithmetic circuit MAC5A illustrated in FIG. 14 in which the memory cell array CA in FIG. 13 is used as the memory cell array CA and the circuit CMS in FIG. 3A is used as the circuit CMS. Note that FIG. 14 mainly illustrates the memory cell array CA, the circuit CMS, the circuit XLD, the circuit WLD, and the circuit INT in the arithmetic circuit MAC5A. Although not illustrated, the circuit ACTV in FIG. 4A is used as the circuit ACTV in the arithmetic circuit MAC5A in FIG. 14.

FIG. 15 shows a timing chart of an operation example of the arithmetic circuit MAC5A. The timing chart in FIG. 15 shows changes in the potentials of the wiring WL[1], the wiring WL[m], the wiring SL4, the wiring SL5, the wiring SL7, the wiring WAD, the wiring WBD, the wiring XAL[1], the wiring XAL[m], the wiring XBL[1], the wiring XBL[m], the node Nx[1], the node Nx[m], the node Nu[1], the node Nu[m], the node Nw[1], the node Nw[m], the node Nr[1], and the node Nr[m] at and around Time T21 to Time T29. Note that in FIG. 15, a high-level potential is denoted by High and a low-level potential is denoted by Low.

In this operation example, the voltage supplied from the wiring VR is a ground potential.

<<Before Time T21>>

Before Time T21, the potentials of the node Nu[1] to the node Nu[m], the node Nw[1] to the node Nw[m], the node Nx[1] to the node Nx[m], and the node Nr[1] to the node Nr[m] are each a ground potential. Note that the ground potential is denoted by GND in FIG. 15.

A low-level potential is input to each of the wiring WAD and the wiring WBD from the circuit WDD (not illustrated in FIG. 14).

The reference potential $V_{RFP}$ is input to each of the wiring XAL[1] to the wiring XAL[m] and the wiring XBL[1] to the wiring XBL[m] from the circuit XLD. Note that $V_{RFP}$ can be a potential higher than a ground potential or a potential lower than a ground potential.

A low-level potential is input to each of the wiring WL[1] to the wiring WL[m] from the circuit WLD. Thus, the transistors M1 included in all of the memory cells AMx, the memory cells AMu, the memory cells AMw, and the memory cells AMr in the memory cell array CA are turned off.

A low-level potential is input to each of the wiring SL4, the wiring SL5, and the wiring SL7. Thus, the switch SW4A, the switch SW5A, the switch SW5B, the switch SW7A, and the switch SW7B are each turned off.

<<From Time T21 to Time T22>>

During the period from Time T21 to Time T22, a high-level potential is input to the wiring SL5. Thus, the switch SW5A and the switch SW5B included in the circuit INT are each turned on.

When the switch SW5A and the switch SW5B are each turned on, electrical continuity is established between the wiring VSL and each of the wiring BAL and the wiring BBL, whereby the potential from the wiring VSL is supplied to each of the wiring BAL and the wiring BBL. Note that in this operation example, the wiring VSL is a wiring for supplying an initialization potential to each of the wiring BAL and the wiring BBL, and the initialization potential is a ground potential. Thus, during the period from Time T21 to Time T22, the potentials of the wiring BAL and the wiring BBL are each a ground potential.

A ground potential is supplied from the wiring VR to the first terminals of the transistors M2 included in all of the memory cells AMx, the memory cells AMu, the memory cells AMw, and the memory cells AMr in the memory cell array CA; hence, the voltage between the first terminal and the second terminal of each of the transistors M2 is 0 V. In addition, since the potentials of the node Nx[1] to the node Nx[m], the node Nu[1] to the node Nu[m], the node Nw[1] to the node Nw[m], and the node Nr[1] to the node Nr[m] are each a ground potential, the transistors M2 are each turned off.

<<From Time T22 to Time T23>>

During the period from Time T22 to Time T23, a high-level potential is input to the wiring WL[1]. Thus, a high-level potential is applied to the gates of the transistors M1 included in the memory cell AMu[1], the memory cell AMw[1], the memory cell AMx[1], and the memory cell AMr[1] in the memory cell array CA, whereby the transistors M1 are each turned on.

Moreover, during the period from Time T22 to Time T23, a potential higher than a ground potential by $V_{W\alpha}[1]$ is input to the wiring WAD. At this time, the transistor M1 in each of the memory cell AMu[1] and the memory cell AMw[1] is in the on state; thus, electrical continuity is established between the wiring WAD and the node Nu[1] and electrical continuity is established between the wiring WAD and the node Nw[1]. Hence, a potential higher than a ground potential by $V_{W\alpha}[1]$ is input to each of the first terminal of the capacitor C1 in the memory cell AMu[1] (node Nu[1]) and the first terminal of the capacitor C1 in the memory cell AMw[1] (node Nw[1]).

Furthermore, during the period from Time T22 to Time T23, a potential higher than a ground potential by $V_{W\beta}[1]$ is input to the wiring WBD. At this time, the transistor M1 in each of the memory cell AMx[1] and the memory cell AMr[1] is in the on state; thus, electrical continuity is established between the wiring WBD and the node Nx[1] and electrical continuity is established between the wiring WBD and the node Nr[1]. Hence, a potential higher than a ground potential by $V_{W\beta}[1]$ is input to each of the first terminal of the capacitor C1 in the memory cell AMx[1] (node Nx[1]) and the first terminal of the capacitor C1 in the memory cell AMr[1] (node Nr[1]).

Here, $V_W[1]$ is defined as in Formula (1.1) described in this embodiment.

In Formula (1.1), $V_W[1]$ is voltage corresponding to the first one among the m pieces of first data. That is, $V_{W\alpha}[1]$ and $V_{W\beta}[1]$ can each be regarded as voltage corresponding to the first one among the m pieces of first data. Note that a combination of the voltages $V_{w\alpha}[1]$ and $V_{w\beta}[1]$ can be freely determined as long as Formula (1.1) is satisfied. For example, $V_{w\alpha}[1]$ can be voltage higher than $V_{w\beta}[1]$, voltage lower than $V_{w\beta}[1]$, or voltage equal to $V_{w\beta}[1]$. That is, $V_w[1]$ may be a positive voltage, 0, or a negative voltage.

Note that since the switch SW5A is in the on state, a ground potential is input to the wiring BAL. Moreover, a ground potential from the wiring VR is input to the first terminal of the transistor M2 in each of the memory cell AMu[1] and the memory cell AMw[1], so that the voltage between the first terminal and the second terminal of the transistor M2 is approximately 0 V. Thus, no current flows between the first terminal and the second terminal of the transistor M2 in each of the memory cell AMu[1] and the memory cell AMw[1].

Similarly, since the switch SW5B is in the on state, a ground potential is input to the wiring BBL. Moreover, a ground potential from the wiring VR is input to the first terminal of the transistor M2 in each of the memory cell AMx[1] and the memory cell AMr[1], so that the voltage between the first terminal and the second terminal of the transistor M2 is also approximately 0 V. Thus, no current flows between the first terminal and the second terminal of the transistor M2 in each of the memory cell AMx[1] and the memory cell AMr[1].

During the period from Time T22 to Time T23, a low-level potential has been continuously input to each of the wiring WL[2] to the wiring WL[m] since before Time T22. Thus, a low-level potential is applied to the gate of the transistor M1 included in each of the memory cells AMu, the memory cells AMw, the memory cells AMx, and the memory cells AMr in the circuit CS[2] to the circuit CS[m] in the memory cell array CA, so that the transistors M1 are each turned off. This prevents the data that has been input to each of the wiring WAD and the wiring WBD from being written to the node Nu[2] to the node Nu[m], the node Nw[2] to the node Nw[m], the node Nx[2] to the node Nx[m], and the node Nr[2] to the node Nr[m].

<<From Time T23 to Time T24>>

During the period from Time T23 to Time T24, a low-level potential is input to the wiring WL[1]. Thus, a low-level potential is applied to the gates of the transistors M1 included in the memory cell AMu[1], the memory cell AMw[1], the memory cell AMx[1], and the memory cell AMr[1] in the memory cell array CA, whereby the transistors M1 are each turned off.

When the transistor M1 in each of the memory cell AMu[1] and the memory cell AMw[1] is turned off, a potential higher than a ground potential by $V_{w\alpha}[1]$ is retained in each of the first terminal of the capacitor C1 in the memory cell AMu[1] (node Nu[1]) and the first terminal of the capacitor C1 in the memory cell AMw[1] (node Nw[1]). Moreover, when the transistor M1 in each of the memory cell AMx[1] and the memory cell AMr[1] is turned off, a potential higher than a ground potential by $V_w[1]$ is retained in each of the first terminal of the capacitor C1 in the memory cell AMx[1] (node Nx[1]) and the first terminal of the capacitor C1 in the memory cell AMr[1] (node Nr[1]).

During the period from Time T23 to Time T24, potentials are sequentially written to the memory cells AMu, the memory cells AMw, the memory cells AMx, and the memory cells AMr in the circuit CS[2] to the circuit CS[m-1], as in the operation of writing the potentials to the memory cell AMu[1], the memory cell AMw[1], the memory cell AMx[1], and the memory cell AMr[1] in the circuit CS[1] during the period from Time T22 to Time T23. Specifically, for example, signals making the potentials high level for a certain period are sequentially input to the wiring WL[2] to the wiring WL[m-1] and the potentials of the wiring WAD and the wiring WBD are changed in accordance with the signals, whereby the predetermined potentials can be written to the memory cells AMu, the memory cells AMw, the memory cells AMx, and the memory cells AMr in the circuit CS[2] to the circuit CS[m-1]. Note that $V_{w\alpha}[2]$ to $V_{w\alpha}[m-1]$ are sequentially written to the memory cell AMu[2] to the memory cell AMu[m-1] and the memory cell AMw[2] to the memory cell AMw[m-1]. Furthermore, $V_{w\beta}[2]$ to $V_{w\beta}[m-1]$ are sequentially written to the memory cell AMx[2] to the memory cell AMx[m-1] and the memory cell AMr[2] to the memory cell AMr[m-1] in parallel with the operation of writing the voltages to the memory cell AMu[2] to the memory cell AMu[m-1] and the memory cell AMw[2] to the memory cell AMw[m-1].

At this time, the memory cell AMx[p] positioned in the p-th row (p is an integer greater than or equal to 2 and less than or equal to m-1) retains the voltage $V_{w\beta}[p]$, and the memory cell AMu[p] retains the voltage $V_{w\alpha}[p]$. Here, as in Formula (1.1), the voltage $V_w[p]$ corresponding to the p-th one among the m pieces of first data is defined as in Formula (1.2) described in this embodiment.

In Formula (1.2), $V_w[p]$ is voltage corresponding to the p-th one among the m pieces of first data. That is, $V_{w\alpha}[p]$ and $V_{w\beta}[p]$ can each be regarded as voltage corresponding to the p-th one among the m pieces of first data. Note that a combination of the voltages $V_{w\alpha}[p]$ and $V_{w\beta}[p]$ can be freely determined as long as Formula (1.2) is satisfied. For example, $V_{w\alpha}[p]$ can be voltage higher than $V_{w\beta}[p]$, voltage lower than $V_{w\beta}[p]$, or voltage equal to $V_{w\beta}[p]$. That is, $V_w[p]$ may be a positive voltage, 0, or a negative voltage.

<<From Time T24 to Time T25>>

During the period from Time T24 to Time T25, a high-level potential is input to the wiring WL[m]. Thus, a high-level potential is applied to the gates of the transistors M1 included in the memory cell AMu[m], the memory cell AMw[m], the memory cell AMx[m], and the memory cell AMu[m] in the memory cell array CA, whereby the transistors M1 are each turned on.

Moreover, during the period from Time T24 to Time T25, a potential higher than a ground potential by $V_{w\alpha}[m]$ is input to the wiring WAD. At this time, the transistor M1 in each of the memory cell AMu[m] and the memory cell AMw[m] is in the on state; thus, electrical continuity is established between the wiring WAD and the node Nu[m] and electrical continuity is established between the wiring WAD and the node Nw[m]. Hence, a potential higher than a ground potential by $V_{w\alpha}[m]$ is input to each of the first terminal of the capacitor C1 in the memory cell AMu[m] (node Nu[m]) and the first terminal of the capacitor C1 in the memory cell AMw[m] (node Nw[m]).

Furthermore, during the period from Time T24 to Time T25, a potential higher than a ground potential by $V_{w\beta}[m]$ is input to the wiring WBD. At this time, the transistor M1 in each of the memory cell AMx[m] and the memory cell AMr[m] is in the on state; thus, electrical continuity is established between the wiring WBD and the node Nx[m] and electrical continuity is established between the wiring WBD and the node Nr[m]. Hence, a potential higher than a ground potential by $V_{w\beta}[m]$ is input to each of the first terminal of the capacitor C1 in the memory cell AMx[m] (node Nx[m]) and the first terminal of the capacitor C1 in the memory cell AMr[m] (node Nr[m]).

Here, $V_w[m]$ is defined as in Formula (1.3) described in this embodiment.

In Formula (1.3), $V_W[m]$ is voltage corresponding to the m-th one among the m pieces of first data. That is, $V_{W\alpha}[m]$ and $V_{W\beta}[m]$ can each be regarded as voltage corresponding to the m-th one among the m pieces of first data. Note that a combination of the voltages $V_{W\alpha}[m]$ and $V_{W\beta}[m]$ can be freely determined as long as Formula (1.3) is satisfied. For example, $V_{W\alpha}[m]$ can be voltage higher than $V_{W\beta}[m]$, voltage lower than $V_{W\beta}[m]$, or voltage equal to $V_{W\beta}[m]$. That is, $V_W[m]$ may be a positive voltage, 0, or a negative voltage.

Note that since the switch SW5A is in the on state, a ground potential is input to the wiring BAL. Moreover, a ground potential from the wiring VR is input to the first terminal of the transistor M2 in each of the memory cell AMu[m] and the memory cell AMw[m], so that the voltage between the first terminal and the second terminal of the transistor M2 is approximately 0 V. Thus, no current flows between the first terminal and the second terminal of the transistor M2 in each of the memory cell AMu[m] and the memory cell AMw[m].

Similarly, since the switch SW5B is in the on state, a ground potential is input to the wiring BBL. Moreover, a ground potential from the wiring VR is input to the first terminal of the transistor M2 in each of the memory cell AMx[m] and the memory cell AMr[m], so that the voltage between the first terminal and the second terminal of the transistor M2 is also approximately 0 V. Thus, no current flows between the first terminal and the second terminal of the transistor M2 in each of the memory cell AMx[m] and the memory cell AMr[m].

During the period from Time T24 to Time T25, a low-level potential has been continuously input to each of the wiring WL[1] to the wiring WL[m−1] since before Time T04. Thus, a low-level potential is applied to the gate of the transistor M1 included in each of the memory cells AMu, the memory cells AMw, the memory cells AMx, and the memory cells AMr in the circuit CS[1] to the circuit CS[m−1] in the memory cell array CA, so that the transistors M1 are each turned off. This prevents the data that has been input to each of the wiring WAD and the wiring WBD from being written to the node Nu[1] to the node Nu[m−1], the node Nw[1] to the node Nw[m−1], the node Nx[1] to the node Nx[m−1], and the node Nr[1] to the node Nr[m−1].

<<From Time T25 to Time T26>>

During the period from Time T25 to Time T26, a low-level potential is input to the wiring WL[m]. Thus, a low-level potential is applied to the gates of the transistors M1 included in the memory cell AMu[m], the memory cell AMw[m], the memory cell AMx[m], and the memory cell AMr[m] in the memory cell array CA, whereby the transistors M1 are each turned off.

When the transistor M1 in each of the memory cell AMu[m] and the memory cell AMw[m] is turned off, a potential higher than a ground potential by $V_{W\alpha}[m]$ is retained in each of the first terminal of the capacitor C1 in the memory cell AMu[m] (node Nu[m]) and the first terminal of the capacitor C1 in the memory cell AMw[m] (node Nw[m]). Moreover, when the transistor M1 in each of the memory cell AMx[m] and the memory cell AMr[m] is turned off, a potential higher than a ground potential by $V_{W\beta}[m]$ is retained in each of the first terminal of the capacitor C1 in the memory cell AMx[m] (node Nx[m]) and the first terminal of the capacitor C1 in the memory cell AMr[m] (node Nr[m]).

By the operation from Time T21 to Time T26, the voltage corresponding to the first data can be written to each of the memory cells AMx, the memory cells AMu, the memory cells AMw, and the memory cells AMr included in the memory cell array CA.

<<From Time T26 to Time T27>>

During the period from Time T26 to Time T27, a low-level potential is input to the wiring SL5. Thus, the switch SW5A and the switch SW5B in the circuit INT are each turned off.

<<From Time T27 to Time T28>>

During the period from Time T27 to Time T28, the potentials corresponding to the m pieces of second data are input to the wiring XAL[1] to the wiring XAL[m]. Here, for example, a potential input from the circuit XLD to the wiring XAL[1] is higher than a ground potential by $V_{X\alpha}[1]$, a potential input from the circuit XLD to the wiring XAL[p] is higher than a ground potential by $V_{X\alpha}[p]$, and a potential input from the circuit XLD to the wiring XAL[m] is higher than a ground potential by $V_{X\alpha}[m]$.

The potential of the wiring XAL[1] increases from a ground potential to $V_{X\alpha}[1]$; thus, $V_{X\alpha}[1]$ is applied to the second terminal of the capacitor C1 in each of the memory cell AMu[1] and the memory cell AMx[1]. Since the node Nu[1] and the node Nx[1] are each in an electrically floating state at this time, the potentials of the node Nu[1] and the node Nx[1] are each changed by capacitive coupling of the capacitor C1.

In each of the memory cell AMu[1] and the memory cell AMx[1], the amount of increase in the gate potential of the transistor M2 is a potential obtained by multiplying a change in the potential of the wiring XAL[1] by a capacitive coupling coefficient determined by the memory cell structure. The capacitive coupling coefficient is calculated using the capacitance of the capacitor C1, the gate capacitance of the transistor M2, the parasitic capacitance, and the like. In this operation example, the capacitive coupling coefficient of each of the memory cell AMu and the memory cell AMx is set to h.

Thus, when a change in the potential of the wiring XAL[1] is $V_{X\alpha}[1]$, a change in the potential of each of the node Nu[1] and the node Nx[1] is $hV_{X\alpha}[1]$. That is, the potential of the node Nu[1] is $V_{W\alpha}[1]+hV_{X\alpha}[1]$, and the potential of the node Nx[1] is $V_{W\beta}[1]+hV_{X\alpha}[1]$.

In this operation example, the capacitive coupling coefficient in the memory cells included in the memory cell array CA other than the memory cell AMu[1] and the memory cell AMx[1] is described as h.

The potential of the wiring XAL[p] increases from a ground potential to $V_{X\alpha}[p]$; thus, $V_{X\alpha}[p]$ is applied to the second terminal of the capacitor C1 in each of the memory cell AMu[p] and the memory cell AMx[p]. Since the node Nu[p] and the node Nx[p] are each in an electrically floating state at this time, the potentials of the node Nu[p] and the node Nx[p] are each changed by capacitive coupling of the capacitor C1. Specifically, the potential of the node Nu[p] is $V_{W\alpha}[p]+hV_{X\alpha}[p]$, and the potential of the node Nx[p] is $V_{W\beta}[p]+hV_{X\alpha}[p]$.

The potential of the wiring XAL[m] increases from a ground potential to $V_{X\alpha}[m]$; thus, $V_{X\alpha}[m]$ is applied to the second terminal of the capacitor C1 in each of the memory cell AMu[m] and the memory cell AMx[m]. Since the node Nu[m] and the node Nx[m] are each in an electrically floating state at this time, the potentials of the node Nu[m] and the node Nx[m] are each changed by capacitive coupling of the capacitor C1. Specifically, the potential of the node Nu[m] is $V_{W\alpha}[m]+hV_{X\alpha}[m]$, and the potential of the node Nx[m] is $V_{W\beta}[m]+hV_{X\alpha}[m]$.

During the period from Time T27 to Time T28, the potentials corresponding to the m pieces of second data are input to the wiring XBL[1] to the wiring XBL[m]. Here, for example, a potential input from the circuit XLD to the wiring XBL[1] is higher than a ground potential by $V_{X\beta}[1]$, a potential input from the circuit XLD to the wiring XBL[p] is higher than a ground potential by $V_{X\beta}[p]$, and a potential input from the circuit XLD to the wiring XBL[m] is higher than a ground potential by $V_{X\beta}[m]$.

The potential of the wiring XBL[1] increases from a ground potential to $V_{X\beta}[1]$; thus, $V_{X\beta}[1]$ is applied to the second terminal of the capacitor C1 in each of the memory cell AMw[1] and the memory cell AMr[1]. Since the node Nw[1] and the node Nr[1] are each in an electrically floating state at this time, the potentials of the node Nw[1] and the node Nr[1] are each changed by capacitive coupling of the capacitor C1.

Note that in this operation example, the capacitive coupling coefficient of each of the memory cell AMw and the memory cell AMr included in the memory cell array CA is described as h, as in the memory cell AMx and the memory cell AMu.

Thus, when a change in the potential of the wiring XBL[1] is $V_{X\beta}[1]$, a change in the potential of each of the node Nw[1] and the node Nr[1] is $hV_{X\beta}[1]$. That is, the potential of the node Nw[1] is $V_{W\alpha}[1]+hV_{X\beta}[1]$, and the potential of the node Nr[1] is $V_{W\beta}[1]+hV_{X\beta}[1]$.

The potential of the wiring XBL[p] increases from a ground potential to $V_{X\beta}[p]$; thus, $V_{X\beta}[p]$ is applied to the second terminal of the capacitor C1 in each of the memory cell AMw[p] and the memory cell AMr[p]. Since the node Nw[p] and the node Nr[p] are each in an electrically floating state at this time, the potentials of the node Nw[p] and the node Nr[p] are each changed by capacitive coupling of the capacitor C1. Specifically, the potential of the node Nw[p] is $V_{W\alpha}[p]+hV_{X\beta}[p]$, and the potential of the node Nr[p] is $V_{W\beta}[p]+hV_{X\beta}[p]$.

The potential of the wiring XBL[m] increases from a ground potential to $V_{X\beta}[m]$; thus, $V_{X\beta}[m]$ is applied to the second terminal of the capacitor C1 in each of the memory cell AMw[m] and the memory cell AMr[m]. Since the node Nw[m] and the node Nr[m] are each in an electrically floating state at this time, the potentials of the node Nw[m] and the node Nr[m] are each changed by capacitive coupling of the capacitor C1. Specifically, the potential of the node Nw[m] is $V_{W\alpha}[m]+hV_{X\beta}[m]$, and the potential of the node Nu[m] is $V_{W\beta}[m]+hV_{X\beta}[m]$.

Here, $V_X[1]$, $V_X[p]$, and $V_X[m]$ are respectively defined as in Formula (1.4) to Formula (1.6) described in this embodiment.

$V_X[1]$ to $V_X[m]$ in Formula (1.4) to Formula (1.6) are each voltage corresponding to the second data. That is, $V_{X\alpha}[1]$ to $V_{X\alpha}[m]$ and $V_{X\beta}[1]$ to $V_{X\beta}[m]$ can each be regarded as voltage corresponding to the second data. Note that a combination of the voltages $V_{X\alpha}[i]$ and $V_{X\beta}[i]$ can be freely determined as long as Formula (1.4) to Formula (1.6) are satisfied. For example, $V_{X\alpha}[i]$ can be voltage higher than $V_{X\beta}[i]$, voltage lower than $V_{X\beta}[i]$, or voltage equal to $V_{X\beta}[i]$. That is, $V_X[i]$ may be a positive voltage, 0, or a negative voltage.

<<From Time T28 to Time T29>>

During the period from Time T28 to Time T29, a high-level potential is input to the wiring SL4 and the wiring SL7. Thus, the switch SW7A and the switch SW7B in the circuit CMS and the switch SW4A in the circuit ACTV are each turned on.

At this time, electrical continuity is established between the second terminal of the transistor M2 included in each of the memory cell AMx[1] to the memory cell AMx[m] and the memory cell AMw[1] to the memory cell AMw[m] and the first terminal of the transistor M3A included in the circuit CM through the wiring BAL. In addition, electrical continuity is established between the second terminal of the transistor M2 included in each of the memory cell AMx[1] to the memory cell AMx[m] and the memory cell AMw[1] to the memory cell AMw[m] and the first terminal of the circuit IVC included in the circuit ACTV through the wiring BAL. Moreover, electrical continuity is established between the second terminal of the transistor M2 included in each of the memory cell AMu[1] to the memory cell AMu[m] and the memory cell AMr[1] to the memory cell AMr[m] and the first terminal of the transistor M3B included in the circuit CM through the wiring BBL.

Here, the current flowing from the second terminal to the first terminal of the transistor M2 in each of the memory cells AMx, the memory cells AMu, the memory cells AMw, and the memory cells AMr is considered.

Assuming that the current flowing from the wiring BAL to the first terminal of the transistor M2 in the memory cell AMx[1] through its second terminal is $I_{AMx[1]}$, $I_{AMx[1]}$ can be expressed in a manner similar to that of Formula (1.7) described in this embodiment.

In Formula (1.7), k is a constant determined by the channel length, the channel width, the mobility, the capacitance of a gate insulating film, and the like of the transistor M2. Furthermore, $V_{th}$ is the threshold voltage of the transistor M2. Note that the constant k can be applied not only to the memory cells AMx but also to the memory cells AMu, the memory cells AMw, and the memory cells AMr. In addition, the threshold voltage of the transistor M2 of not only the memory cells AMx but also the memory cells AMu, the memory cells AMw, and the memory cells AMr is denoted as $V_{th}$.

Assuming that the current flowing from the wiring BAL to the first terminal of the transistor M2 in the memory cell AMx[m] through its second terminal is $I_{AMx[m]}$, $I_{AMx[m]}$ can be expressed in a manner similar to that of Formula (1.7) described in this embodiment.

That is, assuming that the total amount of current flowing from the wiring BAL to the second terminals of the transistors M2 in the memory cell AMx[1] to the memory cell AMx[m] is $I_x$, $I_x$ can be expressed in a manner similar to that of Formula (1.9) described in this embodiment according to Formula (1.7) and Formula (1.8).

Similarly, assuming that the current flowing from the wiring BAL to the first terminal of the transistor M2 in the memory cell AMw[1] through its second terminal is $I_{AMw}[1]$ and the current flowing from the wiring BAL to the first terminal of the transistor M2 in the memory cell AMw[m] through its second terminal is $I_{AMw[m]}$, $I_{AMw[1]}$ and $I_{AMw[m]}$ can be expressed in a manner similar to those of Formula (1.10) and Formula (1.11) described in this embodiment.

That is, assuming that the total amount of current flowing from the wiring BAL to the second terminals of the transistors M2 in the memory cell AMw[1] to the memory cell AMw[m] is $I_w$, $I_w$ can be expressed in a manner similar to that of Formula (1.12) described in this embodiment according to Formula (1.10) and Formula (1.11).

Similarly, assuming that the current flowing from the wiring BBL to the first terminal of the transistor M2 in the memory cell AMu[1] through its second terminal is $I_{AMu[1]}$ and the current flowing from the wiring BBL to the first terminal of the transistor M2 in the memory cell AMu[m]

through its second terminal is $I_{AMu[m]}$, $I_{AMu[1]}$ and $I_{AMu[m]}$ can be expressed in a manner similar to those of Formula (1.13) and Formula (1.14) described in this embodiment.

That is, assuming that the total amount of current flowing from the wiring BBL to the second terminals of the transistors M2 in the memory cell AMu[1] to the memory cell AMu[m] is $I_u$, $I_u$ can be expressed in a manner similar to that of Formula (1.15) described in this embodiment according to Formula (1.13) and Formula (1.14).

Similarly, assuming that the current flowing from the wiring BBL to the first terminal of the transistor M2 in the memory cell AMr[1] through its second terminal is $I_{AMr[1]}$ and the current flowing from the wiring BBL to the first terminal of the transistor M2 in the memory cell AMr[m] through its second terminal is $I_{AMr[m]}$, $I_{AMr[1]}$ and $I_{AMr[m]}$ can be expressed by the following formulae in a manner similar to those of Formula (1.16) and Formula (1.17) described in this embodiment.

That is, assuming that the total amount of current flowing from the wiring BBL to the second terminals of the transistors M2 in the memory cell AMr[1] to the memory cell AMr[m] is $I_r$, $I_r$ can be expressed in a manner similar to that of Formula (1.18) described in this embodiment according to Formula (1.16) and Formula (1.17).

During the period from Time T28 to Time T29, the switch SW7B included in the circuit CMS is in the on state and the switch SW5B included in the circuit INT is in the off state; thus, the current with the total amount $I_u+I_r$ flowing to the memory cell AMu[1] to the memory cell AMu[m] and the memory cell AMr[1] to the memory cell AMr[m] through the wiring BBL flows from the wiring VHE through the first terminal of the transistor M3B. At this time, the voltage of the first terminal (gate) of the transistor M3B is voltage corresponding to the current amount $I_u+I_r$.

Since the circuit CM is the current mirror circuit, the amount of current flowing between the first terminal and the second terminal of the transistor M3B is substantially equal to the amount of current flowing between the first terminal and the second terminal of the transistor M3A. During the period from Time T12 to Time T13, the switch SW7A included in the circuit CMS is in the on state; thus, the amount of current flowing from the wiring VHE to the wiring BAL through the transistor M3A is $I_u+I_r$.

Since the memory cell AMx[1] to the memory cell AMx[m] and the memory cell AMw[1] to the memory cell AMw[m] are electrically connected to the wiring BAL, current with the amount $I_x$ flows from the wiring BAL to the memory cell AMx[1] to the memory cell AMx[m] and current with the amount $I_w$ flows from the wiring BAL to the memory cell AMw[1] to the memory cell AMw[m].

In addition, since the switch SW5A and the switch SW5B included in the circuit INT are in the off state and the switch SW4A included in the circuit ACTV is in the on state, current flows from the wiring BAL to the first terminal of the circuit IVC included in the circuit ACTV through the switch SW4A. Assuming that the amount of current is $I_{EV}$, $I_{EV}$ can be expressed in a manner similar to that of Formula (1.19) described in this embodiment.

Thus, Formula (1.19) can be expressed by the following formula with the use of Formula (1.1) to Formula (1.6), Formula (1.9), Formula (1.12), Formula (1.15), and Formula (1.18) in a manner similar to that of Formula (1.20).

[Formula 21]

$$I_{EV} = 2hk\sum_{i=1}^{m}(V_{W\alpha}[i] - V_{W\beta}[i])(V_{X\alpha}[i] - V_{X\beta}[i]) \quad (1.23)$$

$$= 2hk\sum_{i=1}^{m}V_W[i]V_X[i]$$

According to Formula (1.23), the amount $I_{EV}$ of current input from the wiring BAL to the circuit ACTV is proportional to the product-sum of the potentials $V_W[1]$ to $V_W[m]$ corresponding to the first data and the potentials $V_X[1]$ to $V_X[m]$ corresponding to the second data. That is, the product-sum of the first data and the second data can be expressed as the amount $I_{EV}$ of current.

The current with $I_{EV}$ flowing through the first terminal of the circuit IVC included in the circuit ACTV enables the voltage corresponding to $I_{EV}$ to be output to the third terminal of the circuit IVC. After that, the voltage is input to the first terminal of the circuit ACF to be used for an arithmetic operation of a function system defined in advance by the circuit ACF, so that the arithmetic operation result is output as voltage (or current, for example) from the wiring NIL.

Formula (1.1) to Formula (1.3) can each be modified into $V_{W\alpha}[i]=V_{W\beta}[i]+V_W[i]$. That is, the memory cell AMu[i] and the memory cell AMw[i] retain $V_{W\beta}[i]+V_W[i]$. Since $V_{W\beta}[i]$ can be a given voltage, $V_{W\beta}[1]$ to $V_{W\beta}[m]$ may be the same voltage. Assuming that each of $V_{W\beta}[1]$ to $V_{W\beta}[m]$ is $V_{PR}$, for example, the memory cell AMu[i] and the memory cell AMw[i] each retain $V_{PR}+V_W[i]$, and the memory cell AMx[i] and the memory cell AMr[i] each retain $V_{PR}$. When each of $V_{W\beta}[1]$ to $V_{W\beta}[m]$ is $V_{PR}$ in this manner, the arithmetic operation of Formula (1.23) can be performed similarly by retaining voltage obtained by addition of the voltage corresponding to the first data to the reference voltage $V_{PR}$ in the memory cell AMu and the memory cell AMw and by retaining the reference voltage in the memory cell AMx and the memory cell AMr.

Formula (1.4) to Formula (1.6) can each be modified into $V_{X\alpha}[i]=V_{X\beta}[i]+V_X[i]$. That is, during the period from Time T11 to Time T12, $V_{X\beta}[i]+V_X[i]$ is input to the wiring XAL[i]. Since $V_{X\beta}[i]$ can be a given voltage, $V_{X\beta}[1]$ to $V_{X\beta}[m]$ may be the same voltage. Assuming that each of $V_{X\beta}[1]$ to $V_{X\beta}[m]$ is $V_{RFP}$, for example, $V_{RFP}+V_X[i]$ is input to the wiring XAL[i], and $V_{RFP}$ is input to the wiring XBL[i]. When each of $V_{X\beta}[1]$ to $V_{X\beta}[m]$ is $V_{RFP}$ in this manner, the arithmetic operation of Formula (1.23) can be performed similarly by inputting voltage obtained by addition of the voltage corresponding to the second data to the reference voltage $V_{RFP}$ to the wiring XAL and by inputting the reference voltage to the wiring XBL.

Structure Example 5 of Semiconductor Device

Described here is a semiconductor device that is capable of performing a product-sum operation of the plurality of pieces of first data and the plurality of pieces of second data and is different from the arithmetic circuit MAC5 in FIG. 12.

Figure 16:
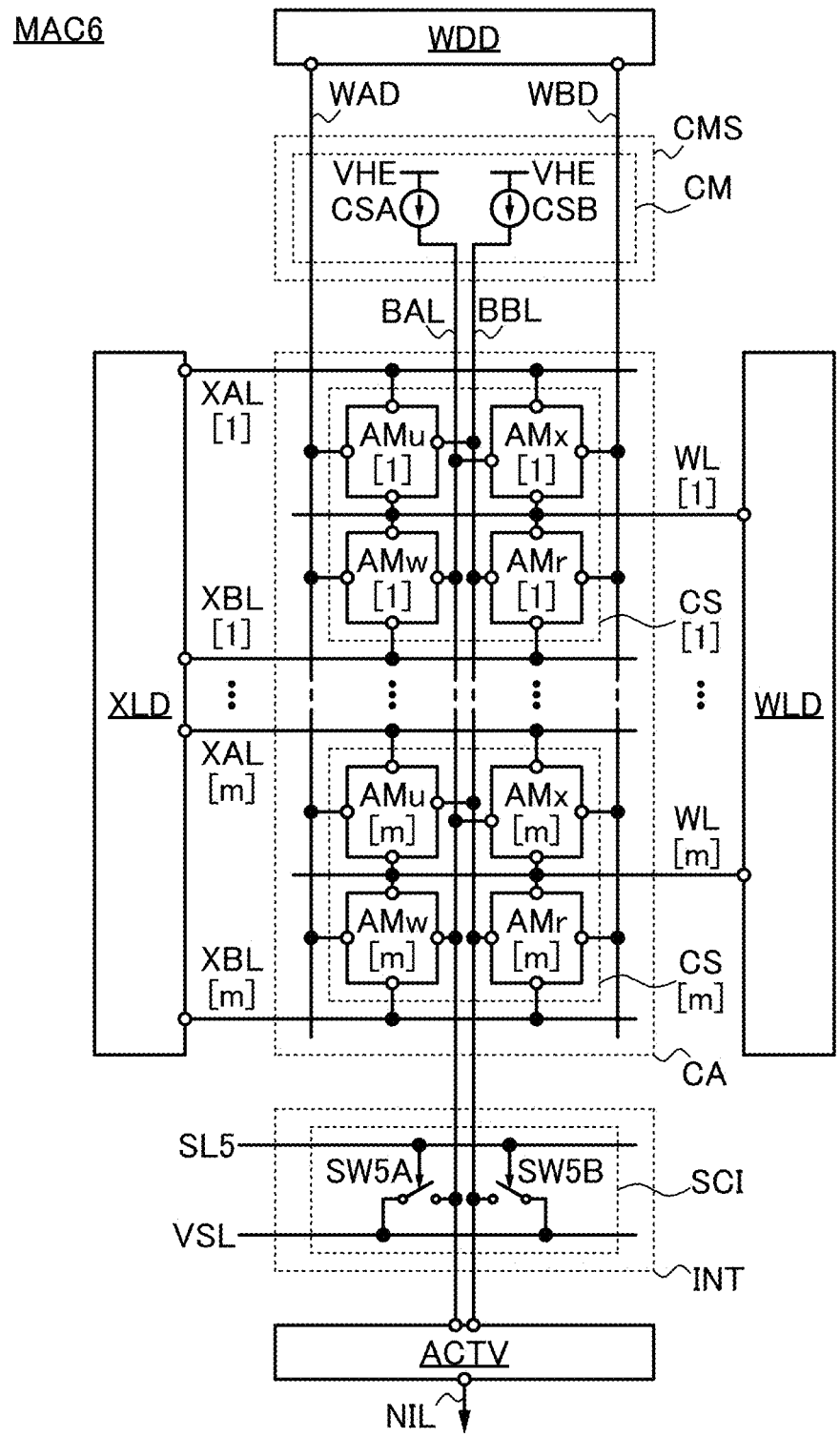
FIG. 16 is a block diagram illustrating an example of a semiconductor device.

Like the arithmetic circuit MAC5 in FIG. 12, an arithmetic circuit MAC6 in FIG. 16 is an example of a semiconductor device capable of performing a product-sum operation of the plurality of pieces of first data and the plurality of pieces of second data. Note that the arithmetic circuit MAC6 is different from the arithmetic circuit MAC5 in the circuit structure of the circuit CMS and in that the wiring BBL is electrically connected to the circuit ACTV.

The circuit CMS included in the arithmetic circuit MAC6 includes the current source CSA and the current source CSB. The input terminal of the current source CSA is electrically connected to the wiring VHE, and the output terminal of the current source CSA is electrically connected to the wiring BAL. The input terminal of the current source CSB is electrically connected to the wiring VHE, and the output terminal of the current source CSB is electrically connected to the wiring BBL.

Note that the circuit CMS that is included in the arithmetic circuit MAC6 and has the above-described circuit structure does not have a function of the current mirror circuit illustrated in FIG. 3A and FIG. 3B.

The wiring VHE can be a wiring for supplying a constant voltage as in the description of the circuit CMS in FIG. 3A and FIG. 3B, for example. The constant voltage is preferably a high-level potential, for example.

The current source CSA and the current source CSB each have a function of outputting a constant current to the output terminal when a power supply potential is input to the input terminal. Note that the amount of current output to the output terminal of the current source CSA is preferably equal to the amount of current output to the output terminal of the current source CSB. Specifically, the amount of current flowing from the output terminal of the current source CSA to the wiring BAL is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing from the output terminal of the current source CSB to the wiring BBL. Note that the above-described lower limits and upper limits can be combined with each other.

As described above, the wiring BBL is electrically connected to the circuit ACTV. The circuit ACTV in FIG. 16 preferably has a function of outputting the voltage corresponding to the amount of current, which is the difference between the current flowing from the wiring BAL to the circuit ACTV and the current flowing from the wiring BBL to the circuit ACTV, a function of performing an arithmetic operation according to a function system defined in advance using the voltage, and a function of outputting the result of the arithmetic operation of the function to the wiring NIL, for example.

Specifically, the circuit ACTV included in the arithmetic circuit MAC6 in FIG. 16 can be the circuit ACTV illustrated in FIG. 9, for example.

When a high-level potential is input to the wiring SL4 to turn on each of the switch SW4A and the switch SW4B, for example, the circuit ACTV in FIG. 9 can supply the current from the wiring BAL to the first terminal of the circuit IVC and can supply the current from the wiring BBL to the third terminal of the circuit IVC.

Assuming that the amount of current supplied from the current source CSA and the current source CSB respectively to the wiring BAL and the wiring BBL is $I_{CS}$, the total amount of current flowing from the wiring BAL to the memory cell AMx[1] to the memory cell AMx[m] is $I_x$, and the total amount of current flowing from the wiring BAL to the memory cell AMw[1] to the memory cell AMw[m] is $I_w$ in the arithmetic circuit MAC6 in FIG. 16, for example, the amount of current flowing from the wiring BAL to the first terminal of the circuit IVC is $I_{CS} - I_x - I_w$. In addition, assuming that the total amount of current flowing from the wiring BBL to the memory cell AMu[1] to the memory cell AMu[m] is $I_u$ and the total amount of current flowing from the wiring BBL to the memory cell AMr[1] to the memory cell AMr[m] is $I_r$, the amount of current flowing from the wiring BBL to the third terminal of the circuit IVC is $I_{CS} - I_u - I_r$.

In the case where the circuit IVC in FIG. 9 is a subtraction circuit (e.g., in the case where the load LEA and the load LEB are resistors), the second terminal of the circuit IVC outputs the voltage corresponding to the difference $(-I_u - I_r + I_x + I_w)$ between the amount of current input to the first terminal of the circuit IVC and the amount of current input to the third terminal of the circuit IVC. The current amount corresponding to the difference depends on the sum of products of the plurality of pieces of first data and the plurality of pieces of second data according to Formula (1.19) and Formula (1.20); thus, the voltage output from the second terminal of the circuit IVC can be regarded as voltage corresponding to the result of the sum of products of the plurality of pieces of first data and the plurality of pieces of second data.

After that, the voltage is input to the first terminal of the circuit ACF to be used for an arithmetic operation of a function system defined in advance by the circuit ACF, so that the arithmetic operation result is output as voltage (or current, for example) from the wiring NIL.

Structure Example 6 of Semiconductor Device

Described next is a semiconductor device that is capable of performing a product-sum operation of the plurality of pieces of first data and the plurality of pieces of second data and is different from the arithmetic circuit MAC5 in FIG. 12 and the arithmetic circuit MAC6 in FIG. 16.

Figure 17:
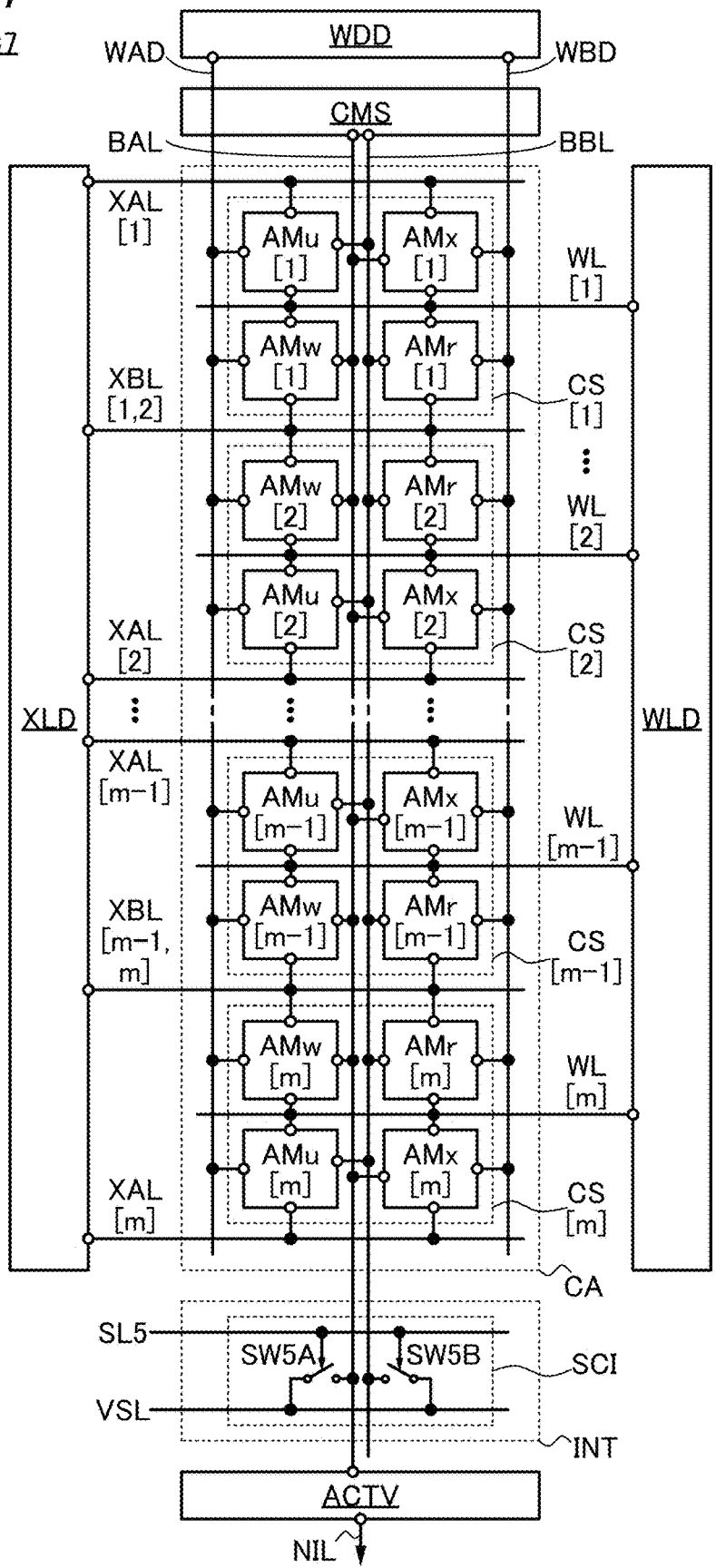
FIG. 17 is a block diagram illustrating an example of a semiconductor device.

Like the arithmetic circuit MAC5 and the arithmetic circuit MAC6, an arithmetic circuit MAC7 in FIG. 17 is an example of a semiconductor device capable of performing a product-sum operation of the plurality of pieces of first data and the plurality of pieces of second data. The arithmetic circuit MAC7 is a modification example of the arithmetic circuit MAC5, and is different from the arithmetic circuit MAC5 in that the wiring XBL[1] and the wiring XBL[2] in the arithmetic circuit MAC5 are combined into one wiring XBL[1,2] and the wiring XBL[m-1] and the wiring XBL[m] in the arithmetic circuit MAC5 are combined into one wiring XBL[m-1,m]. That is, the number of wirings XBL in the arithmetic circuit MAC7 in FIG. 17 is m/2. Note that in the arithmetic circuit MAC7 in FIG. 17, m is an even number greater than or equal to 2.

Thus, the arithmetic circuit MAC7 illustrated in FIG. 17 has a structure in which the memory cell AMw[1], the memory cell AMr[1], the memory cell AMw[2], and the memory cell AMr[2] are electrically connected to the wiring XBL[1,2] and the memory cell AMw[m-1], the memory cell AMr[m-1], the memory cell AMw[m], and the memory cell AMr[m] are electrically connected to the wiring XBL[m-1,m].

In the memory cell array CA in FIG. 17, the memory cells are arranged in a matrix of 2m rows and 2 columns as in the arithmetic circuit MAC5. In FIG. 17, for example, the memory cell AMu[i] is provided at an address of the 2i-1-th row and the first column, the memory cell AMw[i] is provided at an address of the 2i-th row and the first column, the memory cell AMx[i] is provided at an address of the 2i-1-th row and the second column, the memory cell AMr[i] is provided at an address of the 2i-th row and the second column, the memory cell AMu[i+1] is provided at an address of the 2i+2-th row and the first column, the memory cell AMw[i+1] is provided at an address of the 2i+1-th row and the first column, the memory cell AMx[i+1] is provided at an address of the 2i+2-th row and the second column, and the memory cell AMr[i+1] is provided at an address of the 2i+1-th row and the second column. Note that in the arithmetic circuit MAC7 in FIG. 17, i is an odd number greater than or equal to 1 and less than or equal to m.

Thus, the memory cell AMw[i], the memory cell AMr[i], the memory cell AMw[i+1], and the memory cell AMr[i+1] are electrically connected to the wiring XBL[i,j+1], although not illustrated in FIG. 17.

Next, an operation example of the arithmetic circuit MAC7 in FIG. 17 is described. Note that refer to the operation example in the timing chart in FIG. 15 for the operation example of the arithmetic circuit MAC7, and the contents not shown in the timing chart will be mainly described.

The voltages corresponding to the plurality of pieces of first data are set to $V_W[1]$ to $V_W[m]$, and $V_{W\alpha}[1]$ to $V_{W\alpha}[m]$ and $V_{W\beta}[1]$ to $V_{W\beta}[m]$ are defined such that Formula (1.1) to Formula (1.3) are satisfied. In addition, the memory cell AMw[1] to the memory cell AMw[m] and the memory cell AMu[1] to the memory cell AMu[m] retain the respective voltages Vwx[1] to $V_{W\alpha}[m]$, and the memory cell AMx[1] to the memory cell AMx[m] and the memory cell AMr[1] to the memory cell AMr[m] retain the respective voltages $V_{W\beta}[1]$ to $V_{W\beta}[m]$.

The voltages corresponding to the plurality of pieces of second data are set to $V_X[1]$ to $V_X[m]$, and $V_{X\alpha}[1]$ to $V_{X\alpha}[m]$ and $V_{X\beta}[1]$ to $V_{X\beta}[m]$ are defined such that Formula (1.4) to Formula (1.6) are satisfied. Note that $V_{X\beta}[i]$ and $V_{X\beta}[i+1]$ are the same voltage, and $V_{X\beta}[i]=V_{X\beta}[i+1]=V_{X\beta}[i,j+1]$ is satisfied. When the voltages $V_X[1]$ to $V_X[m]$ corresponding to the plurality of pieces of second data are defined in this manner, the voltages $V_{X\alpha}[1]$ to $V_{X\alpha}[m]$ can be respectively input to the wiring XAL[1] to the wiring XAL[m] and $V_{X\beta}[1,2]$ to $V_{X\beta}[m-1,m]$ can be respectively input to the wiring XBL[1,2] to the wiring XBL[m-1,m] in the arithmetic circuit MAC7.

The voltages $V_{X\alpha}[1]$ to $V_{X\alpha}[m]$ are respectively input to the wiring XAL[1] to the wiring XAL[m] and $V_X[1,2]$ to $V_{X\beta}[m-1,m]$ are respectively input to the wiring XBL[1,2] to the wiring XBL[m-1,m] in the arithmetic circuit MAC7 during the period from Time T27 to Time T28, whereby the product-sum operation of the plurality of pieces of first data and the plurality of pieces of second data and the arithmetic operation of a function can be performed, as in the arithmetic circuit MAC5.

The arithmetic circuit MAC7 has a smaller number of wirings XBL than the arithmetic circuit MAC5; thus, the arithmetic circuit MAC7 can have a smaller circuit area than the arithmetic circuit MAC5. In addition, the number of voltage signals input to the wirings XBL in the arithmetic circuit MAC7 is smaller than that in the arithmetic circuit MAC5; thus, the arithmetic circuit MAC7 can have lower power consumption than the arithmetic circuit MAC5.

Although $V_{X\beta}[i]$ and $V_{X\beta}[i+1]$ are the same voltage in the above description, $V_{X\beta}[1]$ to $V_{X\beta}[m]$ may be the same voltage (e.g., $V_{RFP}$) as described in the operation example of the arithmetic circuit MAC5.

Structure Example 7 of Semiconductor Device

Described next is a semiconductor device that is capable of performing a product-sum operation of the plurality of pieces of first data and the plurality of pieces of second data and is different from the arithmetic circuit MAC5 in FIG. 12, the arithmetic circuit MAC6 in FIG. 16, and the arithmetic circuit MAC7 in FIG. 17.

Figure 18:
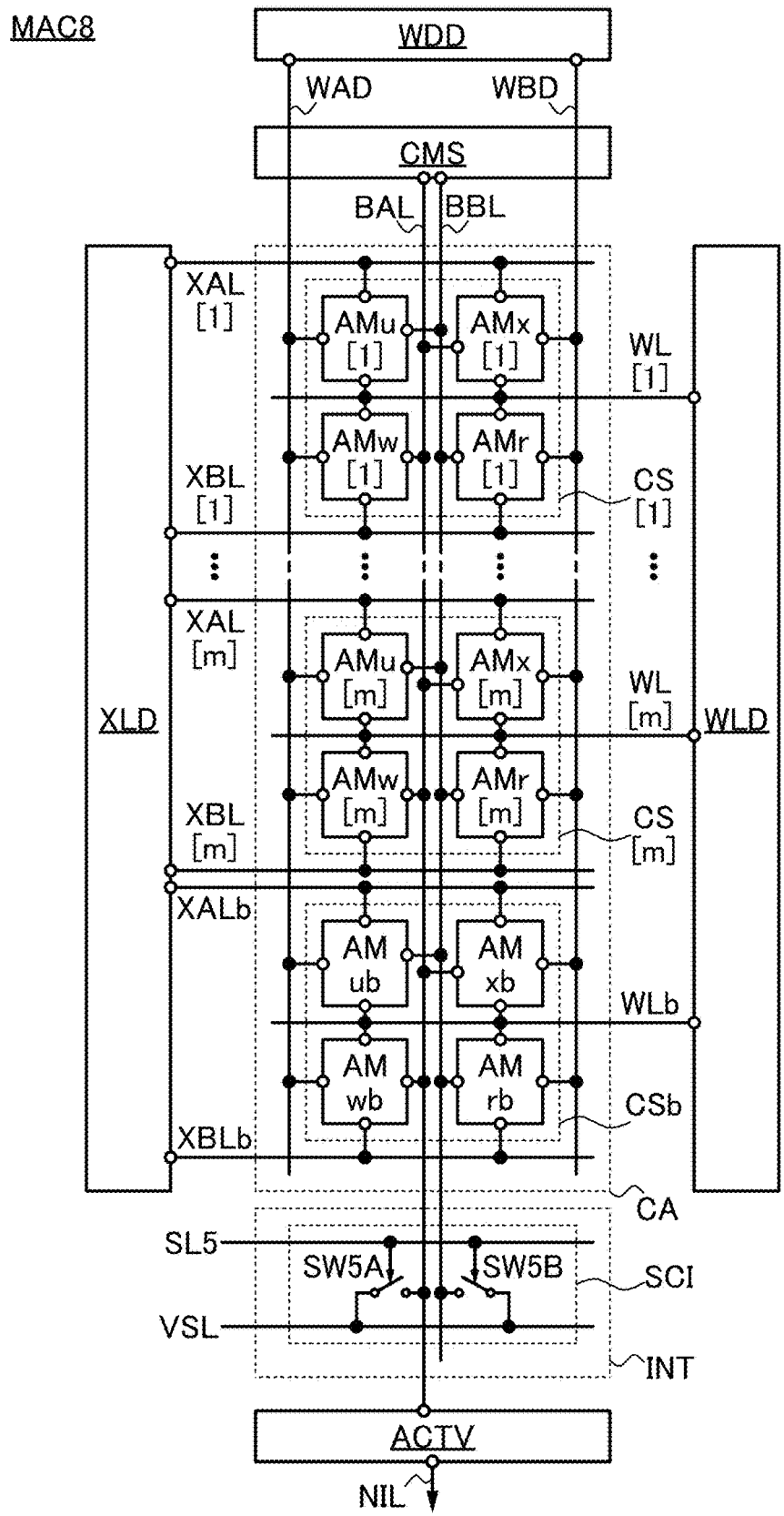
FIG. 18 is a block diagram illustrating an example of a semiconductor device.

Like the arithmetic circuit MAC5, the arithmetic circuit MAC6, and the arithmetic circuit MAC7, an arithmetic circuit MAC8 in FIG. 18 is an example of a semiconductor device capable of performing a product-sum operation of the plurality of pieces of first data and the plurality of pieces of second data. The arithmetic circuit MAC8 is a modification example of the arithmetic circuit MAC5, and is different from the arithmetic circuit MAC5 in that a circuit CSb is provided in the memory cell array CA.

In the arithmetic circuit MAC8 illustrated in FIG. 18, the circuit CSb includes a memory cell AMub, a memory cell AMwb, a memory cell AMxb, and a memory cell AMrb. Note that the memory cell AMub corresponds to the memory cell AMu in each of the circuit CS[1] to the circuit CS[m], the memory cell AMwb corresponds to the memory cell AMw in each of the circuit CS[1] to the circuit CS[m], the memory cell AMxb corresponds to the memory cell AMx in each of the circuit CS[1] to the circuit CS[m], and the memory cell AMrb corresponds to the memory cell AMr in each of the circuit CS[1] to the circuit CS[m].

Next, an operation example of the arithmetic circuit MAC8 is described. Note that refer to the operation example in the timing chart in FIG. 15 for the operation example of the arithmetic circuit MAC8, and the contents not shown in the timing chart will be mainly described.

The voltages corresponding to the plurality of pieces of first data are set to $V_W[1]$ to $V_W[m]$, and $V_{W\alpha}[1]$ to $V_{W\alpha}[m]$ and $V_{W\beta}[1]$ to $V_{W\beta}[m]$ are defined such that Formula (1.1) to Formula (1.3) are satisfied. In addition, the memory cell AMw[1] to the memory cell AMw[m] and the memory cell AMu[1] to the memory cell AMu[m] retain the respective voltages $V_{W\alpha}[1]$ to $V_{W\alpha}[m]$, and the memory cell AMx[1] to the memory cell AMx[m] and the memory cell AMr[1] to the memory cell AMr[m] retain the respective voltages $V_{W\beta}[1]$ to $V_{W\beta}[m]$.

During the period from Time T25 to Time T26 in the timing chart in FIG. 15, for example, the memory cell AMub and the memory cell AMwb retain voltage $V_{Wb_\alpha}$, and the memory cell AMxb and the memory cell AMrb retain voltage $V_{Wb_\beta}$. Moreover, voltage $V_{Wb}$ satisfying $V_{Wb}=V_{Wb_\alpha}-V_{Wb_\beta}$ is defined.

During the period from Time T27 to Time T28 in the timing chart in FIG. 15, for example, voltage $V_{Xb_\alpha}$ is input to a wiring XALb and voltage $V_{Xb_\beta}$ is input to a wiring XBLb. Moreover, voltage $V_{Xb}$ satisfying $V_{Xb}=V_{Xb_\alpha}-V_{Xb_\beta}$ is defined.

In that case, assuming that the amounts of current flowing from the memory cell AMwb and the memory cell AMxb to the wiring BAL are $I_{AMwb}$ and $I_{AMxb}$, respectively, during the period from Time T28 to Time T29 in the timing chart in FIG. 15, $I_{AMwb}$ and $I_{AMxb}$ can be expressed as $I_{AMwb}=k(V_{Wb_\alpha}+V_{Xb_\beta}-V_{th})^2$ and $I_{AMxb}=k(V_{Wb_\beta}+V_{Xb_\alpha}-V_{th})^2$. Moreover, assuming that the amounts of current flowing from the memory cell AMub and the memory cell AMrb to the wiring BBL are $I_{AMub}$ and $I_{AMrb}$, respectively, $I_{AMub}$ and $I_{AMrb}$ can be expressed as $I_{AMub}=k(V_{Wb_\alpha}+V_{Xb_\alpha}-V_{th})^2$ and $I_{AMrb}=k(V_{Wb_\beta}+V_{Xb_\beta}-V_{th})^2$.

In addition, during the period from Time T28 to Time T29 in the timing chart in FIG. 15, the amount $I_{EV}$ of current flowing from the wiring BAL to the circuit ACTV is as in the following formula. Here, $I_b=I_{AMub}+I_{AMrb}+I_{AMxb}+I_{AMwb}$ is satisfied.

[Formula 22]

$$I_{EV} = 2hk\sum_{i=1}^{m} V_W[i]V_X[i] + I_b \quad (1.24)$$

$$= 2hk\sum_{i=1}^{m} V_W[i]V_X[i] + I_{AMub} + I_{AMrb} - I_{AMxb} - I_{AMwb}$$

$$= 2hk\left\{\sum_{i=1}^{m} V_W[i]V_X[i] + (V_{Wb\alpha} - V_{Wb\beta})(V_{Xb\alpha} - V_{Xb\beta})\right\}$$

Formula (1.24) corresponds to a formula in which a given value is added to the product-sum result, like Formula (1.22). This can be used for calculation or the like in which a bias as a given value is added to the result of a product-sum operation of a weight coefficient and a signal of a neuron in an arithmetic operation in a hierarchical neural network, for example.

For example, the sum of currents flowing from the wiring BAL to the memory cell AMxb and the memory cell AMwb, $I_{AMxb}+I_{AMwb}$, is made larger than the sum of currents flowing from the wiring BBL to the memory cell AMub and the memory cell AMrb, $I_{AMub}+I_{AMrb}$, whereby $I_b$ in Formula (1.24) can be a value less than 0. That is, a given value added to a product-sum result can be a negative value.

Note that in at least one of the memory cell AMub, the memory cell AMwb, the memory cell AMxb, and the memory cell AMrb, the amount of current flowing between the first terminal and the second terminal of the transistor M2 may be 0. For example, when the amount of current flowing between the first terminal and the second terminal of the transistor M2 in each of the memory cell AMwb, the memory cell AMxb, and the memory cell AMrb is 0, the current amount $I_b$ in Formula (1.24) can be replaced with $I_b=I_{AMub}$. In addition, when the amount of current flowing between the first terminal and the second terminal of the transistor M2 in each of the memory cell AMub, the memory cell AMxb, and the memory cell AMrb is 0, the current amount $I_b$ in Formula (1.24) can be replaced with $I_b=I_{AMwb}$. That is, at the time of setting a given value to be added to a product-sum operation result, not all the currents flowing between the first terminals and the second terminals of the transistors M2 in the memory cell AMub, the memory cell AMwb, the memory cell AMxb, and the memory cell AMrb are necessarily used. Thus, in the circuit CSb in the arithmetic circuit MAC8, at least one of the memory cell AMub, the memory cell AMwb, the memory cell AMxb, and the memory cell AMrb may be omitted. For example, the circuit CSb can be a circuit including only the memory cell AMub and the memory cell AMxb, a circuit including only the memory cell AMwb and the memory cell AMrb, a circuit including only the memory cell AMub and the memory cell AMwb, or a circuit including only the memory cell AMxb and the memory cell AMrb. For another example, the circuit CSb can have a structure including any one of the memory cell AMub, the memory cell AMwb, the memory cell AMxb, and the memory cell AMrb or a structure in which only one memory cell selected from the memory cell AMub, the memory cell AMwb, the memory cell AMxb, and the memory cell AMrb is not provided.

Note that the semiconductor device of one embodiment of the present invention is not limited to the arithmetic circuit MAC5 to the arithmetic circuit MAC8 and the like described in this embodiment. For example, in the case where a plurality of product-sum operations are performed at the same time using the same second data, an arithmetic circuit MAC9 illustrated in FIG. 19 can be used. The arithmetic circuit MAC9 has a structure in which the n memory cell arrays CA (n is an integer greater than or equal to 1) in the arithmetic circuit MAC5 in FIG. 12 are provided for every column.

Figure 19:
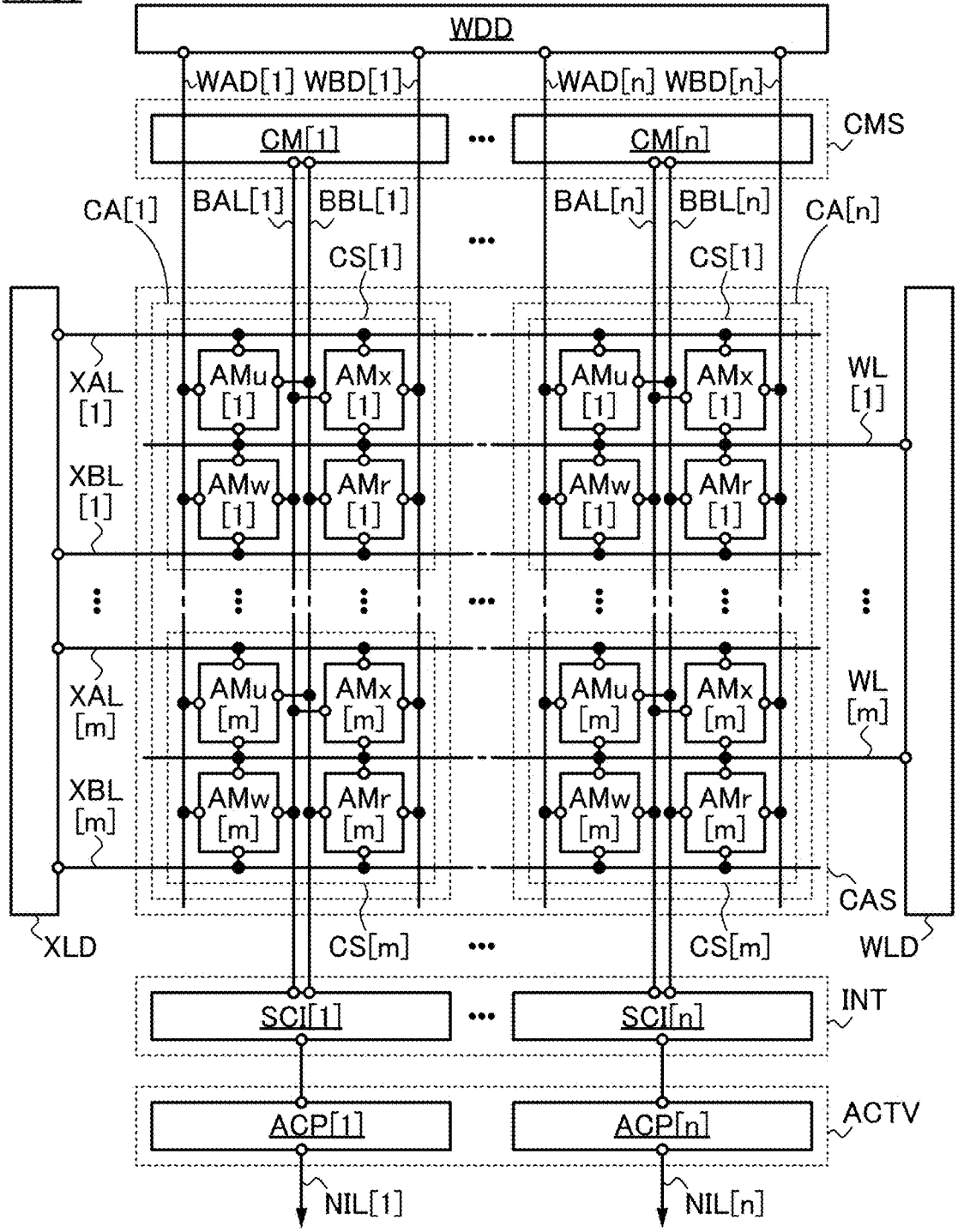
FIG. 19 is a block diagram illustrating an example of a semiconductor device.

FIG. 19 illustrates the memory cell array CA[1] to the memory cell array CA[n], and the memory cell array CA[1] to the memory cell array CA[n] are collectively referred to as the memory cell array CAS. Since the arithmetic circuit MAC9 includes the n memory cell arrays CA, the circuit CMS includes the circuit CM[1] to the circuit CM[n] as the n circuits CM, the circuit INT includes the circuit SCI[1] to the circuit SCI[n] as the n circuits SCI, and the circuit ACTV includes the circuit ACP[1] to the circuit ACP[n] as the n circuits ACP in FIG. 19. The arithmetic circuit MAC9 includes the wiring BAL[1] to the wiring BAL[n] corresponding to the wiring BAL in the arithmetic circuit MAC5, the wiring BBL[1] to the wiring BBL[n] corresponding to the wiring BBL in the arithmetic circuit MAC5, the wiring WAD[1] to the wiring WAD[n] corresponding to the wiring WAD in the arithmetic circuit MAC5, the wiring WBD[1] to the wiring WBD[n] corresponding to the wiring WBD in the arithmetic circuit MAC5, and the wiring NIL[1] to the wiring NIL[n] corresponding to the wiring NIL in the arithmetic circuit MAC5.

The memory cell array CA[1] is electrically connected to the wiring BAL[1], the wiring BBL[1], the wiring WAD[1], the wiring WBD[1], the wiring XAL[1] to the wiring XAL[m], the wiring XBL[1] to the wiring XBL[m], and the wiring WL[1] to the wiring WL[m]. The circuit WDD is electrically connected to the wiring WAD[1] and the wiring WBD[1]. The circuit CM[1] in the circuit CMS is electrically connected to the wiring BAL[1] and the wiring BBL[1], and the circuit SCI[1] in the circuit INT is electrically connected to the wiring BAL[1] and the wiring BBL[1] and the circuit ACP[1] in the circuit ACTV. The circuit ACP[1] is electrically connected to the wiring NIL[1].

Similarly, the memory cell array CA[n] is electrically connected to the wiring BAL[n], the wiring BBL[n], the wiring WAD[n], the wiring WBD[n], the wiring XAL[1] to the wiring XAL[m], the wiring XBL[1] to the wiring XBL[m], and the wiring WL[1] to the wiring WL[m]. The circuit WDD is electrically connected to the wiring WAD[n] and the wiring WBD[n]. The circuit CM[n] in the circuit CMS is electrically connected to the wiring BAL[n] and the wiring BBL[n], and the circuit SCI[n] in the circuit INT is electrically connected to the wiring BAL[n] and the wiring BBL[n] and the circuit ACP[n] in the circuit ACTV. The circuit ACP[n] is electrically connected to the wiring NIL[n].

The arithmetic circuit MAC9 in FIG. 19 writes the voltages corresponding to the plurality of pieces of first data included in the first group to the n-th group to the memory cell array CA[1] to the memory cell array CA[n], respectively, and then inputs the voltage corresponding to the second data to the wiring XAL[1] to the wiring XAL[m] and the wiring XBL[1] to the wiring XBL[m] as in the operation of the timing chart in FIG. 15, whereby the results of the product-sum operation of the plurality of pieces of first data and the plurality of pieces of second data in the first group to the n-th group can be concurrently output to the wiring NIL[1] to the wiring NIL[n].

Although this embodiment describes the case where the transistors included in the arithmetic circuit MAC5 to the arithmetic circuit MAC9 are OS transistors or Si transistors, one embodiment of the present invention is not limited thereto. The transistors included in the arithmetic circuit MAC5 to the arithmetic circuit MAC9 can each be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, or a transistor including an organic semiconductor in a channel formation region.

Note that this embodiment can be combined with any of the other embodiments in this specification as appropriate.

Embodiment 2

Described in this embodiment is an example of an arithmetic circuit capable of performing a plurality of product-sum operations at the same time, which is a semiconductor device of one embodiment of the present invention.

Structure Example 1 of Semiconductor Device

Figure 20:
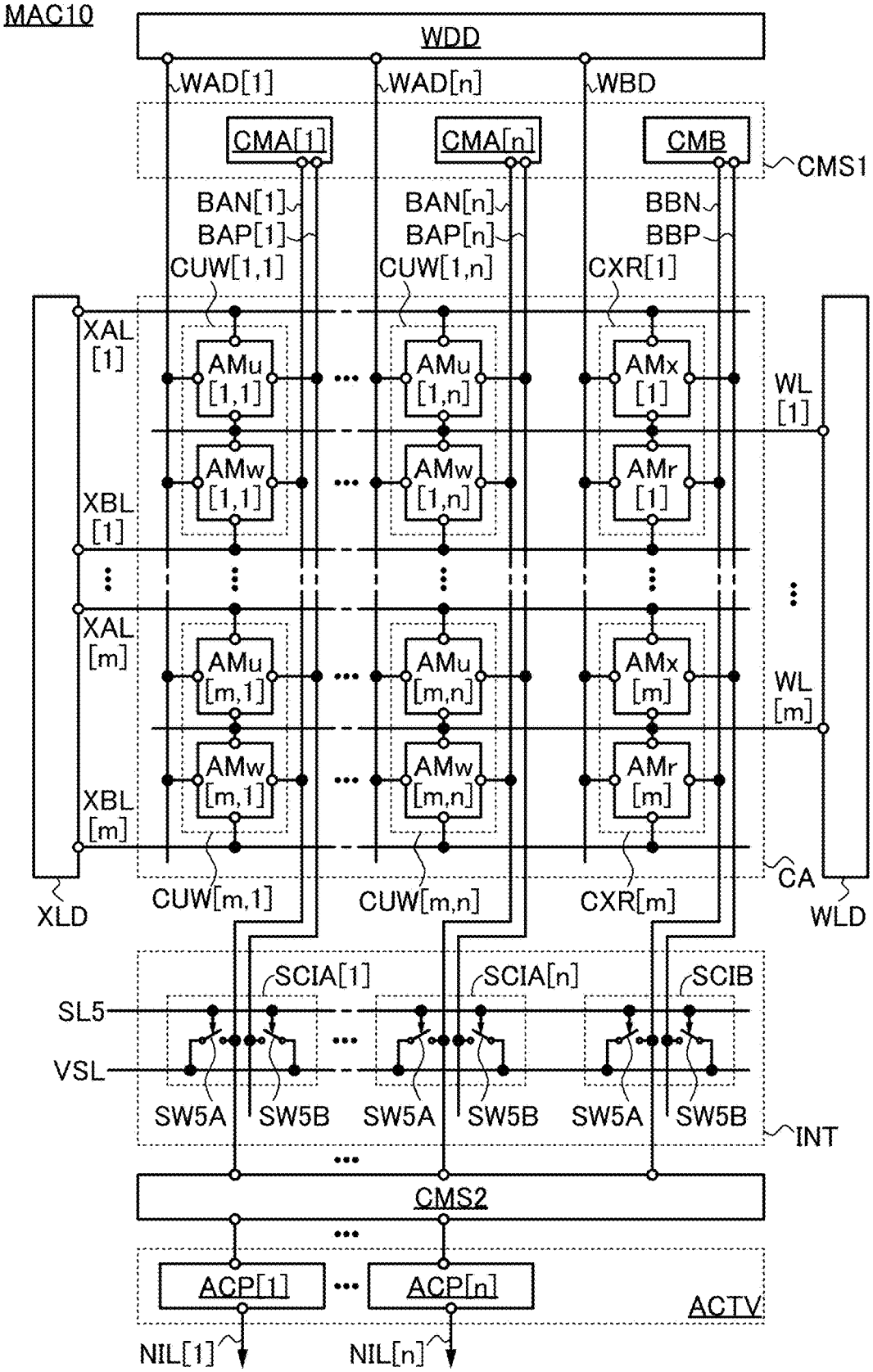
FIG. 20 is a block diagram illustrating an example of a semiconductor device.

FIG. 20 illustrates a structure example of a semiconductor device capable of performing a product-sum operation of the plurality of pieces of first data and the plurality of pieces of second data. In addition, the semiconductor device illustrated in FIG. 20 is capable of performing a plurality of product-sum operations at the same time, for example. Furthermore, the semiconductor device in FIG. 20 is capable of performing an arithmetic operation of a function using results of the product-sum operations as input values. Moreover, the semiconductor device in FIG. 20 is capable of performing arithmetic operations of a plurality of functions at the same time.

Like the arithmetic circuit MAC5 described in the above embodiment, an arithmetic circuit MAC10 in FIG. 20 is a circuit that performs a product-sum operation of the plurality of pieces of first data retained in a plurality of memory cells and the plurality of pieces of input second data and performs an arithmetic operation of a function using the product-sum operation result. Note that the plurality of pieces of first data and the plurality of pieces of second data can be analog data or multilevel data (discrete data), for example.

The arithmetic circuit MAC10 includes, for example, the memory cell array CA, a circuit CMS1, a circuit CMS2, the circuit WDD, the circuit XLD, the circuit WLD, the circuit INT, and the circuit ACTV.

The memory cell array CA includes a circuit CUW[1,1] to a circuit CUW[m,n] (m and n here are each an integer greater than or equal to 1) and a circuit CXR[1] to a circuit CXR[m]. The circuit CUW[1,1] to the circuit CUW[m,n] each include the memory cell AMu and the memory cell AMw, and the circuit CXR[1] to the circuit CXR[m] each include the memory cell AMx and the memory cell AMr. Although not illustrated in FIG. 20, the memory cell AMu and the memory cell AMw included in the circuit CUW[i,j] (here, i is an integer greater than or equal to 1 and less than or equal to m, and j is an integer greater than or equal to 1 and less than or equal to n) are sometimes respectively referred to as a memory cell AMu[i,j] and a memory cell AMw[i,j] in this specification and the like. In addition, the memory cell AMx and the memory cell AMr included in the circuit CXR[i] are sometimes respectively referred to as the memory cell AMx[j] and the memory cell AMr[j] in this specification and the like.

In the memory cell array CA, the memory cells are arranged in a matrix of 2m rows and n+1 columns. In FIG. 20, for example, the memory cell AMu[i,j] is provided at an address of the 2i−1-th row and the j-th column, the memory cell AMw[i,j] is provided at an address of the 2i-th row and the j-th column, the memory cell AMx[i] is provided at an address of the 2i−1-th row and the n+1-th column, and the memory cell AMr[i] is provided at an address of the 2i-th row and the n+1-th column.

The memory cells AMx, the memory cells AMw, the memory cells AMu, and the memory cells AMr each have a function of retaining the voltage corresponding to the first data. Note that the voltage corresponding to the first data can be, for example, the difference between voltage retained in the memory cell AMu[i,j] and the memory cell AMw[i,j] and voltage retained in the memory cell AMx[i] and the memory cell AMr[i].

In particular, the memory cells in the first column to the n-th column in the memory cell array CA respectively retain voltages corresponding to the plurality of pieces of first data in the first group to the n-th group. Specifically, for example, the voltages corresponding to the plurality of pieces of first data included in the first group are retained in the memory cell AMu[1,1] to the memory cell AMu[m, 1] and the memory cell AMw[1,1] to the memory cell AMw[m,1] positioned in the first column, and the voltages corresponding to the plurality of pieces of first data included in the n-th group are retained in the memory cell AMu[1,n] to the memory cell AMu[m,n] and the memory cell AMw[1,n] to the memory cell AMw[m,n] positioned in the n-th column. In this manner, the voltages corresponding to the plurality of pieces of first data included in the j-th group are retained in the memory cell AMu[1,j] to the memory cell AMu[m,j] and the memory cell AMw[1,j] to the memory cell AMw[m,j] positioned in the j-th column.

The memory cell AMu[1,1] is electrically connected to the wiring WAD[1], a wiring BAP[1], the wiring WL[1], and the wiring XAL[1]. The memory cell AMw[1, 1] is electrically connected to the wiring WAD[1], a wiring BAN[1], the wiring WL[1], and the wiring XBL[1]. The memory cell AMu[1,n] is electrically connected to the wiring WAD[n], a wiring BAP[n], the wiring WL[1], and the wiring XAL[1]. The memory cell AMw[1,n] is electrically connected to the wiring WAD[n], a wiring BAN[n], the wiring WL[1], and the wiring XBL[1]. The memory cell AMx[1] is electrically connected to the wiring WBD, a wiring BBP, the wiring WL[1], and the wiring XAL[1]. The memory cell AMr[1] is electrically connected to the wiring WBD, a wiring BBN, the wiring WL[1], and the wiring XBL[1]. The memory cell AMu[m, 1] is electrically connected to the wiring WAD[1], the wiring BAP[1], the wiring WL[m], and the wiring XAL[m]. The memory cell AMw[m, 1] is electrically connected to the wiring WAD[1], the wiring BAN[1], the wiring WL[m], and the wiring XBL[m]. The memory cell AMu[m, n] is electrically connected to the wiring WAD[n], the wiring BAP[n], the wiring WL[m], and the wiring XAL[m]. The memory cell AMw[m,n] is electrically connected to the wiring WAD[n], the wiring BAN[n], the wiring WL[m], and the wiring XBL[m]. The memory cell AMx[m] is electrically connected to the wiring WBD, the wiring BBP, the wiring WL[m], and the wiring XAL[m]. The memory cell AMr[m] is electrically connected to the wiring WBD, the wiring BBN, the wiring WL[m], and the wiring XBL[m].

The detailed circuit structures of the memory cells AMu and the memory cells AMw included in the circuit CUW[1, 1] to the circuit CUW[m,n] and the memory cells AMx and the memory cells AMr included in the circuit CXR[1] to the circuit CXR[m] can be similar to those of the memory cells AMu, the memory cells AMw, the memory cells AMx, and the memory cells AMr that can be used in the arithmetic circuit MAC5 described in the above embodiment, for example.

The circuit CMS1 includes a circuit CMA[1] to a circuit CMA[n] and a circuit CMB, for example. The circuit CMA[1] is electrically connected to the wiring BAN[1] and the wiring BAP[1], the circuit CMA [n] is electrically connected to the wiring BAN[n] and the wiring BAP[n], and the circuit CMB is electrically connected to the wiring BBN and the wiring BBP.

The circuit CMA[j] has a function of supplying current to the memory cell AMu[1,j] to the memory cell AMu[m,j] through the wiring BAP[j] and a function of supplying current to the memory cell AMw[1,j] to the memory cell AMw[m,j] through the wiring BAN[j], for example. Note that the amount of current flowing through the wiring BAP[j] and the amount of current flowing through the wiring BAN[j], which are from the circuit CMA[j], are preferably equal to each other. Specifically, for example, the amount of current flowing to the wiring BAP[j] from the circuit CMA[j] is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing to the wiring BAN[j] from the circuit CMA[j]. Note that the above-described lower limits and upper limits can be combined with each other.

The circuit CMB has a function of supplying current to the memory cell AMx[1] to the memory cell AMx[m] through the wiring BBP and a function of supplying current to the memory cell AMr[1] to the memory cell AMr[m] through the wiring BBN, for example. Note that the amount of current flowing through the wiring BBP and the amount of current flowing through the wiring BBN, which are from the circuit CMB, are preferably equal to each other. Specifically, the amount of current flowing to the wiring BBP from the circuit CMB is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing to the wiring BBN from the circuit CMB. Note that the above-described lower limits and upper limits can be combined with each other.

Note that a specific structure example of the circuit CMS1 will be described later.

The circuit WDD is electrically connected to the wiring WAD[1] to the wiring WAD[n] and the wiring WBD, for example. The circuit WDD has a function of transmitting data to be stored in each memory cell included in the memory cell array CA. For the circuit WDD, refer to the above description of the circuit WDD included in the arithmetic circuit MAC5 described in Embodiment 1.

For the circuit WLD, refer to the above description of the circuit WLD included in the arithmetic circuit MAC5 described in Embodiment 1.

For the circuit XLD, refer to the above description of the circuit XLD included in the arithmetic circuit MAC5 described in Embodiment 1.

The circuit INT is electrically connected to the wiring BAP[1] to the wiring BAP[n], the wiring BAN[1] to the wiring BAN[n], the wiring BBP, and the wiring BBN, for example. The circuit INT has a function of inputting a predetermined voltage to each of the wiring BAP[1] to the wiring BAP[n], the wiring BAN[1] to the wiring BAN[n], the wiring BBP, and the wiring BBN, for example. Note that the voltage can be, for example, a low-level potential, a ground potential, or the like.

For a specific structure example, the circuit INT includes a circuit SCIA[1] to a circuit SCIA[n] and a circuit SCIB. The circuit SCIA[1] to the circuit SCIA[n] and the circuit SCIB can each have a structure similar to that of the circuit SCI included in the circuit INT of the arithmetic circuit MAC5. Specifically, the circuit SCIA[1] to the circuit SCIA [n] and the circuit SCIB in the circuit INT in FIG. 20 each have a structure including the switch SW5A and the switch SW5B. In the circuit SCIA[j], the first terminal of the switch SW5A is electrically connected to the wiring BAN[j], the second terminal of the switch SW5A is electrically connected to the wiring VSL, the first terminal of the switch SW5B is electrically connected to the wiring BAP[j], and the second terminal of the switch SW5B is electrically connected to the wiring VSL. The control terminal of each of the switch SW5A and the switch SW5B is electrically connected to the wiring SL5. Similarly, in the circuit SCIB, the first terminal of the switch SW5A is electrically connected to the wiring BBN, the second terminal of the switch SW5A is electrically connected to the wiring VSL, the first terminal of the switch SW5B is electrically connected to the wiring BBP, and the second terminal of the switch SW5B is electrically connected to the wiring VSL. The control terminal of each of the switch SW5A and the switch SW5B is electrically connected to the wiring SL5.

Note that in this embodiment, each of the switch SW5A and the switch SW5B is turned on when a high-level potential is input to the control terminal, and is turned off when a low-level potential is input to the control terminal.

The wiring SL5 functions as a wiring that supplies voltage for switching the conducting state and the non-conducting state of the switch SW5A and the switch SW5B, for example. Thus, the voltage can be, for example, a high-level potential or a low-level potential.

The wiring VSL functions as a wiring that supplies a constant voltage, for example. The constant voltage can be a low-level potential or a ground potential, for example.

The circuit CMS2 is electrically connected to the wiring BAN[1] to the wiring BAN[n] and the wiring BBN, for example. The circuit CMS2 has a function of discharging current flowing through the wiring BBN and a function of discharging current flowing through each of the wiring BAN[1] to the wiring BAN[n], for example. Note that the amount of current discharged from the wiring BBN and the amount of current discharged from each of the wiring BAN[1] to the wiring BAN[n] by the circuit CMS2 are preferably equal to each other. Specifically, for example, the amount of current flowing from the wiring BBN to the circuit CMS2 is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing from the wiring BAN[j] to the circuit CMS2. Note that the above-described lower limits and upper limits can be combined with each other.

The circuit ACTV includes the circuit ACP[1] to the circuit ACP[n], for example. The circuit ACP[1] is electrically connected to the wiring BAN[1] and the wiring NIL [1], and the circuit ACP[n] is electrically connected to the wiring BAN[n] and the wiring NIL[n]. The circuit ACP[1] to the circuit ACP[n] can have a structure similar to that of the circuit ACP included in the circuit ACTV of the arithmetic circuit MAC5 described above in Embodiment 1, for example. Note that although the structure in which the first terminal of the switch SW4A is electrically connected to the wiring BAL is illustrated in each of FIG. 4A to FIG. 4C and FIG. 5A to FIG. 5C, the wiring BAL illustrated in FIG. 4A to FIG. 4C and FIG. 5A to FIG. 5C is replaced with the wiring BAN in the description in this embodiment.

Structure Example of Memory Cell Array CA

Next, structure examples of the memory cell AMu and the memory cell AMw included in each of the circuit CUW[1,1] to the circuit CUW[m,n] and the memory cell AMx and the memory cell AMr included in each of the circuit CXR[1] to the circuit CXR[m] in the memory cell array CA are described.

Figure 21:
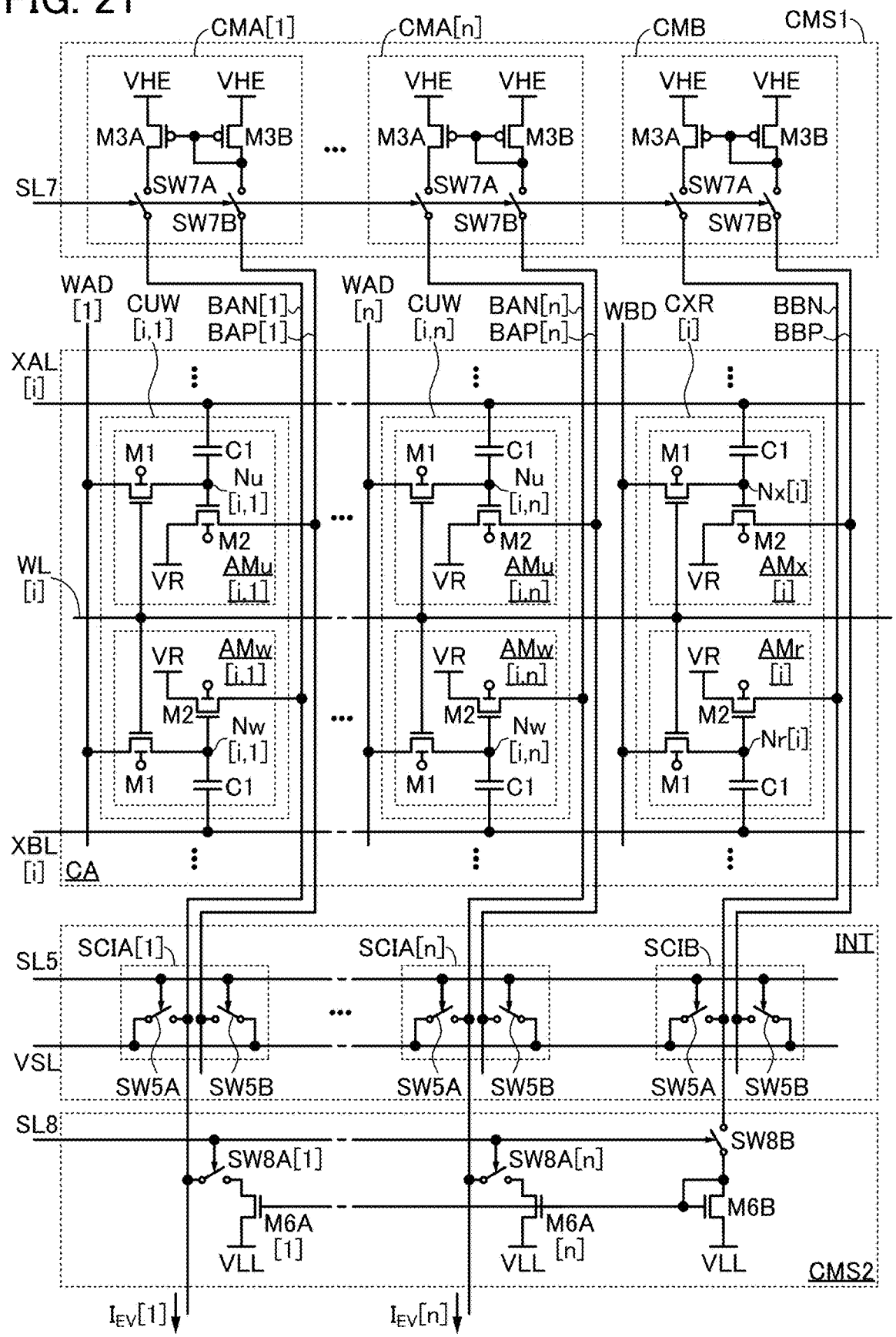
FIG. 21 is a circuit diagram illustrating a structure example of a circuit included in a semiconductor device.

FIG. 21 is a circuit diagram illustrating a structure example of the memory cell array CA. The memory cell array CA has a function of calculating a product-sum of the plurality of pieces of first data and the plurality of pieces of second data as in the arithmetic circuit MAC5 described in the above embodiment.

The structures of the memory cells AMu, the memory cells AMw, the memory cells AMx, and the memory cells AMr illustrated in FIG. 21 are similar to the structures of the memory cells AMu, the memory cells AMw, the memory cells AMx, and the memory cells AMr illustrated in FIG. 13. Thus, for the description of the circuit elements included in the memory cells AMw, the memory cells AMx, and the memory cells AMr, refer to the contents of the memory cells AMu, the memory cells AMw, the memory cells AMx, and the memory cells AMr described in the above embodiment.

In each of the memory cell AMu[i, 1] to the memory cell AMu[in], the gate of the transistor M1 is electrically connected to the wiring WL[i], and the second terminal of the capacitor C1 is electrically connected to the wiring XAL[i]. In the memory cell AMu[i, 1], the second terminal of the transistor M1 is electrically connected to the wiring WAD [1], and the second terminal of the transistor M2 is electrically connected to the wiring BAP[1]. In the memory cell AMu[i,n], the second terminal of the transistor M1 is electrically connected to the wiring WAD[n], and the second terminal of the transistor M2 is electrically connected to the wiring BAP[n]. Although not illustrated in FIG. 21, in the memory cell AMu[i,j], the second terminal of the transistor M1 is electrically connected to the wiring WAD[j], and the second terminal of the transistor M2 is electrically connected to the wiring BAP[j]. In addition, in the memory cell AMu[i,j], an electrical connection portion of the first terminal of the transistor M1, the gate of the transistor M2, and the first terminal of the capacitor C1 is a node Nu[i,j].

In each of the memory cell AMw[i, 1] to the memory cell AMw[i,n], the gate of the transistor M1 is electrically connected to the wiring WL[i], and the second terminal of the capacitor C1 is electrically connected to the wiring XBL[i]. In the memory cell AMw[i, 1], the second terminal of the transistor M1 is electrically connected to the wiring WAD[1], and the second terminal of the transistor M2 is electrically connected to the wiring BAN[1]. In the memory cell AMw[i,n], the second terminal of the transistor M1 is electrically connected to the wiring WAD[n], and the second terminal of the transistor M2 is electrically connected to the wiring BAN[n]. Although not illustrated in FIG. 21, in the memory cell AMw[i,j], the second terminal of the transistor M1 is electrically connected to the wiring WAD[j], and the second terminal of the transistor M2 is electrically connected to the wiring BAN[j]. In addition, in the memory cell AMw[i,j], an electrical connection portion of the first terminal of the transistor M1, the gate of the transistor M2, and the first terminal of the capacitor C1 is a node Nw[i,j].

In the memory cell AMx[i], the gate of the transistor M1 is electrically connected to the wiring WL[i], the second terminal of the capacitor C1 is electrically connected to the wiring XAL[i], the second terminal of the transistor M1 is electrically connected to the wiring WBD, and the second terminal of the transistor M2 is electrically connected to the wiring BBP. In the memory cell AMx[i], an electrical connection portion of the first terminal of the transistor M1, the gate of the transistor M2, and the first terminal of the capacitor C1 is the node Nx[i].

In the memory cell AMr[i], the gate of the transistor M1 is electrically connected to the wiring WL[i], the second terminal of the capacitor C1 is electrically connected to the wiring XBL[i], the second terminal of the transistor M1 is electrically connected to the wiring WBD, and the second terminal of the transistor M2 is electrically connected to the wiring BBN. In the memory cell AMr[i], an electrical connection portion of the first terminal of the transistor M1, the gate of the transistor M2, and the first terminal of the capacitor C1 is the node Nr[i].

Structure Example of Circuit CMS1

Next, a circuit structure example applicable to the circuit CMA[1] to the circuit CMA[n] and the circuit CMB included in the circuit CMS1 in FIG. 20 is described.

FIG. 21 illustrates a circuit structure example applicable to the circuit CMA[1] to the circuit CMA[n] and the circuit CMB in the circuit CMS1. Specifically, the circuit CMA[1] to the circuit CMA[n] and the circuit CMB illustrated in FIG. 21 have the structure of the circuit CM in FIG. 3A. Thus, for the circuit structure of the circuit CMA[1] to the circuit CMA[n] and the circuit CMB illustrated in FIG. 21, the circuit elements included therein, and the like, refer to the description of the circuit CM in the above embodiment.

In the circuit CMA[1], the second terminal of the switch SW7A is electrically connected to the wiring BAN[1], and the second terminal of the switch SW7B is electrically connected to the wiring BAP[1]. In the circuit CMA[n], the second terminal of the switch SW7A is electrically connected to the wiring BAN[n], and the second terminal of the switch SW7B is electrically connected to the wiring BAP [n]. In the circuit CMA[j], the second terminal of the switch SW7A is electrically connected to the wiring BAN[j], and the second terminal of the switch SW7B is electrically connected to the wiring BAP[j], although not illustrated in FIG. 21. In the circuit CMB, the second terminal of the switch SW7A is electrically connected to the wiring BBN, and the second terminal of the switch SW7B is electrically connected to the wiring BBP.

Structure Example of Circuit CMS2

Next, a circuit structure example of the circuit CMS2 in FIG. 20 will be described.

The circuit CMS2 in FIG. 20 can have a circuit structure of the circuit CMS2 illustrated in FIG. 21, for example. The circuit CMS2 in FIG. 21 includes a switch SW8A[1] to a switch SW8A[n], a switch SW8B, a transistor M6A[1] to a transistor M6A[n], and a transistor M6B, for example.

A first terminal of the switch SW8A[1] is electrically connected to the wiring BAN[1] and the circuit ACP[1] (illustrated in FIG. 20 but not illustrated in FIG. 21), and a second terminal of the switch SW8A[1] is electrically connected to a first terminal of the transistor M6A[1]. A second terminal of the transistor M6A[1] is electrically connected to a wiring VLL. A first terminal of the switch SW8A[n] is electrically connected to the wiring BAN[n] and the circuit ACP[n] (illustrated in FIG. 20 but not illustrated in FIG. 21), and a second terminal of the switch SW8A [n] is electrically connected to a first terminal of the transistor M6A[n]. A second terminal of the transistor M6A[n] is electrically connected to the wiring VLL. A first terminal of the switch SW8B is electrically connected to the wiring BBN, and a second terminal of the switch SW8B is electrically connected to a first terminal of the transistor M6B. A second terminal of the transistor M6B is electrically connected to the wiring VLL. A gate of the transistor M6B is electrically connected to the second terminal of the switch SW8B, the first terminal of the transistor M6B, and a gate of each of the transistor M6A[1] to the transistor M6A[n]. A control terminal of each of the switch SW8A[1] to the switch SW8A[n] and the switch SW8B is electrically connected to a wiring SL8.

Note that as the switch SW8A[1] to the switch SW8A[n] and the switch SW8B, for example, a switch that can be used as the switch SW5A and the switch SW5B can be used. In this embodiment, each of the switch SW8A and the switch SW8B is turned on when a high-level potential is input to the control terminal, and is turned off when a low-level potential is input to the control terminal.

The wiring SL8 functions as a wiring that supplies voltage for switching the conducting state and the non-conducting state of the switch SW8A[1] to the switch SW8A[n] and the switch SW8B, for example. Thus, the voltage can be, for example, a high-level potential or a low-level potential.

The wiring VLL functions as a wiring that supplies a constant voltage, for example. The constant voltage is preferably a low-level potential or a ground potential, for example.

The transistor M6A[1] to the transistor M6A[n] and the transistor M6B are each preferably an n-channel transistor, for example. An OS transistor, a Si transistor, or the like can be used as each of the transistor M6A[1] to the transistor M6A[n] and the transistor M6B, for example. As the OS transistor, a transistor that can be used as the transistor M1 or the transistor M2 can be used. In the case where a Si transistor is used as the transistor M6A[1] to the transistor M6A[n] and the transistor M6B, silicon contained in a channel formation region of the Si transistor can be, for example, amorphous silicon (sometimes referred to as hydrogenated amorphous silicon), microcrystalline silicon, polycrystalline silicon, single crystal silicon, or the like.

Unless otherwise specified, the transistor M6A[1] to the transistor M6A[n] and the transistor M6B in the on state may each operate in a saturation region. In other words, voltages in the range where the transistor operates in a saturation region may be appropriately input to the gate, the source, and the drain of each of the above transistors. However, one embodiment of the present invention is not limited thereto. The transistor M6A[1] to the transistor M6A[n] and the transistor M6B can operate in a linear region in order to decrease the amplitude value of voltage to be supplied. Alternatively, the transistor M6A[1] to the transistor M6A [n] and the transistor M6B can operate in a subthreshold region in order to reduce the amount of current flowing through the transistor M6A[1] to the transistor M6A[n] and the transistor M6B. Alternatively, the transistor M6A[1] to the transistor M6A[n] and the transistor M6B can operate in a linear region, in a saturation region, and in a subthreshold region; both in a linear region and in a saturation region; both in a saturation region and in a subthreshold region; or both in a linear region and in a subthreshold region.

The circuit CMS2 in FIG. 21 having the above structure functions as a current mirror circuit. Specifically, with reference to the potential of the first terminal of the transistor M6B (wiring BBN), the circuit CMS2 in FIG. 21 has a function of supplying current corresponding to the potential between the source and the drain of each of the transistor M6A[1] to the transistor M6A[n] and the transistor M6B. In other words, the circuit CMS2 has a function of supplying current with the amount, which is almost equal to the amount of current flowing between the source and the drain of the transistor M6B, between the source and the drain of each of the transistor M6A[1] to the transistor M6A[n].

Figure 22:
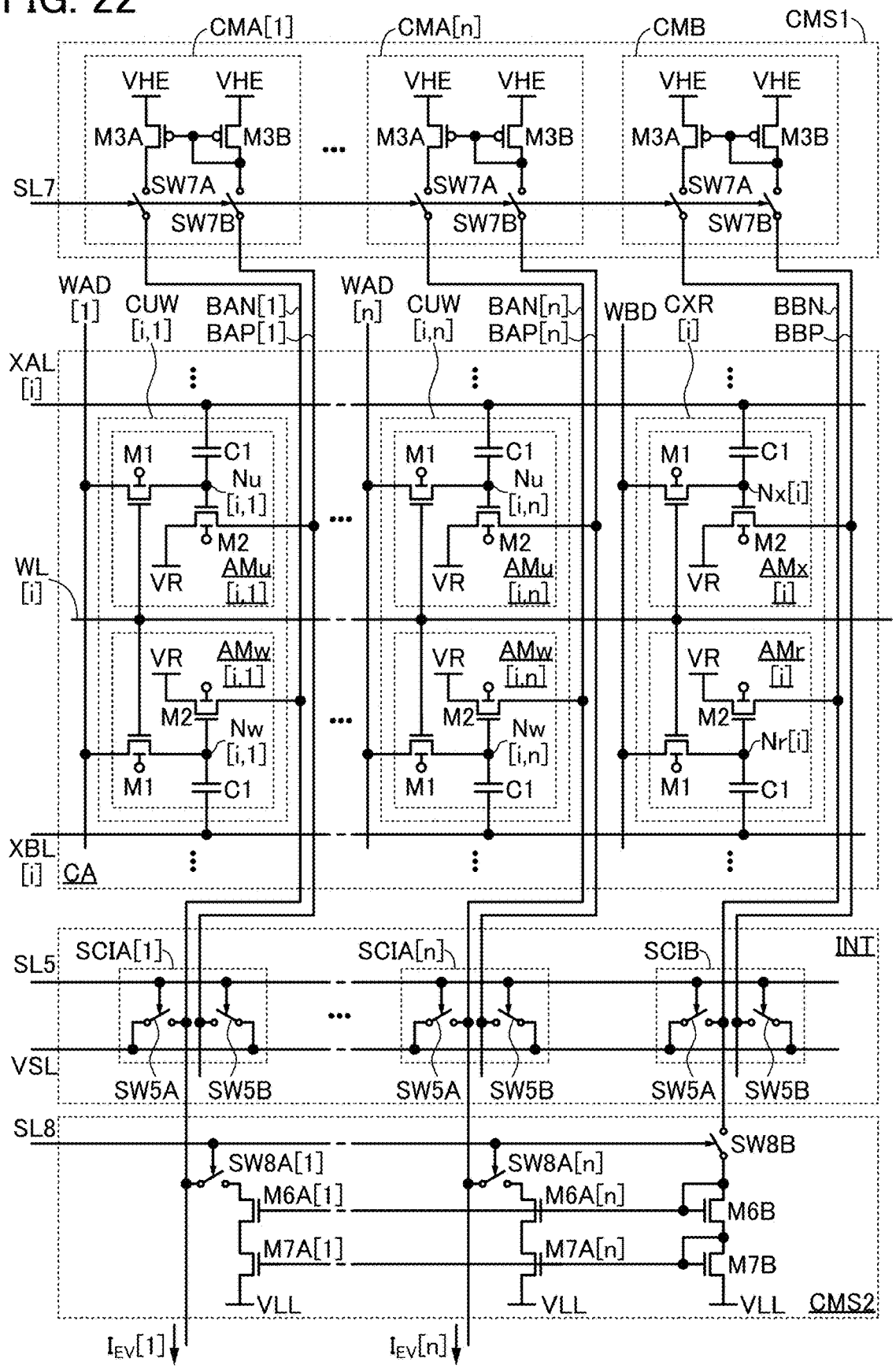
FIG. 22 is a circuit diagram illustrating a structure example of a circuit included in a semiconductor device.

The structure of the circuit CMS2 is not limited to the structure illustrated in FIG. 21. The structure of the circuit CMS2 may be a structure in which the transistor M6A[1] to the transistor M6A[n] and a transistor M7A[1] to a transistor M7A[n] are respectively cascode-connected and the transistor M6B and a transistor M7B are cascode-connected, as in the circuit CMS2 illustrated in FIG. 22, for example. Specifically, the second terminal of the transistor M6A [1] is electrically connected to a first terminal of the transistor M7A[1], and a second terminal of the transistor M7A[1] is electrically connected to the wiring VLL. The second terminal of the transistor M6A[n] is electrically connected to a first terminal of the transistor M7A[n], and the second terminal of the transistor M7A[n] is electrically connected to the wiring VLL. The second terminal of the transistor M6B is electrically connected to a first terminal of the transistor M7B, a gate of each of the transistor M7A[1] to the transistor M7A[n], and a gate of the transistor M7B, and a second terminal of the transistor M7B is electrically connected to the wiring VLL. When the transistors included in the circuit CMS2 are cascode-connected as in the circuit CMS2 illustrated in FIG. 22, the operation of the current mirror circuit of the circuit CMS2 can be more stable.

Figure 23:
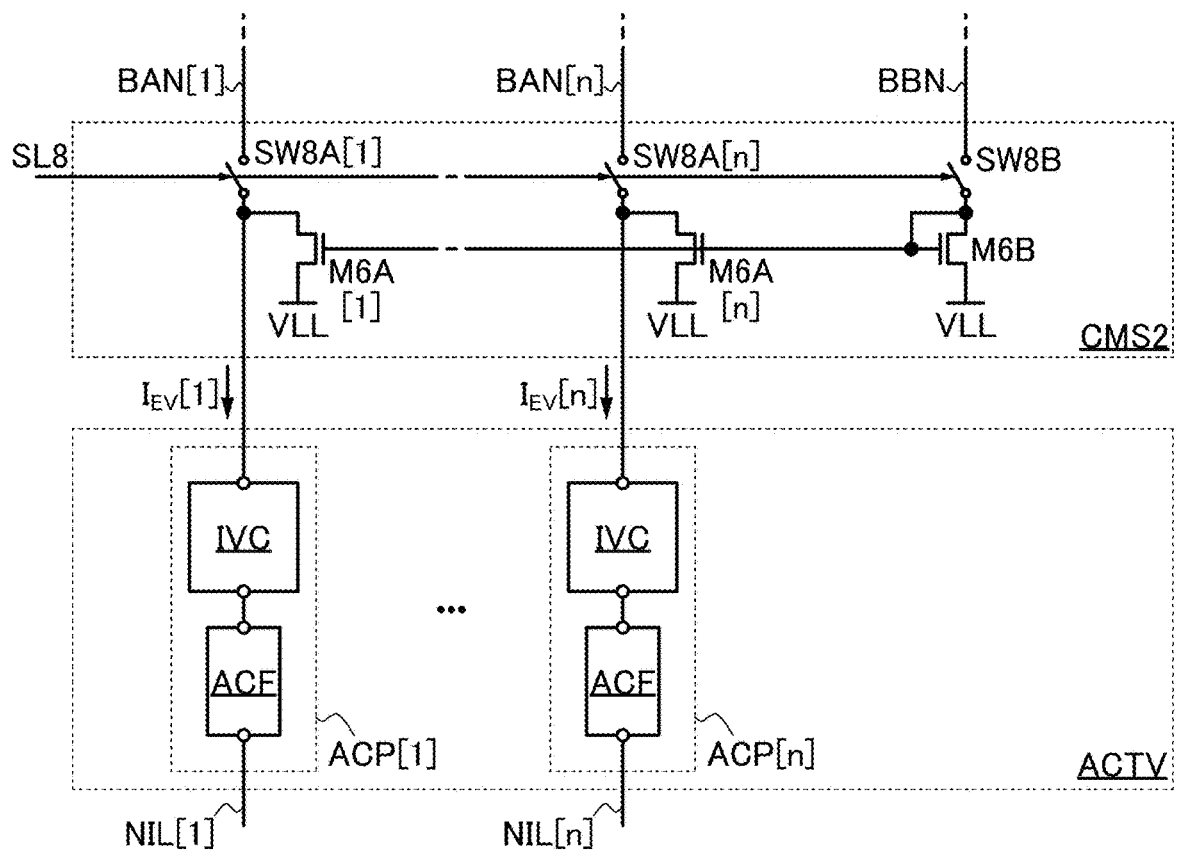
FIG. 23 is a block diagram illustrating a structure example of a circuit included in a semiconductor device.

In the structure of the circuit CMS2, for example, electrical connection portions of the switch SW8A[1] to the switch SW8A[n] may be changed into those in the circuit CMS2 illustrated in FIG. 23. Note that FIG. 23 illustrates not only the circuit CMS2 but also the circuit ACTV in FIG. 4A, for example. The circuit ACTV in FIG. 23 includes n circuits ACP. In the circuit CMS2 in FIG. 23, the first terminal of the switch SW8A[1] is electrically connected to the wiring BAN[1], and the second terminal of the switch SW8A[1] is electrically connected to the circuit ACP[1] and the first terminal of the transistor M6A[1]. In addition, the first terminal of the switch SW8A[n] is electrically connected to the wiring BAN[n], and the second terminal of the switch SW8A[n] is electrically connected to the circuit ACP[n] and the first terminal of the transistor M6A[n]. The use of the circuit CMS2 in FIG. 23 as the circuit CMS2 in the arithmetic circuit MAC10 enables the circuit ACP[1] to the circuit ACP[n] in the circuit ACTV in FIG. 4A to have a structure not including the switch SW4A. That is, the switch SW8A[1] to the switch SW8A[n] included in the circuit CMS2 in FIG. 23 can be made to function as the switch SW4A included in each of the circuit ACP[1] to the circuit ACP[n] in the circuit ACTV in FIG. 4A. The number of circuit elements can thus be reduced by using the circuit CMS2 in FIG. 23 as the circuit CMS2 in the arithmetic circuit MAC10, leading to a reduction in the circuit area of the arithmetic circuit MAC10 and/or a reduction in power consumption of the arithmetic circuit MAC10. Although FIG. 23 illustrates the circuit ACF of FIG. 4A, the circuit ACF illustrated in FIG. 23 may be that in any of FIG. 4B, FIG. 4C, FIG. 5A to FIG. 5C, and the like.

Operation Example of Arithmetic Circuit

Next, an operation example of the arithmetic circuit MAC10 will be described.

Note that as the memory cell array CA, the circuit CMS1, the circuit INT, and the circuit CMS2 in the arithmetic circuit MAC10 here, the memory cell array CA, the circuit CMS1, the circuit INT, and the circuit CMS2, respectively, illustrated in FIG. 21 are used. Although not illustrated, the circuit ACTV in FIG. 4A is used as the circuit ACTV in the arithmetic circuit MAC10 in FIG. 20.

Figure 24:
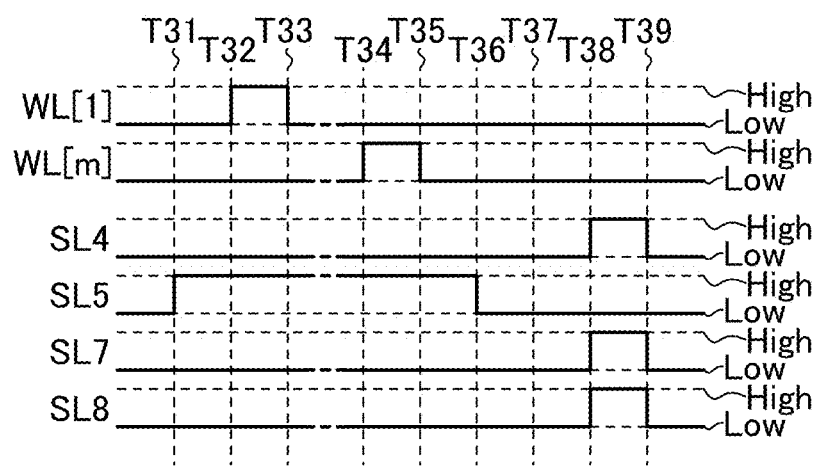
FIG. 24 is a timing chart showing an operation example of a semiconductor device.
Figure 25:
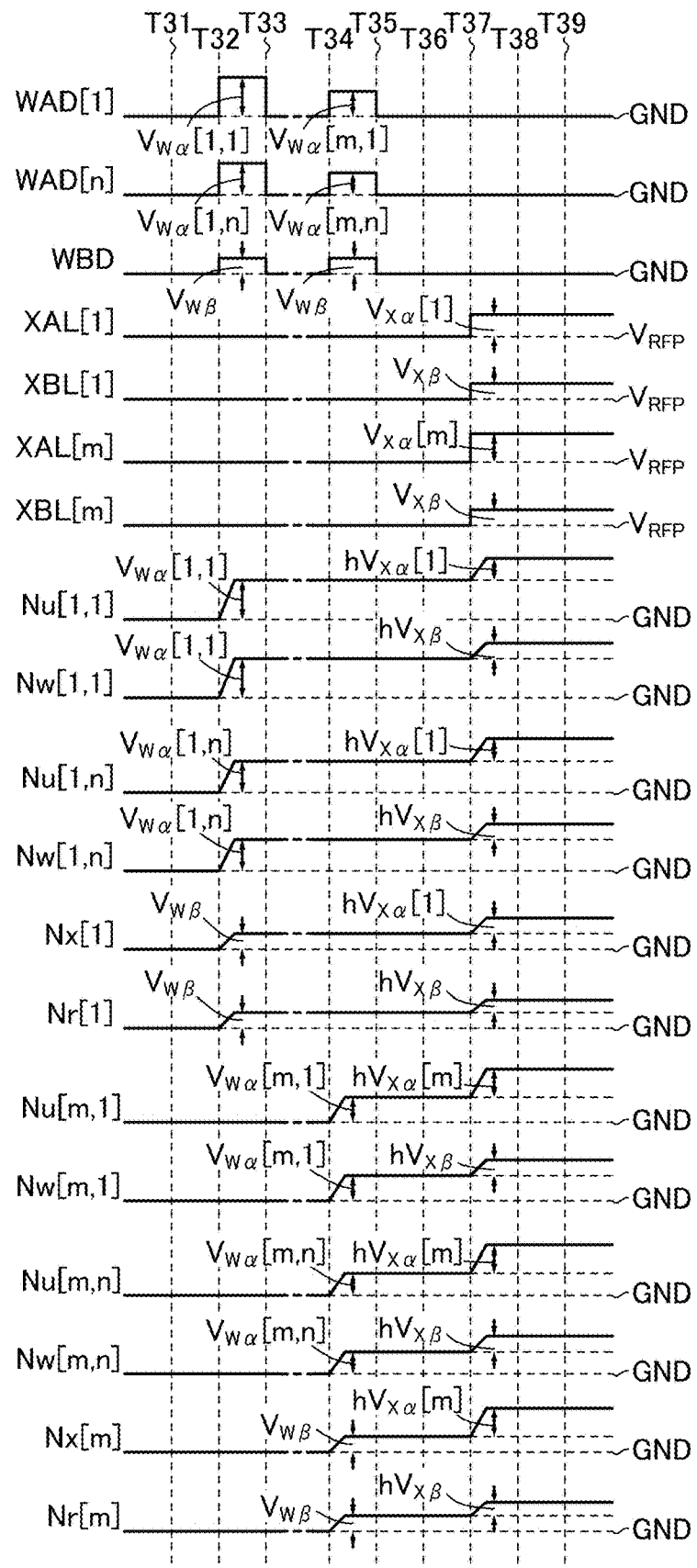
FIG. 25 is a timing chart showing an operation example of a semiconductor device.

FIG. 24 and FIG. 25 show timing charts of an operation example of the arithmetic circuit MAC10. The timing chart in FIG. 24 shows changes in the potentials of the wiring WL[1], the wiring WL[m], the wiring SL4, the wiring SL5, the wiring SL7, and the wiring SL8 at and around Time T31 to Time T39, and the timing chart in FIG. 25 shows changes in the potentials of the wiring WAD[1], the wiring WAD[n], the wiring WBD, the wiring XAL[1], the wiring XAL[m], the wiring XBL[1], the wiring XBL[m], the node Nu[1,1], the node Nw[1, 1], the node Nu[1,n], the node Nw[1,n], the node Nx[1], the node Nr[1], the node Nu[m, 1], the node Nw[m, 1], the node Nu[m,n], the node Nw[m,n], the node Nx[m], and the node Nr[m] at and around Time T31 to Time T39. Note that in FIG. 24, a high-level potential is denoted by High and a low-level potential is denoted by Low. In FIG. 25, a ground potential is denoted by GND.

In this operation example, the voltage supplied from the wiring VR is a ground potential. Moreover, the voltage supplied from the wiring VHE is a high-level potential, and the voltage supplied from the wiring VLL is a ground potential.

First, the operation example describes the plurality of pieces of first data retained in the arithmetic circuit MAC10 and the plurality of pieces of second data input to the arithmetic circuit MAC10.

In this operation example, voltages corresponding to the m pieces of first data included in the j-th group are retained in the memory cells AMu and the memory cells AMw included in the circuit CUW[1,j] to the circuit CUW [m,j] positioned in the j-th column in the memory cell array CA in the arithmetic circuit MAC10, for example.

Here, $V_W[1,j]$ to $V_W[m,j]$ are defined as the voltages corresponding to the m pieces of first data in the j-th group. In addition, $V_{W\alpha}[i,j]$ is defined such that the following formula is satisfied. Note that $V_{W\beta}$ can be a given reference voltage.

[Formula 23]

$$V_W[i, j] = V_{W\alpha}[i, j] - V_{W\beta} \quad (2.1)$$

$V_W[i,j]$ is voltage corresponding to the i-th one among the m pieces of first data included in the j-th group. That is, $V_{W\alpha}[i,j]$ can be regarded as the voltage corresponding to the i-th one among the m pieces of first data included in the j-th group.

As will be described in detail later, the memory cells AMu and the memory cells AMw included in the circuit CUW[1,j] to the circuit CUW[m,j] positioned in the j-th column in the memory cell array CA retain $V_{W\alpha}[1,j]$ to $V_{W\alpha}[m,j]$ as the m pieces of first data included in the j-th group. Furthermore, the memory cells AMx and the memory cells AMr included in the circuit CXR[1] to the circuit CXR[m] positioned in the n+1-th column in the memory cell array CA each retain $V_{W\beta}$.

Next, $V_X[1]$ to $V_X[m]$ are defined as the voltages corresponding to the m pieces of second data. Specifically, $V_{X\alpha}[i]$ is defined such that the following formula is satisfied. Note that $V_{X\beta}$ can be a given reference voltage.

[Formula 24]

$$V_X[i] = V_{X\alpha}[i] - V_{X\beta} \quad (2.2)$$

$V_X[i]$ is voltage corresponding to the i-th one among the m pieces of second data. That is, $V_{X\alpha}[i]$ can be regarded as the voltage corresponding to the i-th one among the m pieces of second data.

As will be described in detail later, when the m pieces of second data are input to the memory cell array CA, $V_{X\alpha}[1]$ to $V_{X\alpha}[m]$ are respectively input to the wiring XAL[1] to the wiring XAL[m], and $V_{X\beta}$ is input to each of the wiring XBL[1] to the wiring XBL[m].

<<Before Time T31>>

Before Time T31, the potentials of the node Nu[1,1] to the node Nu[m,n], the node Nw[1,1] to the node Nw[m,n], the node Nx[1] to the node Nx[m], and the node Nr[1] to the node Nr[m] are each a ground potential.

A low-level potential is input to each of the wiring WAD[1] to the wiring WAD[n] and the wiring WBD from the circuit WDD (not illustrated in FIG. 21).

The reference potential $V_{RFP}$ is input to each of the wiring XAL[1] to the wiring XAL[m] and the wiring XBL[1] to the wiring XBL[m] from the circuit XLD (not illustrated in FIG. 21). Note that $V_{RFP}$ can be a potential higher than a ground potential or a potential lower than a ground potential.

A low-level potential is input to each of the wiring WL[1] to the wiring WL[m] from the circuit WLD (not illustrated in FIG. 21). Thus, the transistors M1 included in all of the memory cells AMx, the memory cells AMu, the memory cells AMw, and the memory cells AMr in the memory cell array CA are turned off.

A low-level potential is input to each of the wiring SL4, the wiring SL5, the wiring SL7, and the wiring SL8. Thus, the switch SW4A, the switch SW5A, the switch SW5B, the switch SW7A, the switch SW7B, the switch SW8A[1] to the switch SW8A[n], and the switch SW8B are each turned off.

<<From Time T31 to Time T32>>

During the period from Time T31 to Time T32, a high-level potential is input to the wiring SL5. Thus, the switch SW5A and the switch SW5B included in the circuit INT are each turned on.

When the switch SW5A and the switch SW5B are each turned on, electrical continuity is established between the wiring VSL and each of the wiring BAN[1] to the wiring BAN[n], the wiring BAP[1] to the wiring BAP[n], the wiring BBN, and the wiring BBP, whereby the potential from the wiring VSL is supplied to each of the wiring BAN[1] to the wiring BAN[n], the wiring BAP[1] to the wiring BAP[n], the wiring BBN, and the wiring BBP. Note that in this operation example, the wiring VSL is a wiring for supplying an initialization potential to each of the wiring BAN[1] to the wiring BAN[n], the wiring BAP[1] to the wiring BAP[n], the wiring BBN, and the wiring BBP, and the initialization potential is a ground potential. Thus, during the period from Time T31 to Time T32, the potentials of the wiring BAN[1] to the wiring BAN[n], the wiring BAP[1] to the wiring BAP[n], the wiring BBN, and the wiring BBP are each a ground potential.

A ground potential is supplied from the wiring VR to the first terminals of the transistors M2 included in all of the memory cells AMx, the memory cells AMu, the memory cells AMw, and the memory cells AMr in the memory cell array CA; hence, the voltage between the first terminal and the second terminal of each of the transistors M2 is 0 V. In addition, since the potentials of the node Nu[1,1] to the node Nu[m,n], the node Nw[1,1] to the node Nw[m,n], the node Nx[1] to the node Nx[m], and the node Nr[1] to the node Nr[m] are each a ground potential, the transistors M2 are each turned off.

<<From Time T32 to Time T33>>

During the period from Time T32 to Time T33, a high-level potential is input to the wiring WL[1]. Thus, a high-level potential is applied to the gates of the transistors M1 included in the memory cell AMu[1,1] to the memory cell AMu[1,n], the memory cell AMw[1,1] to the memory cell AMw[1,n], the memory cell AMx[1], and the memory cell AMr[1] in the memory cell array CA, whereby the transistors M1 are each turned on.

Moreover, during the period from Time T32 to Time T33, the potentials $V_{W\alpha}[1,1]$ to $V_{W\alpha}[1,n]$ are respectively input to the wiring WAD[1] to the wiring WAD[n]. At this time, when the j-th column in the memory cell array CA is focused on, the transistor M1 in each of the memory cell AMu[1,j] and the memory cell AMw[1,j] is in the on state; thus, electrical continuity is established between the wiring WAD[j] and the node Nu[m,j] and electrical continuity is established between the wiring WAD[j] and the node Nw[1,j]. Hence, the potential $V_{W\alpha}[1,j]$ is input to each of the first terminal of the capacitor C1 in the memory cell AMu[1,j] (node Nu[1,j]) and the first terminal of the capacitor C1 in the memory cell AMw[1,j] (node Nw[1,j]). When j is 1, for example, the potential $V_{W\alpha}[1,1]$ is input to each of the first terminal of the capacitor C1 in the memory cell AMu[1,1] (node Nu[1,1]) and the first terminal of the capacitor C1 in the memory cell AMw[1,1] (node Nw[1,1]). When j is n, for example, the potential $V_{W\alpha}[1,n]$ is input to each of the first terminal of the capacitor C1 in the memory cell AMu[1,n] (node Nu[1,n]) and the first terminal of the capacitor C1 in the memory cell AMw[1,n] (node Nw[1,n]).

Furthermore, during the period from Time T32 to Time T33, the potential $V_{W\beta}$ is input to the wiring WBD. At this time, the transistor M1 in each of the memory cell AMx[1] and the memory cell AMr[1] is in the on state; thus, electrical continuity is established between the wiring WBD and the node Nx[1] and electrical continuity is established between the wiring WBD and the node Nr[1]. Hence, the potential $V_{W\beta}$ is input to each of the first terminal of the capacitor C1 in the memory cell AMx[1] (node Nx[1]) and the first terminal of the capacitor C1 in the memory cell AMr[1] (node Nr[1]).

During the period from Time T32 to Time T33, a low-level potential has been continuously input to each of the wiring WL[2] to the wiring WL[m] since before Time T22. Thus, a low-level potential is applied to the gate of the transistor M1 included in each of the memory cells AMu, the memory cells AMw, the memory cells AMx, and the memory cells AMr in the circuit CUW[2] to the circuit CUW[m] and the circuit CXR[2] to the circuit CXR[m] in the memory cell array CA, so that each transistor M1 is in the off state. This prevents the data input to each of the wiring WAD[1] to the wiring WAD[n] and the wiring WBD from being written to the retention node of the memory cell included in each of the circuit CUW[2] to the circuit CUW[m] and the circuit CXR[2] to the circuit CXR[m].

<<From Time T33 to Time T34>>

During the period from Time T33 to Time T34, a low-level potential is input to the wiring WL[1]. Thus, a low-level potential is applied to the gates of the transistors M1 included in the memory cell AMu[1,1] to the memory cell AMu[1,n], the memory cell AMw[1, 1] to the memory cell AMw[1,n], the memory cell AMx[1], and the memory cell AMr[1] in the memory cell array CA, whereby the transistors M1 are each turned off.

When the j-th column in the memory cell array CA is focused on, the transistor M1 in each of the memory cell AMu[1,j] and the memory cell AMw[1,j] is in the off state; thus, the potential $V_{W\alpha}[1,j]$ is retained in each of the first terminal of the capacitor C1 in the memory cell AMu[1,j] (node Nu[1,j]) and the first terminal of the capacitor C1 in the memory cell AMw[1,j] (node Nw[1,j]). When j is 1, for example, the potential $V_{W\alpha}[1,1]$ is retained in each of the first terminal of the capacitor C1 in the memory cell AMu[1,1] (node Nu[1,1]) and the first terminal of the capacitor C1 in the memory cell AMw[1,1] (node Nw[1,1]). When j is n, for example, the potential $V_{W\alpha}[1,n]$ is retained in each of the first terminal of the capacitor C1 in the memory cell AMu[1,n] (node Nu[1,n]) and the first terminal of the capacitor C1 in the memory cell AMw[1,n] (node Nw[1,n]). When the transistor M1 in each of the memory cell AMx[1] and the memory cell AMr[1] is in the off state, the potential $V_{W\beta}$ is retained in each of the first terminal of the capacitor C1 in the memory cell AMx[1] (node Nx[1]) and the first terminal of the capacitor C1 in the memory cell AMr[1] (node Nr[1]).

During the period from Time T33 to Time T34, potentials are sequentially written to the memory cells AMu, the memory cells AMw, the memory cells AMx, and the memory cells AMr in the circuit CUW[2,1] to the circuit CUW[m−1,n] and the circuit CXR[2] to the circuit CXR[m−1], as in the operation of writing the potentials to the memory cells AMu and the memory cells AMw in the circuit CUW[1,1] to the circuit CUW[1,n] and the memory cell AMx and the memory cell AMr in the circuit CXR[1] during the period from Time T32 to Time T33. Specifically, for example, signals making the potentials high level for a certain period are sequentially input to the wiring WL[2] to the wiring WL[m−1] and the potentials of the wiring WAD[1] to the wiring WAD[n] and the wiring WBD are changed in accordance with the signals, whereby the predetermined potentials can be written to the memory cells AMu and the memory cells AMw in the circuit CUW [2,1] to the circuit CUW[m−1,n] and the memory cells AMx and the memory cells AMr in the circuit CXR[2] to the circuit CXR[m−1]. Note that Vwx[2, 1] to $V_{W\alpha}[m-1,n]$ are sequentially written to the memory cell AMu[2,1] to the memory cell AMu[m−1,n] and the memory cell AMw[2, 1] to the memory cell AMw[m−1,n]. Furthermore, $V_{W\beta}$ is sequentially written to the memory cell AMx[2] to the memory cell AMx[m−1] and the memory cell AMr[2] to the memory cell AMr[m−1] in parallel with the operation of writing the voltages to the memory cell AMu[2,1] to the memory cell AMu[m−1,n] and the memory cell AMw[2, 1] to the memory cell AMw[m−1,n].

<<From Time T34 to Time T35>>

During the period from Time T34 to Time T35, a high-level potential is input to the wiring WL[m]. Thus, a high-level potential is applied to the gates of the transistors M1 included in the memory cell AMu[m, 1] to the memory cell AMu[m,n], the memory cell AMw[m,1] to the memory cell AMw[m,n], the memory cell AMx[m], and the memory cell AMr[m] in the memory cell array CA, whereby the transistors M1 are each turned on.

Moreover, during the period from Time T34 to Time T35, the potentials $V_{W\alpha}[m, 1]$ to $V_{W\alpha}[m,n]$ are respectively input to the wiring WAD[1] to the wiring WAD[n]. At this time, when the j-th column in the memory cell array CA is focused on, the transistor M1 in each of the memory cell AMu[m,j] and the memory cell AMw[m,j] is in the on state; thus, electrical continuity is established between the wiring WAD[j] and the node Nu[m,j] and electrical continuity is established between the wiring WAD[j] and the node Nw[m,j]. Hence, the potential $V_{W\alpha}[m,j]$ is input to each of the first terminal of the capacitor C1 in the memory cell AMu[m,j] (node Nu[m,j]) and the first terminal of the capacitor C1 in the memory cell AMw[m,j] (node Nw[m,j]). When j is 1, for example, the potential $V_{W\alpha}[m, 1]$ is input to each of the first terminal of the capacitor C1 in the memory cell AMu[m,1] (node Nu[m, 1]) and the first terminal of the capacitor C1 in the memory cell AMw[m,1] (node Nw[m,1]). When j is n, for example, the potential $V_{W\alpha}[m,n]$ is input to each of the first terminal of the capacitor C1 in the memory cell AMu[m,n] (node Nu[m,n]) and the first terminal of the capacitor C1 in the memory cell AMw[m,n] (node Nw[m,n]).

Furthermore, during the period from Time T34 to Time T35, the potential $V_{W\beta}$ is input to the wiring WBD. At this time, the transistor M1 in each of the memory cell AMx[m] and the memory cell AMr[m] is in the on state; thus, electrical continuity is established between the wiring WBD and the node Nx[m] and electrical continuity is established between the wiring WBD and the node Nr[m]. Hence, the potential $V_{W\beta}$ is input to each of the first terminal of the capacitor C1 in the memory cell AMx[m] (node Nx[m]) and the first terminal of the capacitor C1 in the memory cell AMr[m] (node Nr[m]).

During the period from Time T34 to Time T35, a low-level potential has been continuously input to each of the wiring WL[1] to the wiring WL[m−1] since before Time T34. Thus, a low-level potential is applied to the gate of the transistor M1 included in each of the memory cells AMu, the memory cells AMw, the memory cells AMx, and the memory cells AMr in the circuit CUW[1] to the circuit CUW[m−1] and the circuit CXR[1] to the circuit CXR[m−1] in the memory cell array CA, so that each transistor M1 is in the off state. This prevents the data input to each of the wiring WAD[1] to the wiring WAD[n] and the wiring WBD from being written to the retention node of the memory cell included in each of the circuit CUW[1] to the circuit CUW[m−1] and the circuit CXR[1] to the circuit CXR[m−1].

<<From Time T35 to Time T36>>

During the period from Time T35 to Time T36, a low-level potential is input to the wiring WL[m]. Thus, a low-level potential is applied to the gates of the transistors M1 included in the memory cell AMu[m, 1] to the memory cell AMu[m,n], the memory cell AMw[m, 1] to the memory cell AMw[m,n], the memory cell AMx[m], and the memory cell AMr[m] in the memory cell array CA, whereby the transistors M1 are each turned off.

When the j-th column in the memory cell array CA is focused on, the transistor M1 in each of the memory cell AMu[m,j] and the memory cell AMw[m,j] is in the off state; thus, the potential $V_{W\alpha}[m,j]$ is retained in each of the first terminal of the capacitor C1 in the memory cell AMu[m,j] (node Nu[m,j]) and the first terminal of the capacitor C1 in the memory cell AMw[m,j] (node Nw[m,j]). When j is 1, for example, the potential $V_{W\alpha}[m, 1]$ is retained in each of the first terminal of the capacitor C1 in the memory cell AMu[m,1] (node Nu[m,1]) and the first terminal of the capacitor C1 in the memory cell AMw[m,1] (node Nw[m, 1]). When j is n, for example, the potential $V_{W\alpha}[m,n]$ is retained in each of the first terminal of the capacitor C1 in the memory cell AMu[m,n] (node Nu[m,n]) and the first terminal of the capacitor C1 in the memory cell AMw[m,n] (node Nw[m, n]). When the transistor M1 in each of the memory cell AMx[m] and the memory cell AMr[m] is in the off state, the potential $V_{W\beta}[m]$ is retained in each of the first terminal of the capacitor C1 in the memory cell AMx[m] (node Nx[m]) and the first terminal of the capacitor C1 in the memory cell AMr[m] (node Nr[m]).

By the operation from Time T31 to Time T36, the voltage corresponding to the first data can be written to each of the memory cells AMx, the memory cells AMu, the memory cells AMw, and the memory cells AMr included in the memory cell array CA.

<<From Time T36 to Time T37>>

During the period from Time T36 to Time T37, a low-level potential is input to the wiring SL5. Thus, the switch SW5A and the switch SW5B in the circuit INT are each turned off.

<<From Time T37 to Time T38>>

During the period from Time T37 to Time T38, $V_{X\alpha}[1]$ to $V_{X\alpha}[m]$ as the potentials corresponding to the m pieces of second data are respectively input to the wiring XAL[1] to the wiring XAL[m]. When the i-th column in the memory cell array CA is focused on, for example, the potential $V_{X\alpha}[i]$ is input to the wiring XAL[i] from the circuit XLD.

The potential of the wiring XAL[i] increases from a ground potential to $V_{X\alpha}[i]$; thus, $V_{X\alpha}[i]$ is applied to the second terminal of the capacitor C1 in each of the memory cell AMu[i,1] to the memory cell AMu[i,n] and the memory cell AMx[i]. Since the node Nu[i, 1] to the node Nu[i,n] and the node Nx[i] are each in an electrically floating state at this time, the potentials of the node Nu[i, 1] to the node Nu[i,n] and the node Nx[i] are each changed by capacitive coupling of the capacitor C1.

In each of the memory cell AMu[i, 1] to the memory cell AMu[i,n] and the memory cell AMx[i], the amount of increase in the gate potential of the transistor M2 is a potential obtained by multiplying a change in the potential of the wiring XAL[i] by a capacitive coupling coefficient determined by the memory cell structure. The capacitive coupling coefficient is calculated using the capacitance of the capacitor C1, the gate capacitance of the transistor M2, the parasitic capacitance, and the like. In this operation example, the capacitive coupling coefficient of each of the memory cells AMu and the memory cell AMx is set to h.

Thus, when a change in the potential of the wiring XAL[i] is $V_{X\alpha}[i]$, a change in the potential of each of the node Nu[i, 1] to the node Nu[in] and the node Nx[i] is $hV_{X\alpha}[i]$. In that case, the potential of the node Nu[i,j] is $V_{W\alpha}[i,j]+hV_{X\alpha}[i]$, and the potential of the node Nx[i] is $V_{W\beta}+hV_{X\alpha}[i]$.

For example, when i is 1 and j is 1, the potential of the node Nu[1,1] is $V_{W\alpha}[1,1]+hV_{X\alpha}[1]$; when i is 1 and j is n, the potential of the node Nu[1,n] is $V_{W\alpha}[1,n]+hV_{X\alpha}[1]$; when i is m and j is 1, the potential of the node Nu[m, 1] is $V_{W\alpha}[m,1]+hV_{X\alpha}[m]$; and when i is m and j is n, the potential of the node Nu[m,n] is $V_{W\alpha}[m,n]+hV_{X\alpha}[m]$. For another example, when i is 1, the potential of the node Nx[1] is $V_{W\beta}+hV_{X\alpha}[1]$; and when i is m, the potential of the node Nx[n] is $V_{W\beta}+hV_{X\alpha}[n]$.

In this operation example, the capacitive coupling coefficient in the memory cells AMw and the memory cells AMr as well as the memory cells AMu and the memory cells AMx included in the memory cell array CA is described as h.

During the period from Time T37 to Time T38, $V_{X\beta}$ as the potential is input to each of the wiring XBL[1] to the wiring XBL[m]. Assuming that i is an integer greater than or equal to 1 and less than or equal to m here, the potential $V_{X\beta}$ is input to the wiring XBL[i] from the circuit XLD.

The potential of the wiring XBL[i] increases from a ground potential to $V_{X\beta}[i]$; thus, $V_{X\beta}$ is applied to the second terminal of the capacitor C1 in each of the memory cell AMw[i,1] to the memory cell AMw[i,n] and the memory cell AMr[i]. Since the node Nw[i, 1] to the node Nw[i,n] and the node Nr[i] are each in an electrically floating state at this time, the potentials of the node Nw[i,1] to the node Nw[in] and the node Nr[i] are each changed by capacitive coupling of the capacitor C1.

Thus, when a change in the potential of the wiring XBL[i] is $V_{X\beta}$, a change in the potential of each of the node Nw[i, 1] to the node Nw[i,n] and the node Nr[i] is $hV_{X\beta}$. In that case, the potential of the node Nw[i,j] is $V_{W\alpha}[i,j]+hV_{X\beta}$, and the potential of the node Nr[i] is $V_{W\beta}+hV_{X\beta}$.

For example, when i is 1 and j is 1, the potential of the node Nw[1,1] is $V_{W\alpha}[1,1]+hV_{X\beta}$; when i is 1 and j is n, the potential of the node Nw[1,n] is $V_{W\alpha}[1,n]+hV_{X\beta}$; when i is m and j is 1, the potential of the node Nw[m, 1] is $V_{W\alpha}[m,1]+hV_{X\beta}$; and when i is m and j is n, the potential of the node Nw[m,n] is $V_{W\alpha}[m,n]+hV_{X\beta}$. For another example, when i is 1, the potential of the node Nr[1] is $V_{W\beta}+hV_{X\beta}$; and when i is m, the potential of the node Nr[n] is $V_{W\beta}+hV_{X\beta}$.

<<From Time T38 to Time T39>>

During the period from Time T38 to Time T39, a high-level potential is input to the wiring SL4, the wiring SL7, and the wiring SL8. Thus, the switch SW7A and the switch SW7B in the circuit CMS1, the switch SW4A in the circuit ACTV, and the switch SW8A[1] to the switch SW8A[n] and the switch SW8B in the circuit CMS2 are each turned on.

At this time, electrical continuity is established between the second terminal of the transistor M2 included in each of the memory cell AMx[1] to the memory cell AMx[m] and the first terminal of the transistor M3B included in the circuit CMB through the wiring BBP. In addition, electrical continuity is established between the second terminal of the transistor M2 included in each of the memory cell AMr[1] to the memory cell AMr[m] and the first terminal of the transistor M3A included in the circuit CMB and the first terminal of the transistor M6B in the circuit CMS2 through the wiring BBN.

Thus, the total amount $I_x$ of current flowing from the wiring BBP to the second terminals of the transistors M2 in the memory cell AMx[1] to the memory cell AMx[m] can be expressed by the following formula according to Formula (1.9).

[Formula 25]

$$I_x = k\sum_{i=1}^{m}(V_{W\beta} + hV_{X\alpha}[i] - V_{th})^2 \quad (2.3)$$

The total amount $I_r$ of current flowing from the wiring BBN to the second terminals of the transistors M2 in the memory cell AMr[1] to the memory cell AMr[m] can be expressed by the following formula according to Formula (1.18).

[Formula 26]

$$I_r = k\sum_{i=1}^{m}(V_{W\beta} + hV_{X\beta} - V_{th})^2 \quad (2.4)$$

Electrical continuity is established between the wiring BBP and the first terminal of the transistor M3B in the circuit CMB; thus, the circuit CMB supplies current with the amount $I_x$ to the wiring BBP as the sum of currents flowing through the second terminals of the transistors M2 in the memory cell AMx[1] to the memory cell AMx[m]. Since the circuit CMB has a current mirror circuit structure, the circuit CMB supplies the current with the amount $I_x$ to the wiring BBN.

At this time, electrical continuity is established between the wiring BBN and the first terminal of the transistor M6B in the circuit CMS2; thus, current with the amount $I_x-I_r$ flows from the wiring BBN to the first terminal of the transistor M6B in the circuit CMS2. Note that here, $I_x-I_r$ is a value greater than or equal to 0.

Here, the memory cells in the j-th column in the memory cell array CA are focused on. During the period from Time T38 to Time T39, electrical continuity is established between the second terminal of the transistor M2 included in each of the memory cell AMu[1,j] to the memory cell AMu[m,j] and the first terminal of the transistor M3B included in the circuit CMA[j] through the wiring BAP[j]. In addition, electrical continuity is established between the second terminal of the transistor M2 included in each of the memory cell AMw[1,j] to the memory cell AMw[m,j] and the first terminal of the transistor M3A included in the circuit CMA[j] and the first terminal of the transistor M6A[j] included in the circuit CMS2 through the wiring BAN[j].

Thus, assuming that the total amount of current flowing from the wiring BAP[j] to the second terminals of the transistors M2 in the memory cell AMu[1,j] to the memory cell AMx[m,j] is $I_u[j]$, $I_u[j]$ can be expressed by the following formula according to Formula (1.15).

[Formula 27]

$$I_u[j] = k\sum_{i=1}^{m}(V_{W\alpha}[i,j] + hV_{X\alpha}[i] - V_{th})^2 \quad (2.5)$$

Assuming that the total amount of current flowing from the wiring BAN[j] to the second terminals of the transistors M2 in the memory cell AMw[1,j] to the memory cell AMw[m,j] is $I_w[j]$, $I_w[j]$ can be expressed by the following formula according to Formula (1.12).

[Formula 28]

$$I_w[j] = k\sum_{i=1}^{m}(V_{W\alpha}[i,j] + hV_{X\beta} - V_{th})^2 \quad (2.6)$$

Electrical continuity is established between the wiring BAP[j] and the first terminal of the transistor M3B in the circuit CMA[j]; thus, the circuit CMA[j] supplies current with the amount $I_u[j]$ to the wiring BAP[j] as the sum of currents flowing through the second terminals of the transistors M2 in the memory cell AMu[1,j] to the memory cell AMu[m,j]. Since the circuit CMA[j] has a current mirror circuit structure, the circuit CMA[j] supplies the current with the amount $I_u[j]$ to the wiring BAN[j].

Electrical continuity is established between the wiring BAN[j] and the first terminal of the transistor M6A[j] in the circuit CMS2. Since the circuit CMS2 has a current mirror circuit structure, the current with the amount $I_x-I_r$ flows from the wiring BAN[j] to the circuit CMS2.

At this time, assuming that the amount of current flowing from the wiring BAN[j] to the circuit ACP[j] is $I_{EV}[j]$, $I_{EV}[j]$ can be expressed by the following formula with the use of Formula (2.1) to Formula (2.6).

[Formula 29]

$$I_{EV}[j] = I_u[j] + I_r - I_x - I_w[j] \quad (2.7)$$
$$= 2hk\sum_{i=1}^{m} V_W[i,j]V_X[i]$$

According to Formula (2.7), the amount $I_{EV}[j]$ of current input from the wiring BAN[j] to the circuit ACP[j] in the circuit ACTV is proportional to the product-sum of the potentials $V_W[1]$ to $V_W[m]$ corresponding to the plurality of pieces of first data in the j-th group and the potentials $V_X[1]$ to $V_X[m]$ corresponding to the second data. That is, the product-sum of the plurality of pieces of first data and the plurality of pieces of second data in the j-th group can be expressed as the amount $I_{EV}[j]$ of current.

The current with $I_{EV}$ flowing through the first terminal of the circuit IVC included in the circuit ACTV enables the voltage corresponding to $I_{EV}$ to be output to the third terminal of the circuit IVC. After that, the voltage is input to the first terminal of the circuit ACF to be used for an arithmetic operation of a function system defined in advance by the circuit ACF, so that the arithmetic operation result is output as voltage (or current, for example) from the wiring NIL[j].

In the above, the j-th column in the memory cell array CA is focused on and the product-sum operation of the plurality of pieces of first data and the plurality of pieces of second data in the j-th group and the arithmetic operation of a function system using the product-sum operation result are described; however, since the wiring SL4, the wiring SL5, the wiring SL7, the wiring SL8, and the like in the arithmetic circuit MAC10 in FIG. 20 are electrically connected to the circuit elements such as the switches in the corresponding columns, the product-sum operations in the first column to the n-th column and the arithmetic operations of function systems using the product-sum operation results can be concurrently performed in the respective columns. That is, the arithmetic circuit MAC10 is capable of concurrently performing the product-sum operations of the plurality of pieces of first data and the plurality of pieces of second data included in the first group to the n-th group, and concurrently supplying currents with $I_{EV}[1]$ to $I_{EV}[n]$ as the product-sum operation results to the wiring BAN[1] to the wiring BAN[n], respectively. When the currents with $I_{EV}[1]$ to $I_{EV}[n]$ are respectively supplied to the circuit ACP[1] to the circuit ACP[n], voltages (or currents, for example) corresponding to the product-sum operation results ($I_{EV}[1]$ to $I_{EV}[n]$) can be output from the wiring NIL[1] to the wiring NIL[n].

Structure Example 2 of Semiconductor Device

In the case where the sum of currents flowing from the wiring BBN to the second terminals of the transistors M2 in the memory cell AMr[1] to the memory cell AMr[m] is larger than the sum of currents flowing from the wiring BBP to the second terminals of the transistors M2 in the memory cell AMx[1] to the memory cell AMx[m] in the n+1-th column in the structure of the arithmetic circuit MAC10 illustrated in FIG. 20 and FIG. 21, i.e., in the case where the amount $I_x$ of current supplied to the wiring BBN from the circuit CMB and the sum $I_r$ of currents flowing from the wiring BBN to the second terminals of the transistors M2 in the memory cell AMr[1] to the memory cell AMr[m] have the relationship of $I_x-I_r<0$, no current flows between the first terminal and the second terminal of the transistor M6B in the circuit CMS2. Thus, current is not drawn from each of the wiring BAN[1] to the wiring BAN[n] by the circuit CMS2. Hence, in the case where $I_x-I_r<0$ is satisfied in the product-sum operation, the circuit structure of the arithmetic circuit MAC10 illustrated in FIG. 20 and FIG. 21 needs to be changed.

Figure 26:
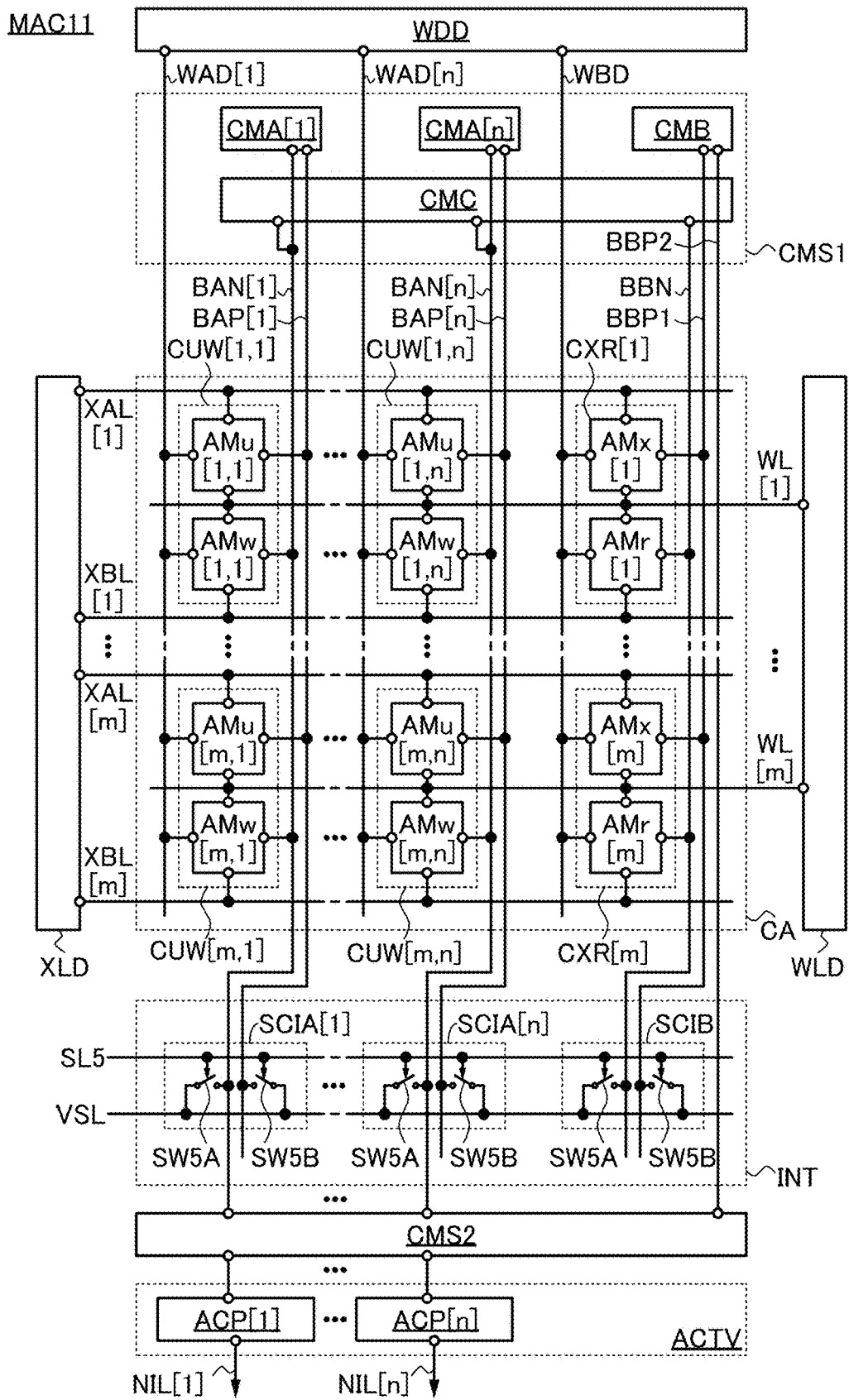
FIG. 26 is a circuit diagram illustrating a structure example of a circuit included in a semiconductor device.

An arithmetic circuit MAC11 illustrated in FIG. 26 is an example of a circuit structure that enables a product-sum operation even in the case where $I_x-I_r<0$ is satisfied. Note that the arithmetic circuit MAC11 is also a modification example of the arithmetic circuit MAC10; thus, description of portions common to the arithmetic circuit MAC11 and the arithmetic circuit MAC10 is sometimes omitted.

In the arithmetic circuit MAC11 in FIG. 26, the circuit CMS1 includes a circuit CMC in addition to the circuit CMA[1] to the circuit CMA[n] and the circuit CMB. The circuit CMC is electrically connected to the wiring BAN[1] to the wiring BAN[n] and the wiring BBN, for example. The circuit CMC has a function of supplying current to the memory cell AMr[1] to the memory cell AMr[m] through the wiring BBN and a function of supplying current to each of the wiring BAN[1] to the wiring BAN[n], for example. Note that the amount of current flowing through the wiring BBN and the amount of current flowing through each of the wiring BAN[1] to the wiring BAN[n], which are from the circuit CMC, are preferably equal to each other. Specifically, the amount of current flowing to the wiring BBN from the circuit CMC is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing to the wiring BAN[j] (j is an integer greater than or equal to 1 and less than or equal to n) from the circuit CMC. Note that the above-described lower limits and upper limits can be combined with each other.

In addition, in the arithmetic circuit MAC11 in FIG. 26, the circuit CMB is electrically connected to a wiring BBP1 and a wiring BBP2. The circuit CMB has a function of supplying current to the memory cell AMx[1] to the memory cell AMx[m] through the wiring BBP1 and a function of supplying current to the wiring BBP2, for example. Note that the amount of current flowing through the wiring BBP1 and the amount of current flowing through the wiring BBP2, which are from the circuit CMB, are preferably equal to each other. Specifically, the amount of current flowing to the wiring BBP1 from the circuit CMB is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing to the wiring BBP2 from the circuit CMB. Note that the above-described lower limits and upper limits can be combined with each other.

Moreover, in the arithmetic circuit MAC11 in FIG. 26, the circuit CMS2 is electrically connected to the wiring BAN[1]

to the wiring BAN[n] and the wiring BBP2, for example. Note that the arithmetic circuit MAC11 in FIG. 26 is different from the arithmetic circuit MAC10 in that current does not directly flow from the wiring BBN to the circuit CMS2. The circuit CMS2 has a function of discharging current flowing through the wiring BBP2 and a function of discharging current flowing through each of the wiring BAN[1] to the wiring BAN[n], for example. Note that the amount of current discharged from the wiring BBP2 and the amount of current discharged from each of the wiring BAN[1] to the wiring BAN[n] by the circuit CMS2 are preferably equal to each other. Specifically, the amount of current flowing from the wiring BBP2 to the circuit CMS2 is preferably greater than or equal to 0.85 times, greater than or equal to 0.9 times, or greater than or equal to 0.95 times and less than or equal to 1.05 times, less than or equal to 1.1 times, or less than or equal to 1.15 times the amount of current flowing from the wiring BAN[j] (j is an integer greater than or equal to 1 and less than or equal to n) to the circuit CMS2. Note that the above-described lower limits and upper limits can be combined with each other.

Figure 27:
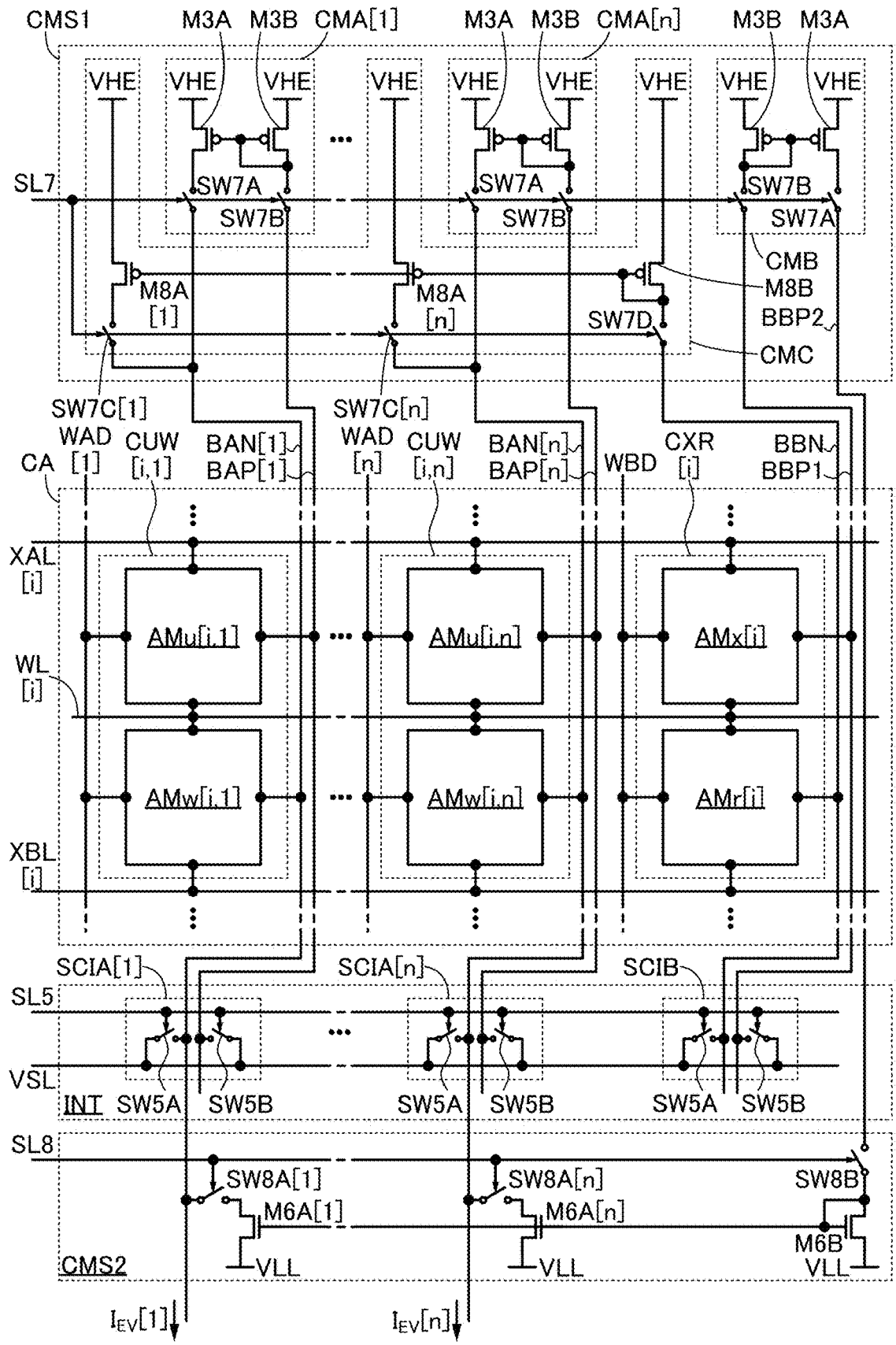
FIG. 27 is a circuit diagram illustrating a structure example of a circuit included in a semiconductor device.

FIG. 27 illustrates a circuit structure example applicable to the circuit CMS1 and the circuit CMS2 in the arithmetic circuit MAC11 in FIG. 26. Note that for the structures of the memory cell AMu[i, 1] to the memory cell AMu[i,n], the memory cell AMw[i, 1] to the memory cell AMw[i,n], the memory cell AMx[i], and the memory cell AMr[i], refer to the structures of the memory cell AMu[i, 1] to the memory cell AMu[in], the memory cell AMw[i,1] to the memory cell AMw[in], the memory cell AMx[i], and the memory cell AMr[i] in FIG. 21.

The circuit CMA[1] to the circuit CMA[n] and the circuit CMB in the circuit CMS1 in FIG. 27 have the structures of the circuit CMA[1] to the circuit CMA[n] and the circuit CMB in FIG. 21. Thus, for the circuit structures of the circuit CMA[1] to the circuit CMA[n] and the circuit CMB illustrated in FIG. 27, the circuit elements included therein, and the like, refer to the above description of the circuit CMA[1] to the circuit CMA[n] and the circuit CMB included in the arithmetic circuit MAC10.

The circuit CMC in the circuit CMS1 in FIG. 27 includes a switch SW7C[1] to a switch SW7C[n], a switch SW7D, a transistor M8A[1] to a transistor M8A[n], and a transistor M8B, for example. A first terminal of the transistor M8A[1] is electrically connected to the wiring VHE, a second terminal of the transistor M8A[1] is electrically connected to a first terminal of the switch SW7C[1], and a second terminal of the switch SW7C[1] is electrically connected to the wiring BAN[1]. A first terminal of the transistor M8A[n] is electrically connected to the wiring VHE, a second terminal of the transistor M8A [n] is electrically connected to a first terminal of the switch SW7C[n], and a second terminal of the switch SW7C[n] is electrically connected to the wiring BAN[n]. A first terminal of the transistor M8B is electrically connected to the wiring VHE, a second terminal of the transistor M8B is electrically connected to a gate of each of the transistor M8A[1] to the transistor M8A[n], a gate of the transistor M8B, and a first terminal of the switch SW7D, and a second terminal of the switch SW7D is electrically connected to the wiring BBN. A control terminal of each of the switch SW7C[1] to the switch SW7C[n] and the switch SW7D is electrically connected to the wiring SL7.

Although not illustrated in FIG. 27, a first terminal of the transistor M8A[j] is electrically connected to the wiring VHE, a second terminal of the transistor M8A[j] is electrically connected to a first terminal of the switch SW7C[j], and a second terminal of the switch SW7C[j] is electrically connected to the wiring BAN[j] in the circuit CMC. A gate of the transistor M8A[j] is electrically connected to the gate of the transistor M8B. A control terminal of the switch SW7C[j] is electrically connected to the wiring SL7.

Note that the transistor M8A[1] to the transistor M8A[n] and the transistor M8B are preferably p-channel transistors, for example. As the transistor M8A[1] to the transistor M8A[n] and the transistor M8B, transistors that can be used as the transistor M3A and the transistor M3B can be used, for example.

As the switch SW7C[1] to the switch SW7C[n] and the switch SW7D, for example, a switch that can be used as the switch SW7A or the switch SW7B can be used.

Since the wiring SL7 is electrically connected to the control terminal of each of the switch SW7C[1] to the switch SW7C[n] and the switch SW7D, switching of the on state and the off state of the switch SW7C[1] to the switch SW7C[n] and the switch SW7D is synchronized with switching of the on state and the off state of the switch SW7A and the switch SW7B included in each of the circuit CMA[1] to the circuit CMA[n] and the circuit CMB. Thus, when the switch SW7A and the switch SW7B are in one of the on state and the off state, the switch SW7C[1] to the switch SW7C[n] and the switch SW7D are each in the one of the on state and the off state.

In the circuit CMS2 in FIG. 27, the first terminal of the switch SW8B is electrically connected to the wiring BBP2. That is, unlike the arithmetic circuit MAC10 in FIG. 21, the arithmetic circuit MAC11 in FIG. 27 has a structure in which current flows to the circuit CMS2 not from the wiring BBN but from the wiring BBP2.

Here, the operation at the time when the potentials corresponding to the first data are retained in the memory cells AMu, the memory cells AMw, the memory cells AMx, and the memory cells AMr in the memory cell array CA and the second data is input to each of the wiring XAL[1] to the wiring XAL[m] and the wiring XBL[1] to the wiring XBL[m] is considered.

Specifically, the operation from Time T31 to Time T39 in the timing charts in FIG. 24 and FIG. 25 is performed also in the arithmetic circuit MAC11 in FIG. 26 and FIG. 27. Thus, in the arithmetic circuit MAC11, the memory cell AMu[i,j] and the memory cell AMw[i,j] each retain $V_{W\alpha}[i,j]$ and the memory cell AMx[i] and the memory cell AMr[i] each retain $V_{W\beta}[i]$ during the period from Time T31 to Time T36. In addition, in the arithmetic circuit MAC11, $V_{X\alpha}[1]$ to $V_{X\alpha}[m]$ are respectively input to the wiring XAL[1] to the wiring XAL[m] and $V_{X\beta}$ is input to each of the wiring XBL[1] to the wiring XBL[m] during the period from Time T37 to Time T38.

After that, through the operation from Time T38 to Time T39, the arithmetic circuit MAC11 outputs current corresponding to the result of the product-sum operation of the m pieces of first data and the m pieces of second data in each of the first group to the n-th group from the wiring NIL[1] to the wiring NIL[n].

Specifically, a plurality of switches SW7A, a plurality of switches SW7B, the switch SW7C[1] to the switch SW7C [n], the switch SW7D, the switch SW8A[1] to the switch SW8A[n], and the switch SW8B included in the circuit CMS1 are each turned on and a plurality of switches SW5A and a plurality of switches SW5B included in the circuit INT are each turned off, so that the memory cells included in the memory cell array CA, the circuit CMA[1] to the circuit CMA[n], the circuit CMB, the circuit CMC, and the circuit CMS2 supply current to the wiring BAN[1] to the wiring BAN[n], the wiring BAP[1] to the wiring BAP[n], the wiring BBN, the wiring BBP1, and the wiring BBP2. The details will be described below.

The circuit CMB in FIG. 27 having the above structure functions as a current mirror circuit. Specifically, with reference to the potential of the wiring BBP1, the circuit CMB in FIG. 27 has a function of supplying current with the amount, which is almost equal to the amount of current flowing between the source and the drain of the transistor M3B, between the source and the drain of the transistor M3A.

Thus, the sum $I_x$ of currents flowing through the second terminals of the transistors M2 in the memory cell AMx[1] to the memory cell AMx[m] positioned in the n+1-th column is supplied from the circuit CMB through the wiring BBP1. The wiring BBP2 is supplied with the current with the amount $I_x$ from the circuit CMB.

The circuit CMS2 in FIG. 27 having the above structure also functions as a current mirror circuit. Specifically, with reference to the potential of the wiring BBP2, the circuit CMS2 in FIG. 27 has a function of supplying current with the amount, which is almost equal to the amount of current flowing between the source and the drain of the transistor M6B, between the source and the drain of each of the transistor M6A[1] to the transistor M6A[n].

Since the current with the current amount $I_x$ flows from the wiring BBP2 to the second terminal of the transistor M6B in the circuit CMS2, the current with the amount $I_x$ flows between the source and the drain of each of the transistor M6A[1] to the transistor M6A[n]. Thus, the current with $I_x$ flows to the circuit CMS2 from each of the wiring BAN[1] to the wiring BAN[n].

The circuit CMC in FIG. 27 having the above structure functions as a current mirror circuit. Specifically, with reference to the potential of the second terminal of the transistor M7D (wiring BBN), the circuit CMC in FIG. 27 has a function of supplying current corresponding to the potential between the source and the drain of each of the transistor M8A[1] to the transistor M8A[n] and the transistor M8B. In other words, the circuit CMC has a function of supplying current with the amount, which is almost equal to the amount of current flowing between the source and the drain of the transistor M8B, between the source and the drain of each of the transistor M7A[1] to the transistor M7A[n].

The sum $I_r$ of currents flowing through the second terminals of the transistors M2 in the memory cell AMr[1] to the memory cell AMr[m] positioned in the n+1-th column is supplied from the circuit CMC through the wiring BBN. Thus, the wiring BAN[1] to the wiring BAN[n] are supplied with the current with the amount $I_r$ from the circuit CMC.

The circuit CMA[1] to the circuit CMA[n] in FIG. 27 having the above structure each function as a current mirror circuit. When the j-th column is focused on, for example, with reference to the potential of the wiring BAP[j], the circuit CMA[j] has a function of supplying current with the amount, which is almost equal to the amount of current flowing between the source and the drain of the transistor M3B, between the source and the drain of the transistor M3.

The sum $I_u[j]$ of currents flowing through the second terminals of the transistors M2 in the memory cell AMu[1,j] to the memory cell AMu[m,j] positioned in the j-th column is supplied from the circuit CMA[j] through the wiring BAP[j]. Thus, the wiring BAN[j] is supplied with the current with the amount $I_u[j]$ from the circuit CMA[j].

Assuming that the total amount of current flowing from the wiring BAN[j] to the second terminals of the transistors M2 in the memory cell AMw[1,j] to the memory cell AMw[m,j] in the j-th column is $I_w[j]$, the amount $I_{EV}[j]$ of current flowing through the wiring BAN[j] can be expressed by the same formula as Formula (2.7).

Unlike the arithmetic circuit MAC10, the arithmetic circuit MAC11 has a structure in which the current with $I_r$ is supplied to the wiring BAN[1] to the wiring BAN[n] using the circuit CMC and thus can perform a product-sum operation even though $I_x$ and $I_r$ have the relationship of $I_x-I_r<0$.

Note that the structure of the circuit CMC is not limited to the structure illustrated in FIG. 27. Like the circuit CMS illustrated in FIG. 3B, the circuit CMS2 in FIG. 22, and the like, the circuit CMC may include a transistor (not illustrated) for cascode-connecting the transistor M8A[1] to the transistor M8A[n] and the transistor M8B, for example. Cascode-connecting the transistor M8A[1] to the transistor M8A[n] and the transistor M8B can further stabilize the operation of the current mirror circuit of the circuit CMC.

Structure Example 3 of Semiconductor Device

The semiconductor device of one embodiment of the present invention is not limited to the arithmetic circuit MAC10 illustrated in FIG. 20 and FIG. 21 or the arithmetic circuit MAC11 illustrated in FIG. 26 and FIG. 27. For example, the semiconductor device of one embodiment of the present invention may have a circuit structure changed from that of the arithmetic circuit MAC10 or the arithmetic circuit MAC11.

Figure 28:
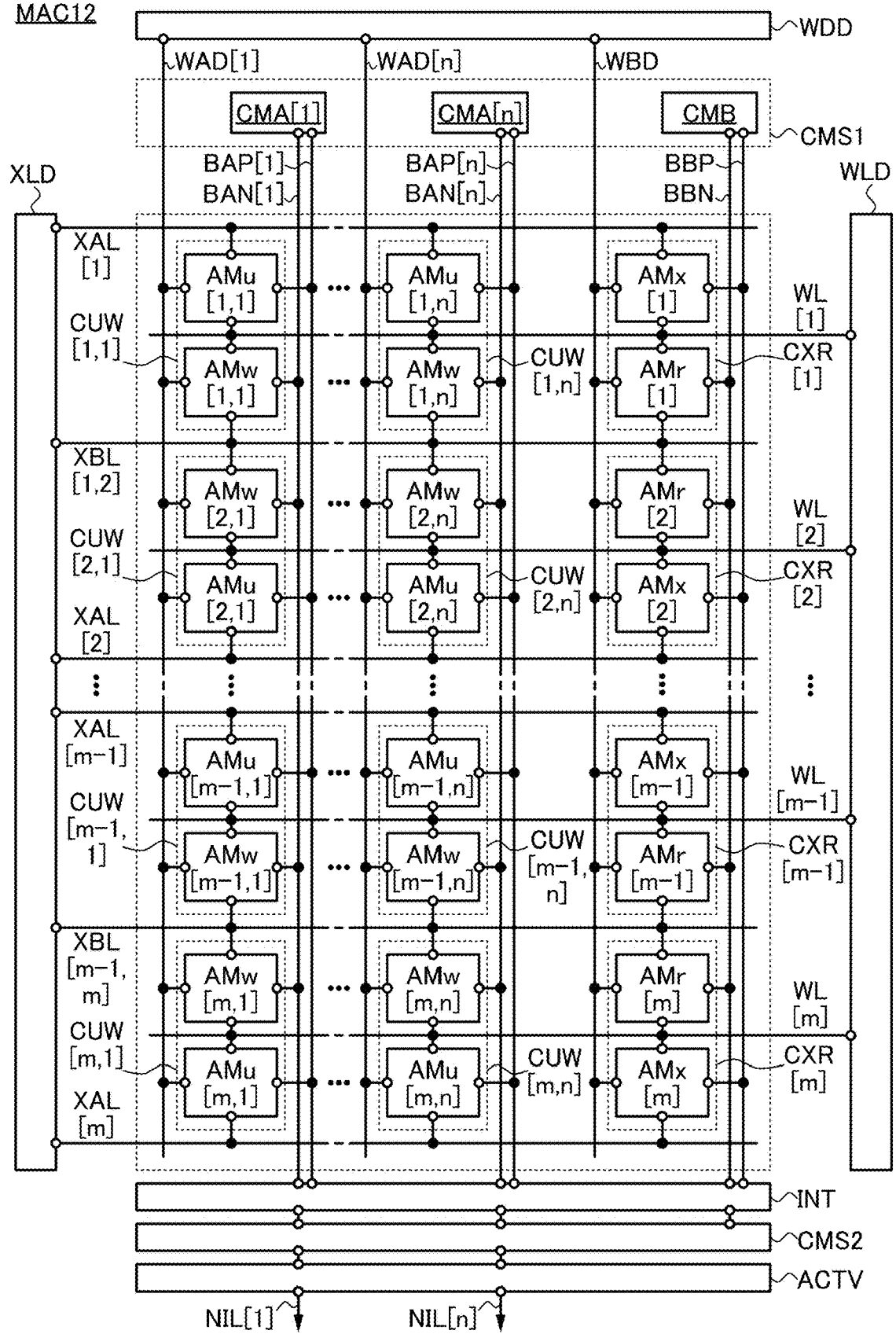
FIG. 28 is a circuit diagram illustrating a structure example of a circuit included in a semiconductor device.

An arithmetic circuit MAC12 illustrated in FIG. 28 is a modification example of the arithmetic circuit MAC10 illustrated in FIG. 20, and has the structure in which the wiring XBL[1] and the wiring XBL[2] are combined into one wiring XBL[1,2] and the wiring XBL[m−1] and the wiring XBL[m] are combined into one wiring XBL[m−1,m], like the arithmetic circuit MAC7 illustrated in FIG. 17. That is, the number of wirings XBL in the arithmetic circuit MAC12 in FIG. 28 is m/2. Note that in the arithmetic circuit MAC12 in FIG. 28, m is an even number greater than or equal to 2.

Thus, the arithmetic circuit MAC12 illustrated in FIG. 28 has a structure in which the memory cell AMw[1,1] to the memory cell AMw[1,n], the memory cell AMr[1], the memory cell AMw[2, 1] to the memory cell AMw[2,n], and the memory cell AMr[2] are electrically connected to the wiring XBL[1,2], and the memory cell AMw[m−1,1] to the memory cell AMw[m−1,n], the memory cell AMr[m−1], the memory cell AMw[m, 1] to the memory cell AMw[m,n], and the memory cell AMr[m] are electrically connected to the wiring XBL[m−1,m].

In the memory cell array CA in FIG. 28, the memory cells are arranged in a matrix of 2m rows and 2 columns as in the arithmetic circuit MAC10. In FIG. 28, for example, the memory cell AMu[i,j] is provided at an address of the 2i−1-th row and the j-th column, the memory cell AMw[i,j] is provided at an address of the 2i-th row and the j-th column, the memory cell AMx[i] is provided at an address of the 2i−1-th row and the n+1-th column, the memory cell AMr[i] is provided at an address of the 2i-th row and the n+1-th column, the memory cell AMu[i+1,j] is provided at an address of the 2i+2-th row and the j-th column, the memory cell AMw[i+1,j] is provided at an address of the 2i+1-th row and the j-th column, the memory cell AMx[i+1] is provided at an address of the 2i+2-th row and the n+1-th column, and the memory cell AMr[i+1] is provided at an address of the 2i+1-th row and the n+1-th column. Note that in the arithmetic circuit MAC12 in FIG. 28, i is an odd number greater than or equal to 1 and less than or equal to m.

Thus, the memory cell AMw[i, 1] to the memory cell AMw[i,n], the memory cell AMr[i], the memory cell AMw[i+1,1] to the memory cell AMw[i+1,n], and the memory cell AMr[i+1] are electrically connected to the wiring XBL[i,j+1], although not illustrated in FIG. 28.

Note that this embodiment can be combined with any of the other embodiments in this specification as appropriate.

Embodiment 3

Described in this embodiment is a structure example in which a capacitor using a material that can show ferroelectricity is used in any of the arithmetic circuits described in the above embodiment.

Examples of a material that can show ferroelectricity include hafnium oxide, zirconium oxide, $HfZrO_X$ (X is a real number greater than 0), a material in which an element J (the element J here is silicon (Si), aluminum (Al), gadolinium (Gd), yttrium (Y), lanthanum (La), strontium (Sr), or the like) is added to hafnium oxide, yttria-stabilized zirconia (YSZ), $PbTiO_X$, barium strontium titanate (BST), strontium titanate, lead zirconate titanate (PZT), strontium bismuth tantalate (SBT), bismuth ferrite (BFO), and barium titanate. Alternatively, as the material, a piezoelectric ceramic having a perovskite structure may be used. The material can be, for example, a plurality of materials selected from the above-listed materials or a stacked-layer structure of a plurality of materials selected from the above-listed materials. Since hafnium oxide may change its crystal structure (characteristics) according to structures of upper and lower films, a process, and the like as well as deposition conditions, a material that exhibits ferroelectricity is referred to not only as a ferroelectric but also as a material that can show ferroelectricity or a material that shows ferroelectricity in this specification and the like.

A material that can show ferroelectricity is an insulator and has a property in which application of an electric field from the outside causes internal polarization and the polarization remains even after the electric field is made zero; thus, such a material can be used as a nonvolatile memory element. Hence, the use of the material as a dielectric sandwiched between a pair of electrodes of a capacitor allows the capacitor to be "a capacitor that can show ferroelectricity". In this specification and the like, a capacitor that can show ferroelectricity includes the material between a first terminal and a second terminal of the capacitor in some cases. Note that a memory circuit using a capacitor that can show ferroelectricity is sometimes referred to as an FeRAM (Ferroelectric Random Access Memory), a ferroelectric memory, or the like.

In an FeRAM (ferroelectric memory), a value of data depends on the direction of polarization (polarity) in a capacitor that can show ferroelectricity. For example, the value can be "1" when the polarity is positive (plus), and the value can be "0" when the polarity is negative (minus). For another example, the value may be "0" when the polarity is positive (plus), and the value may be "1" when the polarity is negative (minus). Note that a capacitor that can show ferroelectricity described in this embodiment retains a binary value as described above or an analog value.

With data writing, a capacitor that can show ferroelectricity can retain polarization for a long time. Thus, a potential between a pair of electrodes of the capacitor can be retained for a long time. In addition, the capacitor can have a smaller area than a conventional capacitor; hence, the use of the capacitor that can show ferroelectricity in a memory cell enables the area of the memory cell to be reduced and the integration degree of an arithmetic circuit to be increased.

Data writing to a capacitor that can show ferroelectricity (polarization of a material that can show ferroelectricity) requires application of a high voltage between a pair of electrodes. This leads to a need for providing a driver circuit that can supply a high voltage for data writing to a memory cell including a capacitor that can show ferroelectricity.

Figure 29:
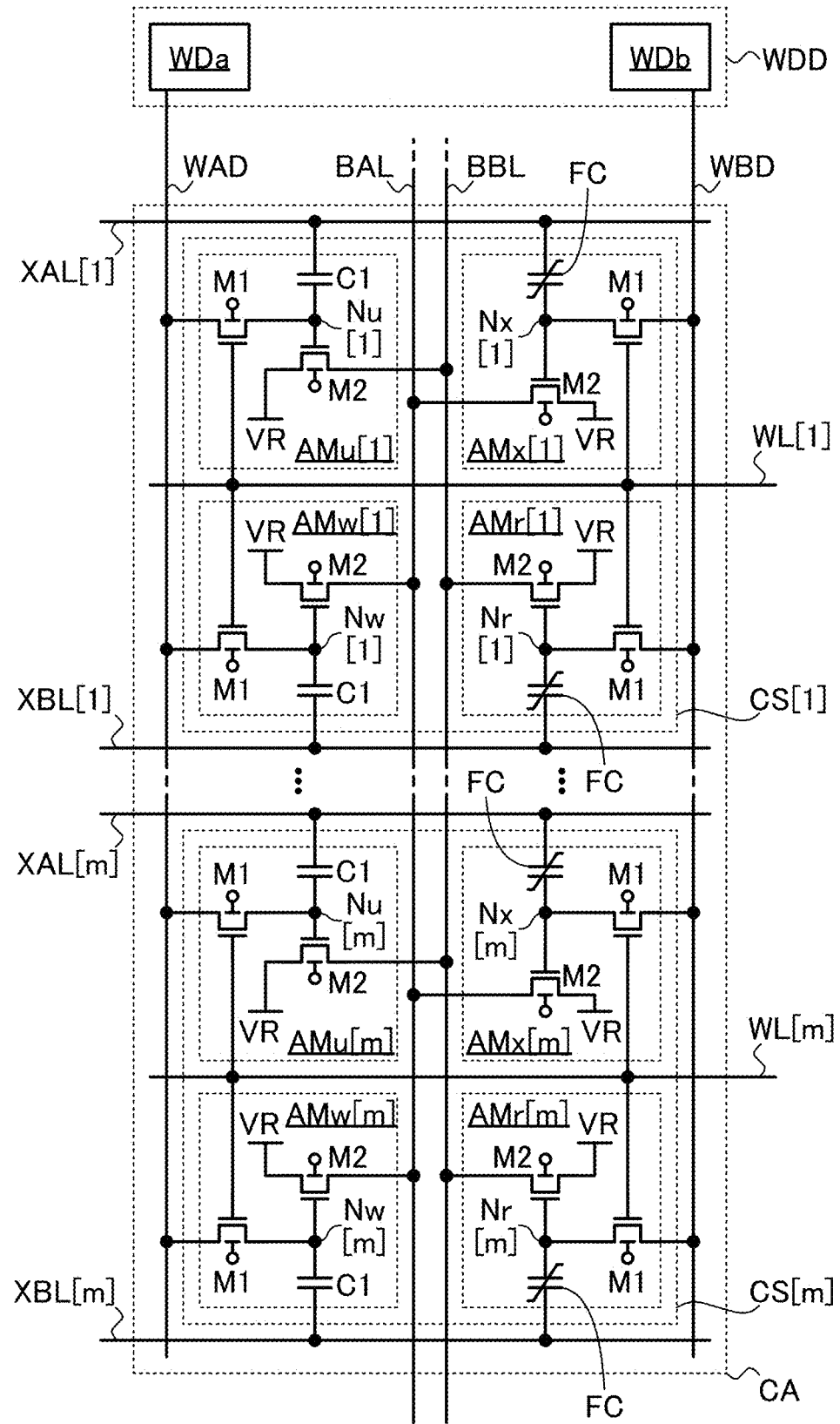
FIG. 29 is a circuit diagram illustrating a structure example of a circuit included in a semiconductor device.

Described here is a circuit structure of the case where a capacitor having a dielectric property is used in the memory cells in any of the arithmetic circuits described in the above embodiment. FIG. 29 illustrates the structures of the memory cell array CA and the circuit WDD, which are modification examples of the memory cell array CA illustrated in FIG. 13 and the circuit WDD in FIG. 12, FIG. 16, or FIG. 17 to FIG. 19.

The memory cell array CA includes the memory cells AMu, the memory cells AMw, the memory cells AMx, and the memory cells AMr. The memory cells AMu and the memory cells AMw illustrated in FIG. 29 can have structures similar to those of the memory cells AMu and the memory cells AMw included in the memory cell array CA in FIG. 13. Note that the memory cells AMx and the memory cells AMr illustrated in FIG. 29 are different from the memory cells AMx and the memory cells AMr in FIG. 13 in that the capacitor C1 is replaced with a capacitor FC. The capacitor FC in this embodiment is the above-described capacitor that can show ferroelectricity.

The circuit WDD illustrated in FIG. 29 includes a circuit WDa and a circuit WDb. Like the circuit WDD in FIG. 12, FIG. 16, or FIG. 17 to FIG. 19, the circuit WDD has a function of transmitting data to be stored in each memory cell included in the memory cell array CA. In particular, the circuit WDa has a function of transmitting data to the memory cell AMu[1] to the memory cell AMu[m] and the memory cell AMw[1] to the memory cell AMw[m] in the memory cell array CA, and the circuit WDb has a function of transmitting data to the memory cell AMx[1] to the memory cell AMx[m] and the memory cell AMr[1] to the memory cell AMr[m] in the memory cell array CA.

The circuit WDD may include, for example, a digital-to-analog converter circuit (DAC) that converts digital data transmitted from the outside into analog data and transmits the data to the wiring WAD and the wiring WBD. Note that the circuit WDD included in the arithmetic circuit described in the above embodiment can include a digital-to-analog converter circuit similarly.

Thus, the circuit WDa and the circuit WDb may each include a digital-to-analog converter circuit. In particular, data writing to the capacitor FC included in each of the memory cell AMx[1] to the memory cell AMx[m] and the memory cell AMr[1] to the memory cell AMr[m] (polarization of a material that can show ferroelectricity and is included in the capacitor FC) requires input of data of a voltage higher (or lower) than voltage of data to be written to the capacitor C1; thus, the digital-to-analog converter circuit included in the circuit WDb is preferably capable of supplying a higher voltage or a lower voltage (e.g., a ground voltage, a negative voltage, or the like) than that included in the circuit WDa. Meanwhile, in the case where data is written to the capacitor C1 included in each of the memory cell AMu[1] to the memory cell AMu[m] and the memory cell AMw[1] to the memory cell AMw[m], voltage that needs to be supplied is not so high or low as voltage required when data is written to the capacitor FC included in each of the memory cell AMx[1] to the memory cell AMx[m] and the memory cell AMr[1] to the memory cell AMr[m]; thus, the digital-to-analog converter circuit included in the circuit WDa does not need to be the digital-to-analog converter circuit that is capable of supplying a high voltage or a low voltage and is included in the circuit WDb. Since the circuit WDa does not need to include the digital-to-analog converter circuit that is capable of supplying a high voltage or a low voltage and is included in the circuit WDb, the circuit WDa can have a smaller area than the circuit WDb, resulting in a reduction in the area of the entire arithmetic circuit.

As described above, when the capacitor FC included in each of the memory cell AMx[1] to the memory cell AMx[m] and the memory cell AMr[1] to the memory cell AMr[m] includes a material that can show stronger ferroelectricity than a material in the capacitor C1 included in each of the memory cell AMu[1] to the memory cell AMu[m] and the memory cell AMw[1] to the memory cell AMw[m], the areas of the memory cell array CA and the circuit WDD can be reduced.

As described in the above embodiment, the voltage written to the capacitors C1 in the memory cell AMu[i] (here, i is an integer greater than or equal to 1 and less than or equal to m) and the memory cell AMw[i] can be $V_{W\alpha}[i]=V_{W\beta}[i]+V_W[i]$, and the voltage written to the capacitors FC in the memory cell AMx[i] and the memory cell AMr[i] can be $V_{W\beta}[i]$. In addition, since $V_{W\beta}[i]$ can be a given voltage as described in the above embodiment, $V_{W\beta}[1]$ to $V_{W\beta}[m]$ can be the same voltage. That is, the voltage written to the capacitors C1 in the memory cell AMu[i] and the memory cell AMw[i] is $V_{W\alpha}[i]=V_{W\beta}+V_W[i]$, and the voltage written to the capacitors FC in the memory cell AMx[i] and the memory cell AMr[i] is $V_{W\beta}$.

In that case, the same voltage $V_{W\beta}$ is applied to the capacitors FC included in the memory cell AMx[1] to the memory cell AMx[m] and the memory cell AMr[1] to the memory cell AMr[m]; thus, the circuit WDb can include a voltage source that supplies $V_{W\beta}$ as a given voltage instead of the digital-to-analog converter circuit. The circuit WDb including the voltage source can have a smaller circuit area than the circuit WDb including the digital-to-analog converter circuit, thereby further reducing the area of the circuit WDD.

The structures of the memory cell array CA and the circuit WDD in FIG. 29 are described as the modification examples of the memory cell array CA illustrated in FIG. 13 and the circuit WDD in FIG. 12, FIG. 16, or FIG. 17 to FIG. 19, i.e., as the modification examples of the arithmetic circuit MAC5 to the arithmetic circuit MAC9; however, one embodiment of the present invention is not limited thereto. For example, the structures of the memory cell array CA illustrated in FIG. 20 to FIG. 22 and FIG. 26 to FIG. 28 and the circuit WDD illustrated in FIG. 20, FIG. 26, and FIG. 28 can be changed in a manner similar to the above.

Figure 30:
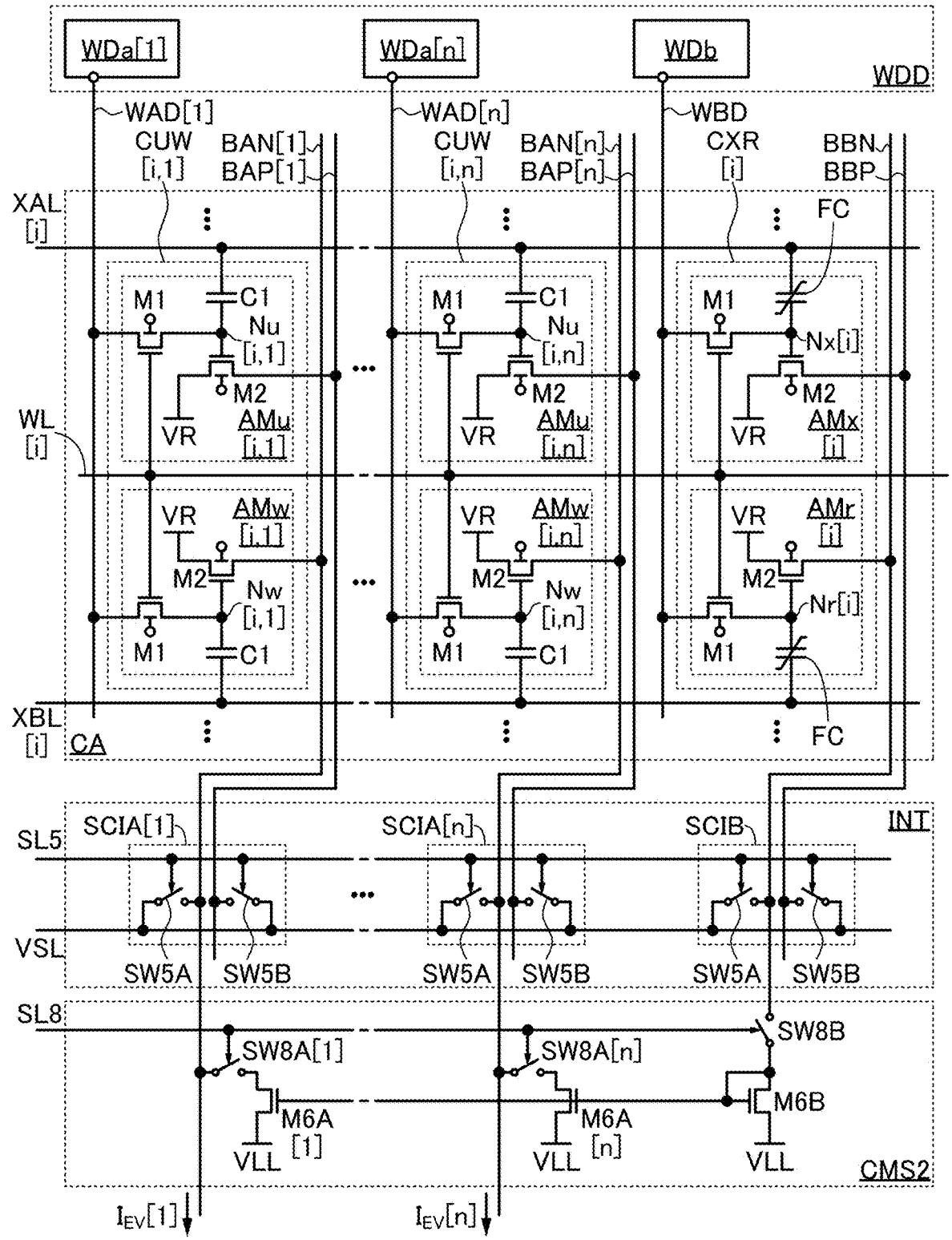
FIG. 30 is a circuit diagram illustrating a structure example of a circuit included in a semiconductor device.

FIG. 30 illustrates the structures of the memory cell array CA and the circuit WDD, which are modification examples of the memory cell array CA illustrated in FIG. 21 and the circuit WDD illustrated in FIG. 20, FIG. 26, and FIG. 28. Note that FIG. 30 also illustrates the circuit INT and the circuit CMS2 for convenience.

The memory cell array CA includes the memory cells AMu, the memory cells AMw, the memory cells AMx, and the memory cells AMr. The memory cell AMu[i, 1] to the memory cell AMu[i,n] and the memory cell AMw[i, 1] to the memory cell AMw[i,n] illustrated in FIG. 30 can have structures similar to those of the memory cells AMu and the memory cells AMw included in the memory cell array CA in FIG. 13. Furthermore, the memory cell AMx[i] and the memory cell AMr[i] illustrated in FIG. 30 include the capacitors FC instead of the capacitors C1, as in FIG. 29.

The circuit WDD in FIG. 30 includes a circuit WDa[1] to a circuit WDa[n] and the circuit WDb. Refer to the description of the circuit WDa in FIG. 29 for the circuit WDa[1] to the circuit WDa[n], and refer to the description of the circuit WDb in FIG. 29 for the circuit WDb.

Changing the memory cell array CA illustrated in FIG. 21 and the circuit WDD illustrated in FIG. 20, FIG. 26, and FIG. 28 into the memory cell array CA and the circuit WDD illustrated in FIG. 30 can reduce the areas of the memory cell array CA and the circuit WDD. As a result, the circuit area of the entire arithmetic circuit can be reduced.

Although FIG. 30 illustrates the modification examples of the memory cell CA and the circuit WDD in FIG. 20 in the above, the memory cell CA and the circuit WDD in FIG. 26 or FIG. 28 can be changed in a manner similar to those in FIG. 30.

Data writing to the capacitor FC described with reference to each of FIG. 29 and FIG. sometimes requires application of a predetermined voltage to the wiring XAL and the wiring XBL. In that case, the wirings XAL and XBL function not only as wirings inputting the second data, but also as plate lines for writing data to the capacitors FC.

Note that this embodiment can be combined with any of the other embodiments in this specification as appropriate.

Embodiment 4

A hierarchical neural network is described in this embodiment. An arithmetic operation of a hierarchical neural network can be performed using the semiconductor device described in the above embodiments.

<Hierarchical Neural Network>

Figure 31A:
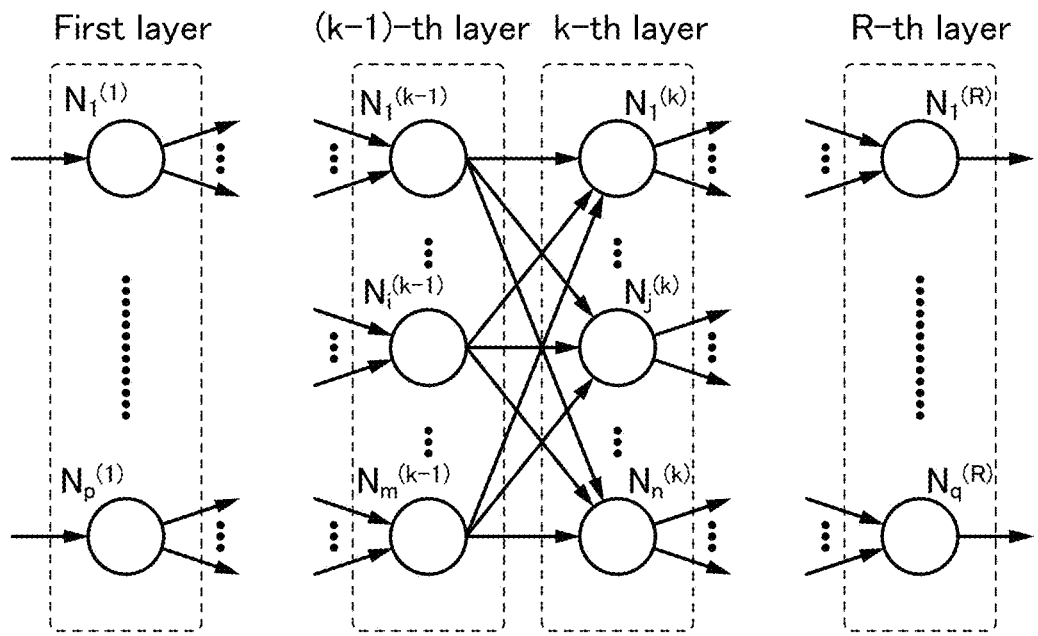
FIG. 31A and FIG. 31B are diagrams illustrating a hierarchical neural network.

A hierarchical neural network includes one input layer, one or a plurality of intermediate layers (hidden layers), and one output layer, for example, and is configured with a total of at least three layers. A hierarchical neural network 100 illustrated in FIG. 31A is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 31A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 31A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 31A selectively illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$ Next, signal transmission from a neuron in one layer to a neuron in the subsequent layer and signals input to and output from the neurons are described. Note that description here is made focusing on the neuron $N_j^{(k)}$ in the k-th layer.

Figure 31B:
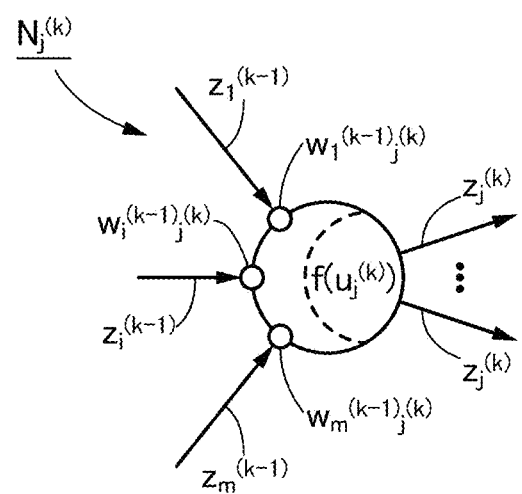

FIG. 31B illustrates the neuron $N_j^{(k)}$ in the k-th layer, signals input to the neuron $N_j^{(k)}$, and a signal output from the neuron $N_j(k)$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)(k)}_j$, a signal input to the neuron $N_j^{(k)}$ in the k-th layer can be expressed by Formula (4.1).

[Formula 30]

$$w_i^{(k-1)(k)}_j \cdot z_i^{(k-1)} \qquad (4.1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the respective weight coefficients ($w_1^{(k-1)(k)}_j$ to $w_m^{(k-1)(k)}_j$). Then, $w_1^{(k-1)}_j(k) \cdot z_1^{(k-1)}$ to $w_m^{(k-1)(k)}_j \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (4.2).

[Formula 31]

$$u_j^{(k)} = \sum_{i=1}^{m} w_i^{(k-1)(k)}_j \cdot z_i^{(k-1)} \qquad (4.2)$$

In addition, a bias may be added to the product-sum result of the weight coefficients $w_1^{(k-1)(k)}_j$ to $w_m^{(k-1)}j^{(k)}$ and the signals $z_1^{(k-1)}$ to $z_m^{(k-1)}$ of the neurons. When the bias is denoted by b, Formula (4.2) can be rewritten to the following formula.

[Formula 32]

$$u_j^{(k)} = \sum_{i=1}^{m} w_i^{(k-1)(k)}_j \cdot z_i^{(k-1)} + b \qquad (4.3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 33]

$$z_j^{(k)} = f(u_j^{(k)}) \qquad (4.4)$$

A function $f(u_j^{(k)})$ is an activation function in a hierarchical neural network, and a sigmoid function, a tanh function, a softmax function, a ReLU function (ramp function), a threshold function, or the like can be used. Note that the activation function can be the same or different among all neurons. In addition, the neuron activation function in one layer can be the same as or different from that in another layer.

Signals output from the neurons in the layers, the weight coefficient w, or the bias b can be an analog value or a digital value. The digital value can be, for example, a value with the number of bits of two, or three or more. A value having a larger number of bits may be used. In the case of an analog value, for example, a linear ramp function or a sigmoid function is used as the activation function. In the case of a binary digital value, for example, a step function with an output of −1 or 1 or an output of 0 or 1 is used. Alternatively, the neurons in the layers can each output a ternary or higher-level signal; in this case, a step function with an output of −1, 0, or 1 or a step function with an output of 0, 1, or 2 is used as a ternary activation function. Furthermore, as an activation function for outputting five values, a step function with an output of −2, −1, 0, 1, or 2 may be used, for example. The use of a digital value as at least one of the signals output from the neurons in the layers, the weight coefficient w, and the bias b enables a reduction in the circuit scale, a reduction in power consumption, or an increase in arithmetic operation speed, for example. Furthermore, the use of an analog value as at least one of the signals output from the neurons in the layers, the weight coefficient w, and the bias b can improve the arithmetic operation accuracy.

The neural network 100 performs an operation in which by input of an input signal to the first layer (input layer), output signals are sequentially generated in the layers from the first layer (input layer) to the last layer (output layer) according to Formula (4.1), Formula (4.2) (or Formula (4.3)), and Formula (4.4) on the basis of the signals input from the previous layers, and the output signals are output to the subsequent layers. The signal output from the last layer (output layer) corresponds to the calculation results of the neural network 100.

In the case where the arithmetic circuit MAC5 described in Embodiment 1 is used as the above-described hidden layer, the weight coefficient $w_{s[k-1]}^{(k-1)}{}_{s[k]}^{(k)}$ (s[k−1] is an integer greater than or equal to 1 and less than or equal to m, and s[k] is an integer greater than or equal to 1 and less than or equal to n) is used as the first data, the voltage corresponding to the first data is stored in the memory cells AMx, the memory cells AMu, the memory cells AMw, and the memory cells AMr, the output signal $z_{s[k-1]}^{(k-1)}$ from the neuron $N_{s[k-1]}^{(k-1)}$ in the (k−1)-th layer is used as the second data, and the current with the amount corresponding to the second data is made to flow from the circuit XLD to the plurality of wirings XAL and the plurality of wirings XBL, so that the product-sum of the first data and the second data can be obtained from the current with the amount $I_{EV}$ flowing to the circuit ACTV. In addition, the value of the activation function is obtained using the product-sum value by the circuit ACP in the circuit ACTV, so that the value of the activation function can be the output signal $z_{s[k]}^{(k)}$ of the neuron $N_{s[k]}^{(k)}$ in the k-th layer.

In the case where the arithmetic circuit MAC5 described in Embodiment 1 is used as the above-described output layer, the weight coefficient $w_{s[R-1]}^{(R-1)}{}_{s[R]}^{(R)}$ ($s[R-1]$ is an integer greater than or equal to 1, and $s[R]$ is an integer greater than or equal to 1 and less than or equal to q) is used as the first data, the voltage corresponding to the first data is stored in the memory cells AMx, the memory cells AMu, the memory cells AMw, and the memory cells AMr, the output signal $z_{s[R-1]}^{(R-1)}$ from the neuron $N_{s[R-1]}^{(R-1)}$ in the (R−1)-th layer is used as the second data, and the current with the amount corresponding to the second data is made to flow from the circuit XLD to the plurality of wirings XAL and the plurality of wirings XBL, so that the product-sum of the first data and the second data can be obtained from the current with the amount $I_{EV}$ flowing to the circuit ACTV. In addition, the value of the activation function is obtained using the product-sum value by the circuit ACP in the circuit ACTV, so that the value of the activation function can be the output signal $z_{s[R]}^{(R)}$ of the neuron $N_{s[R]}^{(R)}$ in the R-th layer.

Note that the input layer described in this embodiment may function as a buffer circuit that outputs an input signal to the second layer.

In the case where the arithmetic circuit MAC4 described in Embodiment 1 is used as the above-described hidden layer, for example, the weight coefficient $w_{s[k-1]}^{(k-1)}{}_{s[k]}^{(k)}$ is used as the first data, the voltage corresponding to the first data is stored in the memory cells AMx, the memory cells AMu, the memory cells AMw, and the memory cells AMr, the output signal $z_{s[k-1]}^{(k-1)}$ from the neuron $N_{s[k-1]}^{(k-1)}$ in the (k−1)-th layer is used as the second data, and the current with the amount corresponding to the second data is input from the circuit XLD to the plurality of wirings XAL and the plurality of wirings XBL, whereby the value of the activation function corresponding to the product-sum of the first data and the second data can be calculated from the current amount $I_{EV}$ input to the circuit ACTV. That is, the value can be the output signal $z_{s[k]}^{(k)}$ from the neuron $N_{s[k]}^{(k)}$ in the k-th layer. When the circuit ACTV outputs voltage corresponding to the value, for example, the output signal $z_{s[k]}^{(k)}$ from the neuron $N_{s[k]}^{(k)}$ in the k-th layer input to the plurality of neurons in the (k+1)-th layer can be the voltage. That is, in the case where the arithmetic circuit MAC4 is used as the (k+1)-th hidden layer, the output signal $z_{s[k]}^{(k)}$ from the neuron $N_{s[k]}^{(k)}$ in the k-th layer input to the wiring XAL and the wiring XBL of the arithmetic circuit MAC1 is not generated in the circuit XLD but can be the voltage output from the circuit ACTV of the arithmetic circuit MAC4 of the k-th hidden layer.

Figure 32:
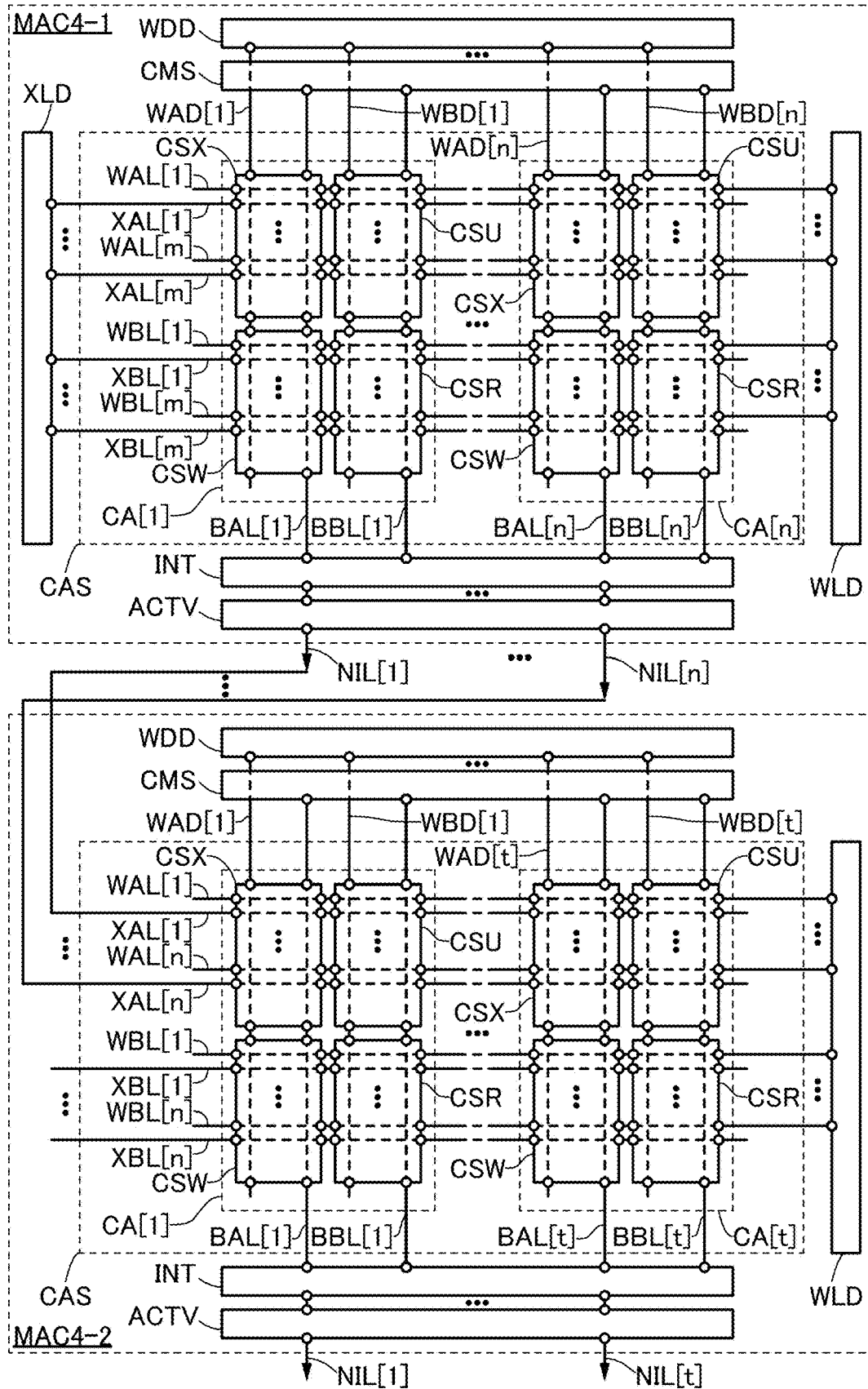
FIG. 32 is a block diagram illustrating a structure example of a semiconductor device.

Specifically, with the use of an arithmetic circuit illustrated in FIG. 32, the arithmetic operation of the hierarchical neural network can be performed. The arithmetic circuit in FIG. 32 includes, for example, an arithmetic circuit MAC4-1 having a structure similar to that of the arithmetic circuit MAC4 in FIG. 18 and an arithmetic circuit MAC4-2 having a structure in which the circuit XLD in the arithmetic circuit MAC4 in FIG. 18 is not provided. Note that the memory cell array CAS in the arithmetic circuit MAC4-1 includes the memory cell array CA[1] to the memory cell array CA[n], and each memory cell array CA includes the m memory cells AMx, the m memory cells AMu, the m memory cells AMw, and the m memory cells AMr. That is, the memory cell array CAS in the arithmetic circuit MAC4-1 includes 2m×2n memory cells in total. Note that the memory cell array CAS in the arithmetic circuit MAC4-2 includes the memory cell array CA[1] to the memory cell array CA[1] (1 is an integer greater than or equal to 1), and each memory cell array CA includes the n memory cells AMx, then memory cells AMu, then memory cells AMw, and the n memory cells AMr. That is, the memory cell array CAS in the arithmetic circuit MAC4-2 includes 2n×2/memory cells in total. The wiring NIL[1] to the wiring NIL[n] in the arithmetic circuit MAC4-1 are electrically connected to the wiring XAL[1] to the wiring XAL[n], respectively, in the arithmetic circuit MAC4-2.

For example, in the arithmetic circuit MAC4-1 in FIG. 32, the weight coefficient between the neurons in the (k−1)-th layer and the neurons in the k-th layer is used as the first data and retained in the memory cell array CA[1] to the memory cell array CA[n], the output signal $z_{s[k-1]}^{(k-1)}$ from the neuron $N_{s[k-1]}^{(k-1)}$ in the (k−1)-th layer is used as the second data, and the voltage corresponding to the second data is input from the circuit XLD to the plurality of wirings XAL and the plurality of wirings XBL, whereby the output signals $z_1^{(k)}$ to $z_n^{(k)}$ of the neuron $N_1^{(k)}$ to the neuron $N_n^{(k)}$ in the k-th layer can be output from the wiring NIL[1] to the wiring NIL[n]. The values of the output signals $z_1^{(k)}$ to $z_n^{(k)}$ can be represented as the voltages output from the circuit ACTV.

Here, in the arithmetic circuit MAC4-2 in FIG. 32, the weight coefficient between the neurons in the k-th layer and the neurons in the (k+1)-th layer is used as the first data and retained in the memory cell array CA[1] to the memory cell array CA[n], and the voltages input to the plurality of wirings XAL, i.e., the output signals $z_1^{(k)}$ to $z_n^{(k)}$ from the neuron $N_1^{(k)}$ to the neuron $N_n^{(k)}$ in the k-th layer, are used as the second data, whereby the wiring NIL[s[k+1]] (here, s[k+1] is an integer greater than or equal to 1 and less than or equal to t) can output the output signal $z_{s[k+1]}^{(k+1)}$ of the neuron $N_{s[k+1]}^{(k+1)}$ in the (k+1)-th layer. Note that a constant potential (a ground potential) is constantly input to the plurality of wirings XBL before the first data is retained in the memory cell array CA[1] to the memory cell array CA[n].

With the arithmetic circuit illustrated in FIG. 32, as described above, the value of the output signal of the neuron (voltage) output from the arithmetic circuit MAC4-1 can be directly input to the arithmetic circuit MAC4-2, whereby an arithmetic operation of a hierarchical neural network can be performed successively from the first layer, for example. The output signals output from the wiring NIL[1] to the wiring NIL[n] of the arithmetic circuit MAC4-1 need not be temporarily stored with an external circuit or the like; thus, a memory device for temporarily storing the signal need not be provided. That is, with the arithmetic circuit in FIG. 32, the circuit area can be reduced and power necessary for transmitting data to be temporarily stored can be reduced.

In the case where the arithmetic circuit MAC9 described in Embodiment 1 is used as the above-described hidden layer, for example, the weight coefficient $w_{s[k-1]}^{(k-1)}$ is used as the first data, the voltage corresponding to the first data is stored in the memory cells AMx, the memory cells AMu, the memory cells AMw, and the memory cells AMr, the output signal $z_{s[k-1]}^{(k-1)}$ from the neuron $N_{s[k-1]}^{(k-1)}$ in the (k−1)-th layer is used as the second data, and the current with the amount corresponding to the second data is input from the circuit XLD to the plurality of wirings XAL and the plurality of wirings XBL, whereby the value of the activation function corresponding to the product-sum of the first data and the second data can be calculated from the current amount $I_{EV}$ input to the circuit ACTV. That is, the value can be the output signal $z_{s[k]}^{(k)}$ from the neuron $N_{s[k]}^{(k)}$ in the k-th layer. When the circuit ACTV outputs voltage corresponding to the value, for example, the output signal $z_{s[k]}^{(k)}$ from the neuron $N_{s[k]}^{(k)}$ in the k-th layer input to the plurality of neurons in the (k+1)-th layer can be the voltage. That is, in the case where the arithmetic circuit MAC9 is used as the (k+1)-th hidden layer, the output signal $z_{s[k]}^{(k)}$ from the neuron $N_{s[k]}^{(k)}$ in the k-th layer input to the wiring XAL and the wiring XBL of the arithmetic circuit MAC9 is not generated in the circuit XLD but can be the voltage output from the circuit ACTV of the arithmetic circuit MAC9 of the k-th hidden layer.

Figure 33:
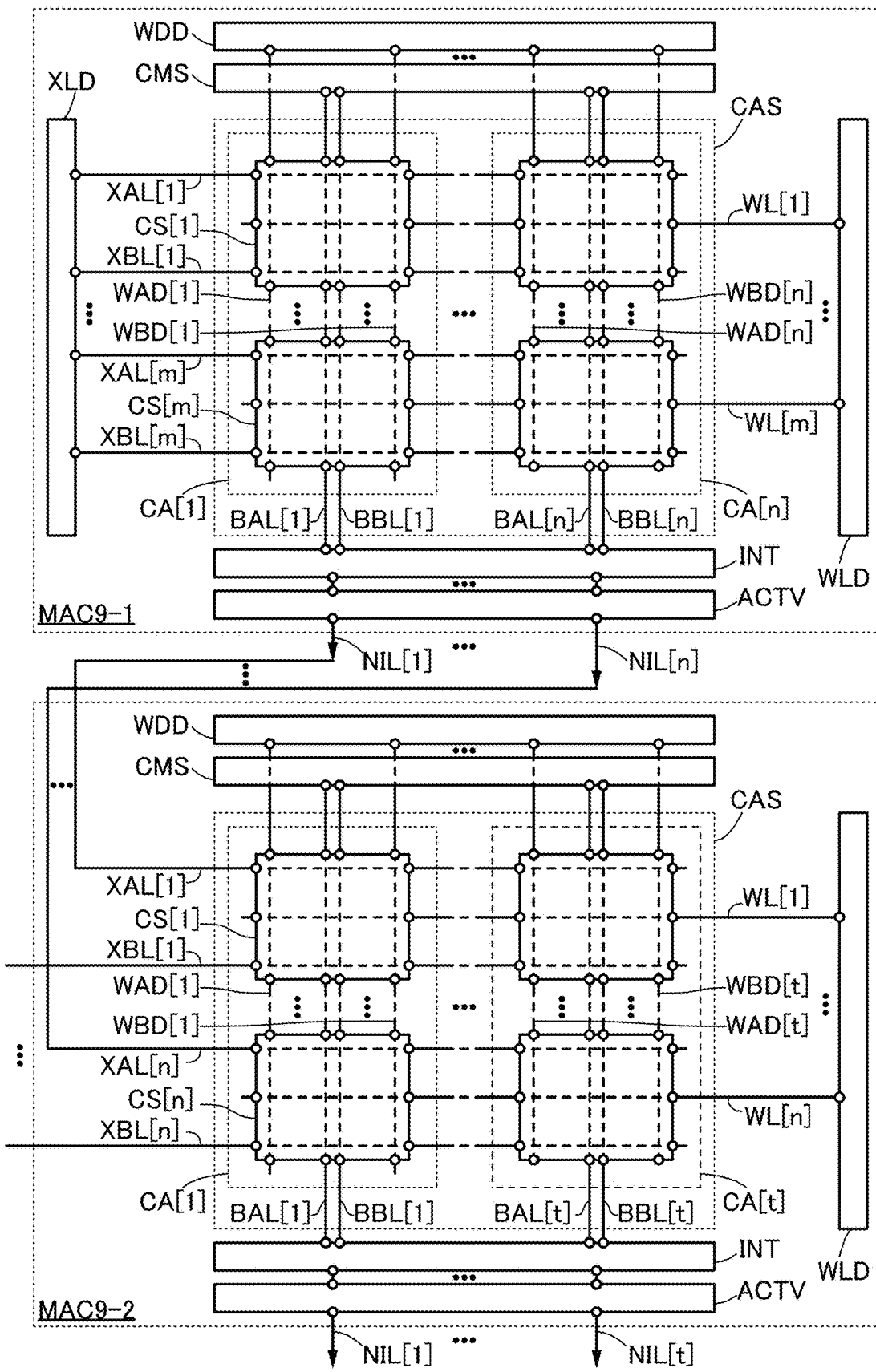
FIG. 33 is a block diagram illustrating a structure example of a semiconductor device.

Specifically, with the use of an arithmetic circuit illustrated in FIG. 33, the arithmetic operation of the hierarchical neural network can be performed. The arithmetic circuit in FIG. 33 includes, for example, an arithmetic circuit MAC9-1 having a structure similar to that of the arithmetic circuit MAC9 in FIG. 19 and an arithmetic circuit MAC9-2 having a structure in which the circuit XLD in the arithmetic circuit MAC9 in FIG. 19 is not provided. Note that the memory cell array CAS in the arithmetic circuit MAC9-1 includes the memory cell array CA[1] to the memory cell array CA[n], and each memory cell array CA includes the m memory cells AMx, the m memory cells AMu, the m memory cells AMw, and the m memory cells AMr. That is, the memory cell array CAS in the arithmetic circuit MAC9-1 includes 2m×2n memory cells in total. Note that the memory cell array CAS in the arithmetic circuit MAC9-2 includes the memory cell array CA[1] to the memory cell array CA[1] (1 is an integer greater than or equal to 1), and each memory cell array CA includes the n memory cells AMx, the n memory cells AMu, the n memory cells AMw, and the n memory cells AMr. That is, the memory cell array CAS in the arithmetic circuit MAC9-2 includes 2n×2t memory cells in total. The wiring NIL[1] to the wiring NIL[n] in the arithmetic circuit MAC9-1 are electrically connected to the wiring XAL[1] to the wiring XAL[n], respectively, in the arithmetic circuit MAC9-2.

For example, in the arithmetic circuit MAC9-1 in FIG. 33, the weight coefficient between the neurons in the (k−1)-th layer and the neurons in the k-th layer is used as the first data and retained in the memory cell array CA[1] to the memory cell array CA [n], the output signal $z_{s[k-1]}^{(k-1)}$ from the neuron $N_{s[k-1]}^{(k-1)}$ in the (k−1)-th layer is used as the second data, and the voltage corresponding to the second data is input from the circuit XLD to the plurality of wirings XAL and the plurality of wirings XBL, whereby the output signals $z_1^{(k)}$ to $z_n^{(k)}$ of the neuron $N_1^{(k)}$ to the neuron $N_n^{(k)}$ in the k-th layer can be output from the wiring NIL[1] to the wiring NIL[n]. The values of the output signals $z_1^{(k)}$ to $z_n^{(k)}$ can be represented as the voltages output from the circuit ACTV.

Here, in the arithmetic circuit MAC9-2 in FIG. 33, the weight coefficient between the neurons in the k-th layer and the neurons in the (k+1)-th layer is used as the first data and retained in the memory cell array CA[1] to the memory cell array CA[n], and the voltages input to the plurality of wirings XAL, i.e., the output signals $z_1^{(k)}$ to $z_n^{(k)}$ from the neuron $N_1^{(k)}$ to the neuron $N_n^{(k)}$ in the k-th layer, are used as the second data, whereby the wiring NIL[s[k+1]] (here, s[k+1] is an integer greater than or equal to 1 and less than or equal to t) can output the output signal $z_{s[k+1]}^{(k+1)}$ of the neuron $N_{s[k+1]}^{(k+1)}$ in the (k+1)-th layer. Note that a constant potential (e.g., a ground potential) is constantly input to the plurality of wirings XBL before the first data is retained in the memory cell array CA[1] to the memory cell array CA[n].

With the arithmetic circuit illustrated in FIG. 33, as described above, the value of the output signal of the neuron (voltage) output from the arithmetic circuit MAC9-1 can be directly input to the arithmetic circuit MAC9-2, whereby an arithmetic operation of a hierarchical neural network can be performed successively from the first layer, for example. The output signals output from the wiring NIL[1] to the wiring NIL[n] of the arithmetic circuit MAC9-1 need not be temporarily stored with an external circuit or the like; thus, a memory device for temporarily storing the signal need not be provided. That is, with the arithmetic circuit in FIG. 33, the circuit area can be reduced and power necessary for transmitting data to be temporarily stored can be reduced.

Note that this embodiment can be combined with any of the other embodiments in this specification as appropriate.

Embodiment 5

This embodiment will describe structure examples of the semiconductor device described in the above embodiments and structure examples of transistors that can be used in the semiconductor device described in the above embodiments.

Structure Example of Semiconductor Device

Figure 34:
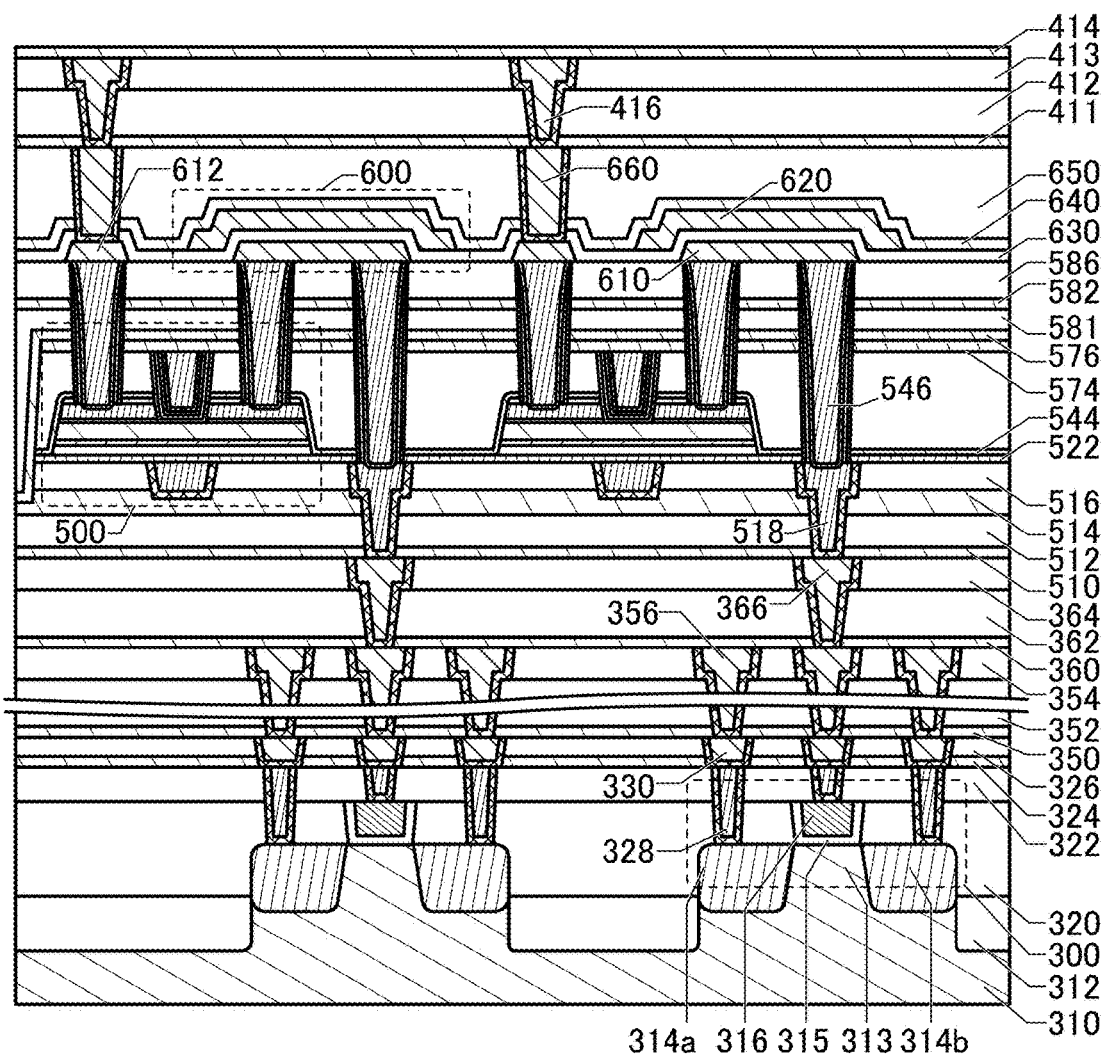
FIG. 34 is a schematic cross-sectional view illustrating a structure example of a semiconductor device.
Figure 35A:
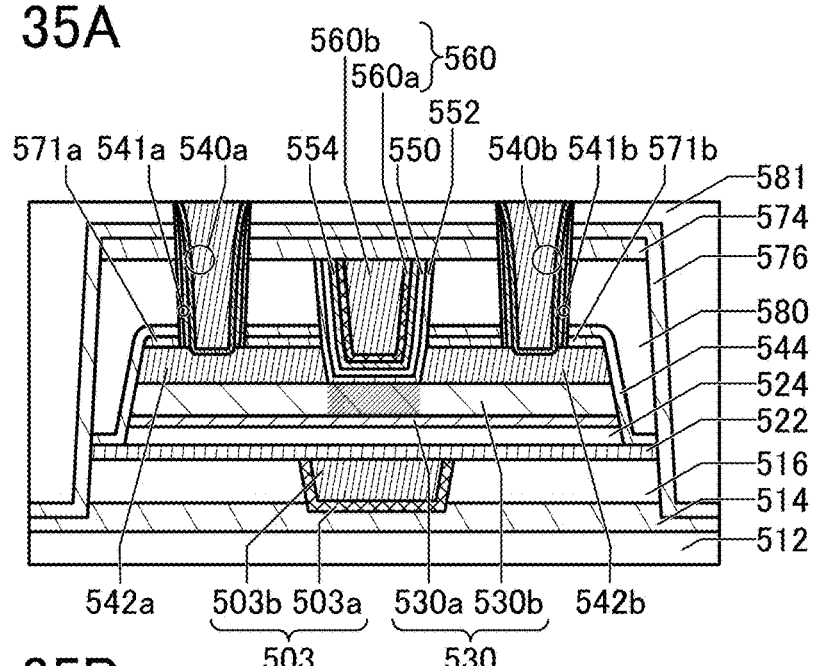
FIG. 35A to FIG. 35C are schematic cross-sectional views illustrating structure examples of transistors.
Figure 35B:
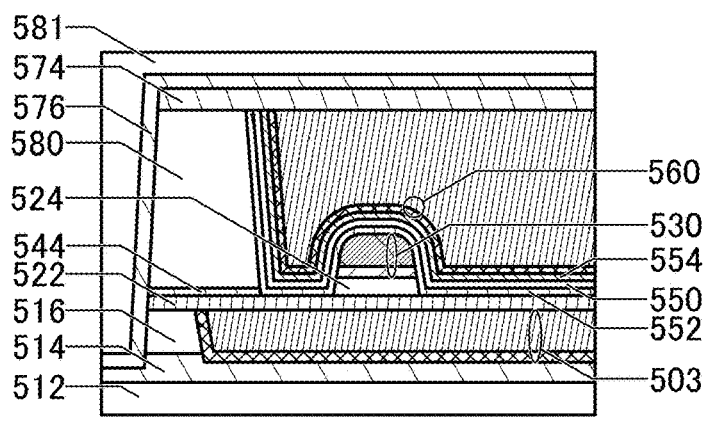
Figure 35C:
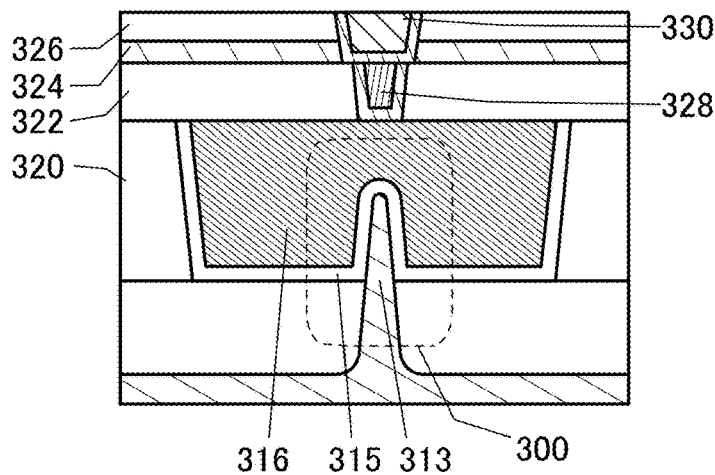

FIG. 34 illustrates the semiconductor device described in the above embodiment as an example, and the semiconductor device includes a transistor 300, a transistor 500, and a capacitor 600. FIG. 35A is a cross-sectional view of the transistor 500 in the channel length direction, FIG. 35B is a cross-sectional view of the transistor 500 in the channel width direction, and FIG. 35C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a transistor included in a semiconductor device, for example, the arithmetic circuit MAC5, the arithmetic circuit MAC5A, the arithmetic circuit MAC6, the arithmetic circuit MAC7, the arithmetic circuit MAC8, the arithmetic circuit MAC9, the arithmetic circuit MAC10, the arithmetic circuit MAC11, or the like described in the above embodiment, whereby a semiconductor device whose operating performance hardly deteriorates even at high temperatures can be obtained. In particular, when the transistor 500 is used as the transistor M1, potentials written to the memory cells AMx, the memory cells AMu, the memory cells AMw, the memory cells AMr, and the like can be retained for a long time by utilizing the feature of a low off-state current.

The transistor 500 is provided above the transistor 300, for example, and the capacitor 600 is provided above the transistor 300 and the transistor 500, for example. Note that the capacitor 600 can be the capacitor or the like included in the arithmetic circuit MAC5, the arithmetic circuit MAC5A, the arithmetic circuit MAC6, the arithmetic circuit MAC7, the arithmetic circuit MAC8, the arithmetic circuit MAC9, the arithmetic circuit MAC10, the arithmetic circuit MAC11, or the like described in the above embodiment. Note that depending on a circuit structure, the capacitor 600 illustrated in FIG. 34 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the transistors or the like included in the arithmetic circuit MAC5, the arithmetic circuit MAC5A, the arithmetic circuit MAC6, the arithmetic circuit MAC7, the arithmetic circuit MAC8, the arithmetic circuit MAC9, the arithmetic circuit MAC10, the arithmetic circuit MAC11, and the like described in the above embodiment. Specifically, for example, the transistor 300 can be the transistors included in the operational amplifier OP included in the circuit ACTV, the circuit ACF, and the like illustrated in FIG. 4A to FIG. 4C. For another example, the transistor 300 can be the transistor M2 included in each memory cell. Note that FIG. 34 illustrates a structure in which a gate of the transistor 300 is electrically connected to one of a source and a drain of the transistor 500 through a pair of electrodes of the capacitor 600; however, depending on the structures of the arithmetic circuit MAC5, the arithmetic circuit MAC5A, the arithmetic circuit MAC6, the arithmetic circuit MAC7, the arithmetic circuit MAC8, the arithmetic circuit MAC9, the arithmetic circuit MAC10, the arithmetic circuit MAC11, and the like, a structure in which one of a source and a drain of the transistor 300 is electrically connected to one of the source and the drain of the transistor 500 through the pair of electrodes of the capacitor 600 can be employed, a structure in which one of the source and the drain of the transistor 300 is electrically connected to a gate of the transistor 500 through the pair of electrodes of the capacitor 600 can be employed, or a structure in which the terminals of the transistor 300 are not electrically connected to the terminals of the transistor 500 and the terminals of the capacitor 600 can be employed.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 35C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 36:
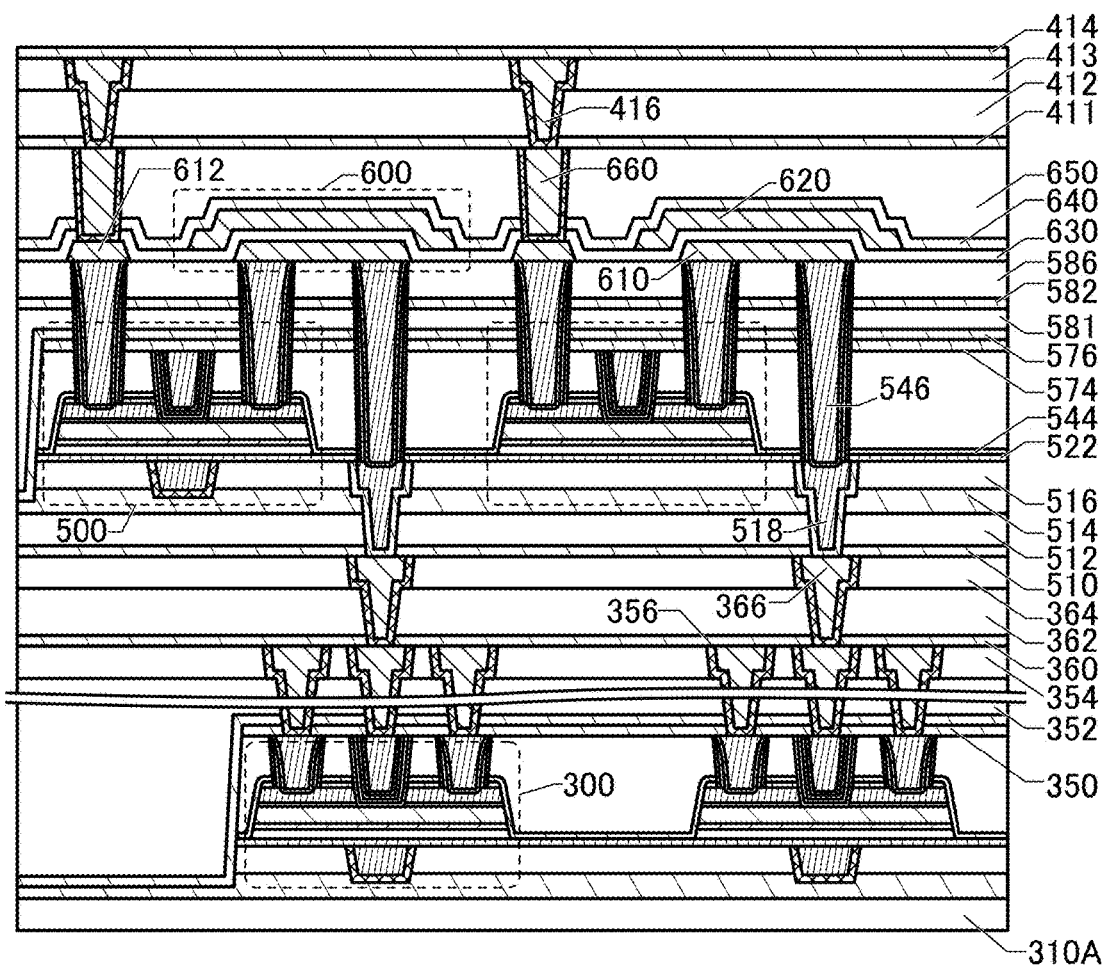
FIG. 36 is a schematic cross-sectional view illustrating a structure example of a semiconductor device.

Note that the transistor 300 illustrated in FIG. 34 is an example and the structure is not limited thereto; an appropriate transistor is used in accordance with a circuit structure or a driving method. For example, the transistor 300 may have a planar structure instead of a FIN-type structure illustrated in FIG. 35C. For example, when a semiconductor device is a single-polarity circuit using only OS transistors, the transistor 300 has a structure similar to that of the transistor 500 using an oxide semiconductor, as illustrated in FIG. 36. In that case, the transistor 300 and the transistor 500 are each an OS transistor, and the transistor 300 and the transistor 500 may be formed so as not to overlap with each other (formed through the same manufacturing steps). Note that the details of the transistor 500 will be described later.

A single-polarity circuit described in this specification and the like refers to a circuit that does not include one of an n-channel transistor and a p-channel transistor but includes the other of the n-channel transistor and the p-channel transistor. Thus, a single-polarity circuit using only an OS transistor refers to a circuit including one of an n-channel OS transistor and a p-channel OS transistor.

Note that in FIG. 36, the transistor 300 is provided over a substrate 310A; in this case, a semiconductor substrate may be used as the substrate 310A, as in the case of the substrate 310 in the semiconductor device in FIG. 34. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 34, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 34, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance with a barrier property against oxygen, hydrogen, or the like is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released. For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 35A and FIG. 35B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 35A and FIG. 35B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and insulator 571b. Here, as illustrated in FIG. 35A and FIG. 35B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 37A:
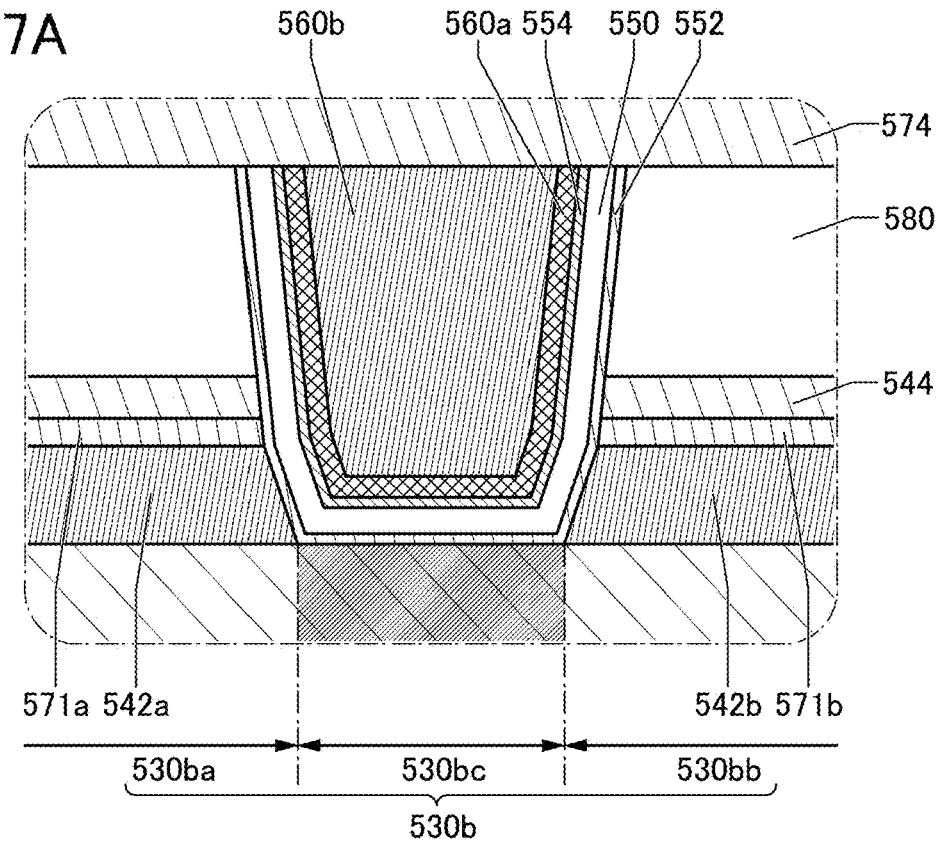
FIG. 37A and FIG. 37B are schematic cross-sectional views illustrating structure examples of a transistor.

Here, FIG. 37A is an enlarged view of the vicinity of the channel formation region in FIG. 35A. Supply of oxygen to the oxide 530b forms the channel formation region in a region between the conductor 542a and the conductor 542b. As illustrated in FIG. 37A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as Vo in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed.

The region 530ba and the region 530bb functioning as the source region and the drain region are each a low-resistance region with an increased carrier concentration because they include a large amount of oxygen vacancies (Vo) or have a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 37A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies (Vo)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and VoH in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and VoH in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can be irradiated with the high-frequency wave such as a microwave or RF. By the effect of the plasma, a microwave, or the like, VoH in the region 530*bc* can be cut; thus, hydrogen H can be removed from the region 530*bc* and an oxygen vacancy Vo can be filled with oxygen. That is, the reaction "VoH→H+Vo" occurs in the region 530*bc*, so that the hydrogen concentration in the region 530*bc* can be reduced. As a result, oxygen vacancies and VoH in the region 530*bc* can be reduced to lower the carrier concentration.

In the microwave treatment in an oxygen-containing atmosphere, the high-frequency wave such as the microwave or RF, the oxygen plasma, or the like is blocked by the conductor 542*a* and the conductor 542*b* and does not affect the region 530*ba* nor the region 530*bb*. In addition, the effect of the oxygen plasma can be reduced by the insulator 571 and the insulator 580 that are provided to cover the oxide 530*b* and the conductor 542. Hence, a reduction in VoH and supply of an excess amount of oxygen do not occur in the region 530*ba* and the region 530*bb* in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530*bc*. In addition, the insulator 552 is provided to be in contact with the side surface of the conductor 542 and the surface of the region 530*bc*, thereby preventing oxygen more than necessary from being supplied to the region 530*bc* and preventing the side surface of the conductor 542 from being oxidized. Furthermore, the side surface of the conductor 542 can be inhibited from being oxidized when an insulating film to be the insulator 550 is formed.

The oxygen supplied into the region 530*bc* has any of a variety of forms such as an oxygen atom, an oxygen molecule, and an oxygen radical (an O radical, an atom or a molecule having an unpaired electron, or an ion). Note that the oxygen supplied into the region 530*bc* preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and VoH can be selectively removed from the region 530*bc* in the oxide semiconductor, whereby the region 530*bc* can be an i-type or substantially i-type region. Furthermore, supply of an excess amount of oxygen to the region 530*ba* and the region 530*bb* functioning as the source region and the drain region can be inhibited and the n-type conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 35B, a curved surface may be provided between the side surface of the oxide 530*b* and the top surface of the oxide 530*b* in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530*b* in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530*b* with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 35A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ ($2$ cm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage ($V_{th}$) of the transistor 500 can be controlled. In particular, $V_{th}$ of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 35B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 35B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524, the oxide 530, or the like.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571.

The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 35B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies (Vo) in the oxide 530a and the oxide 530b. Therefore, oxygen vacancies (Vo) and VoH formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 35A, the insulator 552 is provided in contact with the side surfaces of the conductor 542, the insulator 571, the insulator 544, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. Examples of an ALD method include a thermal ALD method, in which a precursor and a reactant react with each other only by thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15.0 nm or less than or equal to 20 nm. Note that the above-described lower limits and upper limits can be combined with each other. In that case, at least part of the insulator 550 includes a region having the above-described thickness.

Although FIG. 35A, FIG. 35B, and the like illustrate a single-layer structure of the insulator 550, the present invention is not limited to this structure, and a stacked-layer structure of two or more layers may be employed. For example, as illustrated in FIG. 37B, the insulator 550 may have a stacked-layer structure including two layers of an insulator 550a and an insulator 550b over the insulator 550a.

Figure 37B:
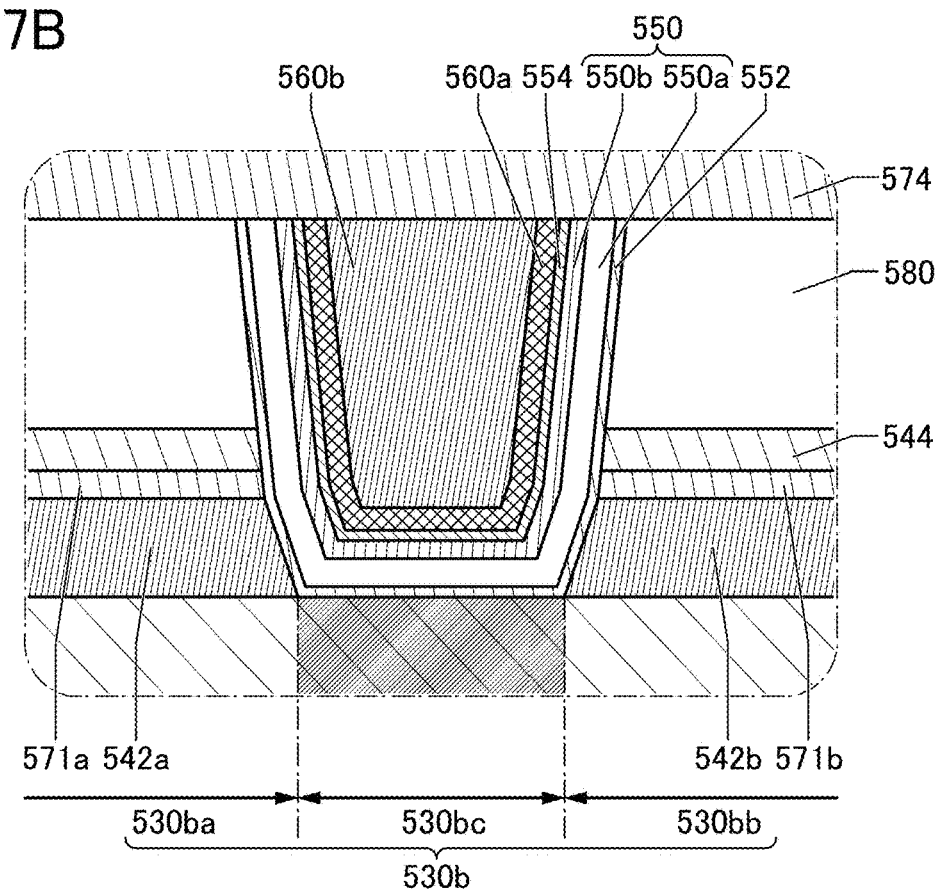

In the case where the insulator 550 has a stacked-layer structure of two layers as illustrated in FIG. 37B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 522 or the insulator 524 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 35A and FIG. 35B, the upper portion of the conductor 560 is substantially level with the upper portion of the insulator 550. Note that although the conductor 560 has a two-layer structure of the conductor 560a and the conductor 560b in FIG. 35A and FIG. 35B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used.

Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 35B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 35A and in an insulator 582 and an insulator 586 illustrated in FIG. 34 in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 35A and in the insulator 582 and the insulator 586 illustrated in FIG. 34 in the region overlapping with the conductor 542b, and the conductor 540b is provided inside the opening portion. Note that the insulator 582 and the insulator 586 will be described later.

As illustrated in FIG. 35A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as the insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like may be used. For the insulator 541*a* and the insulator 541*b*, for example, an insulator such as silicon nitride, aluminum oxide, or silicon nitride oxide may be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 35A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 34, a conductor 610, a conductor 612, and the like serving as wirings may be provided in contact with the upper portion of the conductor 540*a* and the upper portion of the conductor 540*b*. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 34, FIG. 35A, FIG. 35B, and FIG. 36. The structure of the transistor included in the semiconductor device of one embodiment of the present invention may be changed in accordance with circumstances.

Figure 38:
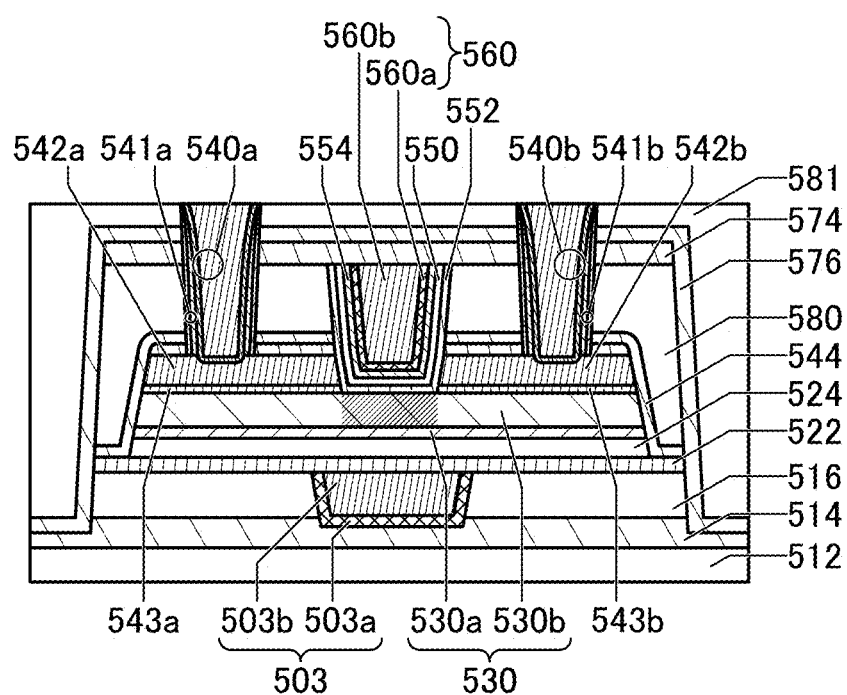
FIG. 38 is a schematic cross-sectional view illustrating a structure example of a transistor.

For example, the transistor 500 illustrated in FIG. 34, FIG. 35A, FIG. 35B, and FIG. 36 may have a structure illustrated in FIG. 38. The transistor in FIG. 38 is different from the transistor 500 illustrated in FIG. 34, FIG. 35A, FIG. 35B, and FIG. 36 in including an oxide 543*a* and an oxide 543*b*. Note that in this specification and the like, the oxide 543*a* and the oxide 543*b* are collectively referred to as an oxide 543. The cross section in the channel width direction of the transistor in FIG. 38 can have a structure similar to the cross section of the transistor 500 illustrated in FIG. 35B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and the bottom surface of the conductor 542*a*. The oxide 543*b* is preferably in contact with the top surface of the oxide 530*b* and the bottom surface of the conductor 542*b*.

The oxide 543 preferably has a function of inhibiting passage of oxygen. The oxide 543 having a function of inhibiting passage of oxygen is preferably provided between the oxide 530*b* and the conductor 542 functioning as the source electrode or the drain electrode, in which case the electric resistance between the conductor 542 and the oxide 530*b* can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen, hydrogen, or the like is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 34 and FIG. 36 will be described. Note that the capacitor 600 and the wiring and/or the plug are provided above the transistor 500 illustrated in FIG. 34 and FIG. 36. The capacitor 600 includes the conductor 610, a conductor 620, and an insulator 630, for example.

The conductor 610 is provided over one of the conductor 540a and the conductor 540b, the conductor 546, and the insulator 586. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like that is electrically connected to the transistor 500. Specifically, the conductor 612 can be the wiring WAD or the wiring WBD in the arithmetic circuit MAC5 described in Embodiment 1, for example.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 34; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

Note that in this specification, hafnium oxynitride refers to a material that has a higher oxygen content than a nitrogen content, and hafnium nitride oxide refers to a material that has a higher nitrogen content than an oxygen content.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as leakage current from a transistor and/or a capacitor might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained. Alternatively, a material having ferroelectricity may be used for the insulator 630. As a material having ferroelectricity, for example, a mixed crystal of hafnium oxide and zirconium oxide (also referred to as "HZO") or a material in which the element.J (the element J is silicon (Si), aluminum (Al), gadolinium (Gd), yttrium (Y), lanthanum (La), strontium (Sr), or the like) is added to hafnium oxide can be used. Alternatively, a piezoelectric ceramic having a perovskite structure may be used for the insulator 630. For example, lead zirconate titanate (PZT), strontium bismuth tantalate (SBT), bismuth ferrite (BFO), or barium titanate may be used. Alternatively, yttria-stabilized zirconia (YSZ), $PbTiO_x$, barium strontium titanate (BST), strontium titanate, or the like may be used for the insulator 630.

The conductor 620 is provided to overlap with the conductor 610 with the insulator 630 therebetween. The conductor 610 has a function of one of the pair of electrodes of the capacitor 600. The conductor 620 can be the wiring XAL or the wiring XBL in the arithmetic circuit MAC5 described in Embodiment 1, for example.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents hydrogen, impurities, or the like from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials that can be used for the insulator 324, for example.

Although the capacitor 600 illustrated in FIG. 34 and FIG. 36 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 34, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are each preferably formed using an insulator having a barrier property against impurities such as water and hydrogen, for example. Thus, the insulator 411 and the insulator 414 can be formed using any of the materials that can be used for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

When a semiconductor device using a transistor including an oxide semiconductor has the structure described in this embodiment, a change in electrical characteristics of the transistor can be inhibited and the reliability can be improved. Alternatively, a semiconductor device using a transistor including an oxide semiconductor can be miniaturized or highly integrated.

Note that this embodiment can be combined with any of the other embodiments in this specification as appropriate.

Embodiment 6

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 39A. FIG. 39A is a diagram showing the classification of crystal structures of an oxide semiconductor, typically IGZO (a metal oxide containing In, Ga, and Zn).

As shown in FIG. 39A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 39A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 39B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 39B and obtained by GIXD measurement is hereinafter simply referred to as an XRD spectrum. The CAAC-IGZO film in FIG. 39B has a composition in the neighborhood of In:Ga:Zn=4:2:3 [atomic ratio]. The CAAC-IGZO film in FIG. 39B has a thickness of 500 nm.

As shown in FIG. 39B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 39B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 39C shows a diffraction pattern of the CAAC-IGZO film. FIG. 39C shows a diffraction pattern obtained by the NBED in which an electron beam is incident in the direction parallel to the substrate. The composition of the CAAC-IGZO film in FIG. 39C is In:Ga:Zn=4:2:3 [atomic ratio] or the neighborhood thereof. In the nanobeam electron diffraction method, electron diffraction is performed with a probe diameter of 1 nm.

As shown in FIG. 39C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 39A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (u), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon, carbon, or the like which is one of Group 14 elements, is contained in the oxide semiconductor, defect states are formed in the oxide semiconductor. Thus, the concentration of silicon, carbon, or the like in the oxide semiconductor and the concentration of silicon, carbon, or the like in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 7

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 40A.

Figure 40A:
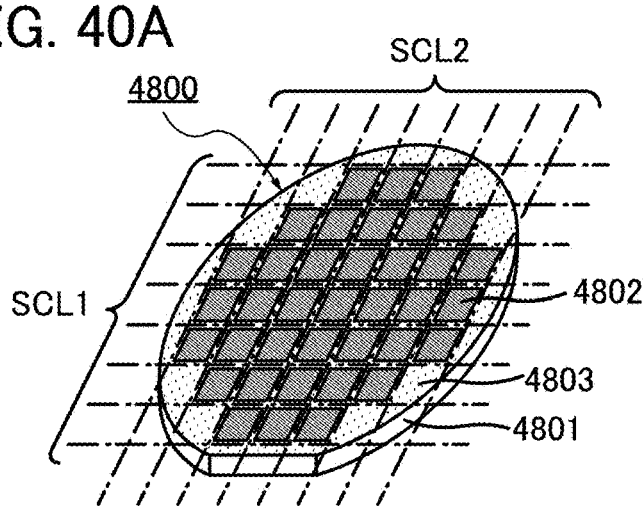
FIG. 40A is a perspective view illustrating an example of a semiconductor wafer.

A semiconductor wafer 4800 illustrated in FIG. 40A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

Figure 40B:
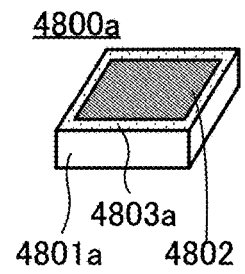
FIG. 40B is a perspective view illustrating an example of a chip.

With the dicing step, a chip 4800a as illustrated in FIG. 40B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 40A. The element substrate may be a rectangular semiconductor wafer, for example. The shape of the element substrate can be changed as appropriate, depending on a manufacturing process of an element and an apparatus for manufacturing the element.

<Electronic Component>

Figure 40C:
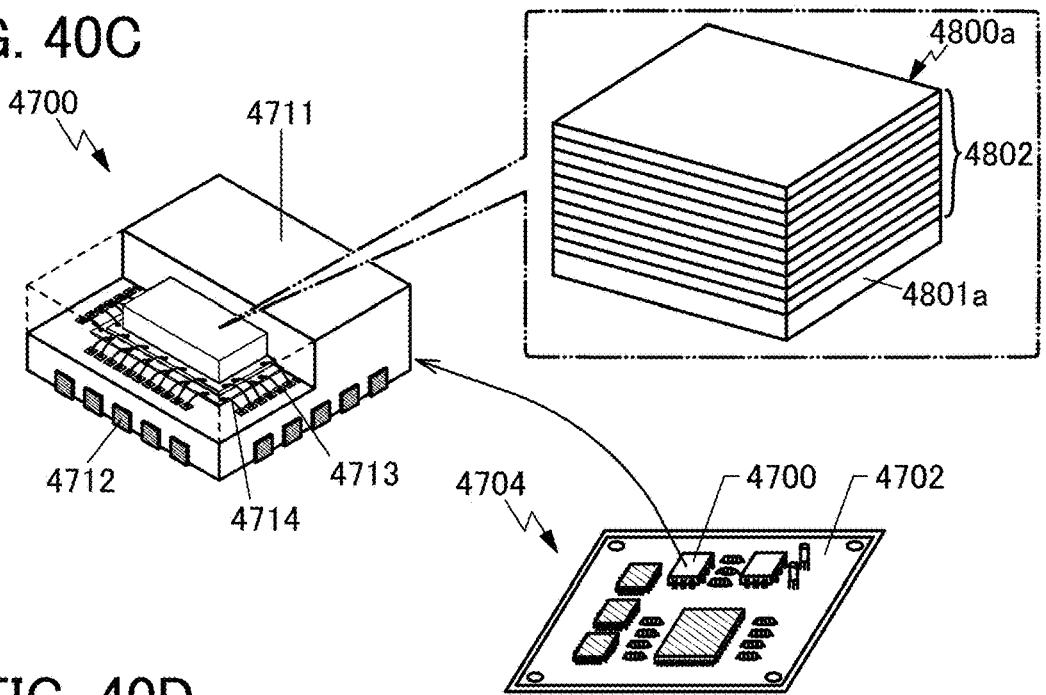
FIG. 40C and FIG. 40D are perspective views illustrating examples of electronic components.

FIG. 40C is a perspective view of an electronic component 4700 and a substrate (a mounting board 4704) on which the electronic component 4700 is mounted. The electronic component 4700 illustrated in FIG. 40C includes the chip 4800a in a mold 4711. Note that the chip 4800a illustrated in FIG. 40C may have a structure in which the circuit portions 4802 are stacked. To illustrate the inside of the electronic component 4700, some portions are omitted in FIG. 40C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 40D:
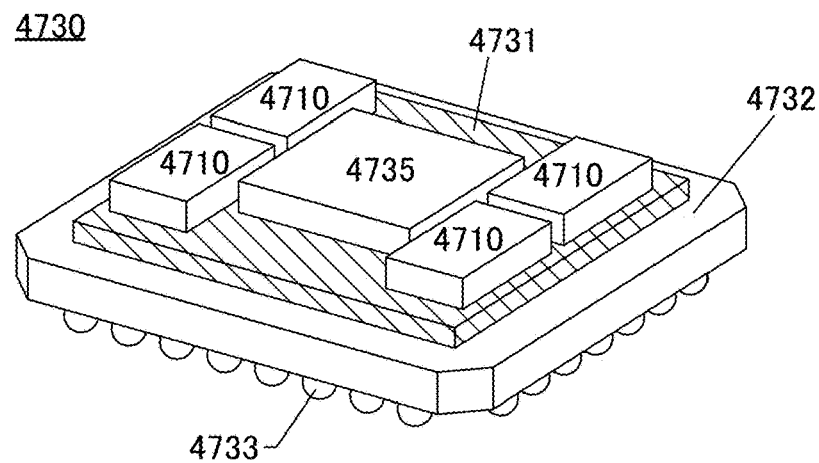

FIG. 40D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 40D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 8

Figure 41:
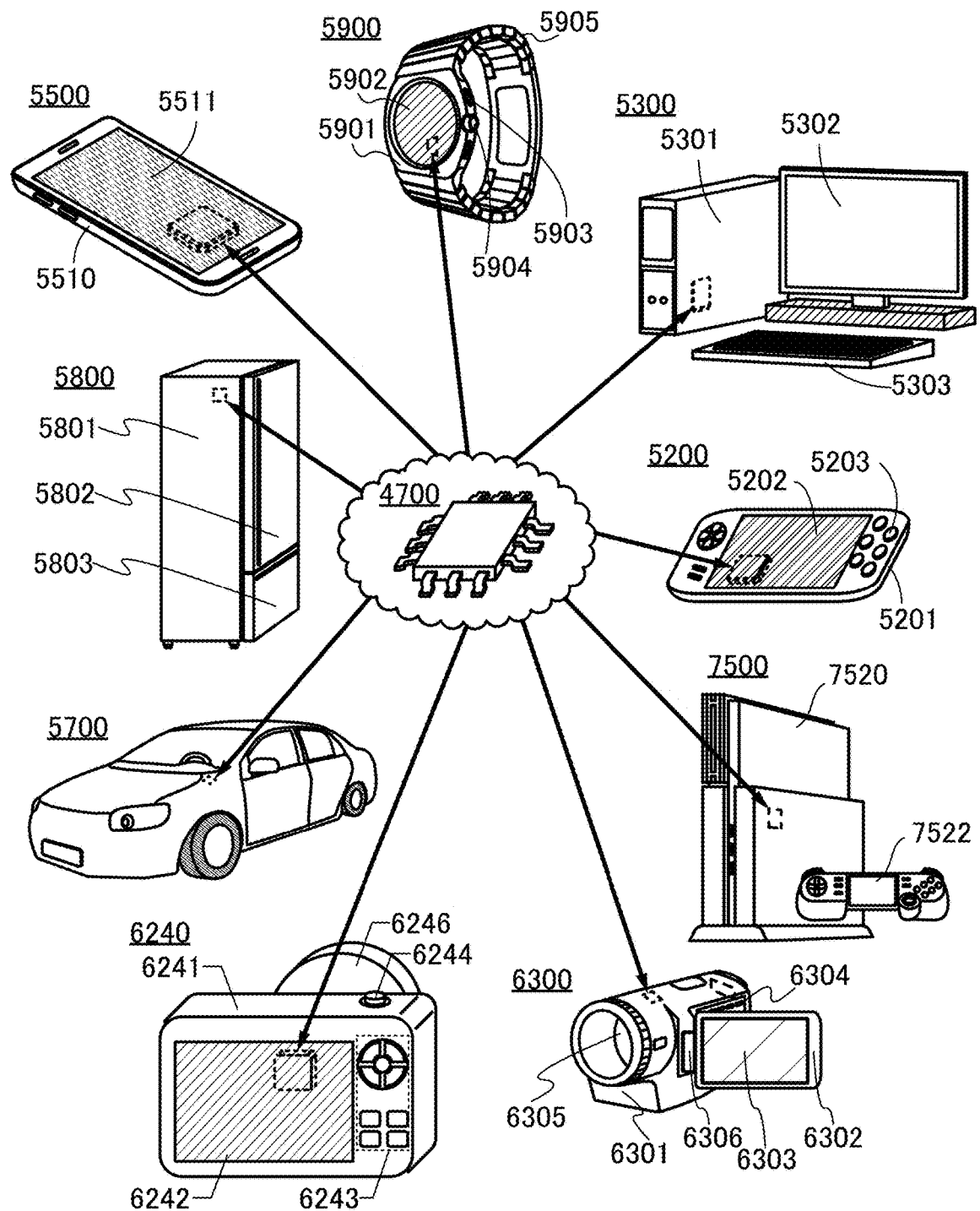
FIG. 41 is a schematic view illustrating examples of electronic devices.

This embodiment will show examples of electronic devices each including the semiconductor device described in the above embodiment. FIG. 41 illustrates electronic devices each including the electronic component 4700 including the semiconductor device.

[Mobile Phone]

An information terminal 5500 illustrated in FIG. 41 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 41 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 41 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500. Examples of the application utilizing artificial intelligence include design-support software, text correction software, and software for automatic menu generation. Furthermore, with the use of the desktop information terminal 5300, novel artificial intelligence can be developed.

Note that although FIG. 41 illustrates the smartphone, the desktop information terminal, and the wearable terminal as examples of the electronic device, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 41 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machine]

FIG. 41 illustrates a portable game machine 5200 as an example of a game machine. The portable game machine 5200 includes a housing 5201, a display portion 5202, a button 5203, and the like.

FIG. 41 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 41, the controller 7522 can include a display portion that displays a game image, and an input interface besides a button, such as a touch panel, a stick, a rotating knob, and a sliding knob, for example. The shape of the controller 7522 is not limited to that in FIG. 41, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

A video of the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program.

For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 41 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 41 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, display of an image taken by an imaging device provided on the exterior of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of a moving vehicle, the moving vehicle is not limited to an automobile. Examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used for a camera.

FIG. 41 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 is detachable from the housing 6241 for replacement here, the lens 6246 may be integrated with the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used for the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used for a video camera.

FIG. 41 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When videos taken by the video camera 6300 are recorded, the videos need to be encoded in accordance with a data recording format. With the use of artificial intelligence, the video camera 6300 can perform the pattern recognition by artificial intelligence in encoding of the videos. The pattern recognition is used to calculate a difference in the human, the animal, the object, and the like between continuously taken image data, so that the data can be compressed.

[Expansion Device for PC]

The semiconductor device described in the above embodiment can be used in a calculator such as a PC (Personal Computer) and an expansion device for an information terminal.

Figure 42A:
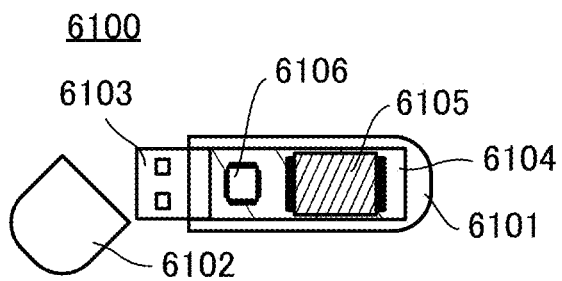
FIG. 42A to FIG. 42C are schematic views illustrating examples of electronic devices.

FIG. 42A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 42A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for the PC and the like can increase the arithmetic processing performance of the PC. Thus, a PC with insufficient processing performance can perform an arithmetic operation of artificial intelligence, moving image processing, and the like.

[Broadcasting System]

The semiconductor device described in the above embodiment can be used for a broadcasting system.

Figure 42B:
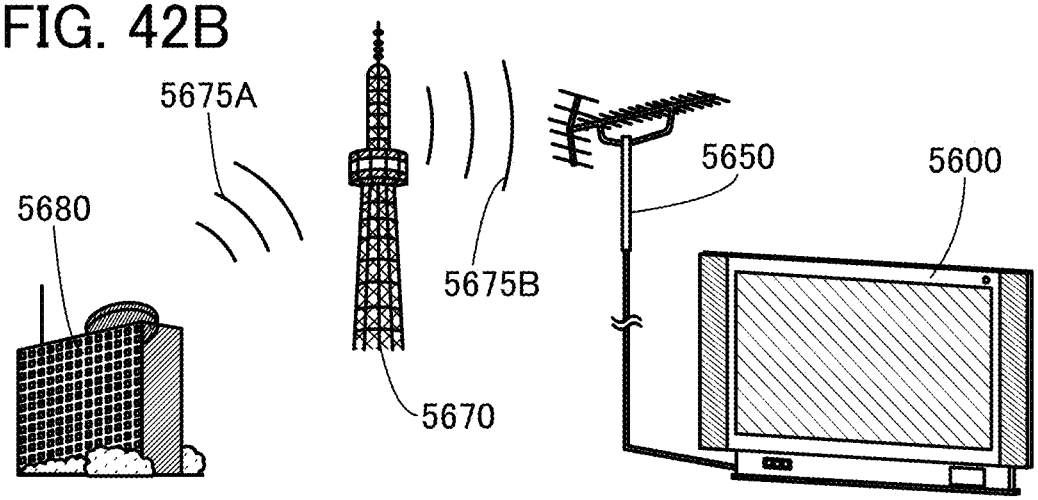

FIG. 42B schematically illustrates data transmission in a broadcasting system. Specifically, FIG. 42B illustrates a path in which a radio wave (a broadcasting signal) transmitted from a broadcast station 5680 reaches a television receiver (TV) 5600 of each household. The TV 5600 includes a receiving device (not illustrated), and the broadcasting signal received by an antenna 5650 is transmitted to the TV 5600 through the receiving device.

Although a UHF (Ultra High Frequency) antenna is illustrated as the antenna 5650 in FIG. 42B, a BS/110° CS antenna, a CS antenna, or the like can also be used as the antenna 5650.

A radio wave 5675A and a radio wave 5675B are broadcasting signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 42B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 42C:
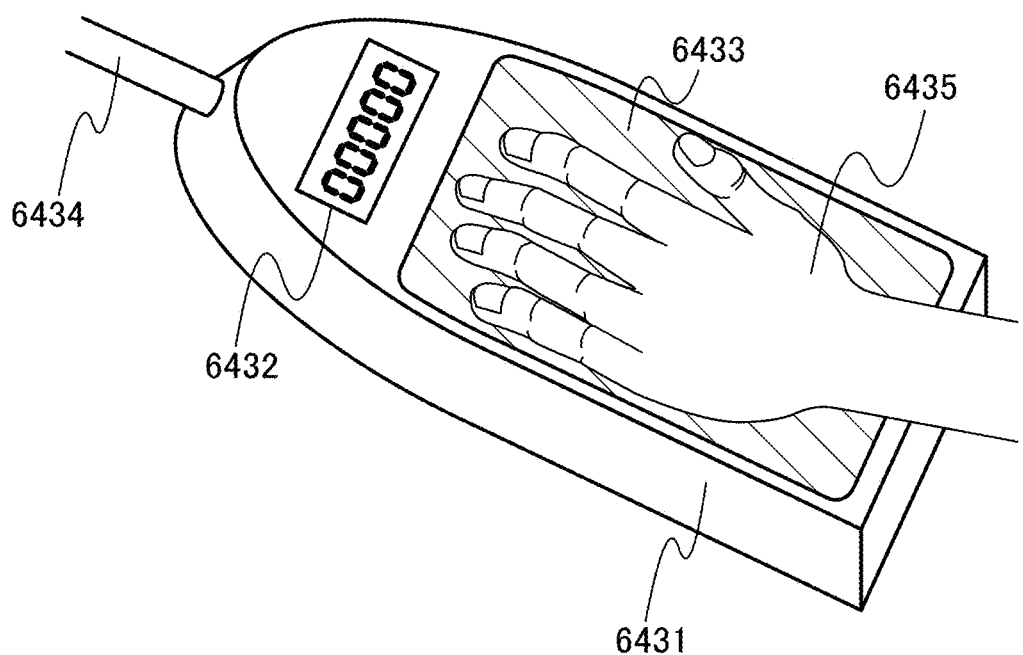

FIG. 42C illustrates a palm print authentication device including a housing 6431, a display portion 6432, a palm print reading portion 6433, and a wiring 6434.

In FIG. 42C, a palm print of a hand 6435 is obtained using the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments in this specification as appropriate.

REFERENCE NUMERALS

MAC1: arithmetic circuit, MAC1A: arithmetic circuit, MAC2: arithmetic circuit, MAC3: arithmetic circuit, MAC4: arithmetic circuit, MAC4-1: arithmetic circuit, MAC4-2: arithmetic circuit, MAC5: arithmetic circuit, MAC5A: arithmetic circuit, MAC6: arithmetic circuit, MAC7: arithmetic circuit, MAC8: arithmetic circuit, MAC9: arithmetic circuit, MAC9-1: arithmetic circuit, MAC9-2: arithmetic circuit, MAC10: arithmetic circuit, MAC11: arithmetic circuit, MAC12: arithmetic circuit, CA: memory cell array, CA[1]: memory cell array, CA[n]: memory cell array, CA[1]: memory cell array, CAS: memory cell array, WDD: circuit, WDa: circuit, WDb: circuit, CMS: circuit, XLD: circuit, WLD: circuit, INT: circuit, ACTV: circuit, CSX: circuit, CSU: circuit, CSW: circuit, CSR: circuit, AMx[1]: memory cell, AMx[m]: memory cell, AMu[1]: memory cell, AMu[m]: memory cell, AMw[1]: memory cell, AMw[m]: memory cell, AMr[1]: memory cell, AMr[m]: memory cell, AMxb: memory cell, AMub: memory cell, AMwb: memory cell, AMrb: memory cell, CS[1]: circuit, CS[m]: circuit, CSb: circuit, CUW[1,1]: circuit, CUW[1,n]: circuit, CUW[2,1]: circuit, CUW[2,n]: circuit, CUW[i,1]: circuit, CUW[in]: circuit, CUW[m-1,1]: circuit, CUW[m-1,n]: circuit, CUW[m, 1]: circuit, CUW[m,n]: circuit, CXR[1]: circuit, CXR[2]: circuit, CXR[i]: circuit, CXR[m-1]: circuit, CXR[m]: circuit, CM: circuit, CM[1]: circuit, CM[n]: circuit, CMS1: circuit, CMS2: circuit, CMA[1]: circuit, CMA[n]: circuit, CMB: circuit, CMC: circuit, SCI: circuit, SCI[1]: circuit, SCI[n]: circuit, SCIA[1]: circuit, SCIA[n]: circuit, SCIB: circuit, ACP: circuit, ACP[1]: circuit, ACP[n]: circuit, IVC: circuit, ACF: circuit, XAL[1]: wiring, XAL[m]: wiring, XAL[n]: wiring, XBL[1]: wiring, XBL[m]: wiring, XBL[n]: wiring, XALb: wiring, XBLb: wiring, WAL[1]: wiring, WAL[m]: wiring, WAL[n]: wiring, WBL[1]: wiring, WBL[m]: wiring, WBL[n]: wiring, WL[1]: wiring, WL[m]: wiring, WL[n]: wiring, WAD: wiring, WAD[1]: wiring, WAD[n]: wiring, WAD[1]: wiring, WBD: wiring, WBD[1]: wiring, WBD[n]: wiring, WBD[i]: wiring, BAL: wiring, BAL[1]: wiring, BAL[n]: wiring, BBL: wiring, BBL[1]: wiring, BBL[n]: wiring, BAP[1]: wiring, BAP[n]: wiring, BAN[1]: wiring, BAN[n]: wiring, BBN: wiring, BBP: wiring, BBP1: wiring, BBP2: wiring, NIL: wiring, NIL[1]: wiring, NIL[n]: wiring, NIL[t]: wiring, SL4: wiring, SL5: wiring, SL7: wiring, SL8: wiring, VDL: wiring, VHE: wiring, VSL: wiring, VSSL: wiring, VLL: wiring, VR: wiring, VRPL: wiring, VBA: wiring, CCS: current source, CSA: current source, CSB: current source, M1: transistor, M2: transistor, M3A: transistor, M3B: transistor, M4A: transistor, M4B: transistor, M5: transistor, M6A[1]: transistor, M6A[n]: transistor, M6B: transistor, M7A[1]: transistor, M7A[n]: transistor, M7B: transistor, C1: capacitor, FC: capacitor, LEA: load, LEB: load, SW4A: switch, SW4B: switch, SW4F: switch, SW5A: switch, SW5B: switch, SW7A: switch, SW7B: switch, SW7C: switch, SW7D: switch, SW8A[1]: switch, SW8A[n]: switch, SW8B: switch, OP: operational amplifier, CMP: comparator, ADC: analog-to-digital converter circuit, Nx[1]: node, Nx[m]: node, Nu[1]: node, Nu[m]: node, Nw[1]: node, Nw[m]: node, Nr[1]: node, Nr[m]: node, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540a: conductor, 540b: conductor, 541a: insulator, 541b: insulator, 542a: conductor, 542b: conductor, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 640: insulator, 650: insulator, 660: conductor, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7500: stationary game machine, 7520: main body, 7522: controller

The invention claimed is:
1. A semiconductor device comprising:
a first cell, a second cell, a third cell, a fourth cell, a current mirror circuit, a first wiring, a second wiring, a third wiring, and a fourth wiring,
wherein the first cell, the second cell, the third cell, and the fourth cell each comprise a first transistor, a second transistor, and a capacitor,
wherein a first terminal of the first transistor is electrically connected to a first terminal of the capacitor and a gate of the second transistor in each of the first cell, the second cell, the third cell, and the fourth cell,
wherein a first terminal of the second transistor in the first cell is electrically connected to the first wiring,
wherein a second terminal of the capacitor in the first cell is electrically connected to the third wiring,
wherein a first terminal of the second transistor in the second cell is electrically connected to the first wiring,
wherein a second terminal of the capacitor in the second cell is electrically connected to the fourth wiring,
wherein a first terminal of the second transistor in the third cell is electrically connected to the second wiring,
wherein a second terminal of the capacitor in the third cell is electrically connected to the third wiring,
wherein a first terminal of the second transistor in the fourth cell is electrically connected to the second wiring,
wherein a second terminal of the capacitor in the fourth cell is electrically connected to the fourth wiring,
wherein the current mirror circuit is electrically connected to the first wiring and the second wiring,
wherein the current mirror circuit is configured to supply current corresponding to a potential of the first wiring to the second wiring,
wherein a first data is determined depending on a difference between a first potential and a second potential,
wherein the first cell is configured to retain the first potential in the first terminal of the capacitor in the first cell,
wherein the second cell is configured to retain the second potential in the first terminal of the capacitor in the second cell,
wherein the third cell is configured to retain the second potential in the first terminal of the capacitor in the third cell,
wherein the fourth cell is configured to retain the first potential in the first terminal of the capacitor in the fourth cell,
wherein a second data is determined depending on a difference between a third potential and a fourth potential, and
wherein, when the third potential is input to the third wiring and the fourth potential is input to the fourth wiring, a current amount obtained by subtracting an amount of current flowing from the second wiring to the first terminal of the second transistor in the third cell and an amount of current flowing from the second wiring to the first terminal of the second transistor in the fourth cell from an amount of current flowing from the current mirror circuit to the second wiring is an amount corresponding to a product of the first data and the second data.

2. A semiconductor device comprising:
m (m is an integer greater than or equal to 1) first cells, m second cells, m third cells, m fourth cells, a current mirror circuit, a first wiring, a second wiring, m third wirings, and m fourth wirings,
wherein the m first cells, the m second cells, the m third cells, and the m fourth cells each comprise a first transistor, a second transistor, and a capacitor,
wherein a first terminal of the first transistor is electrically connected to a first terminal of the capacitor and a gate of the second transistor in each of the m first cells, the m second cells, the m third cells, and the m fourth cells,
wherein a first terminal of the second transistor in each of the m first cells is electrically connected to the first wiring,
wherein a second terminal of the capacitor in the i-th (i is an integer greater than or equal to 1 and less than or equal to m) first cell is electrically connected to the i-th third wiring,
wherein a first terminal of the second transistor in each of the m second cells is electrically connected to the first wiring,
wherein a second terminal of the capacitor in the i-th second cell is electrically connected to the i-th fourth wiring,
wherein a first terminal of the second transistor in each of the m third cells is electrically connected to the second wiring,
wherein a second terminal of the capacitor in the i-th third cell is electrically connected to the i-th third wiring,
wherein a first terminal of the second transistor in each of the m fourth cells is electrically connected to the second wiring,
wherein a second terminal of the capacitor in the i-th fourth cell is electrically connected to the i-th fourth wiring,
wherein the current mirror circuit is electrically connected to the first wiring and the second wiring,
wherein the current mirror circuit is configured to supply current corresponding to a potential of the first wiring to the second wiring,
wherein the first cell electrically connected to the i-th third wiring is configured to retain a potential $V_{W\alpha}[d]$ in the first terminal of the capacitor in the first cell, and the third cell electrically connected to the i-th third wiring is configured to retain a potential $V_{W\beta}[i]$ in the first terminal of the capacitor in the third cell,
wherein the second cell electrically connected to the i-th fourth wiring is configured to retain the potential $V_{W\beta}[i]$ in the first terminal of the capacitor in the second cell, and the fourth cell electrically connected to the i-th fourth wiring is configured to retain the potential $V_{W\alpha}[i]$ in the first terminal of the capacitor in the fourth cell, and
wherein, when a potential $V_{X\alpha}[i]$ is input to the i-th third wiring and a potential $V_{X\beta}[i]$ is input to the i-th fourth wiring, a current amount obtained by subtracting a total amount of current flowing from the second wiring to the first terminals of the second transistors in the m third cells and a total amount of current flowing from the second wiring to the first terminals of the second transistors in the m fourth cells from an amount of current flowing from the current mirror circuit to the second wiring is an amount corresponding to a value of Formula (A1):

$$\sum_{i=1}^{m}(V_{W\alpha}[i] - V_{W\beta}[i])(V_{X\alpha}[i] - V_{X\beta}[i]) \qquad (A1)$$

3. A semiconductor device comprising:
a first cell, a second cell, a third cell, a fourth cell, a first wiring, a second wiring, a third wiring, a fourth wiring, a fifth wiring, a sixth wiring, and a seventh wiring,
wherein the first cell, the second cell, the third cell, and the fourth cell each comprise a first transistor, a second transistor, and a capacitor,
wherein a first terminal of the first transistor is electrically connected to a first terminal of the capacitor and a gate of the second transistor in each of the first cell, the second cell, the third cell, and the fourth cell,
wherein a first terminal of the second transistor in the first cell is electrically connected to the fourth wiring,
wherein a second terminal of the capacitor in the first cell is electrically connected to the sixth wiring,
wherein a second terminal of the first transistor in the first cell is electrically connected to the second wiring,
wherein a gate of the first transistor in the first cell is electrically connected to the first wiring,
wherein a first terminal of the second transistor in the second cell is electrically connected to the fourth wiring,
wherein a second terminal of the capacitor in the second cell is electrically connected to the seventh wiring,
wherein a second terminal of the first transistor in the second cell is electrically connected to the third wiring,
wherein a gate of the first transistor in the second cell is electrically connected to the first wiring,
wherein a first terminal of the second transistor in the third cell is electrically connected to the fifth wiring,
wherein a second terminal of the capacitor in the third cell is electrically connected to the sixth wiring,
wherein a second terminal of the first transistor in the third cell is electrically connected to the third wiring,
wherein a gate of the first transistor in the third cell is electrically connected to the first wiring,
wherein a first terminal of the second transistor in the fourth cell is electrically connected to the fifth wiring,
wherein a second terminal of the capacitor in the fourth cell is electrically connected to the seventh wiring,
wherein a second terminal of the first transistor in the fourth cell is electrically connected to the second wiring, and
wherein a gate of the first transistor in the fourth cell is electrically connected to the first wiring.

4. The semiconductor device according to claim 3, further comprising a current mirror circuit,
wherein the current mirror circuit is electrically connected to the fourth wiring and the fifth wiring, and
wherein the current mirror circuit is configured to supply current corresponding to a potential of the fourth wiring to the fifth wiring.

5. The semiconductor device according to claim 4,
wherein a first data is determined depending on a difference between a first potential and a second potential,
wherein the first cell is configured to retain the first potential in the first terminal of the capacitor in the first cell,
wherein the second cell is configured to retain the second potential in the first terminal of the capacitor in the second cell,
wherein the third cell is configured to retain the second potential in the first terminal of the capacitor in the third cell,
wherein the fourth cell is configured to retain the first potential in the first terminal of the capacitor in the fourth cell,
wherein a second data is determined depending on a difference between a third potential and a fourth potential, and
wherein, when the third potential is input to the sixth wiring and the fourth potential is input to the seventh wiring, a current amount obtained by subtracting an amount of current flowing from the fifth wiring to the first terminal of the second transistor in the third cell and an amount of current flowing from the fifth wiring to the first terminal of the second transistor in the fourth cell from an amount of current flowing from the current mirror circuit to the fifth wiring is an amount corresponding to a product of the first data and the second data.

6. The semiconductor device according to claim 3, further comprising a first current source, a second current source, and a subtraction circuit,
wherein the first current source is electrically connected to the fourth wiring,
wherein the second current source is electrically connected to the fifth wiring,
wherein an amount of current flowing from the first current source to the fourth wiring is greater than or equal to 0.9 times and less than or equal to 1.1 times an amount of current flowing from the second current source to the fifth wiring,
wherein a first input terminal of the subtraction circuit is electrically connected to the fourth wiring, and
wherein a second input terminal of the subtraction circuit is electrically connected to the fifth wiring.

7. The semiconductor device according to claim 6,
wherein a first data is determined depending on a difference between a first potential and a second potential,
wherein the first cell is configured to retain the first potential in the first terminal of the capacitor in the first cell,
wherein the second cell is configured to retain the second potential in the first terminal of the capacitor in the second cell,
wherein the third cell is configured to retain the second potential in the first terminal of the capacitor in the third cell,
wherein the fourth cell is configured to retain the first potential in the first terminal of the capacitor in the fourth cell,
wherein a second data is determined depending on a difference between a third potential and a fourth potential, and
wherein, when the third potential is input to the sixth wiring and the fourth potential is input to the seventh wiring:
current with an amount obtained by subtracting a total amount of current flowing from the fourth wiring to the first terminals of the second transistors in the first cell and the second cell from an amount of current flowing from the first current source to the fourth wiring is input to the first input terminal of the subtraction circuit;
current with an amount obtained by subtracting a total amount of current flowing from the fifth wiring to the first terminals of the second transistors in the third cell and the fourth cell from an amount of current flowing from the second current source to the fifth wiring is input to the second input terminal of the subtraction circuit; and the subtraction circuit is configured to output voltage corresponding to a product of the first data and the second data from an output terminal.

8. A semiconductor device comprising:

m (m is an integer greater than or equal to 1) first cells, m second cells, m third cells, m fourth cells, a current mirror circuit, m first wirings, a second wiring, a third wiring, a fourth wiring, a fifth wiring, m sixth wirings, and m seventh wirings, wherein the m first cells, the m second cells, the m third cells, and the m fourth cells each comprise a first transistor, a second transistor, and a capacitor, wherein a first terminal of the first transistor is electrically connected to a first terminal of the capacitor and a gate of the second transistor in each of the m first cells, the m second cells, the m third cells, and the m fourth cells, wherein a first terminal of the second transistor in each of the m first cells is electrically connected to the fourth wiring, wherein a second terminal of the capacitor in the i-th (i is an integer greater than or equal to 1 and less than or equal to m) first cell is electrically connected to the i-th sixth wiring, wherein a second terminal of the first transistor in each of the m first cells is electrically connected to the second wiring, wherein a gate of the first transistor in the i-th first cell is electrically connected to the i-th first wiring, wherein a first terminal of the second transistor in each of the m second cells is electrically connected to the fourth wiring, wherein a second terminal of the capacitor in the i-th second cell is electrically connected to the i-th seventh wiring, wherein a second terminal of the first transistor in each of the m second cells is electrically connected to the third wiring, wherein a gate of the first transistor in the i-th second cell is electrically connected to the i-th first wiring, wherein a first terminal of the second transistor in each of the m third cells is electrically connected to the fifth wiring, wherein a second terminal of the capacitor in the i-th third cell is electrically connected to the i-th sixth wiring, wherein a second terminal of the first transistor in each of the m third cells is electrically connected to the third wiring, wherein a gate of the first transistor in the i-th third cell is electrically connected to the i-th first wiring, wherein a first terminal of the second transistor in each of the m fourth cells is electrically connected to the fifth wiring, wherein a second terminal of the capacitor in the i-th fourth cell is electrically connected to the i-th seventh wiring, wherein a second terminal of the first transistor in each of the m fourth cells is electrically connected to the second wiring, wherein a gate of the first transistor in the i-th fourth cell is electrically connected to the i-th first wiring, wherein the current mirror circuit is electrically connected to the fourth wiring and the fifth wiring, wherein the current mirror circuit is configured to supply current corresponding to a potential of the fourth wiring to the fifth wiring, wherein the first cell electrically connected to the i-th sixth wiring is configured to retain a potential $V_{W\alpha}[i]$ in the first terminal of the capacitor in the first cell, and the third cell electrically connected to the i-th sixth wiring is configured to retain a potential $V_{W\beta}[i]$ in the first terminal of the capacitor in the third cell, wherein the second cell electrically connected to the i-th seventh wiring is configured to retain the potential $V_{W\beta}[i]$ in the first terminal of the capacitor in the second cell, and the fourth cell electrically connected to the i-th seventh wiring is configured to retain the potential $V_{W\alpha}[i]$ in the first terminal of the capacitor in the fourth cell, and wherein, when a potential $V_{X\alpha}[i]$ is input to the i-th sixth wiring and a potential $V_{X\beta}[i]$ is input to the i-th seventh wiring, a current amount obtained by subtracting a total amount of current flowing from the fifth wiring to the first terminals of the second transistors in the m third cells and a total amount of current flowing from the fifth wiring to the first terminals of the second transistors in the m fourth cells from an amount of current flowing from the current mirror circuit to the fifth wiring is an amount corresponding to a value of Formula (A3):

$$\sum_{i=1}^{m}(V_{W\alpha}[i] - V_{W\beta}[i])(V_{X\alpha}[i] - V_{X\beta}[i]) \qquad (A3)$$

9. A semiconductor device comprising:

a first cell, a second cell, a third cell, a fourth cell, a first current mirror circuit, a second current mirror circuit, a third current mirror circuit, and a fourth current mirror circuit, wherein the first cell, the second cell, the third cell, and the fourth cell each comprise a first transistor, a second transistor, and a capacitor, wherein a first terminal of the first transistor is electrically connected to a first terminal of the capacitor and a gate of the second transistor in each of the first cell, the second cell, the third cell, and the fourth cell, wherein a gate of the first transistor in the first cell is electrically connected to a gate of the first transistor in the second cell, a gate of the first transistor in the third cell, and a gate of the first transistor in the fourth cell, wherein a first terminal of the first current mirror circuit is electrically connected to a first terminal of the second transistor in the first cell, wherein a second terminal of the first current mirror circuit is electrically connected to a first terminal of the second transistor in the fourth cell, wherein a first terminal of the second current mirror circuit is electrically connected to a first terminal of the second transistor in the third cell, wherein a second terminal of the second current mirror circuit is electrically connected to a first terminal of the third current mirror circuit, wherein a second terminal of the third current mirror circuit is electrically connected to the first terminal of the second transistor in the fourth cell, wherein a first terminal of the fourth current mirror circuit is electrically connected to a first terminal of the second transistor in the second cell, wherein a second terminal of the fourth current mirror circuit is electrically connected to the first terminal of the second transistor in the fourth cell, wherein the first current mirror circuit is configured to supply current corresponding to a potential of the first terminal of the first current mirror circuit to an outside from the first terminal and the second terminal of the first current mirror circuit, wherein the second current mirror circuit is configured to supply current corresponding to a potential of the first terminal of the second current mirror circuit to an outside from the first terminal and the second terminal of the second current mirror circuit, wherein the third current mirror circuit is configured to supply current corresponding to a potential of the first terminal of the third current mirror circuit to an inside from the first terminal and the second terminal of the third current mirror circuit, and wherein the fourth current mirror circuit is configured to supply current corresponding to a potential of the first terminal of the fourth current mirror circuit to an outside from the first terminal and the second terminal of the fourth current mirror circuit.

10. The semiconductor device according to claim 9, wherein a second terminal of the capacitor in the first cell is electrically connected to a second terminal of the capacitor in the third cell, wherein a second terminal of the first transistor in the first cell is electrically connected to a second terminal of the first transistor in the fourth cell, wherein a second terminal of the capacitor in the second cell is electrically connected to a second terminal of the capacitor in the fourth cell, and wherein a second terminal of the first transistor in the second cell is electrically connected to a second terminal of the first transistor in the third cell.

11. The semiconductor device according to claim 10, wherein a first data is determined depending on a difference between a first potential and a second potential, wherein the first cell is configured to retain the first potential in the first terminal of the capacitor in the first cell, wherein the second cell is configured to retain the second potential in the first terminal of the capacitor in the second cell, wherein the third cell is configured to retain the second potential in the first terminal of the capacitor in the third cell, wherein the fourth cell is configured to retain the first potential in the first terminal of the capacitor in the fourth cell, wherein a second data is determined depending on a difference between a third potential and a fourth potential, and wherein, when the third potential is input to each of the second terminal of the capacitor in the first cell and the second terminal of the capacitor in the third cell and the fourth potential is input to each of the second terminal of the capacitor in the second cell and the second terminal of the capacitor in the fourth cell, a current amount obtained by subtracting an amount of current flowing through the first terminal of the second transistor in the fourth cell and an amount of current flowing through the third terminal of the third current mirror circuit from a total amount of current flowing from the second terminal of the first current mirror circuit and current flowing from the second terminal of the fourth current mirror circuit is an amount corresponding to a product of the first data and the second data.

12. The semiconductor device according to claim 1, wherein the capacitor in each of the second cell and the third cell comprises a material having ferroelectricity between the first terminal and the second terminal.

13. The semiconductor device according to claim 12, wherein the material comprises one or more materials selected from hafnium oxide, zirconium oxide, $HfZrO_X$ (X is a real number greater than 0), yttria-stabilized zirconia, barium titanate, $PbTiO_X$, lead zirconate titanate, barium strontium titanate, strontium titanate, strontium bismuth tantalate, and bismuth ferrite.

14. The semiconductor device according to claim 3, wherein the capacitor in each of the second cell and the third cell comprises a material having ferroelectricity between the first terminal and the second terminal.

15. The semiconductor device according to claim 14, wherein the material comprises one or more materials selected from hafnium oxide, zirconium oxide, $HfZrO_X$ (X is a real number greater than 0), yttria-stabilized zirconia, barium titanate, $PbTiO_X$, lead zirconate titanate, barium strontium titanate, strontium titanate, strontium bismuth tantalate, and bismuth ferrite.

16. The semiconductor device according to claim 1, wherein the first transistor and the second transistor each comprise a metal oxide in a channel formation region.

17. An electronic device comprising:

the semiconductor device according to claim 1; and a housing.

18. The semiconductor device according to claim 2, wherein the first transistor and the second transistor each comprise a metal oxide in a channel formation region.

19. An electronic device comprising:

the semiconductor device according to claim 2; and a housing.

20. The semiconductor device according to claim 3, wherein the first transistor and the second transistor each comprise a metal oxide in a channel formation region.

21. An electronic device comprising:

the semiconductor device according to claim 3; and a housing.

22. The semiconductor device according to claim 8, wherein the first transistor and the second transistor each comprise a metal oxide in a channel formation region.

23. An electronic device comprising:

the semiconductor device according to claim 8; and a housing.

24. The semiconductor device according to claim 9, wherein the first transistor and the second transistor each comprise a metal oxide in a channel formation region.

25. An electronic device comprising:

the semiconductor device according to claim 9; and a housing.

* * * * *